(12) United States Patent
Leedy

(10) Patent No.: US 8,269,327 B2
(45) Date of Patent: Sep. 18, 2012

(54) VERTICAL SYSTEM INTEGRATION

(76) Inventor: Glenn J Leedy, Saline, MI (US)

( * ) Notice: Subject to any disclaimer, the term of this patent is extended or adjusted under 35 U.S.C. 154(b) by 965 days.

(21) Appl. No.: 12/143,774

(22) Filed: Jun. 21, 2008

(65) Prior Publication Data

US 2008/0251941 A1     Oct. 16, 2008

Related U.S. Application Data

(60) Division of application No. 10/485,046, filed on Jan. 22, 2004, now Pat. No. 7,402,897, which is a continuation of application No. PCT/US03/25048, filed on Aug. 8, 2003.

(60) Provisional application No. 60/402,112, filed on Aug. 8, 2002.

(51) Int. Cl.
*H01L 21/00* (2006.01)

(52) U.S. Cl. .................. 257/678; 257/777; 257/48

(58) Field of Classification Search ............. 257/678, 257/777, 48
See application file for complete search history.

(56) References Cited

U.S. PATENT DOCUMENTS

| | | |
|---|---|---|
| 2,915,722 A | 12/1959 | Foster |
| 3,202,948 A | 8/1965 | Farrand |
| 3,430,835 A | 3/1969 | Patzer et al. |
| 3,559,282 A | 2/1971 | Lesk |
| 3,560,364 A | 2/1971 | Burkhardt |
| 3,602,982 A | 9/1971 | Kooi |
| 3,615,901 A | 10/1971 | Medicus |
| 3,636,358 A | 1/1972 | Groschwitz |
| 3,716,429 A | 2/1973 | Napoli et al. |
| 3,777,227 A | 12/1973 | Krishna et al. |
| 3,780,352 A | 12/1973 | Redwanz |
| 3,868,565 A | 2/1975 | Kuipers |
| 3,922,705 A | 11/1975 | Yerman |
| 3,932,932 A | 1/1976 | Goodman |
| 3,997,381 A | 12/1976 | Wanlass |
| 4,028,547 A | 6/1977 | Eisenberger |
| 4,070,230 A | 1/1978 | Stein |
| 4,131,985 A | 1/1979 | Greenwood et al. |
| 4,142,004 A | 2/1979 | Hauser, Jr. et al. |
| 4,196,232 A | 4/1980 | Schnable et al. |
| 4,246,595 A | 1/1981 | Noyori et al. |
| 4,249,302 A | 2/1981 | Crepeau |

(Continued)

FOREIGN PATENT DOCUMENTS

DE     3233195     3/1983

(Continued)

OTHER PUBLICATIONS

Chu et al., ed., 3D Packaging for Integrated Circuit Systems, Sandia Report SAND96-2801, UC-704, Nov. 1996.

(Continued)

*Primary Examiner* — Laura Menz
(74) *Attorney, Agent, or Firm* — Useful Arts IP

(57) ABSTRACT

The Vertical System Integration (VSI) invention herein is a method for integration of disparate electronic, optical and MEMS technologies into a single integrated circuit die or component and wherein the individual device layers used in the VSI fabrication processes are preferably previously fabricated components intended for generic multiple application use and not necessarily limited in its use to a specific application. The VSI method of integration lowers the cost difference between lower volume custom electronic products and high volume generic use electronic products by eliminating or reducing circuit design, layout, tooling and fabrication costs.

10 Claims, 44 Drawing Sheets

U.S. PATENT DOCUMENTS

| | | |
|---|---|---|
| 4,251,909 A | 2/1981 | Hoeberechts |
| 4,262,631 A | 4/1981 | Kubacki |
| 4,393,127 A | 7/1983 | Greschner et al. |
| 4,394,401 A | 7/1983 | Shioya et al. |
| 4,401,986 A | 8/1983 | Trenkler et al. |
| 4,416,054 A | 11/1983 | Thomas et al. |
| 4,500,905 A | 2/1985 | Shibata |
| 4,528,072 A | 7/1985 | Kurosawa et al. |
| 4,539,068 A | 9/1985 | Takagi et al. |
| 4,566,037 A | 1/1986 | Takatsu et al. |
| 4,585,991 A | 4/1986 | Reid et al. |
| 4,604,162 A | 8/1986 | Sobczak |
| 4,612,083 A | 9/1986 | Yasumoto et al. |
| 4,617,160 A | 10/1986 | Belanger et al. |
| 4,618,397 A | 10/1986 | Shimizu et al. |
| 4,618,763 A | 10/1986 | Schmitz |
| 4,622,632 A | 11/1986 | Tanimoto et al. |
| 4,663,559 A | 5/1987 | Christensen |
| 4,684,436 A | 8/1987 | Burns et al. |
| 4,693,770 A | 9/1987 | Hatada |
| 4,702,336 A | 10/1987 | Seibert et al. |
| 4,702,936 A | 10/1987 | Maeda et al. |
| 4,706,166 A | 11/1987 | Go |
| 4,721,938 A | 1/1988 | Stevenson |
| 4,724,328 A | 2/1988 | Lischke |
| 4,761,681 A | 8/1988 | Reid |
| 4,766,670 A | 8/1988 | Gazdik et al. |
| 4,784,721 A | 11/1988 | Holmen et al. |
| 4,810,673 A | 3/1989 | Freeman |
| 4,810,889 A | 3/1989 | Yokomatsu et al. |
| 4,825,277 A | 4/1989 | Mattox et al. |
| 4,835,765 A | 5/1989 | Bergmans et al. |
| 4,849,857 A | 7/1989 | Butt et al. |
| 4,855,867 A | 8/1989 | Gazdik et al. |
| 4,857,481 A | 8/1989 | Tam et al. |
| 4,890,157 A | 12/1989 | Wilson |
| 4,892,753 A | 1/1990 | Wang et al. |
| 4,897,708 A | 1/1990 | Clements |
| 4,919,749 A | 4/1990 | Mauger et al. |
| 4,924,589 A | 5/1990 | Leedy |
| 4,928,058 A | 5/1990 | Williamson |
| 4,934,799 A | 6/1990 | Chu |
| 4,939,568 A | 7/1990 | Kato et al. |
| 4,939,694 A | 7/1990 | Eaton et al. |
| 4,940,916 A | 7/1990 | Borel et al. |
| 4,950,987 A | 8/1990 | Vranish et al. |
| 4,952,446 A | 8/1990 | Lee et al. |
| 4,954,865 A | 9/1990 | Rokos |
| 4,954,875 A | 9/1990 | Clements |
| 4,957,882 A | 9/1990 | Shinomiya |
| 4,965,415 A | 10/1990 | Young et al. |
| 4,966,663 A | 10/1990 | Mauger |
| 4,983,251 A | 1/1991 | Haisma et al. |
| 4,990,462 A | 2/1991 | Sliwa |
| 4,994,336 A | 2/1991 | Benecke et al. |
| 4,994,735 A | 2/1991 | Leedy |
| 5,000,113 A | 3/1991 | Wang et al. |
| 5,008,619 A | 4/1991 | Keogh et al. |
| 5,010,024 A | 4/1991 | Allen et al. |
| 5,020,219 A | 6/1991 | Leedy |
| 5,034,685 A | 7/1991 | Leedy |
| 5,051,326 A | 9/1991 | Celler et al. |
| 5,062,689 A | 11/1991 | Koehler |
| 5,064,275 A | 11/1991 | Tsunoda et al. |
| 5,070,026 A | 12/1991 | Greenwald et al. |
| 5,071,510 A | 12/1991 | Findler et al. |
| 5,098,865 A | 3/1992 | Machado et al. |
| 5,103,557 A | 4/1992 | Leedy |
| 5,110,373 A | 5/1992 | Mauger |
| 5,110,712 A | 5/1992 | Kessler et al. |
| 5,111,278 A | 5/1992 | Eichelberger |
| 5,116,777 A | 5/1992 | Chan et al. |
| 5,117,282 A | 5/1992 | Salatino |
| 5,119,164 A | 6/1992 | Sliwa et al. |
| 5,130,894 A | 7/1992 | Miller |
| 5,132,244 A | 7/1992 | Roy |
| 5,144,142 A | 9/1992 | Fueki et al. |
| 5,151,775 A | 9/1992 | Hadwin |
| 5,156,909 A | 10/1992 | Henager, Jr. et al. |
| 5,166,962 A | 11/1992 | Murooka et al. |
| 5,169,805 A | 12/1992 | Mok |
| 5,188,706 A | 2/1993 | Hori et al. |
| 5,198,965 A | 3/1993 | Curtis et al. |
| 5,203,731 A | 4/1993 | Zimmerman |
| 5,225,771 A | 7/1993 | Leedy |
| 5,236,118 A | 8/1993 | Bower et al. |
| 5,240,458 A | 8/1993 | Linglain et al. |
| 5,241,454 A | 8/1993 | Ameen et al. |
| 5,245,277 A | 9/1993 | Nguyen |
| 5,259,247 A | 11/1993 | Bantien |
| 5,262,341 A | 11/1993 | Fueki et al. |
| 5,262,351 A | 11/1993 | Bureau et al. |
| 5,270,261 A | 12/1993 | Bertin et al. |
| 5,273,940 A | 12/1993 | Sanders |
| 5,274,270 A | 12/1993 | Tuckerman |
| 5,279,865 A | 1/1994 | Chebi et al. |
| 5,283,107 A | 2/1994 | Bayer et al. |
| 5,284,796 A | 2/1994 | Nakanishi et al. |
| 5,284,804 A | 2/1994 | Moslehi |
| 5,293,457 A | 3/1994 | Arima et al. |
| 5,321,884 A | 6/1994 | Ameen et al. |
| 5,323,035 A | 6/1994 | Leedy |
| 5,324,687 A | 6/1994 | Wojnarowski |
| 5,343,366 A | 8/1994 | Cipolla et al. |
| 5,347,428 A | 9/1994 | Carson et al. |
| 5,354,695 A * | 10/1994 | Leedy .......................... 438/411 |
| 5,358,909 A | 10/1994 | Hashiguchi et al. |
| 5,363,021 A | 11/1994 | MacDonald |
| 5,374,940 A | 12/1994 | Corio |
| 5,385,632 A | 1/1995 | Goossen |
| 5,385,909 A | 1/1995 | Nelson et al. |
| 5,399,505 A | 3/1995 | Dasse et al. |
| RE34,893 E | 4/1995 | Fujii et al. |
| 5,420,458 A | 5/1995 | Shimoji |
| 5,424,920 A | 6/1995 | Miyake |
| 5,426,072 A | 6/1995 | Finnila |
| 5,426,363 A | 6/1995 | Akagi et al. |
| 5,432,444 A | 7/1995 | Yasohama et al. |
| 5,432,729 A | 7/1995 | Carson et al. |
| 5,432,999 A | 7/1995 | Capps et al. |
| 5,434,500 A | 7/1995 | Hauck et al. |
| 5,448,106 A | 9/1995 | Fujitsu |
| 5,450,603 A | 9/1995 | Davies |
| 5,451,489 A | 9/1995 | Leedy |
| 5,453,404 A | 9/1995 | Leedy |
| 5,457,879 A | 10/1995 | Gurtler et al. |
| 5,463,246 A | 10/1995 | Matsunami |
| 5,470,693 A | 11/1995 | Sachdev et al. |
| 5,476,813 A | 12/1995 | Naruse |
| 5,480,842 A | 1/1996 | Clifton et al. |
| 5,481,133 A | 1/1996 | Hsu |
| 5,489,554 A | 2/1996 | Gates |
| 5,502,667 A | 3/1996 | Bertin et al. |
| 5,512,397 A | 4/1996 | Leedy |
| 5,514,628 A | 5/1996 | Enomoto et al. |
| 5,517,457 A | 5/1996 | Sakui et al. |
| 5,527,645 A | 6/1996 | Pati et al. |
| 5,529,829 A | 6/1996 | Koskenmaki et al. |
| 5,534,465 A | 7/1996 | Frye et al. |
| 5,555,212 A | 9/1996 | Toshiaki et al. |
| 5,563,084 A | 10/1996 | Ramm et al. |
| 5,571,741 A * | 11/1996 | Leedy .......................... 438/27 |
| 5,572,689 A | 11/1996 | Gallup et al. |
| 5,577,050 A | 11/1996 | Bair et al. |
| 5,580,687 A | 12/1996 | Leedy |
| 5,581,498 A | 12/1996 | Ludwig et al. |
| 5,582,939 A | 12/1996 | Pierrat |
| 5,583,688 A | 12/1996 | Hornbeck |
| 5,592,007 A | 1/1997 | Leedy |
| 5,592,018 A * | 1/1997 | Leedy .......................... 257/619 |
| 5,595,933 A | 1/1997 | Heijboer |
| 5,606,186 A | 2/1997 | Noda |
| 5,615,163 A | 3/1997 | Sakui et al. |
| 5,620,915 A | 4/1997 | Chen et al. |
| 5,627,112 A | 5/1997 | Tennant et al. |
| 5,629,137 A | 5/1997 | Leedy |
| 5,633,209 A | 5/1997 | Leedy |

| Patent No. | Date | Name | Ref |
|---|---|---|---|
| 5,637,536 A | 6/1997 | Val | |
| 5,637,907 A | 6/1997 | Leedy | |
| 5,654,127 A | 8/1997 | Leedy | |
| 5,654,220 A * | 8/1997 | Leedy | 438/25 |
| 5,656,552 A | 8/1997 | Hudak et al. | |
| 5,661,339 A | 8/1997 | Clayton | |
| 5,675,185 A | 10/1997 | Chen et al. | |
| 5,694,588 A | 12/1997 | Ohara et al. | |
| 5,715,144 A | 2/1998 | Ameen et al. | |
| 5,725,995 A | 3/1998 | Leedy | |
| 5,733,814 A | 3/1998 | Flesher et al. | |
| 5,736,448 A | 4/1998 | Saia et al. | |
| 5,745,076 A * | 4/1998 | Turlington et al. | 342/372 |
| 5,745,673 A | 4/1998 | Di Zenzo et al. | |
| 5,750,211 A | 5/1998 | Weise et al. | |
| 5,753,536 A | 5/1998 | Sugiyama et al. | |
| 5,760,478 A | 6/1998 | Bozso et al. | |
| 5,773,152 A | 6/1998 | Okonogi | |
| 5,777,379 A | 7/1998 | Karavakis et al. | |
| 5,786,116 A | 7/1998 | Rolfson | |
| 5,786,629 A | 7/1998 | Faris | |
| 5,787,445 A | 7/1998 | Daberko | |
| 5,793,115 A | 8/1998 | Zavracky et al. | |
| 5,818,748 A | 10/1998 | Bertin et al. | |
| 5,831,280 A | 11/1998 | Ray | |
| 5,834,162 A * | 11/1998 | Malba | 430/317 |
| 5,834,334 A | 11/1998 | Leedy | |
| 5,840,593 A | 11/1998 | Leedy | |
| 5,847,929 A | 12/1998 | Bernier et al. | |
| 5,856,695 A | 1/1999 | Ito et al. | |
| 5,868,949 A | 2/1999 | Sotokawa et al. | |
| 5,869,354 A | 2/1999 | Leedy | |
| 5,870,176 A | 2/1999 | Sweatt et al. | |
| 5,880,010 A | 3/1999 | Davidson | |
| 5,882,532 A | 3/1999 | Field et al. | |
| 5,892,271 A | 4/1999 | Takeda et al. | |
| 5,902,118 A | 5/1999 | Hubner | |
| 5,915,167 A * | 6/1999 | Leedy | 438/108 |
| 5,940,031 A * | 8/1999 | Turlington et al. | 342/372 |
| 5,946,559 A | 8/1999 | Leedy | |
| 5,985,693 A | 11/1999 | Leedy | |
| 5,998,069 A | 12/1999 | Cutter | |
| 6,008,126 A | 12/1999 | Leedy | |
| 6,017,658 A | 1/2000 | Rhee et al. | |
| 6,020,257 A | 2/2000 | Leedy | |
| 6,023,098 A | 2/2000 | Higashiguchi et al. | |
| RE36,623 E | 3/2000 | Wang et al. | |
| 6,045,625 A | 4/2000 | Houston | |
| 6,050,832 A | 4/2000 | Lee et al. | |
| 6,084,284 A | 7/2000 | Adamic, Jr. | |
| 6,087,284 A | 7/2000 | Brix et al. | |
| 6,092,174 A | 7/2000 | Roussakov | |
| 6,097,096 A | 8/2000 | Gardner et al. | |
| 6,133,626 A * | 10/2000 | Hawke et al. | 257/686 |
| 6,133,640 A * | 10/2000 | Leedy | 257/778 |
| 6,154,809 A | 11/2000 | Ikenaga et al. | |
| 6,194,245 B1 | 2/2001 | Tayanaka | |
| 6,197,456 B1 | 3/2001 | Aleshin et al. | |
| 6,208,545 B1 * | 3/2001 | Leedy | 365/51 |
| 6,230,233 B1 | 5/2001 | Lofgren | |
| 6,236,602 B1 | 5/2001 | Pati | |
| 6,261,728 B1 | 7/2001 | Lin | |
| 6,288,561 B1 | 9/2001 | Leedy | |
| 6,294,909 B1 | 9/2001 | Leedy | |
| 6,300,935 B1 | 10/2001 | Sobel et al. | |
| 6,301,653 B1 | 10/2001 | Mohamed et al. | |
| 6,320,593 B1 | 11/2001 | Sobel et al. | |
| 6,335,491 B1 | 1/2002 | Alagaratnam et al. | |
| 6,355,976 B1 | 3/2002 | Faris | |
| RE37,637 E | 4/2002 | Clifton et al. | |
| 6,392,304 B1 | 5/2002 | Butler | |
| 6,445,006 B1 | 9/2002 | Brandes et al. | |
| 6,518,073 B2 | 2/2003 | Momohara | |
| 6,551,857 B2 * | 4/2003 | Leedy | 438/109 |
| 6,563,224 B2 * | 5/2003 | Leedy | 257/778 |
| 6,632,706 B1 * | 10/2003 | Leedy | 438/109 |
| 6,682,981 B2 | 1/2004 | Leedy | |
| 6,713,327 B2 | 3/2004 | Leedy | |
| 6,714,625 B1 | 3/2004 | Leedy | |
| 6,765,279 B2 | 7/2004 | Leedy | |
| 6,838,896 B2 | 1/2005 | Leedy | |
| 6,891,387 B2 | 5/2005 | Leedy | |
| 6,894,392 B1 | 5/2005 | Gudesen et al. | |
| 7,138,295 B2 * | 11/2006 | Leedy | 438/109 |
| 7,193,239 B2 * | 3/2007 | Leedy | 257/74 |
| 7,402,897 B2 * | 7/2008 | Leedy | 257/678 |
| 7,474,004 B2 * | 1/2009 | Leedy | 257/777 |
| 7,489,025 B2 * | 2/2009 | Chen et al. | 257/678 |
| 7,504,732 B2 * | 3/2009 | Leedy | 257/777 |
| 7,521,785 B2 * | 4/2009 | Damberg et al. | 257/686 |
| 7,615,837 B2 | 11/2009 | Leedy | |
| 7,670,893 B2 | 3/2010 | Leedy | |
| 7,705,466 B2 * | 4/2010 | Leedy | 257/777 |
| 7,736,948 B2 * | 6/2010 | Dekker et al. | 438/106 |
| 7,763,948 B2 | 7/2010 | Leedy | |
| 8,080,442 B2 * | 12/2011 | Leedy | 438/106 |
| 2001/0002711 A1 | 6/2001 | Gonzalez | |
| 2001/0033030 A1 * | 10/2001 | Leedy | 257/777 |
| 2002/0127775 A1 | 9/2002 | Haba et al. | |
| 2002/0132465 A1 * | 9/2002 | Leedy | 438/618 |
| 2002/0135075 A1 * | 9/2002 | Leedy | 257/778 |
| 2003/0011032 A1 | 1/2003 | Umebayashi | |
| 2003/0184976 A1 * | 10/2003 | Brandenburg et al. | 361/719 |
| 2003/0197253 A1 * | 10/2003 | Gann et al. | 257/678 |
| 2003/0218182 A1 | 11/2003 | Leedy | |
| 2003/0223535 A1 | 12/2003 | Leedy | |
| 2004/0000708 A1 | 1/2004 | Rapport et al. | |
| 2004/0245617 A1 * | 12/2004 | Damberg et al. | 257/686 |
| 2005/0023656 A1 * | 2/2005 | Leedy | 257/686 |
| 2006/0231927 A1 * | 10/2006 | Ohno | 257/621 |
| 2007/0035033 A1 * | 2/2007 | Ozguz et al. | 257/777 |
| 2007/0176297 A1 * | 8/2007 | Zohni | 257/777 |
| 2008/0237591 A1 * | 10/2008 | Leedy | 257/48 |
| 2008/0251941 A1 * | 10/2008 | Leedy | 257/777 |
| 2008/0254572 A1 * | 10/2008 | Leedy | 438/109 |
| 2008/0284611 A1 * | 11/2008 | Leedy | 340/815.4 |
| 2008/0302559 A1 | 12/2008 | Leedy | |
| 2009/0014397 A1 * | 1/2009 | Ohno | 257/778 |
| 2009/0067210 A1 | 3/2009 | Leedy | |
| 2009/0174082 A1 | 7/2009 | Leedy | |
| 2009/0175104 A1 | 7/2009 | Leedy | |
| 2009/0194768 A1 * | 8/2009 | Leedy | 257/48 |
| 2009/0218700 A1 | 9/2009 | Leedy | |
| 2009/0219742 A1 | 9/2009 | Leedy | |
| 2009/0219743 A1 | 9/2009 | Leedy | |
| 2009/0219744 A1 | 9/2009 | Leedy | |
| 2009/0219772 A1 | 9/2009 | Leedy | |
| 2009/0230501 A1 | 9/2009 | Leedy | |
| 2010/0148371 A1 * | 6/2010 | Kaskoun et al. | 257/777 |
| 2010/0171224 A1 | 7/2010 | Leedy | |
| 2010/0171225 A1 | 7/2010 | Leedy | |
| 2010/0172197 A1 | 7/2010 | Leedy | |
| 2010/0173453 A1 | 7/2010 | Leedy | |
| 2011/0042829 A1 * | 2/2011 | Kaskoun et al. | 257/777 |

FOREIGN PATENT DOCUMENTS

| | | |
|---|---|---|
| EP | 0189976 | 8/1986 |
| EP | 0201380 | 12/1986 |
| EP | 0224418 | 6/1987 |
| EP | 0238089 | 9/1987 |
| EP | 0314437 | 5/1989 |
| EP | 0419898 | 4/1991 |
| EP | 0455455 | 11/1991 |
| EP | 0487302 | 5/1992 |
| EP | 0503816 | 9/1992 |
| EP | 0518283 | 12/1992 |
| EP | 0518774 | 12/1992 |
| EP | 0526551 | 2/1993 |
| EP | 0554063 | 8/1993 |
| EP | 0555252 | 8/1993 |
| EP | 0703618 | 3/1996 |
| EP | 0703619 | 3/1996 |
| EP | 0731525 | 9/1996 |
| FR | 2641129 | 6/1990 |
| GB | 2125168 | 2/1984 |
| GB | 2215168 | 2/1984 |
| JP | 6074643 | 4/1985 |
| JP | 60126871 | 7/1985 |

| | | |
|---|---|---|
| JP | 6130059 | 2/1986 |
| JP | 62272556 | 11/1987 |
| JP | 63076484 | 4/1988 |
| JP | 01199476 | 9/1988 |
| JP | 63229862 | 9/1988 |
| JP | 01157561 | 6/1989 |
| JP | 02027600 | 1/1990 |
| JP | 02037655 | 2/1990 |
| JP | 02082564 | 3/1990 |
| JP | 2239627 A | 9/1990 |
| JP | 03127816 | 5/1991 |
| JP | 03174715 | 7/1991 |
| JP | 03284871 | 12/1991 |
| JP | 4010649 A | 1/1992 |
| JP | 04042957 | 2/1992 |
| JP | 04076946 | 3/1992 |
| JP | 04083371 | 3/1992 |
| JP | 04107964 | 4/1992 |
| JP | 04196263 | 7/1992 |
| JP | 456956 A | 12/1992 |
| JP | 05109977 | 4/1993 |
| JP | 05283607 | 10/1993 |
| JP | 08017962 | 1/1996 |
| JP | 09152979 | 6/1997 |
| JP | 10107065 | 4/1998 |
| JP | 10209371 | 8/1998 |
| JP | 261001 A | 9/1999 |
| WO | WO8910255 | 11/1989 |
| WO | WO9009093 | 8/1990 |
| WO | WO9105366 | 4/1991 |
| WO | WO9203848 | 3/1992 |
| WO | WO92017901 | 10/1992 |
| WO | 9413121 | 6/1994 |
| WO | 9509438 | 4/1995 |
| WO | 9641204 | 12/1996 |
| WO | WO9641264 | 12/1996 |
| WO | WO9819337 | 5/1998 |
| WO | WO03078305 | 9/2003 |

OTHER PUBLICATIONS

Hayashi et al., A New Three Dimensional IC Fabrication Technology, Stacking Thin Film Dual-CMOS Layers, NEC Microelectronics Research Laboratories, 1991 IEEE.

Koyanagi, Different Approaches to 3D Chips, Dept. of Bioengineering and Robotics, Tohoku University, Japan, pp. 10, 11, 13, 14, 16, 19.

Aboaf, J.A., "Stresses in SiO2 Films Obtained from the Thermal Decomposition of Tetraethylorthosilicate—Effect of Heat Treatment and Humidity." J. Electrochem. Soc.: Solid State Science: 116(12): 1732-1736 (Dec. 1969).

Allen, Mark G.; Senturia, Stephen D.; "Measurement of polyimide interlayer adhesion using microfabricated structures"; 1988; pp. 352-356.

Alloert, K., et al., "A Comparison Between Silicon Nitride Films Made by PCVD of N2-SiH4/Ar and N2-SiH4/He," Journal of the Electrochemical Society. vol. 132. No. 7. pp. 1763-1766. (Jul. 1985).

Bailey, R., "Glass for Solid-State Devices: Glass film has low intrinsic compressive stress for isolating active layers of magnetic-bubble and other solid-state devices," NASA Tech Brief (1982).

Boyer, P.K.; Collins, G.J.; Moore, C.A.; Ritchie, W.K.; Roche, G.A.; Solanski, R. (A); Tang, C.C.; "Microelectronic thin film deposition by ultraviolet laser photolysis Monograph Title—Laser processing of semiconductor devices".

Boyer, P.K.; Collins. G.J.; Moore. C.A.; Solanski, R.; Ritchie, W.K.; Roche, G.A.; Collins, G.J.; "Laser photolytic deposition of thin films"; 1983; pp. 119-127.

Chang, E.Y.; Cibuzar, G.T.; Pande, K.P.; "Passivation of GaAs FETs with PECVD silicon nitride films of different stress states"; Sep. 1988; pp. 1412-1418.

Chen, Y.S.; Fatemik, H.; "stress measurements on multilevel thin film dielectric layers used in Si integrated circuits"; May-Jun. 1986; pp. 645-649.

"Christensens Physics of Diagnostic Radiology," Currey et al., pp. 29-33, 1990.

Draper, B.L.; Hill, T.A.: "Stress and stress relaxation in integrated circuit metals and dielectrics"; Jul.-Aug. 1991; pp. 1956-1962.

Garino, T.J.; Harrington, H.M.; "Residual stress in PZT films and its effect on ferroelectric properties"; 1992; pp. 341-347.

Guckel, H.; "Surface micromachined pressure transducers"; 1991; pp. 133-146.

Hendricks et al., "Polyquinoline Coatings and Films: Improved Organic Dielectrics for ICs and MCMs," Eleventh IEEE/CHMT International Electronics Manufacturing Technology Symposium, pp. 361-365 (1991).

Hsieh, et al., "Directional Deposition of Dielectric Silicon Oxide by Plasma Enhanced TEOS Process," 1989 Proceedings, Sixth International IEEE VLSI Multilevel Interconnection Conference, pp. 411-415 (1989).

"Partitioning Function and Packaging of Integrated Circuits for Physical Security of Data," IBM Technical Disclosure Bulletin. IBM Corp.; 32(1): 46-49 (Jun. 1989).

Jones, R.E., Jr. "An evaluation of methods for passivating silicon integrated circuits"; Apr. 1972; pp. 23-28.

Knolle, W.R., et al., "Characterization of Oxygen-Doped, Plasma-Deposited Silicon Nitride," Journal of the Electrochemical Society, vol. 135, No. 5, pp. 1211-1217, (May 1988).

Kochugova, I.V.; Nikolaeva, L.V.; Vakser, N.M., (M.I. Kalinin Leningrad Polytechnic Institute (USSR); "Electrophysical investigation of thin-layered inorganic coatings"; 1989; pp. 826-828.

Mitsumasa Koyanagi et al.; "Design of 4-DBIT X 4-layer Optically Coupled Three-Dimensional Common Memory for Parallel Processor System," IEEE Journal of Solid-State Circuits, vol. 25, No. 1, Feb. 1, 1990.

Krishnamoorthy, et al., "3-D Integration of MQW Modulators Over Active Submicron CMOS Circuits: 375 Mb/s Transimpedance Receiver-Transmitter Circuit," IEEE Photonics Technology Letters, 2(11): 1288-1290 (November.

Maw, T.; Hopla, R.E.; "Properties of a photoimageable thin polyimide film"; Nov. 26-29, 1990; pp. 71-76.

"Miniature Electron Microscopes Without Vacuum Pumps, Self-Contained Microfabricated Devices with Short Working Distances, Enable Operation in Air," NASA Tech Briefs, 39-40 (1998).

Nguyen, S.V., 'Plasma Assisted Chemical Vapor Deposited Thin Films for Microelectronic Applications, J. Vac. Sci. Technol. vol. B4, No. 5, pp. 1159-1167, (Sep./Oct. 1986).

Olmer, et al., "Intermetal Dielectric Deposition by Plasma Enhanced Chemical Vapor Deposition," Fifth IEEE/CHMT International Electronic Manufacturing Technology Symposium—Design-to-Manufacturing Transfer Cycle, pp. 98-99.

Pei-lin Pai; Chetty, A.; Roat, R.; Cox, N.; Chiu Ting; "Material characteristics of spin-on glassesfor interlayer dielectric applications"; Nov. 1987, pp. 2829-2834.

Pai, Pei-Lin; "Multilevel Interconnection Technologies—A Framework and Examples"; 1987; pp. 1871.

Partial European Search Report for Application No. EP 02009643 (Oct. 8, 2002).

Phys. Rev. B., Condens, Matter Mater. Phys. (USA), Physical Review B (Condensed Matter and Materials Physics), Mar. 15, 2003, APS through AIP, USA.

Reche, J.J.H.; "Control of thin film materials properties used in high density multichip interconnect"; Apr. 24-28, 1989; p. 494.

Riley, P.E.; Shelley, A.; "Characterization of a spin-applied dielectric for use in multilevel metallization"; May 1988; pp. 1207-1210.

Runyan, W.R., "Deposition of Inorganic Thin Films," Semiconductor Integrated Circuit Processing Technology, p. 142 (1990).

Salazar, M.; Wilkins, C.W., Jr.; Ryan, V.W.; Wang, T.T.; "low stress films of cyclized polybutadiene dielectrics by vacuum annealing"; Oct. 21-22, 1986; pp. 96-102.

Scheuerman, R.J., "Fabrication of Thin Dielectric Films with Low Internal Stresses," J. Vac. Sci. and Tech., 7(1): 143-146 (1970).

"IC Tower Patent: Simple Technology Receives Patent on the IC Tower, a Stacked Memory Technology," http://www.simpletech.com/whatsnew/memory/@60824.htm (1998).

Sun, R.C.; Tisone, T.C.; Cruzan, P.D.; "Internal stresses and resistivity of low-voltage sputtered tungsten films (microelectronic cct. conductor)"; Mar. 1973: pp. 1009-1016.

Sung et al., "Well-aligned carbon nitride nanotubes synthesized in anodic alumina by electron cyclotron resonance chemical vapor deposition," Applied Physics Letters, vol. 74, No. 2. 197, 1999, Jan. 11, 1999.

Svechnikov, S.V.; Kobylyatskaya, M.F.; Kimarskii, V.I.; Kaufman, A.P.; Kuzolvlev, Yu.I.; Cherepov, Ye. I.; Fomin, B.I.; "A switching plate with aluminum membrane crossings of conductors"; 1972.

Sze, S.M., "surface Micromachining," Semiconductor Sensors, pp. 58-63 (1994).

Tamura, H.; Nishikawa, T.; Wakino, K.; Sudo, T.; "Metalized MIC substrates using high K dielectric resonator materials": Oct. 1988; pp. 117-126.

Tessler, et al., "An Overview of Dielectric Materials for Multichip Modules," SPE, Electrical & Electronic Div.; (6): 260-269 (1991).

Tielert, et al., "Benefits of Vertically Stacked Integrated Circuits for Sequential Logic," IEEE, XP-000704550, 121-124 (Dec. 5, 1996).

Townsend, P.H.; Huggins, R.A.; "Stresses in borophosphosilicate glass films during thermal cycling"; Oct. 21-22, 1986; pp. 134-141.

Treichel, et al., "Planaized Low-Stress Oxide/Nitride Passivation for ULSI Devices," J. Phys IV, Colloq. (France), 1 (C2): 839-846 (1991).

Vossen, John L., "Plasma-Enhanced Chemical Vapor Deposition," Thin Film Processes II, pp. 536-541 (1991).

Wade, T.E.; "low temperature double-exposed polyimide/oxide dielectric for VLSI multilevel metal interconnection"; 1982; pp. 516-519.

S. Wolf, Silicon Processing, 1990, Lattice Press, vol. 2, p. 111.

Wolf, Stanley and Richard N. Tauber; Silicon Processing for the VLSI Era. vol. 1: Process Technology; Sunset Beach, CA; Lattice Press, 1986, pp. 191-194.

Wolf, Stanley, "Basics of Thin Films," Silicon Processing for the VLSI Era, pp. 115, 192, 193, and 199 (1986).

* cited by examiner

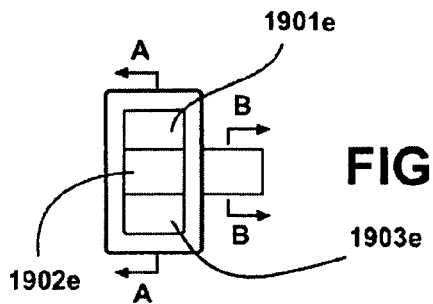
FIG - 19E
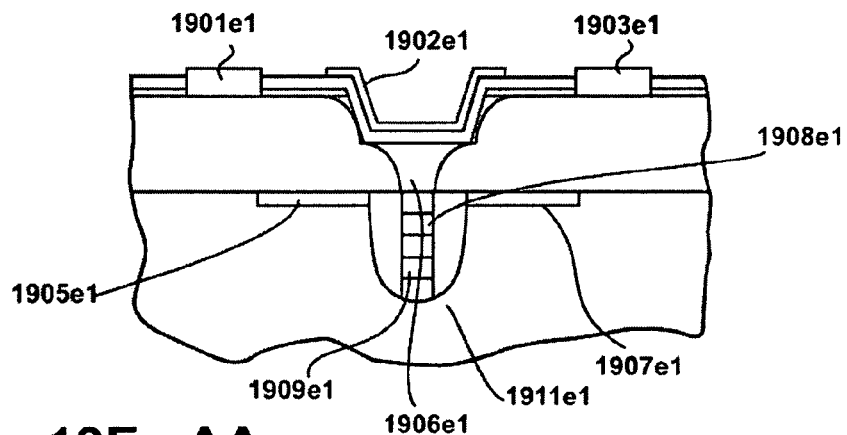
FIG - 19E - AA
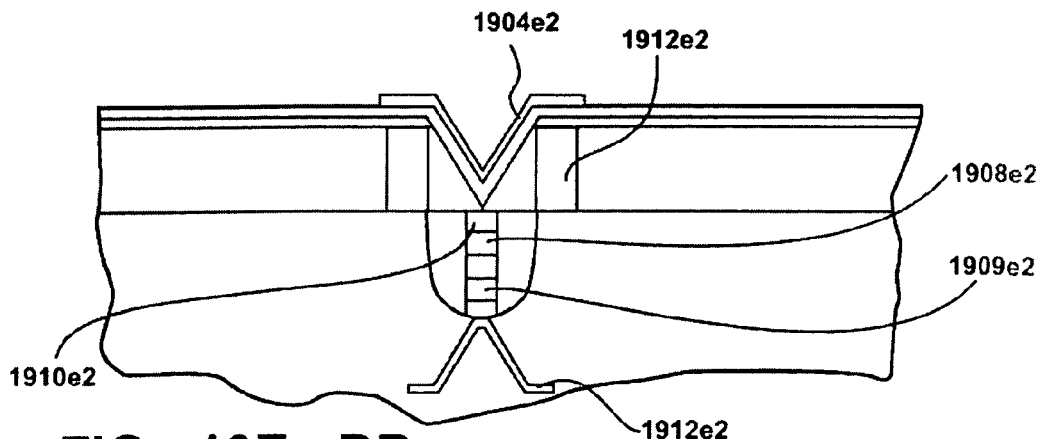
FIG - 19E - BB

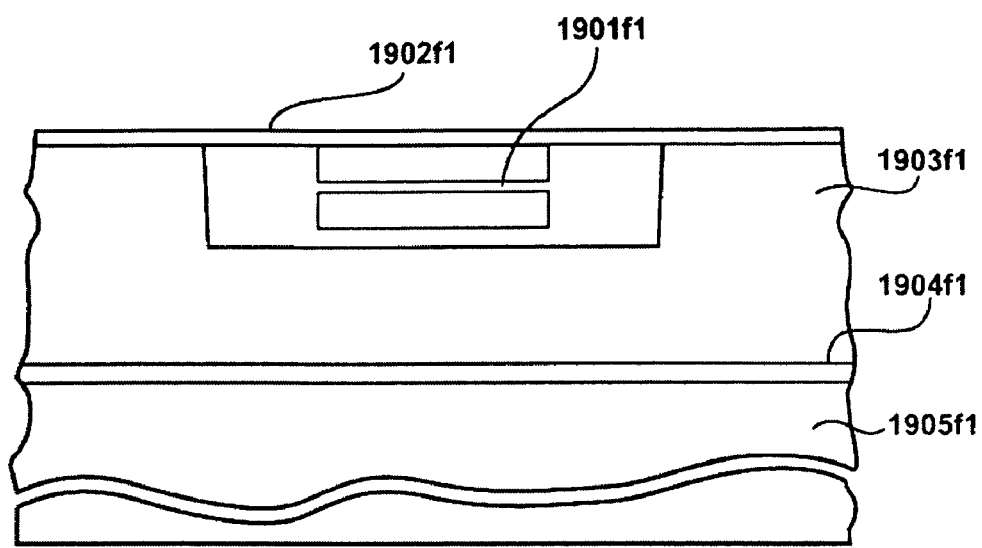
FIG - 19F1
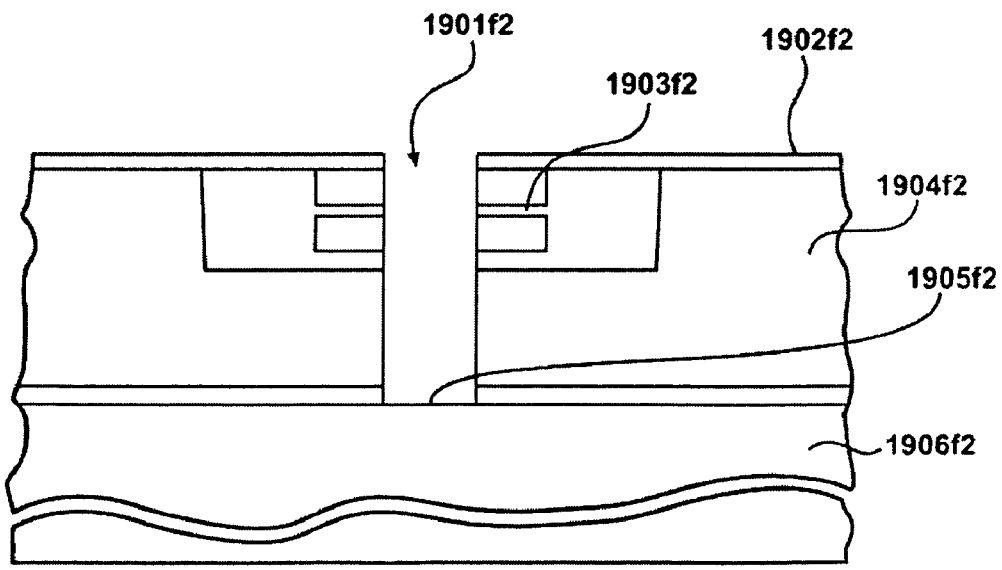
FIG - 19F2

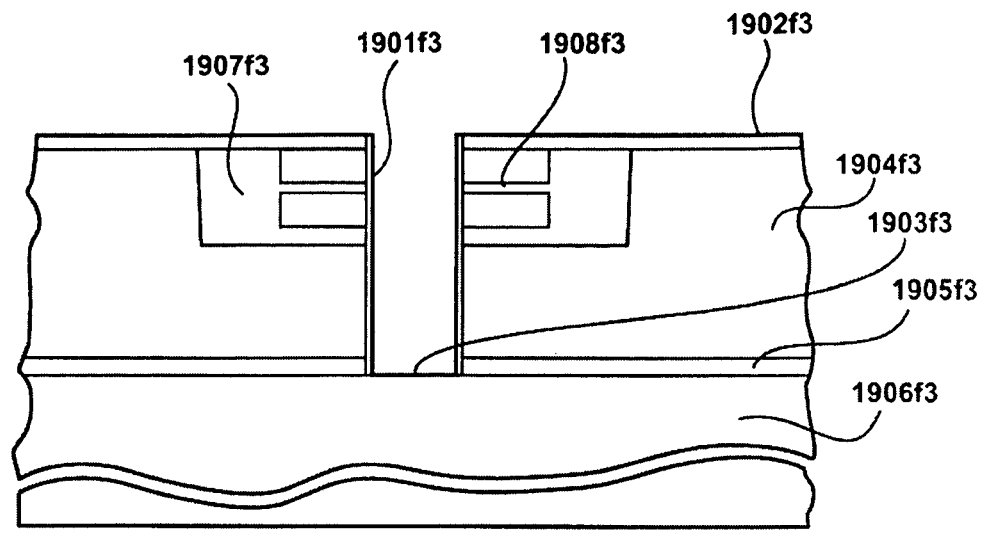
FIG - 19F3
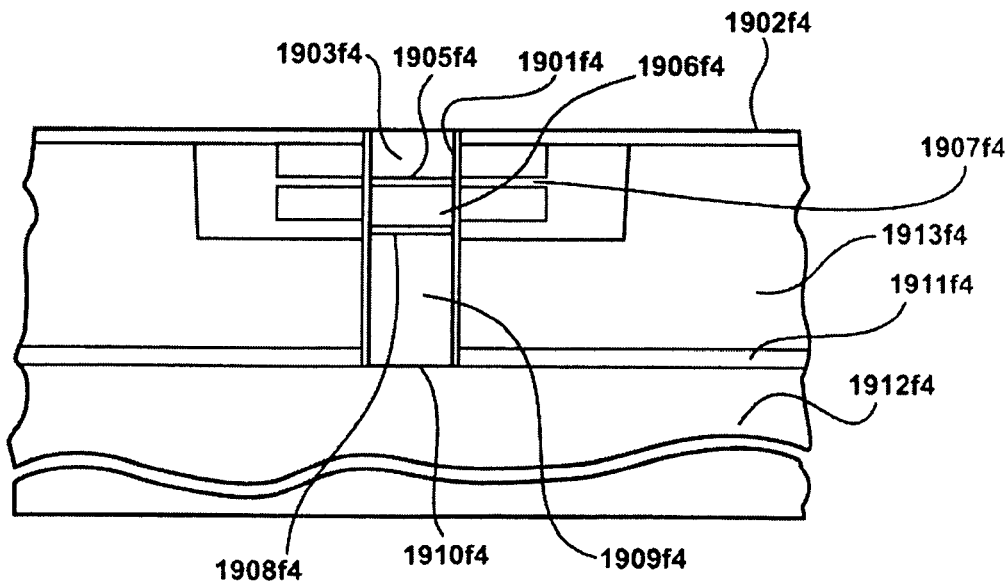
FIG - 19F4

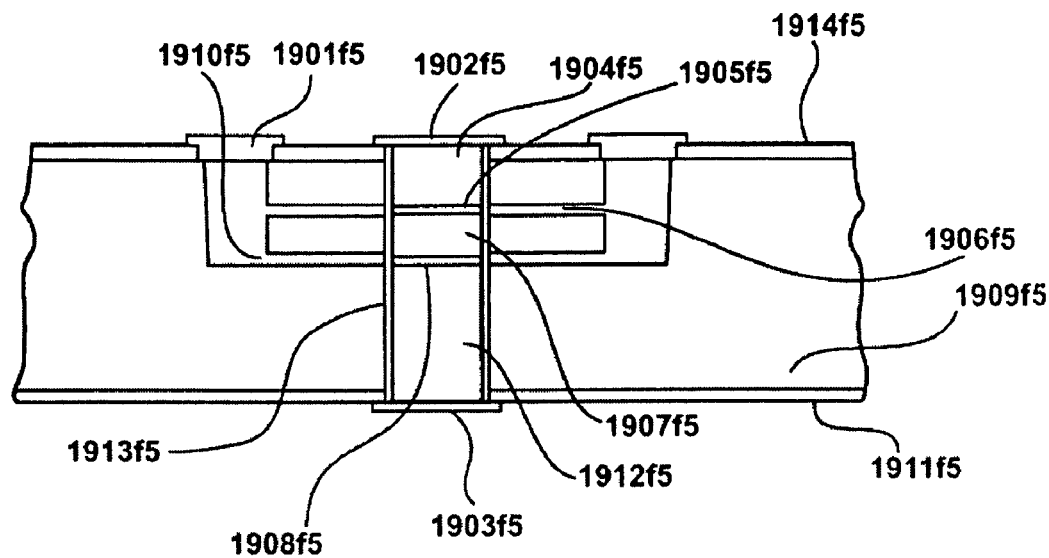
FIG - 19F5
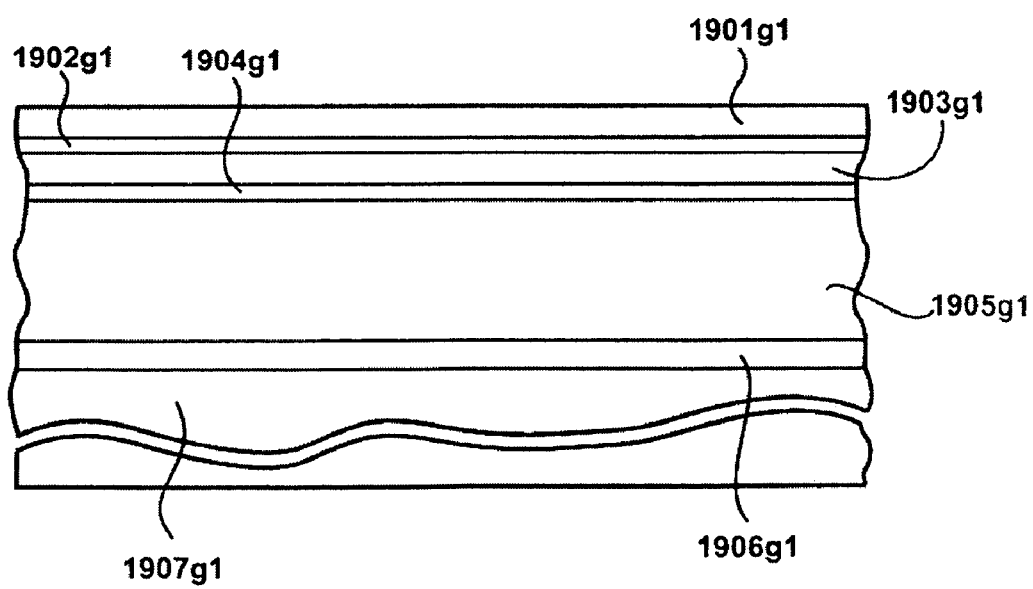
FIG - 19G1

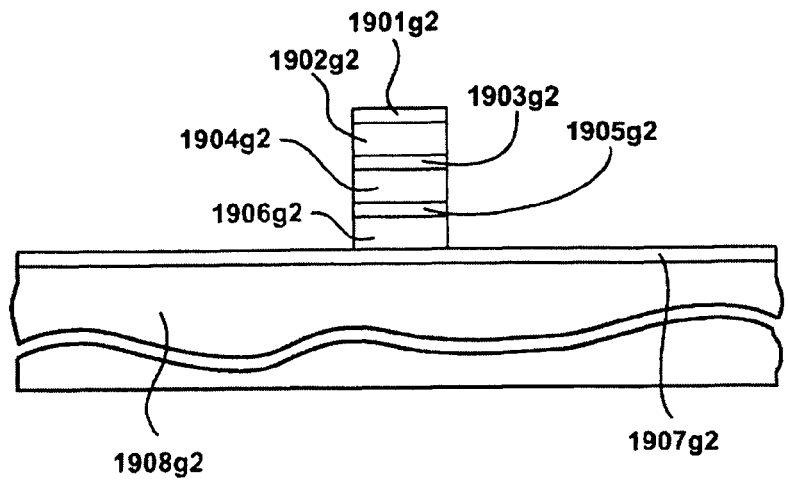
FIG - 19G2
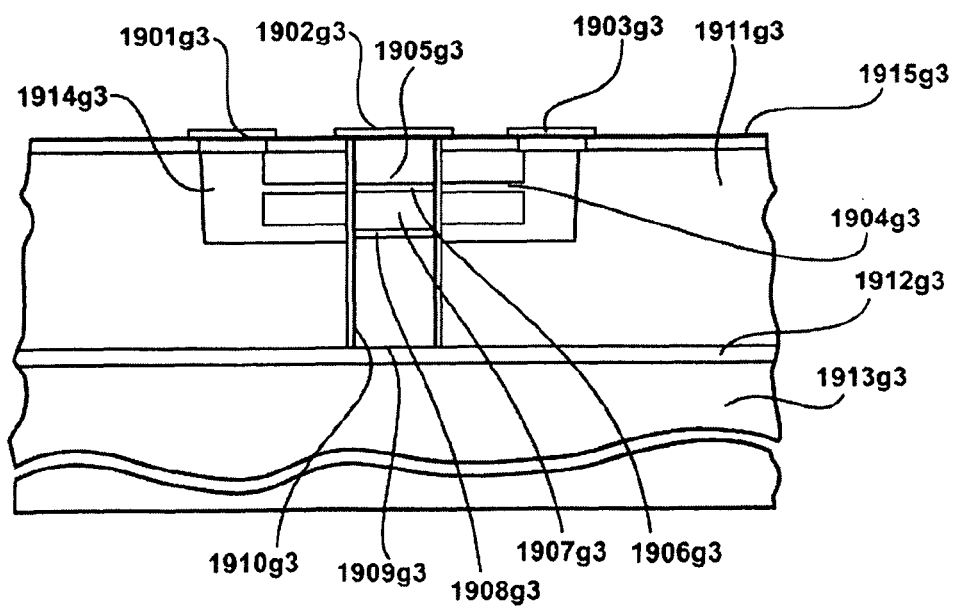
FIG - 19G3

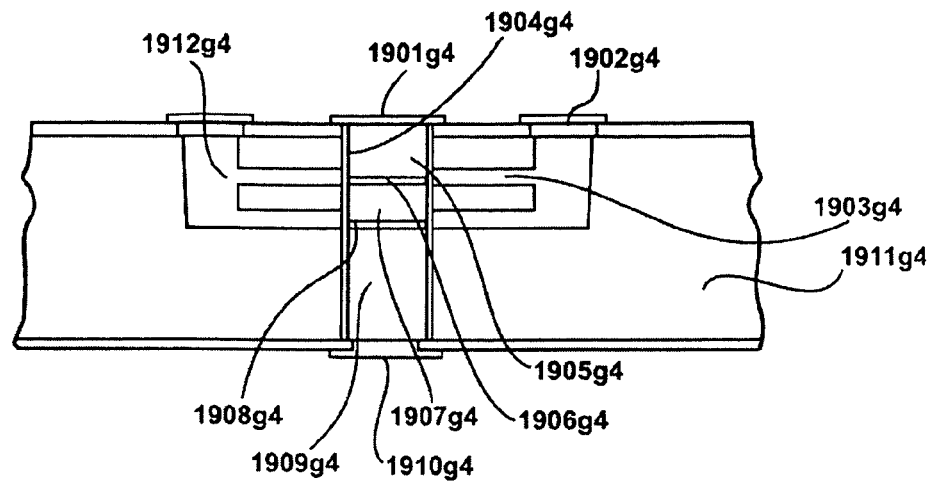
FIG - 19G4
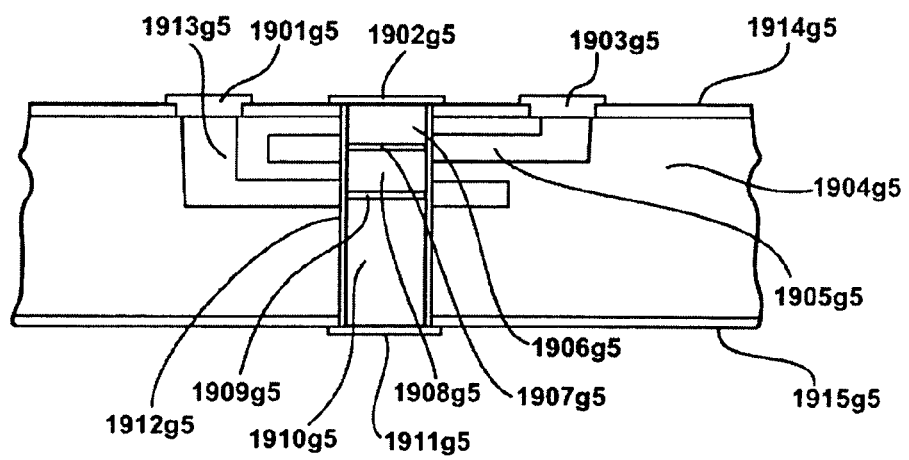
FIG - 19G5

FIG - 21A
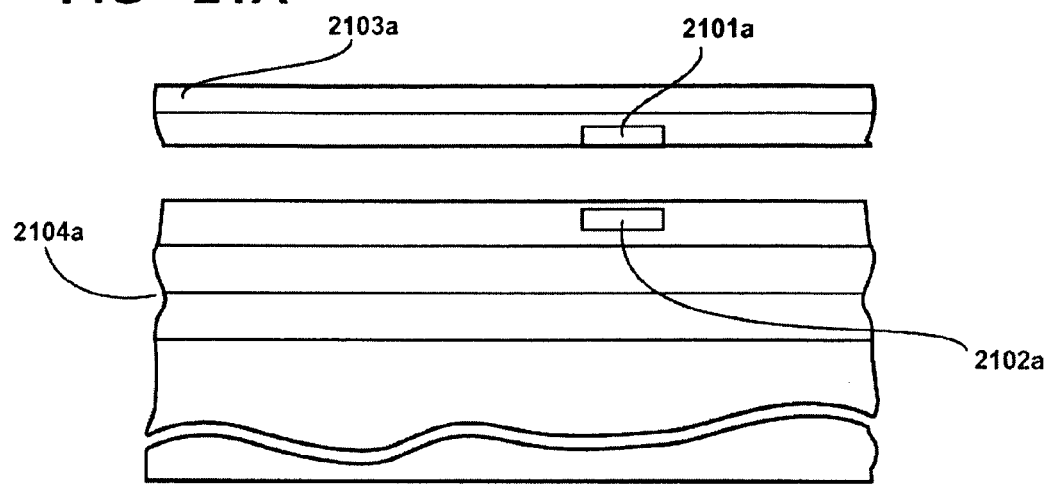
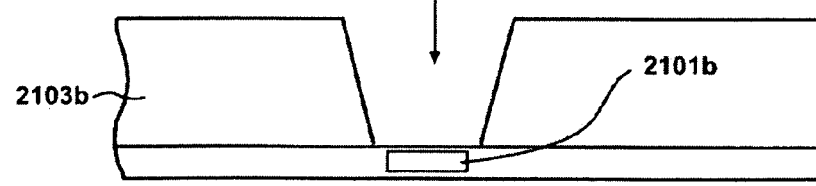
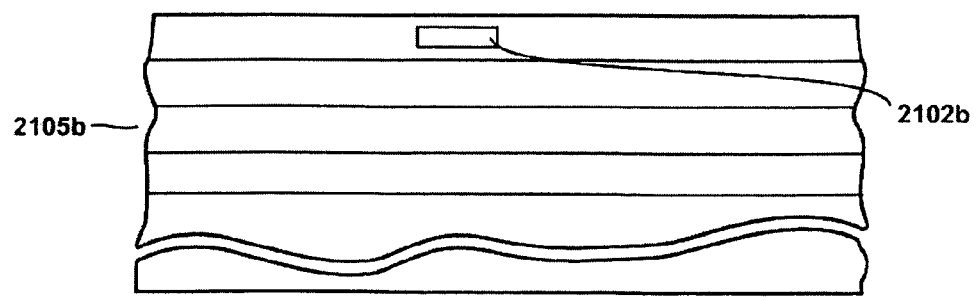
FIG - 21B

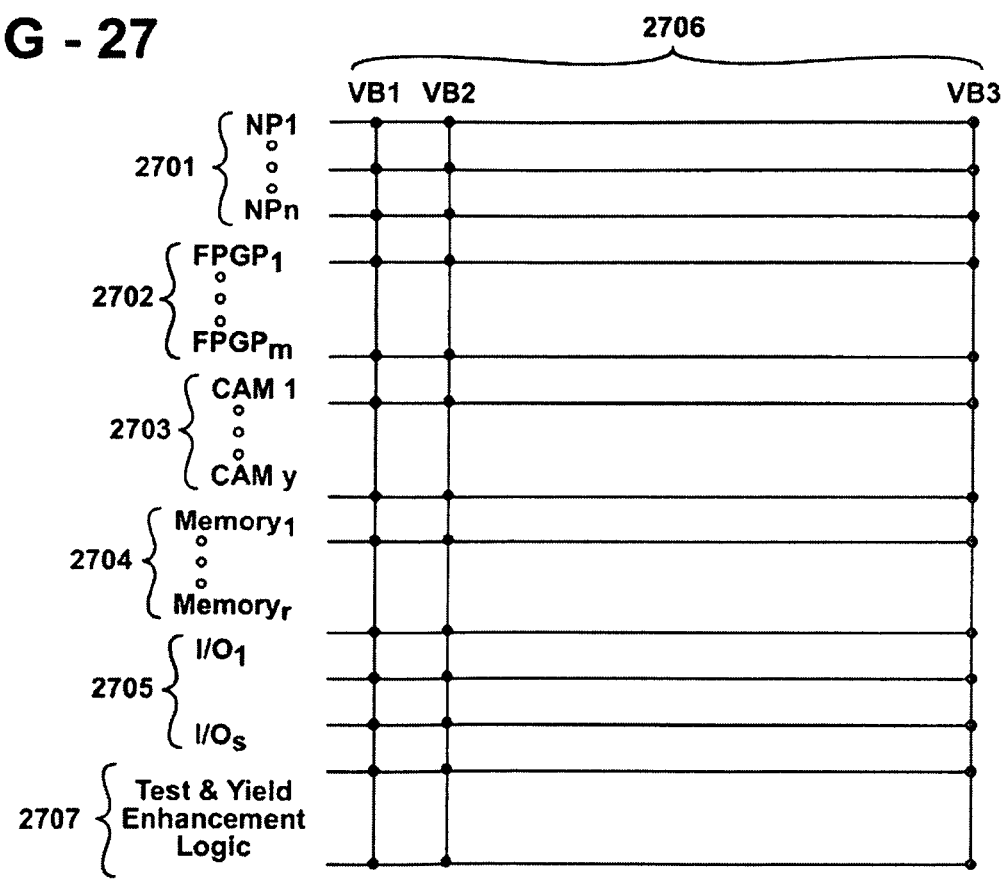

VERTICAL SYSTEM INTEGRATION

RELATED APPLICATIONS

This application is a divisional of U.S. Ser. No. 10/485,046, now U.S. Pat. No. 7,402,897, filed Jan. 22, 2004, which is a continuation of International Application PCT/US03/25048 designating the U.S., filed Aug. 8, 2003, which is a continuation of U.S. Ser. No. 60/402,112 filed Aug. 8, 2002.

The diversity of circuit function and operational requirements that underlay the implementation of a broad range of integrated circuit applications including what is commonly referred to as a SoC [System on a Chip] demand widely varying semiconductor fabrication processes and/or technologies without further consideration being given to the integration of optical and MEMS technologies with those semiconductor technologies. Limitations on the electronic industry's capability to meet these ever greater demands has made the implementation of numerous integrated circuit and SoC products impossible or beyond acceptable manufacturing costs.

The Vertical System Integration (VSI) invention herein is a method for integration of disparate electronic, optical and MEMS technologies into a single integrated circuit die or component and wherein the individual device layers used in the VSI fabrication processes are preferably previously fabricated components intended for generic multiple application use and not necessarily limited in its use to a specific application. The VSI method of integration lowers the cost difference between lower volume custom electronic products and high volume generic use electronic products by eliminating or reducing circuit design, layout, tooling and fabrication costs.

The VSI invention achieves its novel methods of integration through high precision alignment and stacking of component layers, fine grain vertical interconnections, thin flexible circuit substrates fabricated using stress-controlled dielectrics and low temperature component layer bonding. The VSI integration methods are fabrication methods that are independent of the fabrication process methods used in electronic or optical circuit fabrication or MEMS fabrication.

The VSI invention enables the integration of systems or subsystems as a single die or VSI IC which would otherwise be collections of multiple planar ICs, optical ICs, passive circuit devices and or MEMS. A VSI IC is a stack of closely coupled device or component layers the majority of which are less than 50 µm thick and typically less than 25 µm thick. The VSI invention for vertical integration fabrication of planar electronic [passive and active], optical or MEMS device layers enables on demand fast turn circuit fabrication through the use of an inventory of previously fabricated generic VSI IC or device layers in combination of various proprietary IP generic device layers to achieve custom circuitry which, heretofore, would require at a minimum a new circuit design, layout and masking before consideration of the planar circuit process integration incompatibility of various device elements.

The VSI fabrication methods enable significant cost and power reduction and performance enhancement through higher levels of integration with higher circuit yields than are presently possible with planar circuit fabrication processes. VSI IC device layers are interconnected by high density vertical interconnections which are scalable so that they can be compatible with the on going decreases of circuit fabrication geometries used in horizontal interconnections of the planar device layers. The VSI method for high density vertical interconnection is enabled through wafer to wafer bonding alignment methods capable of precisions of less than 25 nm.

The VSI fabrication methods enable the integration as one IC or die that are currently system assemblies of discreet circuits with the benefit that performance limiting circuit interconnect structures such as long on-IC interconnections, IC carriers and sockets, PCBs and PCB edge connectors are eliminated. The VSI invention enables the reuse of post fabrication or inventory circuit device layers for multiple IC applications. The primary benefits of the VSI technology is a reduction in complexity of IC manufacturing, testing, packaging and an increased in circuit yield resulting in a nominal reduction in manufacturing costs of approximately 10× and commensurate with an approximate nominal 5× increase in net circuit operating performance.

The VSI invention enables the implementation of SoC circuits which presently cannot be manufactured for the commercial or consumer markets due to technological or manufacturing costs limitations. This is before consideration of the present high costs associated with custom circuit tooling, large die size or the low production quantities.

BACKGROUND OF THE INVENTION

1. Field of the Invention

The present invention relates to methods for making closely coupled closely aligned stacked integrated electronic circuits, optical circuits and MEMS. In particular, the present invention relates to methods specific to fabrication integration, yield enhancement, performance enhancement, power dissipation reduction and cost reduction.

2. State of the Art

Manufacturing Integrated Circuit [IC] methods are most notable for an exponential rate in the integration progression of electronic devices per unit area, consistently doubling approximately every 18 months over a short forty year history. These manufacturing methods are remarkable for their abilities of increasing circuit performance while simultaneously reducing circuit cost, power and size, and as a result ICs have contributed in no small measure to today's modern way of life.

The integration progression has repeatedly enabled the making of ICs that were not possible or practical only a few years earlier. What before prevented the practical implementation of circuits with 100,000 transistors due to excessive power dissipation or low fabrication yields, the integration progression has now enabled practical yields of circuits with 100,000,000 transistors and at much lower power dissipations despite the dramatic increase in transistor count. The integration progression has made possible the expectation that ICs with more than 1 billion transistors will be in wide spread common use within the next three to four years.

The ultimate and widely understood objective of the IC integration progression is to reduce all electronic systems or subsystems composed of multiple ICs to one IC. This ultimate IC is often commonly referred to as a SoC [System on Chip]. The result of this objective is ever lower cost of manufacturing, higher performance, and hopefully therefore, a greater end user utility and social benefit. FIG. 1 shows in cross section a conventional planar IC composed of number of IP [Intellectual Property] circuit blocks 1a which are interconnected by numerous layers of horizontal metal interconnect or wiring 1b.

Electronic systems and subsystems made from assemblies of separate planar ICs are performance or cost reduction limited foremost by the implementation means for off-circuit or off-chip interconnections or I/Os. The performance and cost reduction limitations due to IC I/O result from manufacturing restrictions in the number of I/Os an IC may have, the cost of packaging, the significantly lower transmission performance of off-circuit connections versus on-circuit connections and the higher power dissipation required for off-chip signal transmission. Further, there is not presently planar IC fabrication technology that will allow the integration onto one planar IC for all of the significantly different IC fabrication processes used to make the electronic components of widely used products such as PCs, PDAs or cell phones. This is likely to remain so for the foreseeable future, because past demand for greater capabilities from such electronic products has resulted in greater divergence of the IC fabrication processes used to implement the various types of ICs from which they are made.

The usefulness of the integration progression is now strongly challenged by the growing complexity in the design, and logical and physical verification development and test efforts required to bring ICs to market. The wide spread incorporation of previously designed or off the shelf logic functions referred to as IP [Intellectual Property] is an example of efforts being taken to address IC design and development complexity. However, the usage of ever greater numbers of IP placements across an IC has resulted in greater logical, physical and manufacturing interconnection complexity.

The integration progression rate has changed the relationship of the primary cost structure components for making ICs. The cost of testing ICs is now approaching and in a number of cases exceeding IC fabrication cost and the cost of IC packaging ranging from 25% to several times IC fabrication cost. The cost dominance of test and packaging over IC fabrication increases with each generation of IC fabrication technology. It is becoming clear that IC manufacturing methods that reduce through IC integration techniques the cost of test and packaging are of most importance.

The integration progression is presently challenged by the need for methods to integrate as a single die not only active electronics, but also passive electronic devices, optical devices and MEMS [Micro-Electro-Mechanical Systems]. This need is particularly evident in networking and telecommunication equipment where the switching of optical signals through the conversion of optical signals to electronic and back, to optical or electronically controlled MEMS of optical mirrors are used. But also in consumer products such as video devices that use imaging arrays which need higher integration of processing electronics and memory or wireless communication devices which need greater integration of analog and passive circuitry.

The primary drivers of the integration progression of planar IC manufacturing have been circuit feature size reduction through fabrication process methods and increased wafer or substrate diameter. Volume production process fabrication methods for the dominate CMOS semiconductor technology has presently reached feature sizes of 0.12 µm [120 nm], and wafer sizes of 300 mm [12 inches]. Methods for forming stacked ICs or stacked IC structures have been demonstrated and are expected to become one more of the primary drivers of the IC integration progression.

IC stacking methods can be broadly classified as:
1. Package driven stacked ICs.
2. Process driven [design and fabrication] stacked closely coupled ICs.

The stacking of ICs through various packaging methods or package driven stacking has a long and varied application history that goes back at least twenty years. A recent article published in the IEEE Spectrum entitled "Packages Go Vertical" by Harry Goldstein, August 2001, pages 46-51, is one representative summary of the more recent methods of 3D packaging of Integrated Circuits. The primary benefit of package driven stacking of ICs is reduced physical volume, implemented through the use of conventional ICs with various methods of forming peripheral connections from the I/O contacts of each IC to a common set of termination contacts of the package envelop enclosing the ICs.

The stacking of ICs through process drive methods, typically requires custom designed ICs and wafer level processing steps. The primary benefits of process driven IC stacking are increased performance with simultaneous reductions of cost, size and power. Process driven stacked ICs can be generally characterized by the following process steps:

1. Wafer level bonding with a bonding material thickness of a few microns or less.
2. Thinning of wafer circuit layers to less than 50 µm and typically less than 25 µm and less than 15 µm.
3. Vertical through the circuit layer substrate interconnections or interconnections that are internal to the IC stack.

Process driven wafer stacking fabrication in the above manner will herein also be referred to as Closely Coupled stacked integrated circuits. The Closely Coupled stacked integrated circuit layers of the invention herein are thinned to facilitate the fabrication of fine grain vertical interconnections passing through the circuit layers and substantially flexible, and wherein these layers are preferably fabricated using low stress or stress controlled dielectric materials. The primary objective of closely coupled wafer stacking is to enhance the integration progression of IC fabrication beyond that possible with existing planar wafer process fabrication methods and wafer diameter. Closely coupled stacked IC prior art by the inventor and referred to as 3DS [Three Dimensional Structures] are U.S. Pat. Nos. 5,915,167, 6,208,545, 6,133,640, 6,551,857, 6,563,224, 5,985,693 and 5,654,220.

Closely coupled wafer bonding requires wafer to wafer alignment prior to bonding. Equipment presently available has the capability for ±1 µm wafer to wafer alignment. By comparison horizontal interconnection minimum pitch is 0.15 µm [150 nm] with current state of the art semiconductor processes. The horizontal routing efficiency through vertical interconnections is determined by wafer to wafer alignment, and is fundamentally important to the scaling of fine grain vertical interconnections to maintain compatibly with reducing horizontal interconnection geometries.

The state of the art for completed or fabricated planar ICs has and presently results in the expectation that the utility of a fabricated IC does not allow its reuse for subsequent IC integration in a single die or single IC. This is to say that subsequent integration of post-fabricated planar semiconductor circuitry with other fabricated ICs that would result in device and interconnection integration densities that are the same or similar to any of the planar ICs being integrated, and therefore, providing the well known attendant benefits of single IC integration, is no longer possible. Therefore, any and all subsequent circuit design changes or additions [placement of circuitry or horizontal interconnect routing layers] to a completed planar IC requires the IC be remade, requiring at a minimum revalidation of electrical and functional operation of the circuit, the remaking of mask tooling, circuit fabrication and in most cases the obsolescence of previous circuit inventory. This is a clear and significant restriction on the control of cost in the development, manufacturing and inventory management of planar ICs. Conversely, having the ability to inventory fabricated or complete circuitry which can subsequently be integrated at the IC or die level presents a opportunity for cost savings that affects all aspects of IC development and manufacturing, and extends the range of intended end use applications beyond that presently possible.

Planar Circuit Integration Progression Limitations

There presently exists numerous limitations to the integration progression of planar ICs, some of these limitations which are:

[1] Die Size in Fabrication, Complexity and Performance

The IC Integration Progression is limited by die size. The die size of planar circuits is limited by current semiconductor fabrication lithographic technology. Die size fabrication lithographic limitations stem from the maximum imaging field size of present semiconductor lithographic processing equipment. The often sought end objective for most electronic products or applications composed of multiple ICs is to integrate the ICs into a single chip solution referred to generically as a SoC [System on Chip]. The limits of circuit integration manufacturing are feature size and lithographic stepper reticle size [maximum lithographic image size] and yield. At this point in time production IC feature size is approaching 0.12 µm and stepper reticle demagnification size is approximately 25 mm by 30 mm which enables presently a die size limit of approximately one square inch.

Larger planar ICs, those greater than 100 mm$^2$, that are fabricated with lithographic processes less than 0.15 µm are limited in performance by the distances across the surface of a die or chip of such size resulting in the use of additional circuitry to amplify signals that must travel these greater distances. Adding further to the complexity of long signal line propagation is the use of lower voltage levels [such as 1.5v when using 0.15 µm fabrication technology] which result in lower signal strength, and stronger parasitic electronic effects due to the use of smaller lithographic geometries. And further as a result of large ICs and smaller lithographic geometries, skewed timing of signals which results from the varying distances of circuit sources makes an ever present demand for more precise circuit timing analysis and attendant circuit design compensations necessary to reduce planar circuit signal skew sufficiently to bring the circuit into acceptable operating ranges without too great a reduction in net circuit performance.

[2] Levels of Interconnections and Substrate Leakage Limit Device Fabrication Density and the Use of Complex IP Blocks The IC Integration Progression has now reached a minimum circuit device feature size of 0.15 µm [150 nm] in volume production. The end of the IC integration progression is now anticipated to be something approaching a feature size of approximately 20 nm. An increase in circuit density of approximately 36 times. However, such circuit density gains will be difficult to achieve or to implement their effective use without additional horizontal interconnect layers and new methods of power reduction or utilization necessary to drive a greater number of low voltage signals long distances over the surface of planar circuits. In order to implement greater circuit densities resulting from smaller circuit devices, a comparable reduction in the geometries of interconnections and an increase in the number of interconnection levels must be achieved. Reduction in power dissipation is necessary to prevent power dissipation from becoming a limitation on IC Integration Progression. Reduction in transistor substrate leakage could reduce current power dissipation by approximately 50%.

The IC Integration Progression is limited by the number of interconnection levels that can be used in a circuit design. The number of horizontal wiring levels of a planar IC is limited by manufacturing processes, presently nine [9] layers, which in turn limit the integration density of an IC design. Smaller active device circuit geometries and the frequent incorporation of hardwired Intellectual Property [IP] in the design of a circuit increases the wiring or interconnection complexity between those IP circuit elements to each other and the rest of the circuitry of an IC. The design of most ICs and certainly most large complex ICs incorporate IP circuitry into their circuit designs in order to save the time and human resources that would otherwise be required in duplicative development of such circuit IPs. Increased die size and greater use of IPs results most often in an increase in the planar [horizontal] routing interconnection complexity. This interconnect complexity results in more layers of interconnections necessary to complete a circuit's local and global wiring networks. This interconnect complexity is proportional circuit size, resulting in higher manufacturing costs.

[3] Interconnection Design Complexity

The integration progression is physically accomplished by the making of ever smaller circuit devices and through the fabrication of denser and denser interconnections or wiring. Design of most planar circuits posses the challenge of routing interconnections from one circuit block or functional group of transistors to another circuit block and then typically to the portion of the die of the circuit where I/O pads or contacts are formed for off circuit or external connections. These horizontal interconnections take the form of successive layers first interconnecting adjacent circuit devices, then progressing to the interconnection of ever more distant circuit blocks of the circuit. These interconnection layers are themselves connected by structures called vias, or wiring connections typically of less than 1 µm in length. These horizontal circuit interconnections have proved to be the greatest challenge in the design of large circuits resulting in a non-stop evolution of more sophisticated automatic interconnect routing software tools for completing what is called the physical IC design, and the addition of more and more interconnect layers presently at nine [9] and anticipated to exceed twelve [12] by 2005.

[4] Limits of SoCs, ASICs and FPGAs

The IC Integration Progression has lead to efforts to incorporate all the ICs of a system onto one chip, resulting in the reference to such ICs as SoCs [System on Chip]. However, achieving the SoC goal is greatly restricted by the limited ability of the semiconductor industry to fabricate single ICs consisting of multiple semiconductor processes [such as 0.5 µm analog and 0.18 µm logic or DRAM processes] or multiple semiconductor technologies [such as SiGe and GaAs, InP, GaN, etc.].

Similar problems face the more traditional and familiar ASIC and FPGA [Field Programmable Gate Arrays] or CPLD [Complex Programmable Logic Devices] products. The limitations of ASICs are design complexity due to their relentless growth in size, and a long and costly of product development process. The well established benefit of ASIC integration has now also become a limitation that requires re-verification and retooling of the entire circuit irregardless of the size of a design change and followed by prototype fabrication delays measured in months.

The alternative to ASICs are FPGAs or CPLDs with the advantage of a very short product development process, but with the distinct disadvantages versus ASICs of higher unit circuit cost, lower performance and lower gate density. The lower performance and lower gate density of FPGAs follows from the interconnect complexity required to support programmable function blocks and the on chip programmable routing interconnections for programming of the function blocks.

The development of SoCs, ASICs and FPGAs circuits has become increasing capital intensive in terms of facility support and large numbers of highly trained personnel. The IC integration progression can only guarantee that this trend will continue, making the development of these circuits the exclusive domain of a few large established companies with the result of lessening product diversity, competition and the well established economic vitality that flows from the innovation of small enterprise. The result of the current trends of the IC integration process is the loss of greater diversity due to the growing capital barrier to market entry, this cannot be in the long term public best interest.

All planar circuits are made from a custom mask set, where a mask set consists of typically 16 to 32 lithography masks. A single change to one circuit device or the its wiring connections in a circuit design of 10s of millions of circuit devices will result in the remaking of several or all masks for a planar IC. This in turn results in a requirement for timing simulation analysis of the circuit to determine anew it operating characteristics and if a failure condition has been created by the change. The operational simulation process or IC physical validation process presently requires the majority of development effort in the design of most ICs. This effort is growing with the rate of integration progression.

[5] Intellectual Property

IP [Intellectual Property] in the semiconductor circuit design industry typically refers to previously designed integrated circuit blocks that can be incorporated into a circuit design with only modest levels of additional engineering design effort. IPs are often an item of trade and are leased for incorporation into a circuit design. Some examples of IPs are microprocessors, DSPs, PCI bus interfaces and arithmetic functions. The value of IP is its ability to reduce IC development costs by its use, however, the reuse of IP only offers circuit design cost savings and does not extend savings to IC fabrication.

[6] IC Inventory Management and Reuse

Circuit design changes to an ASIC or any IC results in the need to make new masks and potentially the creation of devalued or obsolete [valueless] inventory of those circuits made from the current and now outdated mask set. A design change requires the remaking of one or more masks. New masks are expensive, and in large planar circuit designs made with complex processes they also can result in the introduction of new circuit defects, or due to large mask size reduced IC yield. ASIC inventory is a serious problem which comes in three forms: wafers, bare die and packaged circuits. Circuit inventory is most often held in wafer form for cost reasons, it represents unfinished goods at a lower value but can be quickly turned into the finished goods of bare die or packaged die, however, circuit wafer inventories often take several months to replenish. This is a difficult unfinished goods management challenge. Once circuit wafers are fabricated, a change in IC demand or a circuit design change can render these circuit wafers of little or no value. The ability to reuse such obsolete circuit wafers is often not an option even though the majority of the area of each die on the wafer is often unaffected by a circuit design change; this being even more the case the larger the planar circuit design. The challenge for IC integration is to reduce mask complexity for large circuit designs and to find methods for reuse of unaffected circuit area due to design changes.

[7] Power Limitations Due to Substrate Leakage and I/Os

Power dissipation of large ICs have increased significantly with the Integration Progression such that high performance circuits exceed 100 watts of power. Such high thermal heating of ICs limits the performance and useful life of the IC. The primary sources of IC power dissipation for most high performance ICs is from substrate leakage and high I/O counts. Substrate leakage is the passage of current between source and drain while the transistor is in the off state. Substrate leakage is increasing with decreasing circuit feature size and is expected to be more than 30% of IC power dissipation for fabrication processes below 130 nm. The power dissipation from I/O drivers are well known, but the increase in the number of I/Os for advanced ICs is expected to exceed 1,000 by 2004 and is a limit on the use of the IC technology.

[8] Circuit Yield Enhancement

ICs of greater than 100 mm$^2$ often resort to redundant or spare circuit yield enhancement methods. Such methods have proven successful in only a few higher volume production circuit types such as DRAMs and PLDs. These methods have been tried with little success in planar custom logic circuits by such companies as TRW in the 1980s and Trilogy Corporation founded by Dr. Gene Amdahl in the 1970s. These attempts failed due primarily to the limitation of circuit design automation software tools and available capacity of horizontal interconnections. The integration progression beyond 0.15 μm [150 nm] circuit device feature size will reduce the size or foot print of large and complex IP circuit functions such as microprocessors, DSPs or graphics processors to enable sparing as the simple solution to planar circuit defect resolution, however, the design complexity of interconnection layout and the capacity of horizontal interconnection is still a challenge for generalized implementation methods for these types of circuits.

The testing of ICs under normal and stressed conditions is challenging problem. External testing of ICs by ATE [Automatic Test Equipment] is presently the primary means of determining if a circuit is defective. This testing procedure is complex and lengthy and can result in failure to detect a defective operating condition.

Further, most circuits under go a procedure called burn-in. Various failure conditions of an IC only occur under temperature or voltage stressing, or after some lengthy period of operation. The burn-in procedure is the means used to provide this type of testing, however, the burn-in procedure lacks the full speed functional testing procedures of ATE testing, and therefore, can result in failure to detect a defective operating condition.

[9] Lithographic Limitations

Production semiconductor lithographic tools use masks in the form of imaging reticles which image or print one or more die onto a wafer per lithographic exposure. Lithographic exposures are repeated until the wafer or substrate is completed. The reticle is limited in its ability to image circuitry on a wafer in one exposure to an approximate area of 25×30 mm, and therefore, the largest planar IC that can be made is limited to the maximum imaging area of the reticle of the lithographic system. The production tooling for making an IC consists of a set of masks. The number of masks per mask set is dependent on the complexity of the process being used and nominally vary from 16 to 32 masks. Any design change to a circuit results in the remaking of one or masks of the ICs mask set. Changing the placement of an IP circuit block or interconnection busing structure will result in the remaking of all of the masks of the ICs mask set. The cost of making an IC mask set has increased sharply with mask geometries below 150 nm, and is limiting the development of ICs with smaller market volumes.

[10] MEMS [Micro-Electro Mechanical Systems]

MEMS devices are a rapidly developing manufacturing technology which use semiconductor fabrication processes but has only limited compatibility for integration with IC fabrication processes and technologies. MEMS take the form of such devices as accelerometers, DMD [Digital Mirror Devices], video imaging sensors, micro-switches and micro-gyros. The capability to integrate microprocessors, memories and wireless circuitry to name a limited few IC types would greatly expand the application, performance and capability of MEMS devices.

[11] IC Test Complexity and Cost

The complexity of circuit test has risen steadily with the increase of circuit integration and higher circuit performance. The common use of generic programmable external test ATE systems has proven to be limited in their ability to do exhaustive IC testing due to access to internal circuitry blocks and the economic constraints of their use due to their high cost. It is presently the case that for many complex circuits, ATE system testing is the largest cost component in the manufacture of such circuits. The methods that incorporate self test circuitry have met with limited success because these methods add to the already complex effort of planar circuit design and layout. Additionally, neither of these two test method approaches provides the ability to validate the full operational integrity of a circuit during its useful life in either a stand-by means or a dynamic means.

[12] Information Transmission

The transmission of information between ICs is restricted by the frequency of transmission between ICs and the data path width between ICs. The use of ever higher internal IC clock rates now exceeding 1 GHz makes this problem more pronounced. A single IC to IC connection [wire] using a transmission frequency of 500 MHz requires complex and customized transceiver logic with disadvantages in power and space. Secondly, these disadvantages coupled with packaging I/O restrictions impose a practical limitation on data path widths of 256 connections and on the length of the data path.

[13] Custom ICs Versus Generic Application ICs

The IC integration progression has resulted in reducing the per transistor cost of manufacturing to near zero cost, however, the cost of design and fabrication tooling have risen to unanticipated high levels and are expected to continue to do so. Low volume custom circuit demand is being strongly challenged by higher volume generic application circuits. There is still demand or a need for custom designed circuits made with state of the art IC fabrication process, but their low production volumes are making them prohibitively expensive. This is a problem for the semiconductor industry as a whole, because innovation almost always comes from small or startup businesses with new ways of using established technologies, such increasing demonstration costs for new higher risk IC designs will certainly have a negative effect on innovation.

Summary of Primary Improvement Objectives of the VSI IC Invention Versus Planar ICs The primary improvement objectives of the VSI invention disclosed herein over current planar IC design and manufacturing processes are higher performance and lower cost.
Higher Performance:
1. Smaller die size that is independent of circuit size.
2. Integration of disparate fabrication technologies by circuit layer.
3. Single die level integration that is independent of circuit size and process technologies used.
4. Shorter horizontal interconnection lengths through the use of vertical interconnections.
5. Shorter horizontal lengths through the use of smaller die size.
6. Greater of planar circuit layer to circuit layer interconnection density through fine grain vertical interconnection.
Lower Cost:
1. Smaller die size.
2. Fewer IC packages.
3. Fabrication process of self packaging.
4. Lower I/O pin count per package.
5. Internal self test logic.
6. Enhanced Yield.
7. Lower design complexity through smaller die size.
8. Design and fabricated circuit reuse through standardized fine grain vertical interconnection physical foot print sizes and placement.
9. Automated design of large scale and fine grain circuit reconfiguration and failure replacement by circuit redundancy.

SUMMARY OF THE INVENTION

The invention is a general method for custom integration fabrication of a broad range of electronic, optical and MEMS fabrication processes and technologies including the sensing and processing of information. This invention is a general method for vertical integration into a single die or component of incompatible and disparate electronic, optical and MEMS manufacturing processes. This invention is herein referred to as Vertical System Integration [VSI] or the VSI invention. Various additional inventions are also disclosed that are enabled through use of the VSI invention, provide novel means for enabling the VSI invention or are in novel combination with the VSI invention as a preferred embodiment.

The VSI invention provides novel means for achieving through vertical integration the multiple primary objectives of lower manufacturing cost, higher performance and smaller size for electronic, optical and MEMS devices. The VSI invention enables the integration into a single IC or component electronic circuit, optical circuits and MEMS devices as circuit or device layers, which are presently individually packaged and assembled onto a supporting interconnection structure such a PCB [Printed Circuit Board]. The circuit or device layers of the VSI invention are preferably thin and flexible wherein these layers are fabricated using low stress or stress controlled dielectric materials. The VSI method of device integration is markedly different from planar IC methods which have demonstrated success only where device implementation does not require multiple dissimilar circuit fabrication processes, more than one semiconductor technology or a circuit device die size that is beyond available IC fabrication manufacturing capabilities. Since the circuit layers of the VSI invention not only consist of electronic active device circuitry, but also electronic passive device circuitry [such as inductors, resistors, capacitors, associated interconnections or wireless transmission antennas], active and passive optical circuitry with associated wave guide interconnections and mechanical devices generically referred to as MEMS [Micro Electro-Mechanical Systems], the broader terms VSI Layer or Device Layer will be used to inclusively refer to layers of the VSI invention as being anyone of an electronic, optical or mechanical layer. A completed stack of VSI layers will be referred to as a VSI component or a VSI circuit or a VSI IC. Other terminology used to refer to a VSI layer are circuit layer, EO [Electro-Optical] layer, MEMS device layer, IC layer or VSI component layer, wherein the term circuit layer will be used to reference both electronic or optical VSI layers, and VSI component layer will be used to reference all VSI layer types. The individual active or passive circuitry used in a die or circuit layer are referred to as circuit devices or circuit elements, examples of which are electronic transistors, magnetic memory cells, optical amplifiers, resistors or inductors. The unit of VSI fabrication in general is a substrate consisting of an array of ICs, passive circuit interconnection patterns or MEMS devices fabricated on it, it is these wafers or substrates that become the circuit layers of a VSI wafer or substrate stack, and from which after a dicing process step, individual VSI components or ICs are realized.

The VSI invention integrates electronic circuits, optical circuits and or MEMS devices through a stacking fabrication process where circuit or device layer wafers or substrates, made with similarly dimensioned arrays of electronic, optical or MEMS components, are precisely aligned and bonded together, the substrate is thinned as needed to enable vertical access to circuit layer elements, electronic conductors or optical wave guides for subsequent circuit element or interconnect structure fabrication where upon the subsequent device layers are added until the substrate stacking is completed. The individual VSI components are then cut or sawed from their wafer or substrate stack in a manner similar to the way today's conventional planar ICs are cut from wafer substrates on which they are fabricated.

The VSI invention is a means for fabrication of customized or application specific single die IC components with the requirement for little or no custom circuit design and fabrication tooling. Today, all planar ICs require circuit design, layout and mask tooling before they can be fabricated. The VSI invention achieves this novel result in its preferred embodiment by making integrated VSI components of electronic, optical circuit layers and or MEMS device layers from generic libraries of VSI inventory circuit and or MEMS substrates with completed physical designs, wherein an application specific IC results from the selection and or order or number of the VSI library layers, or in combination with the specific use of one or more types of programmable VSI circuit layers. This aspect or embodiment of the VSI invention enables application specific customization to be the result of only the VSI fabrication process and absent the specific custom design of a circuit layer. Another embodiment the VSI invention is the fabrication of a VSI component or IC from a inventory circuit substrates and circuit substrates of completed physical application specific design intended only for use in one or limited number of VSI component part types. This is in clear difference to present ASIC or custom circuit integration methods wherein all device components from an IC library require individual placement and layout to be performed to complete the integration of the planar IC, and therefore, any change or addition to a planar IC requires design changes and fabrication of mask tooling for the whole or all of the planar IC.

Although such terms as ASIC and ASSP [Application Specific Standard Product] are used to refer to planar ICs of application specific designs and such terms as DSP, µP and DRAM are not used to refer to custom circuits, this distinction relates to the production volumes of such circuits where volumes for ASICs are low and volumes for DRAMs are high; however, there is no distinction between these various circuit types with respect to circuit layout and fabrication tooling, these items are customized to the circuit no matter its volume, whereas VSI components or ICs with customized or application specific capabilities can be fabricated without requiring circuit layout and fabrication tooling specific to the capacities or capabilities of a VSI component. It is also a distinction of VSI components or ICs versus conventional planar ICs that a portion of a VSI circuit can be customized and without requiring the custom layout and tooling for the whole or all of the VSI component; this is the case wherein certain VSI circuit layers, but not all circuit layers, with application specific functions are fabricated as custom design layouts and requiring fabrication tooling of the layers of the VSI IC; such VSI circuit layers could be referred to as VSI ASIC circuit layers. It is a distinct advantage of the VSI invention that the incorporation of hardwired customized or application specific capabilities or functions or design changes of a VSI circuit layer or layers affect only a portion of the VSI circuit and do not result in circuit layout related design considerations and fabrication tooling of the whole circuit as is the case with all planar circuit fabrication technologies.

Further, as a result of the aspect of the VSI invention enabling fabrication of circuitry with a minimum of or no design layout and fabrication tooling efforts, the well known cost distinction that exists presently to the advantage of ICs of high volume production versus ICs of low volume is significantly reduced due to the VSI invention capability to fabricate many low volume VSI ICs in an additive or comingled manner with high volume VSI ICs achieving similar cost savings, which is now only a benefit of the high volume fabrication of single planar circuit. This distinction of the VSI invention enables the design and fabrication of electronic and optical integrated circuits from a library of previously completed physical IC designs and fabricated circuit substrates without placing a predetermined constraint on the size, circuit functions, capacities and technologies of the integrated circuit; this is a benefit that reduces the fabrication complexity and cost of an integrated circuit in an inverse relationship to circuit capacity and capability.

The VSI IC fabrication process of the VSI invention produces Closely Coupled circuit layers. The term Closely Coupled means that the circuit layers are sufficiently thin to enable fine grain vertical interconnections between each circuit layer and that the interconnection lengths of electronic or optical interconnections connecting the circuitry on the various VSI circuit layers of a VSI component are less than or equal to the total thickness of the VSI layers making up the stack of the VSI circuit layers of a VSI component. These interconnections are routed vertically between VSI layers and interior to each VSI circuit layer passing through any number of circuit layers with or without making a signal contact to circuitry on them. Further, Closely Coupled means that the interconnection density between VSI layers is fine grain and significantly greater than what is possible with present off circuit interconnection densities between coplanar circuits, wherein the vertical interconnection pitch of Closely Coupled VSI layers is preferably less than 4 μm and preferably less than 2 μm and less than 1 μm. Interconnect lengths between two physically adjoining VSI circuit layers can be less than the combined thickness of these adjoining VSI circuit layers, since the typical thickness of a VSI layer is less than 50 μm and often less than 15 μm, VSI layer to layer interconnection lengths can be less than 30 μm and less than 15 μm. The thickness of a VSI component is typically less than 4,000 μm and in most embodiments is less than 200 μm and can be thinner than 110 μm. The two primary characteristics of Closely Coupled VSI circuit layers are electronic or optical vertical interconnections which are [1] of similar pitch density to that of the horizontal interconnections of a circuit layer, and [2] provide the shortest interconnection length between any two active or passive circuit device elements that are not both located on the same VSI circuit layer.

Closely Coupled VSI circuit layers enable improved IC performance due to the shorter circuit layer to circuit layer vertical connection lengths and also due to the VSI enabled capability to hold constant or reduce VSI layer die size [circuit layer area] while increasing the total circuitry surface area by increasing the number of VSI circuit layers of a VSI IC or component. The performance and power dissipation of planar ICs is inversely proportional to the lengths of horizontal interconnections. The VSI invention improves circuit performance by enabling VSI circuit layer die size or areal dimensions to be held constant or reduced in a manner that is independent of the total amount of circuitry for most embodiments of a VSI component, and thereby, improving circuit performance while increasing the amount of circuitry per VSI component or die independent of the size or areal dimensions of the die. This aspect of the VSI invention to hold constant or reduce horizontal interconnection lengths results in a reduction in total VSI circuit power consumption through reduced parasitic RC effects and or a reduction in the use of long interconnection signal buffers or amplifiers commonly used in planar ICs to prevent signal propagation losses due to long interconnection lengths.

The Closely Coupled circuit layers of the VSI invention enables performance improvement through multiple VSI circuit layer stacking. Each VSI circuit layer corresponds with the use of current planar IC technology as a separately packaged planar IC mounted on a PCB [Printed Circuit Board] or electronic circuit assembly, wherein the signal propagation delay between these planar electronic circuits is now typically greater than the internal clocking rates of today's production CMOS circuits of 1 GHz and greater. The IC signal propagation delay between packaged planar ICs is the result of the unavoidable lengths of the interconnections between these ICs, and therefore, the accompanying parasitic RCL electronic effects which delay signal propagation. The Closely Coupled VSI layer interconnection lengths are several hundred [100] to several thousand [1,000] times shorter than those of planar ICs arrayed on a PCB or stacked planar ICs using edge or peripheral connection methods.

Another aspect of the VSI invention is a doubling of available horizontal interconnection metallization layers for each VSI circuit layer. This is enabled through the VSI invention with the use of materials that are compatible with established semiconductor fabrication means, and therefore, are able to withstand semiconductor metal and dielectric deposition processing techniques and temperatures. This increase in horizontal interconnection routing density of the VSI invention is enabled by thickness reduction or thinning as required of the backside substrate of a VSI device or circuit layer to less than 50 μm and as required to less than 1 μm. The substrate may be thinned or partially thinned before it is bonded to a VSI substrate stack, however, it is the preferred embodiment of the VSI fabrication methods that the thinning of the substrate is completed after wafer or substrate bonding. The thinning of the substrate of a VSI layer is preferably accomplished with use of a barrier layer in the substrate or dissimilar stacked semiconductor materials that provide a means to precisely determine the end point for removal of the substrate. The use of a barrier layer such as silicon dioxide of less than 500 Å and as thin as 50 Å will enable a precision thinning of the substrate of a VSI device or circuit layer to less than 50 Å. The fabrication of horizontal interconnection on the backside of a conventional planar circuit substrate is realized after the circuit wafer or device substrate is bonded to a VSI component stack or carrier substrate by one of various permanent or temporary bonding means, and whereupon, the backside of the device or circuit substrate is made available for fabrication by conventional fabrication means of electronic or optical interconnections and completion of interconnections originating on the front side of the immediately adjacent circuit or device substrate or other circuit layers of the VSI component stack.

The preferred embodiment of VSI Closely Coupled circuit layers is the thinning of one or more substrates to a thickness of less than 50 μm. Thinning of the substrate can be assisted by embedding a barrier layer, a dielectric layer or an etch stop layer beneath the active devices. In the case of SOI [Silicon On Insulator] substrates the buried oxide layer can be used as an etch stop for substrate thinning. Nominally the barrier layer or buried oxide layer is in a thickness range of 2,000 Å to 6,000 Å which presently adds greatly to the cost of the substrate. Closely coupled IC layers enable the buried oxide substrate layer to be less than 1,000 Å in thickness and preferably less than 100 Å or less than 200 Å or in the range of 50 Å to 500 Å, since the buried oxide layer need only act as an etch stop and not as in its original intended purpose of electrical isolation of the semiconductor device layer overlying the oxide [dielectric] layer from the remaining semiconductor substrate below the dielectric layer. Once this substrate is thinned additional oxide or dielectric deposition can be performed to provide the circuit isolation layer that would normally be present in a standard SOI substrate. The thinner buried etch stop layer reduces device layer crystalline defects by a factor proportional to the reduced thickness of the buried oxide layer, crystalline defects are a common problem with current SOI substrates. Further, since the purpose of the buried oxide layer in a Closely Coupled VSI circuit layer is now to function as a barrier layer or an etch stop, it opens the opportunity to form a layer other than oxide, since the layer can be completely removed after thinning such as an epitaxial layer. Further, the thickness of the dielectric layer can be enhanced to a thickness beyond that presently possible with SOI substrates to provide greater circuit isolation for better circuit performance.

Another aspect of the VSI invention that in addition to the fabrication of horizontal interconnections on the backside of the substrate of a VSI circuit layer, the fabrication of circuit devices such as transistors, memory cells, resistors, capacitors, inductors is enabled. More specifically, the completion of circuit devices such as transistors or memory cells partially fabricated on the front surface of the substrate can be completed from the backside of the VSI circuit layer; this is enabled by VSI bonding process and VSI precision wafer or substrate thinning. This specific VSI capability of completing the fabrication of a circuit device requires the thickness of the semiconductor substrate wherein active circuit elements or devices are fabricated to be controlled preferably to within a tolerance of less than 5% of the thickness of the retained substrate thickness. This is enabled by use of a barrier layer in the VSI circuit layer beneath the top substrate surface at a depth equal to the desired thickness that the substrate is to be thinned or approximately so, compensating for additional processing steps. The preferred barrier layer embodiments are silicon dioxide or silicon nitride with thickness of less than 500 Å. An alternate preferred embodiment for enabling precision thinning from the backside of a circuit layer is the use of a semiconductor substrate composed of dissimilar materials such as SOS [Silicon on Sapphire], Si on glass or quartz, GaAs on Si or InP on Si wherein the underlying substrate material such as glass or silicon can be removed by established semiconductor processing methods after circuit substrate bonding to a VSI component circuit layer stack. The objective in the above methods is to achieve a very well controlled thickness of the remaining portion of semiconductor substrate of the circuit layer, these methods allow a semiconductor layer thickness tolerance of less than 50 Å to be achieved. The backside processing of the substrate of a VSI circuit layer can also include the fabrication of a plurality of memory layers such as those made from MRAM, PRAM, ferroelectric or dendritic memory cells. The benefit of fabrication of memory layers on the backside of the VSI circuit layer, in addition to the top or first side of the VSI circuit layer, enables the opportunity for design of the memory cell density to be increased with respect to the semiconductor logic layer associated with a less complex vertical interconnection structure to the memory layers, or enables double the total number of memory layers that can be associated with a logic circuit layer.

The Closely Coupled aspect of layers of the VSI invention enables high density vertical interconnections that are local to adjoining Closely Coupled VSI circuit layers or global wherein interconnecting some number of other VSI circuit layers of any order in the VSI component, or by forming dedicated or bused interconnections through all or group of the VSI circuit layers of a VSI component. A global bused VSI component interconnection structure is similar or is analogous to the well known PCB back plane bus structure used to interconnect at right angles daughter PCB cards. This comparison helps to make clear the interconnection efficiencies of the VSI vertical interconnection method enables a connection density in excess of 1000 times greater than the state of the art of PCB to PCB interconnection means, further, there are none of the interconnection performance delays intrinsic to the long interconnections of the PCBs. The VSI vertical interconnection of electronic substrates also includes substrates with deposited layers of active devices such as polycrystalline or amorphous semiconductor devices. Here the vertical interconnections fabricated between these deposited device layers can be extended to form interconnections to other Closely Coupled layers in a VSI component with established circuit fabrication means.

Another aspect of the VSI invention regarding backside substrate processing is that it permits process separation from the fabrication process used on the front or top side of the VSI substrate. This is enabled once a wafer or substrate is bonded on to a VSI substrate stack. The bonding process seals the top side of the substrate from effects of most processing steps that may be performed on the backside. If an inorganic sealing method is used such as metal thermal diffusion bonding, then the top substrate surface is hermetically sealed. This ability to employ disparate fabrication processes on the backside of a VSI layer applies to MEMS VSI layers in addition to electronic and optical VSI circuit layers. Fabrication processes that are not presently compatible or with limited compatibility such as CMOS and MRAM [Magnetic RAM], chalcogenide phase change memories or dendritic memories can be fabricated on the same but opposite sides of a substrate. Processes and materials that have unique or limited product production use would never be considered for integration with a state of the art high volume CMOS fabrication process line, can with the VSI invention be integrated on the backside of the CMOS circuit with no change to the CMOS fabrication sequence or risk to its fabrication cost efficiency. Further, thin film active devices such as TFTs can be fabricated on the back side of a conventional CMOS circuit wherein multiple layers of thin film devices can be fabricated with vertical interconnections not only between these layers but also directly to the active devices on the front side of the CMOS layer.

Another aspect of the VSI invention is inclusion of optical circuitry as Closely Coupled VSI circuit or device layers. Optical circuits that are fabricated with semiconductor processing techniques on substrates such as silicon, GaAs or quartz with dimension similar to those that would be used in the VSI fabrication process can be integrated into a VSI component or IC. The same bonding means used for bonding electronic Closely Coupled layers can be used to bond optical layers to form Closely Coupled VSI layers including one or more optical circuit layers. An array of optical circuits fabricated on a substrate such as silicon arranged in much the same manner as an electronic circuit is bonded face down [or initially face to face] onto a VSI circuit stack, the backside of the optical circuit substrate is thinned as need and through established semiconductor fabrication techniques various types of interconnections to the optical device and other VSI circuit layers to which it may be bonded are fabricated on the backside and optionally a bonding layer is fabricated for subsequent additions of more VSI circuit layers. Optical circuit interconnections between VSI layers are achieved through such means as the coupling of adjoining wave guides on the surfaces of VSI layers as a result of the bonding process, through the means of reflectors fabricated onto top or backside surfaces, or through coupling of photo diodes and photo sensors as shown in FIG. 28 and FIG. 29.

Another aspect of the VSI invention is inclusion of MEMS as Closely Coupled VSI device layers. MEMS that are fabricated with semiconductor processing techniques on substrates such as silicon or quartz with dimension similar to those that would be used in the VSI fabrication process can be integrated into a VSI circuit or VSI component. The bonding means used for bonding electronic or optical Closely Coupled layers can be used to bond MEMS layers to form Closely Coupled VSI layers including one or more MEMS device layers. An array of MEMS devices fabricated on a substrate such as silicon arranged in much the same manner as an electronic or optical circuit is bonded face down [or initially face to face] onto a VSI circuit stack, the backside of the MEMS substrate is thinned as need and through established semiconductor fabrication techniques various vertical interconnections between the MEMS device and VSI circuit layers to which it may be bonded are fabricated on the backside and optionally a bonding layer is fabricated for subsequent addition of more VSI circuit layers. MEMS devices such as interferometers, micro mirrors or mass storage devices benefit from immediate or Close Coupling to circuitry that can more accurately sense the output of these devices or control their operations improving their performance as well as reducing their cost.

FIG. 28 shows a portion in cross section with VSI circuit layers 2801, 2802, 2803, 2805, 2811 with optical interconnections over a MEMS layer 2803 of a VSI component or IC wherein active optical laser diode 2804 fabricated on the front side of single crystalline semiconductor VSI layer 2805 emits an optical signal into a dielectric wave guide 2806 incorporating optical reflectors 2807 and 2808 which is received by photodiode sensor 2809. Also shown are TFT deposited layer and horizontal interconnect layers 2810, digital logic circuit layer 2811 and VSI layer thermal diffusion bond 2812. The optical wave guide of FIG. 28 may also incorporate an optical wave guide coupling shown in FIG. 29 formed by the bonding of two VSI circuit layers wherein optical wave guide 2901 on circuit layer 2903 is coupled to optical wave guide 2902 fabricated on circuit layer 2904 with the formation of bond 2905 and cavity 2906. The optical coupling is accomplished by an off angle end terminations 2907 off optical wave guide 2901 and 2908 of optical wave guide 2902 wherein optical signals leaving the end of wave guide 2901 are reflected off reflective metal surfaces 2909, 2910, 2911 and 2912 and into the end of waver guide 2902. The cavity 2906 is vacuum or filed with a fluid with minimum absorption characteristics for the wavelength of the optical signal.

Over the past thirty-five years the cost trend for transistors of an integrated circuit has seen an average annual rate of reduction of approximately 50% resulting today in a cost of approximately $3 \times 10^{-6}$ ç per transistor of a memory circuit and approximately $2.5 \times 10^{-4}$ ç per transistor of a logic circuit. If this trend continues, it can be anticipated that the cost of memory circuit transistor, will further decrease based on the integration progression of current manufacturing methods to $4 \times 10^{-8}$ ç and a logic transistor to $4 \times 10^{-5}$ ç over the next five years. Even though these numbers are impressive they may be at least an order of magnitude higher than what can be achieved with the present VSI invention.

This near "zero cost" trend of the IC transistor has resulted in greater IC design complexity now approaching hundreds of millions of transistors per planar IC. The advantage of this cost trend, however, is not now being fully realized. IC yield, test and IC packaging are now preventing the full realization of the transistor's cost reduction benefit. Further frustrating the full realization of the transistors cost reduction is the high cost associated with merging different IC fabrication processes on a single planar IC or the complete inability to do so.

It is an objective of the VSI invention to provide methods for fuller realization of the present and future cost reduction trend of the IC transistor. The VSI invention takes into account that the rapidly declining fabrication cost of IC transistors can offset the cost of circuit designs and their fabrication costs where circuit self repair or reconfigurability implemented though vertical IC integration methods are used as means to achieve increased IC yields, lower packaging costs including reduction of net system assembly costs and the merger of disparate incompatible semiconductor fabrication processes and technologies. The VSI invention achieves this result by enabling a greater density of IC integration than is possible by the foreseeable means available to planar IC fabrication through the implementation of vertical integration and fine-grain vertical interconnections aligned to less than 2 μm pitch and the thinning of the semiconductor substrate to less than 1,000 Å or to any dimension as required. VSI wafer or substrate thinning enables fabrication processes to be performed on the backside or underside of circuit layers providing the opportunity for novel transistor design improvements and fabrication of additional conventional [horizontal] interconnections with equivalent circuit complexity and density presently only afforded with the topside of the integrated circuit.

The VSI invention enables the cost effective trade-off of the use of dynamic or static field programmable circuitry to implement circuit self repair with the use of spare or redundant circuitry. The implementation of these methods through the VSI invention improves IC yield, reduces the circuit design complexity and the merging of technologies and processes through modular IC structures with higher degrees of assured operation.

The VSI fine grain vertical interconnections preferably are formed at the time two circuit wafers or substrates are bonded [preferably by thermal diffusion bonding] and during the backside interconnection fabrication of one subsequently thinned wafer or substrate so that the thinned substrate is less than 50 μm and preferably less than 5 μm. In the case where the substrate being thinned is an SOI substrate, all of the silicon is removed up to the buried insulation layer [the buried insulation layer is typically oxide but alternate insulation materials can be used such as nitrogen to form a nitride layer] underlying the semiconductor device layer.

The VSI invention is a set of circuit and MEMS integration methods enabling the fabrication of electronic systems or subsystems as one IC die or VSI component instead of what are now and for the foreseeable future assemblies of large numbers of individually packaged planar ICs. The integration methods of the VSI invention result in greater IC integration than that possible with conventional planar IC integration and with IC benefits of higher performance and net lower manufacturing cost and power dissipation than an equivalent non-integrated set of planar ICs. VSI closely coupled IC circuits enable the performance limiting off-circuit or off-chip interconnections or I/Os of conventional planar ICs to be replaced by their integration into the VSI IC as vertical interconnections between VSI circuit layers or more specifically the interconnection density between the ICs of VSI IC layers.

The VSI invention enables novel methods addressing present IC fabrication limitations of yield enhancement, performance enhancement, cost reduction, lower power dissipation, NRE cost reduction, and design and fabrication complexity. The VSI invention reduces the requirement for use of second-tier IC interconnect means such as IC carriers or packages, IC carrier sockets, PCBs and PCB edge connectors. The integration of second-tier interconnect means results in reduced cost and increased circuit performance, but also total circuit power, size and I/O reductions in a range of 100× to 10,000×. Further the VSI invention is a means that simplifies the design, development, mask making, final test and burn-in of ICs. The IC integration progression has also provided the infrastructure and means for implementing the VSI invention.

The solid solubility or diffusion of one metal into another metal of a higher melting temperature is a means for forming a VSI circuit layer bond at a lower temperature and resulting in an alloyed metal at the bond interface of the bonding layers with a higher working and melting temperature. Metal films or layers deposited on the VSI circuit wafers or substrates for the purpose of forming bonds of VSI circuit layers are deposited with semiconductor techniques such as sputtering, evaporation or CVD [Chemical Vapor Deposition]. Such films made from In, Sn, Zn, Cd or Ag or alloys of such metals when deposited on top of another metal film with a higher working or melting temperature such as Cu, Al, Ni or Pd will with appropriate annealing temperatures diffuse into each other forming an alloy of high working temperature. If the lower working temperature film is thinner relative to the higher working temperature film, the resulting alloy film will have a higher working temperature than if they were in equal proportions.

The VSI invention uses this physical relationship of metal films to use a first wafer or substrate bonding temperature that is lower than the final working temperature of the VSI circuit layer bond. This is done by using a lower melting temperature metal such as Sn over a film of Cu on the two bond contact surfaces of VSI circuit substrates to be bonded. For example, with a first Sn film of 500 Å and a second underlying film of Cu film of 5,000 Å to 7,500 Å, applying temperature of 180° C. and pressure of 2 atmospheres will bond the Sn first films, and with subsequent temperature annealing steps of 180° C. or higher, the Sn will diffuse into the Cu layer creating a SnCu diffused or alloyed film at the bond interface with a higher working temperature than the melting point of Sn. Bonding films made of two or more deposited metal films will be herein referred to as Diffusion Alloy bond layers. This type of metal bond layer is novel in its use in integrated circuits and MEMS and can be used in VSI fabrication to lower the bonding temperatures of VSI substrates.

Another example of dual metal thin film diffusion bonding is the sputter deposition of a 50 Å to 500 Å film of Sn [tin] over Al [aluminum]. The deposition of the Sn should be done after the removal of the approximate 35 Å thick Al oxide on the surface of the Al film by a method such as sputter etching or the Sn film should be deposited following the deposition of the Al film without exposure of the Al film to atmosphere or oxygen, and therefore, avoiding the formation of the Al oxide film on the Al film; the Sn film can be deposited over the Al film to prevent the formation of Al oxide on the Al film. When two substrates or wafers with the SnAl metal film stack depositions are diffusion bonded, the Sn films enable a bond between the substrates to be rapidly formed. Subsequent thermal annealing of the bonded substrates will cause the thin Sn film to diffuse in to the thicker Al film. The benefit of this bond processing sequence is to simplify and to accelerate the bonding of Al films and to create an alloy of SnAl at the diffusion bond interface that has a higher melting temperature than Sn such that the working temperature of the IC stack is higher than the melting temperature of Sn. Another example of such a metal sequence is Sn/Cu/Al. In this example the Sn layer may serve as an etch mask for the Cu/Al films and the Cu film will act to prevent the formation of an SnAl diffusion intermetallic alloy. The characteristics of the diffusion formed intermetallic alloys are determined by the thickness of the various metal films of the film stack and their exposure sequences to temperature in terms of duration and temperature range. The thinner the primary bonding metal film is, the greater the control available in reducing the emergence of an undesirable intermetallic diffusion alloy.

The VSI invention is a Closely Coupled stacked integrated circuit fabrication technology. The primary benefit of Closely Coupled circuit stacking integration is its ability to achieve electronic circuit characteristics equivalent to that of planar circuit integration from the stacking of a plurality of individual planar ICs. Closely coupled integrated IC layers have the same electronic and electrical operation as a planar integrated ICs. However, there are clear benefits that Closely Coupled integration provides that planar integration does not. These are shorter wire lengths from fine grain vertical interconnections and smaller die size, the capability to arbitrarily integrate widely dissimilar semiconductor device fabrication processes [digital CMOS, DRAM, Flash, etc.] or technologies [SiGe, SOI, GaAs, SiC, GaN, etc.] as separate circuit layers, and the capability to increase wiring density through the application of very dense vertical interconnections, thereby replacing equivalent horizontal cross die interconnects or local interconnections among devices of immediate proximity on separate circuit layers.

The VSI invention through Closely Coupled circuit fabrication enables one or more of the following:

1. Fine grain vertical system bus or buses, ranging in data width from a typical 16 or 32 wide data width to several thousand data bus lines.
2. Reduced I/O [off chip] contact count versus the total count of I/O contacts of a planar circuit equivalent chip set.
3. Fine grain vertical interconnections for enabling or disabling whole circuit layers or portions of circuit layers.
4. Fine grain vertically interconnected redundant or spare circuit layers or portions of circuit layers.
5. Inventory or generic multiple application use IP circuit layers.
6. Fine grain vertically interconnected FPGA, CPLD or PLD circuit layers
7. No tooling IC integration.
8. Fine grain vertically interconnected yield enhancement logic comprising a whole circuit layer or portion of a circuit layer.
9. Fine grain vertically interconnected MEMS layer or layers such as antennas, SAWs [Surface Acoustic Wave], circuit probe, magnetic disk head or video image sensors.
10. Fine grain vertically interconnected memory subsystems of such memory technologies as DRAM, Flash, EEPROM, SRAM, CAM, PRAM, dendritic, Ferroelectric or Ferromagnetic.
11. Circuit layers of different semiconductor technologies such as GaAs, CMOS, SOI, InP, GaN or GeSi, or passive circuit layers made of such passive circuit devices as resistors, capacitors or inductors.
12. Fine grain vertical interconnections used to implement circuit defect repair with fuses and or anti-fuses during burn-in processing.
13. Horizontal interconnect fabrication on the backside of thinned circuit layers allowing the horizontal interconnect density to approximately double.

The primary benefit sought from the use of planar ASICs is to achieve high performance of an application by fabricating selected portions of the application as hardware functions. This narrow focus to achieve performance utilization of an application is also the most serious limitation to the use of ASICs for the reason that once hardware functions or IP [Intellectual Property] is committed to a hardware design in a planar IC its reuse in another IC will require at least partial redesign of the circuitry to place it into the circuitry of a second IC, the cost of fabrication tooling masks and physical testing verification. Perhaps the most important limitation facing present ASICs being made with CMOS technologies of 150 nm and smaller fabrication processes is their increasing costs due to mask tooling and achieving cost economies for these circuit manufacturing processes demands large production volumes. The great majority of ASICs designs are intended only for low production volumes which significantly increases their costs.

It is an objective of the VSI invention to reduce the cost of ASICs or small volume production circuits by increasing their utilization as a VSI circuit layer or portion thereof which allows the reuse of the IP of the ASIC in a second application without design changes, additional fabrication tooling, production or separate physical testing. Large production lots of an IP as a separate VSI circuit layer could be made with the expectation of higher application utilization. Unlike completed or fabricated planar ICs, the VSI circuit wafers or substrates can be thought of as reusable circuitry from the stand point that their subsequent integration is possible on an as is basis into alternate VSI circuit applications, and without losing the well known attendant benefits of planar IC integration. Subsequent VSI IC or component design changes by changes to one circuit layer or the addition of circuit layers does not unavoidably result in making the existing VSI layers obsolete or require the remaking of mask tooling for the existing VSI circuit layers as is required when changes are made to planar ICs. Furthermore, VSI component density can be increased or decreased without circuit redesign; the addition or removal of VSI circuit layers is similar in principle to the addition or removal of daughter PCBs from a mother board or back plane. Furthermore, any and all subsequent circuit design changes or additions to an existing circuit layer only requires the remaking of that specific VSI circuit layer. This is a clear and significant novel advantage over planar ICs in terms of IC development, manufacturing and management of fabricated IC inventory.

The IC integration progression to ever smaller circuit feature sizes [lithographic] has enabled the manufacture of 32-bit and 64-bit microprocessors on a single semiconductor chip, and most recently two 64-bit microprocessors on a single semiconductor chip. Integrated with these microprocessors also is some amount of volatile memory such as SRAM or DRAM, this on chip memory is extremely important to the performance of the microprocessor. This integration progression is also true for other circuit types such as PLDs [Programmable Logic Devices], also referred to as FPGA or CPLD circuits, network processors, graphic processors, ASICs [Application Specific Integrated Circuits] and ASSPs [Application Specific Standard Products], to name some broad class of circuit types. The integration progression is valid for MEMS [MicroElectro-Mechanical Systems], a new circuit type with need to integrate sensor and mechanical functions with electronic or optical circuitry, whereby it can be expected that MEMS will eventually integrate circuitry such as microprocessor, memory and wireless communications.

The IC integration progression is expected to continue with the integration of microprocessor circuits with ever more memory and processor related control circuitry such as graphic processing logic and DSPs. This progression is driven by the demands for more performance and lower cost, and with portable electronic devices lower power and smaller physical form factor or finished circuit size. The result of reducing circuit feature sizes is increased circuit operating performance, lower cost, lower power and smaller form factor or size per some unit of circuit area. This is well know to those skilled in the art.

The terminology used to describe ICs is diverse. More often than not the names of existing IC terminology owe their origins to efforts to give these IC products a meaningful description for the times of the available market and technology, but the integration progression relentlessly continues to render less useful such original meaningful description. IC names such as microprocessor, DRAM, DSP and PLD are becoming less useful because the integration progression has enabled them to be combined into one planar IC, and new names like MEMS will most certainly experience similar declining usefulness. It is because of this history that the new and very general term SoC [System on Chip] has come to be used. There are two other very familiar terms, ASIC [Application Specific IC] and ASSP [Application Specific Standard Product] which were coined to describe a class of custom designed ICs or ICs designed for a specific application and used depending upon whether an IC was intended for a narrowly defined use [ASIC] or a broader and more general but specific market use [ASSP]. It can be argued that all ICs have always been and always will be custom ASICs, since all ICs are made for some narrow or broad set of applications. The use of the term ASIC in this description when in reference to the VSI invention herein, is meant to apply broadly and to refer to all semiconductor fabricated circuitry and devices of which only a partial list includes microprocessors, graphic processors, network processors, PLDs, FPGAs, CPLDs, DRAM, Flash, MEMS, sensors, photosensor arrays, CCDs, baseband processors, CAMs, configurable and reconfigureable circuits, passive circuit arrays, analog circuits, hybrid circuits and mixed signal circuits.

The clear end objective for most electronic products or applications composed of multiple ICs is to integrate the ICs into a single chip solution referred to by the all encompassing term of SoC [System on Chip]. The limits of circuit integration are feature size, lithographic stepper reticle size [maximum lithographic image size] and yield. At this point in time feature size is approaching 0.12 µm, stepper reticle size is approximately 25 mm by 30 mm and circuit yield is inversely proportional to the size of the semiconductor circuit die with best circuit yields obtained with chip sizes of less than 1 cm$^2$. And ICs are also made from different semiconductor manufacturing processes and technologies, such CMOS, flash, DRAM, BiCMOS, GaAs, GaN, InP, etc. Processes like CMOS and DRAM are difficult and expensive to integrate, semiconductor technologies such as GaAs, GaN or InP have proven to be extremely difficult or impossible to date to commercially integrate with silicon as a single SoC planar circuit. Larger electronic systems such as multi-processors computer systems, Storage Area Networks and internet routers are performance limit by the methods used to interconnect the various highly integrated ASICs, µPs and memory circuits from which they are made. In such systems the on-chip IC clock speed can be as much or more than several times higher than the clocking speed used to communicated between ICs. The inter-IC wiring interconnect consisting of IC package, IC socket, PCB, PCB connectors and back plane are the contributors of the single greatest delay in electronic system performance. Greater integration of the components of such systems is expected, however, single chip integration of large electronic systems is not soon expected, and therefore, electronic systems as presently assembled will continue to have performance limitations due to the interconnections between IC components. It is an objective of the VSI invention to provide fabrication means to enable the integration of mixed IC semiconductor processes and technologies, and to reduce the interconnection delays attributed to ICs in electronic and electro-optical system and subsystems.

The VSI vertical interconnections enable a circuit to be reconfigureable by function with similar facilities as it uses in configuring a circuit to delete or add circuitry as a result of a circuit defect. The benefit of VSI vertical interconnections for the implementation of reconfigureable circuits such as PLDs, FPGAs or CPLDs is reduced interconnect routing complexity and or a reduction in the number of horizontal interconnection layers per VSI circuit layer, these benefits result from the use of smaller die dimensions and the segregation to separate VSI circuit layers of various logic circuitry and memory circuitry. An example is global routing for FPGA type circuits where die size can be as large as 600 mm$^2$ with global horizontal interconnections as long as 20-30 mm. The use of VSI vertical interconnections can reduce maximum global horizontal interconnect lengths to less than 2 mm with a majority of the FPGA logic blocks globally interconnected by lengths of less than 100-200 µm. This is done by segregating or partitioning the FPGA or CPLD circuit into a set of circuit layers with a die area of 25-30 mm². The VSI partitioning of a planar FPGA circuit into a set of VSI FPGA circuit layers allows the majority of FPGA circuit blocks to be interconnected vertically and reduces the average interconnection length to a function of the die thickness, a length of nominally less than 200 µm, and the maximum interconnection length to a function of the die size, a length of nominally less than 10 mm.

Planar PLD, FPGA or CPLD circuits provide an unrivaled flexibility to achieve hardware development and performance efficiencies through an implementation of a logic function by the programming means of the FPGA circuit. This benefit, however, is significantly offset by a low density of programmable interconnections of and between logic functions, low gate density and low memory density relative to custom logic circuits [ASICs] which results in higher FPGA circuit cost. FPGA circuits are presently limited in the number of gates per circuit by the field size of the lithography tool or reticle and the global routing resources necessary for transmission of data signals across the circuit. PLD routing resources typically require 60 to 70% of the area of a PLD circuit. Dynamically reconfigurable PLD circuits or PLD circuits that can be reprogrammed during operation are limited by the availability routing resources. The VSI invention significantly reduces the cost of planar FPGA circuits by increasing the interconnect, gate and memory density. However, the VSI invention further uniquely improves on the capability and capacity of present FPGA circuits by enabling an increase gate and memory density beyond current planar circuit limitation due to lithography, and to incorporate dedicated circuit functions or IP on an as needed basis without requiring design change to a VSI FPGA circuit layout by implementing hardwired or dedicated circuit functions or IP on VSI circuit layers that can be added to a VSI FPGA component.

The lithography die size limitation is a physical constraint on the fabrication of all planar ICs, and therefore, limiting the amount of circuitry that can be integrated on any single planar IC regardless of what planar fabrication process used. The amount of circuitry that can be integrated into a VSI IC is not limited by the lithography fabrication limitation on die size, but by the integration of a plurality of circuit layers providing the integration efficiencies of at least that of planar integration.

A unique advantage of the VSI fabrication method of making stacked circuits with SOI substrates fabricated with the SIMOX process is that the buried insulation layer or barrier layer of the SOI substrate need only be as thick as that required to complete the removal of the underlying substrate. The thickness of the buried insulation layer can be as thin as 50 Å to 150 Å versus typical SOI buried insulator layer of 4,000 Å. The direct advantage of such a thin buried insulation layer is that there is less crystal lattice damage of the overlying semiconductor layer during the implant of the insulating atomic species. Once the underlying substrate is completely removed the insulation layer is exposed and the thickness of the insulation layer can be enhanced by deposition of insulation films.

The VSI invention integration method uses the fabrication of vertical interconnects on less than 4 µm pitch and with the wafer to wafer alignment and bonding methods provided herein, the fabrication of vertical interconnects of less than 250 nm [0.25 µm] pitch and less than 100 nm [0.1 µm] pitch. A 4 µm pitch enables a vertical interconnect density of 62,500/mm², and a 100 nm [0.1 µm] pitch enables a vertical interconnect density 100,000,000/mm². Vertical interconnect pitch with geometries of less than 1,000 nm [1 µm] pitch are necessary in order to match the integration scale of a majority of current circuit devices. This density of vertical interconnections between VSI circuit layers eliminates a majority of interconnection restrictions that presently exist between planar circuits and result in performance limitations on inter IC bandwidth often referred to as I/O bottlenecks. Present planar ICs have external [off-chip or off-die] I/Os of less than 500 connections and are limited to a maximum I/O count of approximately 4,000; the maximum I/O count limitation results from packaging technology constraints in addition to cost constraints. The VSI high density fine grain vertical interconnections can be organized into standardized placements in the layouts of a family or library of circuit layers with the objective of enabling the subsequent direct coupling of these interconnections to overlying [underlying] circuit layers of a VSI IC. Further, with a large number of vertical interconnections per placement, some number of these interconnections can be spare or unused interconnections and available for use in a future VSI IC design. FIG. 2c shows a standardized placement of several fine grain vertical interconnection blocks 201c, 202c, 203c and within such blocks the vertical interconnection density may vary independently by pitch in addition to the total number of interconnections per block; for example, block 201c may have 1,000 vertical interconnections arrayed with a 1,000 nm [1 µm] pitch for providing power between circuit layers, block 202c may have 15,000 vertical interconnection arrayed with a mix on two or more pitches from 2,000 nm to 1,000 nm, and block 203c may have 80,000 vertical interconnections arrayed with a 200 nm pitch to implement a high bandwidth bus connections.

A primary objective of the VSI invention is the reduction of the interconnect length of and circuitry associated with off die or external IC circuit interconnections commonly referred to as IC I/O bond pads or I/O connections 11 as shown in FIG. 3. External IC interconnections typically account for more than 50% of the power dissipation of an IC. In the case of a 64 bit DRAM IC, the I/O circuitry necessary to send signals on and off the DRAM circuit account for approximately 90% of the power dissipation. The direct benefits of reducing the number of external I/Os of an interconnected set of ICs in addition to lower power dissipation are smaller die size and an increase in the combined performance of the set or network of interconnected ICs. The benefit of reduced power dissipation of the VSI invention follows from the reduction of inter IC or circuit layer connection wire lengths to typically less than 200 µm implemented with fine grain vertical interconnections, therefore, reducing or eliminating the I/O circuitry and associated power needed to drive circuit signals lengths of several inches to tens of inches. The benefit of reduced die size in VSI invention follows from the reduced foot print of a fine grain vertical connection that can be 2,500 to 10,000 times smaller than an I/O bond pad 11, therefore freeing the surface area that would be required of a planar IC. This VSI benefit is most significant with ICs that require additional surface area beyond that necessary for the implementation of circuitry in order to provide area for bond pads are referred to as bond pad limited. The benefits of higher performance in VSI circuit layers follows from the shorter inter IC connection lengths. The VSI vertical integration method enables the elimination of external I/O circuit drivers and pads between circuit layers by routing these interconnections to one or more of fine grain vertical interconnections or vertical buses. The fine grain vertical interconnections can be designed to implement any order of connections between each circuit layer of a VSI IC through fabrication of interconnection routing on the backside of a circuit layer, therefore, at a minimum any routing connection network between a set of planar ICs can be reproduced when such ICs are stacked in a VSI IC or component.

The VSI integration enables the design of a circuit to be the determiner of VSI circuit layer foot print or die size and not the total amount of circuitry comprising the IC as in planar ICs. The performance and yield of a planar circuit is directly related to its die size. The performance of planar circuits made with fabrication geometries of 0.15 µm and less are dominated by the propagation delay of the wire length used to interconnect the transistors and not the switching propagation delay of the transistor. The design of a VSI circuit enables the arbitrary partitioning or placement of circuit functions per circuit layer and combining horizontal interconnections with fine grain vertical interconnections between circuit layers, therefore, the VSI circuit layer foot print or die size is a circuit design decision.

The VSI integration reduces circuit power dissipation and increases circuit performance through smaller die size and the elimination of stacked IC to IC I/O drivers with fine grain vertical interconnection. Circuit integration with geometries below 0.15 µm dramatically increases the density of active devices per unit area of semiconductor substrate. However, as geometries are reduced, circuit operating voltages are also reduced, reducing the transistor signal drive capability and necessitating greater numbers of repeater circuits in order to send a signal across the surface of the IC of lengths of several thousand microns [4-20 mm] or more. This in turn increases the power dissipation of the circuit. The fine grain vertical interconnections of a VSI circuit layer nominally vary in length from a few microns to 10 µm per circuit layer with total vertical wire lengths through the complete VSI IC or component of nominally less than 150 µm, although physical implementation of vertical wire lengths of greater than 1,000 µm [1 mm] are possible, a practical design driven maximum length of less than 600 µm [0.6 mm] is anticipated. The shorter VSI vertical wire lengths would replace all global or long wire lengths of an equivalent planar circuit reducing the wire propagation delay nominally by more than a factor of 10 and power dissipation by a design dependent amount.

Secondly, IC to IC I/O drivers often account for the majority of power dissipation of a planar circuit and the number of I/Os of a planar circuit design may be restricted in order to reduce total power dissipation. The power dissipation of off chip I/O drivers results from the resistance and capacitance loading of the interconnections between planar circuits consisting of at least circuit packages and PCBs [Printed Circuit Boards], but may further include package sockets, PCB edge connectors and back planes. These same interconnections are the primary determiners of net electronic system performance [exclusive of delays attributed to electro-mechanical subsystems such as disk drives] for most electronic systems such as PCs, servers, network processors or supercomputers. The use of fine grain vertical interconnect in VSI components eliminates the need for conventional I/O drivers between circuit layers due to the shorter vertical path length between all VSI circuit layers, and this same shorter vertical path length between circuit layers eliminates the performance delay normally resulting from interconnections between planar ICs.

The VSI invention enables simplified methods for high speed electronic and or very wide data path transfer of information between two or more VSI circuit layers. High speed transfers of information between planar ICs at rates of greater than 500 Mbps per single interconnection require custom transceiver logic specific to this function. The Rambus transmission technology is a very well known example of such transceiver logic. The short connection [wire] lengths provided by fine grain vertical interconnections of the VSI invention enable information to be transferred from one circuit [IC] layer to any other circuit layer of the same circuit stack with no more circuitry than would be required for transmission over the surface of a planar circuit. It also follows from the use of fine grain vertical interconnections that its capability for interconnection densities of less than 2 µm pitch enables making of arbitrarily wide data paths between circuit [IC] layers within a VSI component. Such data paths can be of any practical width such as 1,000 to 4,000 connections, but connection widths of 10,000 or more can be implemented without restriction within a VSI component.

The VSI invention enables a new method for built-in self test of a VSI IC with a standardized or specialized tester capability comparable to that now provided by ATE systems. This is accomplished by incorporating tester logic on a separate circuit layer or portion of a circuit layer. The tester circuitry uses fine grain vertical interconnections as direct connections or as standardized bus structures to send test signals to other circuit layers. In the preferred embodiment the tester circuitry is available as a standardized circuit layer that can be programmed to test all or most of the various circuit layers through standardized or common busing means that test a circuit layer as a whole or portions there of. The tester circuit layer may also be fully redundant to enhance the probability that tester circuitry will be available to perform testing. Secondly, there may be more than one type of tester logic incorporated on one or more circuit layers depending on the types of circuit layers in the VSI circuit stack or component. This approach where a general purpose or broad application built-in circuit tester is incorporated as a circuit layer of a VSI component avoids the obvious and considerable design impact that would result if the tester logic were to be incorporated as part of a planar circuit. The availability of the high density VSI fine grain vertical interconnections allow tester connections on any specific circuit layer to be implemented through a standardized test interface protocol with routing to standardized vertical bus interconnection placements on all circuit layers. It is also in accordance with this aspect of the VSI invention that this method of built-in self test would eliminate the need for VSI IC testing by current ATE systems and allow all or the majority of VSI IC testing procedures to be performed during IC burn-in processing, thereby reducing the cost of VSI IC testing and the present complexity of burn-in tester circuitry, since no additional burn-in test circuitry or tester programming would be required as presently required for planar circuit burn-in. The cost benefit of the VSI method of built-in circuit self test increases as the number of circuit layers are increased from the stand point of higher tester logic utilization and lower tester logic cost as a percentage of total circuit layer cost. An additional advantage of this method of built-in self test is that it gives the circuit the option of using this internal tester logic capability to validate the integrity of the complete circuit or portions thereof during the useful life of the circuit. Further, this method enables the VSI component to provide stand-by [stand alone] or dynamic self testing, or a means to perform circuit operational monitoring to observe circuit degradation over its useful life. The availability of ATE or programmable generic or specialized tester logic also enables internal VSI IC defect detection and reconfiguration when in combination with reconfiguration circuitry and or sparing circuitry.

VSI integration reduces the need for circuit packaging and provides a hermetically self-sealed package. Only one conventional package may be required per VSI component, this reduces the number of packages that would have been required for the VSI IC's equivalent as multiple planar circuits to one or none. Reducing the number of packages in an electronic assembly increases circuit yield in addition to a reduction in circuit component cost; the IC packaging process has a nominal 1% or greater yield loss. Further, the VSI IC can form its own package or is self packaging. This results from the VSI bonding process where the top surface of a completed VSI is the backside of the last circuit layer bonded onto the VSI component. This means all electronic device surfaces are interior to the VSI circuit layer stack and protected from damage. This also allows I/O bond pads to be placed anywhere on the VSI top surface without concern of damage to circuitry underlying that may be directly under a bond pad. When a VSI IC is fabricated with the preferred bonding method of thermal diffusion bonding with inorganic bond materials, a hermetic seal at the edge of all circuit layers prevents moisture or chemical vapor contact with the electronic surfaces of the circuit layers.

The IC integration progression below 0.15 µm [150 nm] reduces the size of the IP or circuit foot print but not necessarily the die size of a planar IC because the size and number of I/O [off chip] contacts or bond pads are not affected. This is a frequently occurring condition where the size of a die is said to be bond pad limited, meaning that the size of the die is not reduced proportionately with the reduction of area occupied by the circuitry on the die when fabricated with smaller geometries. The integration of additional off chip circuitry or IP in an effort to reduce I/O count is most often limited by the size of off chip IP that would be included, the inclusion of the IP often increases the net I/O count or makes the circuit design non-manufacturable, or the IP is unavailable except as a separate planar circuit. The VSI invention avoids bond pad limitations because the fine grain vertical interconnections pads are nominally more than 2,000 times smaller than conventional planar IC bond pads. Further, prefabricated IP can be integrated into the VSI component without requiring circuit redesign and there is no practical limit to the amount of off chip circuitry or IP that can be added as separate VSI circuit layers. This aspect of the invention enables the VSI component to achieve an I/O bond pad count that is significantly less than the bond pad count of equivalent planar circuit.

An example of VSI component bond pad reduction is given by taking a set of planar ICs comprising a microprocessor, DSP, one or more ASICs, CPLDs or FPGAs, several SRAMs and CAMs, and some number of SerializerDeserializer circuits which would be mounted and interconnected via a PCB and with less than 200 contact edge connections on the PCB. Fabricating these planar ICs with perhaps a total of as many as 3,000 I/O bond pad connections as VSI circuit layers of a VSI component would result in a single circuit die with approximately 200 of I/O bond pads corresponding to the edge connections required by the PCB upon which the stacked circuit would be mounted, or approximately a more than 10 to 1 reduction in bond pads.

In accordance with the invention it also enables a reduction in the design complexity and numbers of metal horizontal interconnection layers than may be required of a planar IC. The reduction of IC geometry increases the number of transistors that can be fabricated to make a planar IC also increases the wiring complexity and number of wiring layers needed to effect the connections of structures of transistors which take the form of microprocessors, DSPs, memory arrays, register arrays, and IPs of various functions. The continuing integration of more of these circuit structures results in increased circuit design and placement complexity and additional metal horizontal interconnection layers in planar ICs due to the requirement to complete the high numbers of interconnections between the circuit structures and or IP over the surface of the IC. Secondly, the placement of circuit structures is unique to each circuit design causing a repetition of design effort for each planar IC. It is clear that the design complexity of these interconnections layers and the need for additional interconnections are limited today by the number of physical horizontal interconnection layers that can be fabricated. The VSI invention enables the partitioning of the circuit structures of a planar IC to separate circuit layers and a reduction in the number of required horizontal metal interconnection layers with fine grain vertical interconnections. This aspect of the VSI invention has the direct benefits of reduced die size, reduced design complexity from the reduced number of circuit structures per circuit layer and through standardized placement of fine grain vertical interconnections per circuit layer, reduced horizontal interconnection layers per circuit layer due to fewer circuit structures in combination with the use of vertical interconnections, and higher performance through shorter interconnection lengths between circuit structures.

The VSI invention uniquely enables SoC circuitry through the following:
1. The use of different semiconductor processes or technologies per circuit layer.
2. Design control of die size
3. Reduced I/O bond pad count through fine grain vertical interconnections.
4. The use of passive circuitry as one or more circuit layers.
5. The use of MEMS.

One of the objectives of the VSI invention is to enable an increase of information transfer between memory and logic [ASICs, µPs, graphics processors] circuits in both of the fundamental measures of data bandwidth: data line transfer rate and data path width. This disclosure will describe novel methods of making and device implementations for integrating the IC interconnect components of IC sockets, PCBs, PCB connectors and back plane onto stacked logic and memory chips.

In accordance with the invention, closely coupled stacked ICs or VSI components are formed of circuit layers or planar circuits where each circuit layer can be made from an arbitrary and unrestricted choice of circuit device fabrication technology and process to implement active or passive circuit elements or devices. The circuit layers of a VSI component are circuits of 50 µm thickness or less, typically less than 20 µm or as thin as 2 µm, and composed of the layout of single circuit elements or devices or the groupings of various single type circuit elements as Circuit Blocks interconnected by conventional horizontal interconnect means and further connected as required by fine grain vertical interconnections which can be scaled or implemented to dimensions compatible with the horizontal interconnection means used in the fabrication of the individual circuit layers. A VSI IC can be implemented solely with a combination of fine grain vertical interconnections between the various circuit elements or Circuit Blocks on the various circuit layers of VSI component. The VSI component preferred embodiment is implemented with one of several possible yield management methods in combination with fine grain vertical interconnections.

Another aspect of the VSI invention is a method of making memory circuits of widely varying capacity with a predictable yield of greater 95%, resulting in a lower cost per bit than planar memory ICs and with the capability to use customized control logic in the VSI memory component but still achieve the cost benefit normally attributed only to the very high production volumes of fixed memory design circuits such as DRAMs or flash. This aspect of the VSI invention includes implementations not limited to flash, DRAM but also includes SRAM, MRAM, PRAM [Phase-change RAM], dendritic, GMR or other such memory cells.

The width and transmission rate of an off-chip bus determines transmission bandwidth for moving information within a planar IC. Bus widths for conventional planar circuits vary in a range up to 256 signal lines which are intended to match the processor data width or the width of the off-chip cache or memory associated with the processor. The ability of a processor to move information from one memory area to another, to or from large memory I/O buffers associated with I/O processing logic, context state changes of several thousand bytes or the movement of large messages in a communications router are examples of when throughput performance of an IC would be limited by a bus width of 256 or even 512 signal lines. Off-chip connections or I/Os for present planar ICs are limited to less than approximately 2,000 by horizontal interconnect layer density, packaging and power dissipation. VSI fabrication methods enables multiple vertical interconnect off-chip buses of several thousand signal lines each, with a capability of total off-circuit layer I/Os exceeding 100,000, and no more increased power dissipation than if such a bus were an on-chip transmission bus.

The methods of the VSI invention enables the fabrication of a new class of single die ICs which includes without process integration restrictions digital logic, most types of memory, mixed signal circuitry, sensors, passives, and any other type of semiconductor based circuitry and MEMS. The VSI methods are generic in design and fabrication allowing new applications to reach lower manufacturing cost levels without the normally attendant requirement of mass volume production rates.

Another aspect of the VSI invention is the ability to reduce the number of horizontal interconnection layers of an IC layer and or the routing complexity of the horizontal interconnect layers for the implementation of large numbers logic function units and or for the implementation of spare logic circuitry for circuit repair in the event of manufacturing defects or operating life-time circuit failures by arranging the design of logic functions vertically and interconnecting them with fine grain vertical interconnections. Vertical interconnections used in this manner can substitute for horizontal interconnections and allow for much higher levels of interconnection density due to the fine pitch [less than 1 μm], and therefore, small cross-sectional area of the vertical interconnections, the implementation of which is not related to or restricted by the number of horizontal interconnection layers of a circuit layer.

The VSI component or IC can be implemented with internal or external yield management circuitry specific to the layers of a VSI IC but not necessarily used or required for use with all circuit layers or all sub portions of any circuit layer. The VSI IC contains one or more circuit layers with yield management circuitry for specific use with one or more circuit layers of a VSI IC and connected to those circuit layers with fine grain vertical interconnections, and or a combination of fine grain vertical interconnections some of which are common to each circuit layer and unique to each circuit layer of all or a subset of the circuit layers of a VSI IC for implementing an external connection for access to yield management circuitry. The VSI IC can be implemented with a combination of fine grain vertical interconnections some of which are common to each circuit layer and unique to each circuit layer to enable or disable individual circuit elements, Circuit Blocks, various groupings of same or whole circuit layers through voltage supply connections.

Additionally, in accordance with the VSI invention, the fine grain vertical interconnections are used to make connections that test, permanently or temporarily program, configure, reconfigure, repair, dynamically reconfigure, dynamically enable or disable, and power individual or groups of circuit elements or Circuit Blocks of a circuit layer or whole circuit layers from one or more controller circuits on a separate circuit layer or layers internal to a VSI IC, external to a VSI IC or a combination of both. The VSI fine grain vertical interconnections are further used as a means to establish customized connections between circuit elements and Circuit Blocks on different circuit layers. The VSI fine grain vertical interconnections are further used as a means to establish standardized physical circuit layout placement of inter circuit layer I/O contacts on the surfaces of circuit layers for the interchange of circuit layers with the same or different functions from a preexisting inventory of circuit layers. The VSI fine grain vertical interconnections further are used for the functional implementation of arbitrarily wide high performance communication protocols, control and data information transfers, permanent or temporary programming of control and data information between separate circuit layers internal to a VSI IC. The VSI fine grain vertical interconnections are further used as a means to establish physical interconnections for functional communication solely between any single circuit layer or a group of circuit layers and circuitry external to a VSI IC. The VSI fine grain vertical interconnections are further used as a means to establish through circuit design, in addition to the established means of fabrication process control, a reasonable expectation of the percentage yield of a wafer of VSI IC circuits independent of the size in planar circuit area of the VSI IC.

Yield management circuitry is circuitry specific to the enhancement of the correct operation of a VSI IC or the yield of a wafer of VSI IC circuits. The intention of this circuitry is to enable or disable, permanently or temporarily, one or more circuit elements or Circuit Blocks of a circuit layer or layers, or one or more whole circuit layers of a VSI IC circuit. This circuitry may or may not have circuit test capability. This circuitry may be low in complexity such as a circuit for switching signals from external circuitry for enabling or disabling various combinations of circuit elements, Circuit Blocks or circuit layers via pass transistors, fuses or anti-fuses as examples.

In accordance with the VSI invention a yield enhancement can be achieved through circuit structure redundancy or sparing. The implementation of redundant or spare circuitry increases the requirement for horizontal interconnections on a planar circuit above existing interconnection requirements. This in and of itself makes most implementations of yield improvement through redundancy in planar circuits physically impractical. However, there is also additional design complexity. The VSI invention implements yield enhancement through redundant or spare circuit structures placing these structures adjacent each other on the same circuit layer or on separate circuit layers and enabling or disabling them by control circuitry placed on a separate circuit layer and interconnected by fine grain vertical interconnections. The placement of the circuit spares and control circuitry on separate circuit layers eliminates the need to use additional layers of interconnects and reduces design complexity by providing a standardized interconnection means. In this embodiment of the VSI invention, high degrees of redundancy can be implemented without increased layers of interconnection or design complexity.

There is no more important circuit cost parameter than IC yield, even if the cost of fabricating circuit wafers were not significant, a near zero yield still results in a high cost per unit IC before cost considerations for IC packaging testing. IC yield is widely understood to be the percentage of fully working finished circuits from a wafer divided by the total number of die available on the wafer. There are only two ways to make a working IC, one is to fabricate without defect [perfect], and the second, is to "fix" the defective IC. The making of perfect ICs is the preferred goal, rapidly evolving IC fabrication technology makes this an ever challenging goal. However, the smaller the die size [and the more mature the fabrication process] the higher the probability for perfect circuits [1 cm$^2$ seems to be one of those time worn constants of the human universe, once you go beyond it, IC yield drops at a near exponential rate]. This can be seen most clearly in the manufacture of planar DRAMs. High volume production of a DRAM does not begin until the size of the die is less than 90-100 mm$^2$; however, a significant portion of planar DRAM circuits still require defect repair through sparing [redundant substitution] of the defective portion of the DRAM circuit.

If the more silicon used then the lower the circuit yield, what advantage is the VSI invention even if the physical circuit is spread over several layers versus one large planar circuit? The answer is in the novel circuit design architecture enabled by the VSI high density vertical interconnect and small die size. PLD and memory circuits are very regular in their organization and when stacked and organized about a single control layer, naturally lend themselves to defect isolation and circuit reconfiguration to avoid defects. The VSI high density vertical interconnect enables the communications between VSI circuit layers without requiring additional horizontal interconnect metallization layers per VSI circuit layer; fewer planar metallization interconnect layers enhance circuit yield and lower its fabrication cost. With this design method, one VSI circuit layer becomes the Achilles Heel for defects for the whole circuit, so the yield of a 400 mm$^2$ circuit made from ten VSI circuit layers is determined by a single 40 mm$^2$ "control" layer; taking this one step further, making the control layer redundant will boost circuit yield.

The VSI invention for yield enhancement is through the novel application of its high density vertical bus interconnection, and smaller die size with increased circuit density due to shrinking fabrication geometries. Yields of large defect free planar ICs are low to zero with leading edge processes. The yield of large planar ICs is achieved through the use of redundant circuit blocks. This is typical of highly regular circuits like DRAMs, Flash, and PLDs, where such circuits are physically repaired after fabrication by replacing [reconfiguring] defective circuit blocks with redundant or spare circuit blocks by physically modifying the circuit wiring. The VSI vertical bus is effectively "free". This means that the amount of surface area required for a high density vertical bus for as many as 10,000 interconnections is very small and no additional planar interconnect layers are required; even when the vertical buses are fully redundant. This is important because logic chips like μPs are presently approaching 9 and 10 layers of horizontal metal interconnect which leaves little room for horizontal reconfiguration interconnections and buses. Secondly, multiple copies of processing logic blocks [parallelism] are required to provide greater circuit performance, and due to shrinking circuit geometries these logic blocks take less and less area. So, remembering silicon is cheap and one or more copies of a complete logic function will fit on a VSI circuit layer, vertical reconfiguration buses enable a simple design method for VSI circuit repair that is similar in its efficiency to what has been implemented in planar memory ICs. The VSI repair method is dynamic and logical [not static and physical as in planar circuits] reconfiguration of failed circuit logic blocks by reconfiguring or disabling the interconnections to failed circuit blocks through vertical bus connections. This means that 100% circuit redundancy is not necessary and that if a defect develops during the useful life of a circuit, it may be able to reconfigure [repair] itself or achieve a degree of fault tolerant capability.

The VSI invention provides the capability for wafer to wafer alignment that scales with the reducing geometry of the horizontal interconnections of planar semiconductor fabrication processes. Presently available wafer to wafer alignment technology intended for the pre-bonding of wafers supports the use of fine grain vertical interconnection minimum pitch of 2-3 μm which is 8 to 12 times greater than the minimum horizontal interconnect pitch of present state of the art semiconductor processes which have a minimum feature size 150 nm [0.15 μm]. FIG. 8 shows horizontal 81*a*, 81*b* and 81*c* and vertical 82*a*, 82*b* and 83 interconnections with equal spacing pitch. In order for fine grain vertical interconnect to most efficiently integrate with horizontal interconnection processes the vertical interconnection pitch should be approximately equal to or less than the pitch of the last horizontal metal interconnection layer as shown in FIG. 8; the last horizontal interconnection layer may or may not be the VSI bond layer. A similar or compatible scaling of fine grain vertical interconnections enables the efficiency and capacity of VSI IC integration. The fine grain vertical pitch capability of the of the VSI invention can scale with anticipated geometry reductions of horizontal interconnections to a minimum feature size of less than 100 nm and less than 50 nm due to the enabling capability of the VSI wafer and substrate alignment method described herein. The VSI IC fine grain vertical interconnections have the novel and unique advantage of being able to support higher current flows that may be required when stacking such circuitry as multiple high operating frequency microprocessors or analog circuitry. This advantage results from the ability of VSI IC fine grain vertical interconnections 83 to be formed with arbitrarily high cross section aspect ratios in a range such as from 4:1 and exceeding 80:1, and thereby creating a vertical wire between circuit layers with a cross-sectional area large enough to carry more than 100 times the current of horizontal signal wires or approximately the current carried by present 25 μm diameter packaging bond wires. The methods used for making fine grain vertical interconnections with high cross section aspect ratios are the same as those used for making vias on planar ICs.

The VSI invention's capability to achieve wafer to wafer alignment fine grain vertical interconnection contacts of less than 50 to 100 nm pitch, enables a reduction in the number horizontal interconnection layers typically required for global or cross die interconnections. The VSI IC integration density is further increased when fabricated with SOI wafers or wafers with a buried etch stop layer or wafers or substrates made from two or more distinct materials such as Silicon on glass or GaAs on Silicon. This increase in integration results from thinner remaining semiconductor substrate enabling smaller vertical interconnection pitch through the remaining substrate.

The VSI IC integration uniquely enables or enhances the fabrication of a wide range of electronic and MEMS products. The principle results of applying the VSI IC circuit development and manufacturing methods are:
 1. Reduced product design or architecture complexity,
 2. Reduced product development complexity,
 3. Increased technology, process and IP integration,
 4. Reduced manufacturing tooling,
 5. Reduced net circuit power dissipation,
 6. Higher circuit yields, and
 7. Higher overall circuit performance.

VSI IC integration enables the structuring of various circuit function types as one or more circuit layers that can subsequently and arbitrarily be integrated into a final VSI component product. These circuit function types are presently implemented as separate planar circuits. The VSI IC capability to Closely Couple any and all of the numerous wide ranging circuit function types and MEMS devices results in the same operational benefits of an as if planar circuit and or MEMS integration. A partial listing of circuit function or MEMS device types that can be integrated into a VSI IC consists of CAMs [Content Addressable Memories], network specific processing functions, DRAMs, flash, non-volatile memories, DSPs, microprocessors, PLDs, CPLDs, FPGAs, Serdes [serializer deserializer], CCD or CMOS video imaging sensor arrays, and MEMS devices such as DMDs [Digital Micromirror Devices], antennas, micro-gryos, inkjet nozzle arrays, free air inductors, micro switches, IC probes, accelerometers or microphones.

BRIEF DESCRIPTION OF DRAWINGS

The present invention may be further understood from the following description in conjunction with the appended drawings. In the drawing:

FIG. 19E is a top view of a VSI dual function circuit device.

FIG. 19E-AA is a cross section of a VSI dual function circuit device.

FIG. 19E-BB is a cross section of a VSI dual function circuit device.

FIG. 19F1 is a cross section of a Quad-Gate transistor fabrication step.

FIG. 19F2 is a cross section of a Quad-Gate transistor fabrication step.

FIG. 19F3 is a cross section of a Quad-Gate transistor fabrication step.

FIG. 19F4 is a cross section of a Quad-Gate transistor fabrication step.

FIG. 19F5 is a cross section of a Quad-Gate transistor.

FIG. 19G1 is a cross section of a Quad-Gate transistor fabrication step.

FIG. 19G2 is a cross section of a Quad-Gate transistor fabrication step.

FIG. 19G3 is a cross section of a Quad-Gate transistor fabrication step.

FIG. 19G4 is a cross section of a Quad-Gate transistor fabrication step.

FIG. 19G5 is a cross section of a Quad-Gate transistor.

FIG. 21A is a cross section of a VSI optical substrate alignment method.

FIG. 21B is a cross section of a VSI optical substrate alignment method.

FIG. 27 is the diagram of the circuit layer stacking order of a VSI Internet Protocol communication processing IC.

ADDITIONAL ASPECTS AND OBJECTIVES OF THE VSI INVENTION

Figure 1:
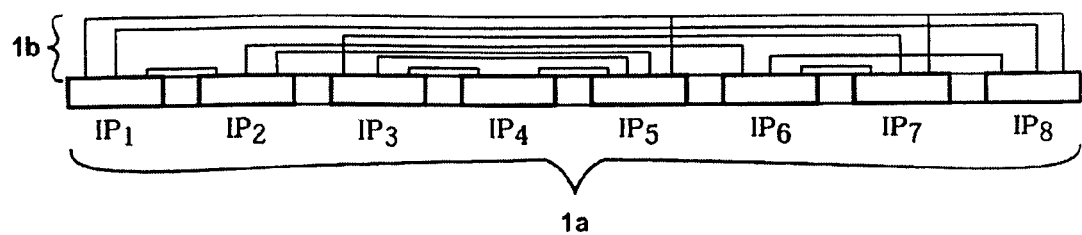
FIG. 1 is a cross section of horizontal interconnections of a planar IC.

It is an aspect and objective of the VSI invention to provide a means for the fabrication of application specific ICs [ASICs] or custom integrated circuits and or Application Specific Standard Product [ASSP] ICs without the present requirement for customized circuit design and layout or fabrication tooling.

It is a further aspect and objective of the VSI invention to provide a means for the integration of electronic, optical and MEMS device types as closely coupled separate device layers as a single data processing system or sub-system component.

It is a further aspect and objective of the VSI invention to provide a method for achieving high yields of VSI components.

It is a further aspect and objective of the VSI invention to provide a means to make electronic or optical components customized for specific applications from previously fabricated device layers.

It is a further aspect and objective of the VSI invention to provide one or more circuit test and configuration control layers connected by fine grain vertical interconnections to improve circuit yield, power dissipation and operational function.

It is a further aspect and objective of the VSI invention to provide a means for design of circuit development platforms for the rapid development of application specific products.

It is a further aspect and objective of the VSI invention to provide a means for the reduction of integrated circuit architectural, design and development complexity. It is a further aspect and objective of the VSI invention to provide a means for the incorporation and reuse of hardware function IP [Intellectual Property] without requiring circuit design changes, synthesis and timing analysis.

It is a further aspect and objective of the VSI invention to provide a means for the alignment of wafer or substrates prior to bonding to an accuracy of less than ±1 µm and less than ±500 nm and less than ±100 nm.

It is a further aspect and objective of the VSI invention to provide a method of VSI device layer fabrication with the use of multiple barrier layers.

It is a further aspect and objective of the VSI invention to provide a method of IC fabrication from a physical circuit library.

It is a further aspect and objective of the VSI invention to provide a method of IC self packaging.

It is a further aspect and objective of the VSI invention to provide a means for generic IC internal testing.

It is a further aspect and objective of the VSI invention to provide a means to eliminate design restrictions on interconnect memory access bandwidth.

It is a further aspect and objective of the VSI invention to provide a means for proscribed maximum interconnect lengths.

It is a further aspect and objective of the VSI invention to provide a means for fabricating ICs with a die size independent of total circuit surface area.

It is a further aspect and objective of the VSI invention to provide a means for IC design with a predictable net circuit yield.

It is a further aspect and objective of the VSI invention to provide a means for integration of incompatible circuit fabrication technologies and processes.

It is a further aspect and objective of the VSI invention to provide a means for reduction or elimination of mask tooling requirements per IC fabrication sequence.

It is a further aspect and objective of the VSI invention to provide a means for reduction of circuit fabrication complexity of large ICs.

It is a further aspect and objective of the VSI invention to provide a means of reduction or elimination of the leakage path between the source and drain of a MOS transistor.

It is a further aspect and objective of the VSI invention to provide a method for making a gate on the backside of the transistor body.

It is a further aspect and objective of the VSI invention to provide a method for making an EEPROM memory cell.

It is a further aspect and objective of the VSI invention to provide a method for making an EEPROM memory cell that is written and erased from the PG and is not programmed through the gate dielectric of the device.

It is a further aspect and objective of the VSI invention to provide a method for making an EEPROM memory cell that can be set to a precise charge value or by a write or erase operation eliminating the need for a full erase operation.

It is a further aspect and objective of the VSI invention to provide a method for making an EEPROM memory cell with a dual programmable gate structure. It is a further aspect and objective of the VSI invention that the processor modules of an array of processor modules can form wireless point-to-point interconnection paths between any and all of the processor modules.

It is a further aspect and objective of the VSI invention to provide a point-to-point wireless communication means between the processor modules of an array of processor modules to enable the processor to operate at approximately their designed performance capacity.

It is a further aspect and objective of the VSI invention to provide a point-to-point wireless communication means between the processor modules of an array of processor modules that reduces the distance, and therefore, the time to transmit information signals or data between any two of the processor modules.

It is a further aspect and objective of the VSI invention to provide a means for changing the position of processor modules of an array of processor modules without interruption of the operation of the array of processor modules providing a high availability or non-stop processing capability.

It is a further aspect and objective of the VSI invention to provide a means that the physical size of an individual processor module of an array of processor modules that is largely independent of the size of the array of processor modules of which it is in, and without diminishing the point-to-point communication capacity between the processor modules of the array of processor modules as the size of the array of processor modules is increased.

DETAILED DESCRIPTION OF THE VSI INVENTION AND PREFERRED EMBODIMENTS

The preferred embodiment of the VSI invention is a method of integration consisting of fabricating a stack of Closely Coupled circuit layers where one or more of the circuit layers are not specifically designed for a specific application or at least the intended application of the final VSI Component into which it is incorporated or fabricated. The VSI invention enables the making of custom components comprising electronic, optical and or MEMS device layers solely from non-application specific device or circuit layers, or a combination of non-application specific and application specific circuit layers. Non-application specific circuit or device layers or grouping of such device layers called a VSI device layer group may be generically referred to as VSI library device layers, wherein these VSI device layers or device layer groups of completed physical circuit designs or fabricated circuits await subsequent intermediate or final integration into a VSI component in the form of unfinished inventory. Such VSI library device layers are novel from the standpoint that they are completed physical designs and no further custom fabrication processing is necessary in order for them to be fabricated into a VSI component with a custom or application specific use; wherein the custom nature of the circuit is derived in part or whole from the choice and quantity of the VSI library device layers selected for an intended application and these selected VSI library layers require no further application specific or custom fabrication tooling or processing in order to be used. Further, the VSI invention can also be comprised of all application specific device or circuit layers without limitation.

The VSI invention can also be implemented as one circuit layer bonded face down onto a substrate wherein the substrate is limited to passive circuitry on its surface and or has no circuitry and is intended to act as a heat sink or both or is intended to act primarily as a supporting substrate to the circuit layer. The circuit layer bonded to the substrate is thinned and vertical interconnections are formed from the face surface or top surface to the backside of the thinned circuit layer. The vertical interconnections are then used to connect additional circuitry such as I/O drivers or ESD isolation that may be fabricated on the backside and or I/O bond or contact pads.

The VSI invention enables greater integration into one die or component than is possible with planar ICs using current sub 0.15 μm lithographic processes, however, the use of this level of integration is only practical if the VSI component yields are economic, and by present consumer market driven standards this means a yield of at least 75% and higher. The VSI invention enables high component yields through the same means as it enables arbitrary levels of integration, and this is to use the increased level of interconnection capability to incorporate reconfiguration circuitry and test or ATE [Automatic Test Equipment] circuitry. There is also the additional unique aspect of VSI yield enhancement and not possible with planar circuitry, this is that large VSI circuits derive their cost effectiveness from the observation that the incremental cost in circuit layer area for reconfiguration control and test or ATE circuitry is more than offset by the reduction in costs of separate testing of numerous planar circuits of VSI circuit equivalents, reduction in the number of sophisticated I/O intensive packages required for the packaged planar circuit equivalent of the VSI circuit layers, reduced power dissipation resulting from the significant reduction in inter package I/O drivers and increased net performance due to the reduced interconnection lengths for VSI circuit layers. A further observation of the integration progression that uniquely benefits the VSI invention is that present IC manufacturing processes continue to reduce IC circuitry costs as a percentage of a finished packaged planar IC cost such that IC circuitry is now less than the combined costs of packaging and testing of the IC circuitry. These aspects of the VSI invention are made clear with the example of a VSI component of 20 circuit layers where four of these layers are reconfiguration and ATE circuitry, wherein a 25% increase in the cost of IC circuitry is offset by a 93.5% reduction in packaging and testing costs, resulting in a net finished IC cost reduction of approximately 20%; wherein the cost of packaging and testing 16 planar circuits is reduced to the cost of packaging and testing one VSI IC and assuming that IC circuitry cost is approximately 50% of a finished packaged planar IC.

The VSI invention further enables the incorporation of ATE and reconfiguration circuitry as circuit layers; wherein the reconfiguration circuitry is used to alter the connections between portions of one or more circuit layers and prevent their use as a result of testing that determines the presents of a defect in said portions of circuitry. The segregated application circuitry of the VSI invention enables these circuit layers to achieve higher levels of utilization of the ATE and or reconfiguration circuitry without consideration of the number of application circuit layers due to the ability to design in a high density of fine grain vertical interconnections wherein the physical placement and small layout area or foot print of the vertical interconnections can be implemented without affecting the design or layout of VSI circuit layers per application usage. There are two primary VSI capabilities that support this result. First the allocation areas for placement of vertical interconnection can be an initial condition of the physical layout of a circuit layer. Secondly, the VSI invention enables the backside fabrication of horizontal interconnection with conventional IC fabrication means, and therefore, vertical interconnections that do not align from one circuit layer to the next can be routed to compensate for a misalignment; this may be the case where there is the intention to reuse a circuit layer designed for a prior VSI application or a second library comprising completed physical designs or fabricated VSI IP [Intellectual Property] circuit layers.

Figure 2A:
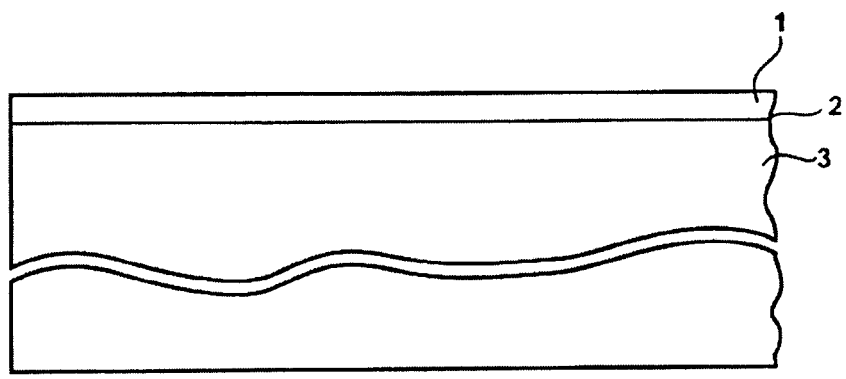
FIG. 2A is a cross section of a two layer VSI IC.

The VSI invention can take a wide range of substrate stacking organizations of electronic, optical and MEMS circuit and device layers. FIGS. 2 through 7 show by example a range of VSI component organizations consisting of two layers up to tens of layers. FIG. 2A shows a minimal VSI component consisting of two bonded substrates 1, 3, an active electronic circuit layer 1 face down bonded with a hermetic seal 2 onto an active, passive electronic or optical circuit layer or a MEMS device layer 3. The lower substrate 3 may also act as a mechanical support and or for thermal dissipation and made from materials such as graphite, Boron Nitride, Aluminum or quartz. The bond 2 between the substrates if made from a process such as a metal thermal diffusion will form a hermetic seal, which may be necessary in certain applications, such as in the case when the lower substrate is an optical circuit layer or MEMS device.

Figure 2B:
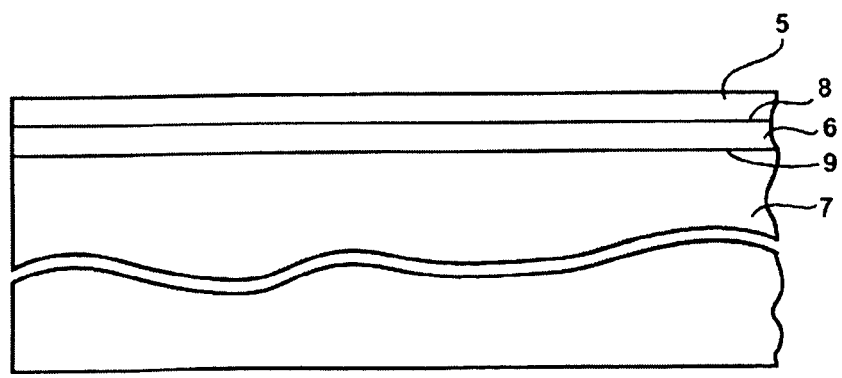
FIG. 2B is a cross section of a three layer VSI IC.

A more complex example of the VSI invention is shown in FIG. 2B which is a cross section of a stack of three VSI circuit or device layers 5, 6, 7. A first layer 5 with passive electronic elements on its top side which is bonded face down or top side down onto the back side of the second layer 6 which is sufficiently thin to allow fine grain vertical interconnections to be formed through the layer 6, and which is bonded face down or top side down onto the top side of the third layer 7. Bonds 8 and 9 between the three layers may be hermetic seals depending on the bond process used. There are no VSI process limitations of what type of circuitry or devices that may be on a layer, for example, the second layer 6 can be an electronic or optical circuit layer with active devices and the third layer 7 can be a passive or active electronic or optical circuit layer, a MEMS device layer or serve a completely mechanical support or thermal dissipation function.

Figure 3:
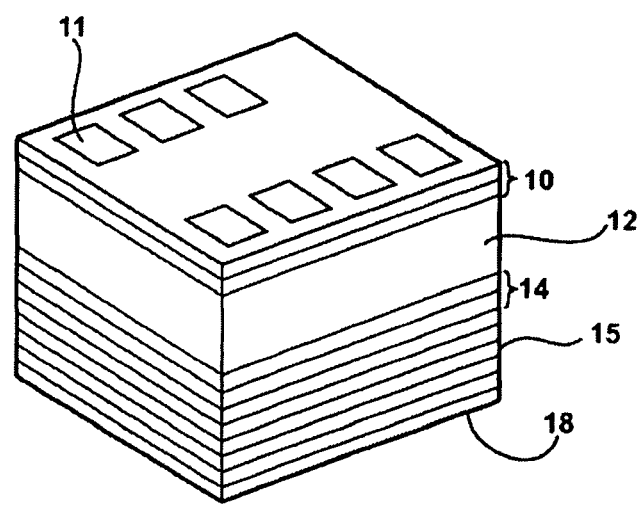
FIG. 3 is a pictorial view of a VSI Application Specific IC with Component MEMS device, CMOS, bipolar and optical circuit layers.
Figure 4:
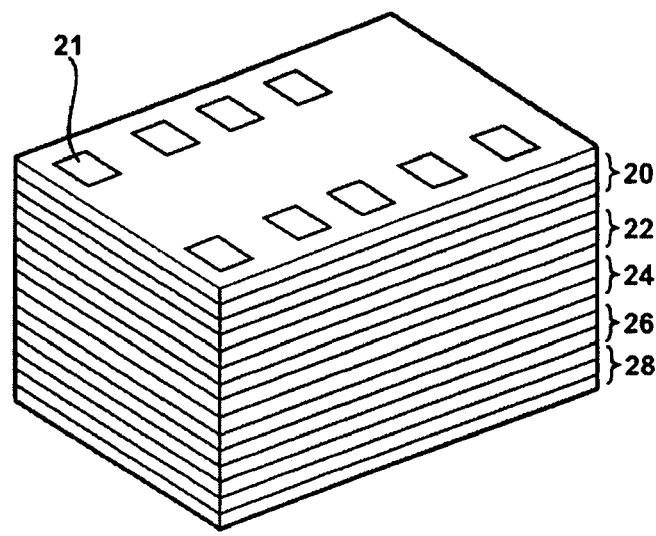
FIG. 4 is a pictorial view of a VSI Non-application Specific IC or Component and Function Layer Groups.
Figure 5:
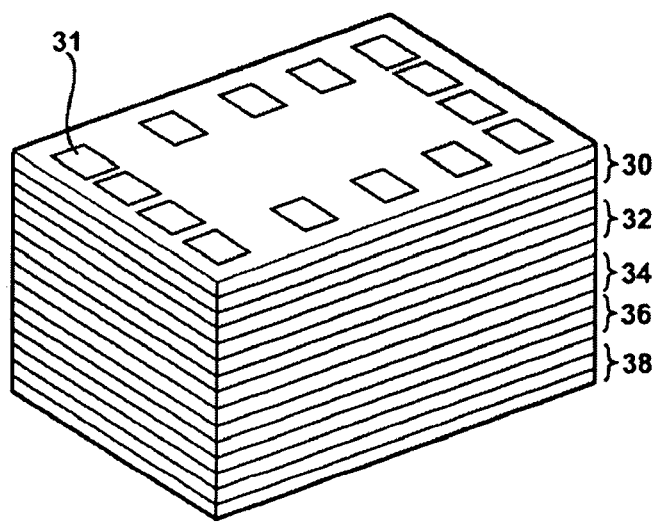
FIG. 5 is a pictorial view of a VSI IC or Component and Application Specific and Non-application Specific Function Layer Groups.

FIG. 3 shows a pictorial view of a VSI component or IC comprising various application specific and non-application specific circuit layers of EEPROM circuit layers 10, MEMS device layer 12 such as a Rf antenna, CMOS logic and µP circuit layers 14, optical circuit layers 15, bipolar power circuit layer 18 and conventional external I/O contact 11 pads; various organized internal vertical interconnections with standardized and non-standardized protocol buses are not shown. FIG. 4 shows a pictorial view of a VSI component or IC comprising all non-application specific circuit layers of non-volatile memory circuit layers 20, DRAM circuit layers 22, FPGA circuit layers 24, configuration and ATE or test circuit layers 26, optical transceiver layers 28 and conventional external I/O contact 21 pads; various organized internal vertical interconnections with standardized and non-standardized protocol buses are not shown. FIG. 5 shows a pictorial view of a VSI component comprising a group 30 of memory circuit layers of several Gbits, a group 32 of microprocessor layers comprising various types, an ATE and reconfiguration 34 circuit layer, a group 36 of FPGA circuit layers, various power regulation and Rf function 38 circuit layer and conventional external I/O contact 31 pads; various organized internal vertical interconnections with standardized and non-standardized protocol buses are not shown.

FIG. 3 and FIG. 4 show self packaged VSI component dice with total thickness of approximately 200 µm and size or area of 50 mm$^2$; the die dimensions or layer structures do not imply limitations on components of the VSI invention. The fine grain vertical interconnections and busing between the layers of these VSI components are not shown, however, cross sectional views of such component layers are shown in other figures herein. Both of these figures use inorganic dielectric or metal thermal diffusion bonding between each layer forming a hermetic seal of the device surfaces of the layers, and therefore, no additional packaging is required such that these VSI components demonstrate the self packaging aspect of the VSI invention.

FIG. 5 shows a self packaged VSI component of conventional planar die IC thickness of less than 500 µm and wherein the memory circuit layer group is not application specific and microprocessor and FPGA circuit layer groups are application specific for operation in a consumer product providing general personal computing capability and internet wireless communications. This VSI component also has internal ATE self test circuitry and sufficient redundant circuitry in fine grain and macro circuit form such that in conjunction with the reconfiguration circuitry, a net circuit yield of greater than 80% is enabled.

Figure 6:
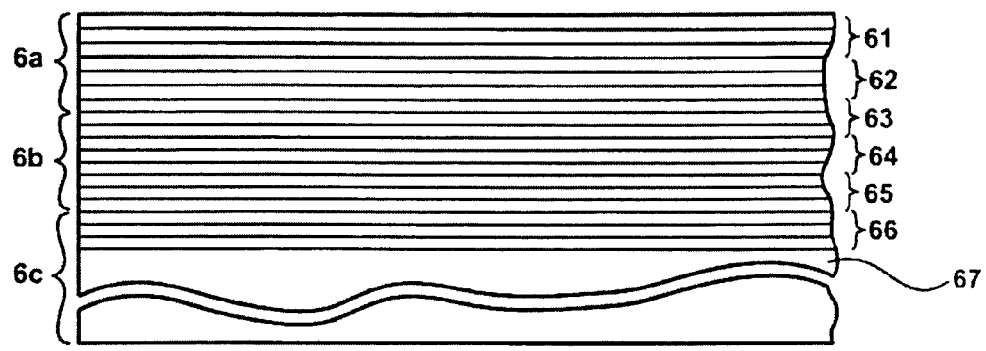
FIG. 6 is a cross section of a VSI IC with test and yield enhancement circuit layers.

FIG. 6 shows in cross-section various groupings of layer types of a VSI component. The purpose of this figure is to show the VSI invention can integrate the variety of electronic, optical and MEMS technologies with a common process of substrate alignment, bond and thinning as appropriate wherein the preferred method of bonding is thermal compression bonding but may include other bond means and the alignment precision is less than ±1 µm and preferably less than 500 nm. The layer groupings are also significant due to the reuse capability of certain VSI circuit layers or groups. Layer group 6c consists of application specific optical circuit layers 66 in combination with a MEMS device layer 67 to form a portion of an optical communication switch. The other layer groups 6a and 6b may not be application specific, but selected from broad non-application specific reusable inventory circuit layers fabricated prior to the initiation of the design of the VSI component of FIG. 6. Circuit layer group 6a consists of subgroups of one or more circuit layers of programmable circuit layers 61, IP 62 and programmable routing interconnections 63. Circuit layer group 6b consists of subgroups of one or more circuit layers of memory 64 and test and reconfiguration logic 65. Not shown but assumed are multiple vertical buses which interconnect one or more layer groups or subgroups and have standardized placements or where placement variances are compensated for by horizontal routing formed by conventional fabrication techniques on the backside of certain circuit layers. FIG. 6 shows a level of electronic, optical and MEMS integration that is not possible with present techniques or technologies. It should also be noted that there is not a planar circuit equivalent for the VSI IC component of FIG. 6 for the fundamental reason that the total circuit area of all of the electronic circuit layers exceed the maximum lithographic circuit fabrication size of planar ICs.

The 6a, 6b circuit layer groupings of FIG. 6 may be placed in reverse order and or one or both of these groupings maybe used more than once in the VSI circuit stack to increase the capacity of the IC as needed. Further, the quantities of circuit layers within each of these groupings may also vary.

Figure 7A:
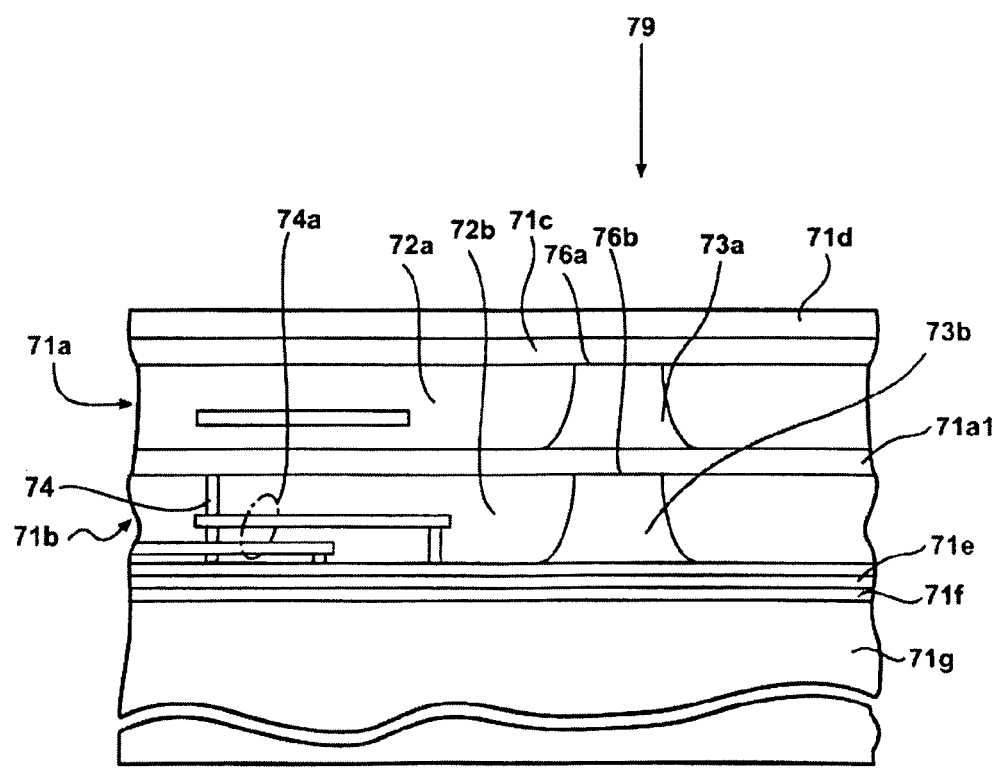
FIG. 7A is a cross section of a VSI IC with MEMS and low-K dielectric cavities.

FIG. 7A is the cross-sectional view of several VSI component layers wherein two of the layers 71a and 71b have internal cavities 72a, 72b. The cavities are supported at the edge of the VSI component die by depositions of either dielectric and or metal 73a, 73b, a portion 73a of which is shown between two overlying VSI components and would be of sufficient width to accommodate the area commonly called the dicing scribe lane 79 where a cut in the VSI substrate stack is made when separating the VSI components or ICs from the substrate stack. The first circuit layer 71a with an internal cavity shown as an optical circuit layer or MEMS device layer to accommodate the structural features of the layer. The second circuit layer 71b with an internal cavity is shown as an electronic circuit layer wherein the horizontal interconnection layers are free standing with a majority of the normally solid dielectric material removed and wherein vertical columns 74 which can act as vertical interconnections and or mechanical support of the cavity, and support for suspended horizontal interconnections 74a. Vertical columns 74 may also act as a means for thermal dissipation from the electronic layer to thermal spreading layer not shown but part of layer 71a1. The layer bonds 76a and 76b adjoining the internal cavities form hermetic seals to preserve the atmosphere of the internal cavities which may be vacuum or partial pressures of an inert gas or a fluid and sealed at the time the bonds are formed. Additional circuit layers or substrates 71c through 71g are also shown. This VSI component once completed can be packaged or used without packaging. Free standing horizontal antennas for Rf transmission and reception can also be formed in this or a similar manner.

The internal cavity 72b with the free standing electronic interconnections of FIG. 7A can be fabricated by selective etch removal of the dielectric that normally would be used to fabricated the horizontal interconnections of the circuit layer 71b, or by using a material in place of the dielectric material that may be more readily removed such as amorphous silicon. The objective of fabricating the free standing interconnections on a circuit layer is to use a fluid such as air as the dielectric separating the free standing interconnection which has a dielectric constant of approximately 1, the lowest possible dielectric constant. The bonding of the face of a circuit layer with free standing horizontal interconnections as part of a VSI IC prevents subsequent damage to these very fragile interconnections, and therefore, the integration of such a circuit layer into a VSI IC is compatible with the VSI invention IC fabrication processing. It should be noted that backside processing of a circuit layer with free standing interconnections 74a is consistent with the backside processing of a circuit layer with dielectric supported interconnections.

Figure 7B:
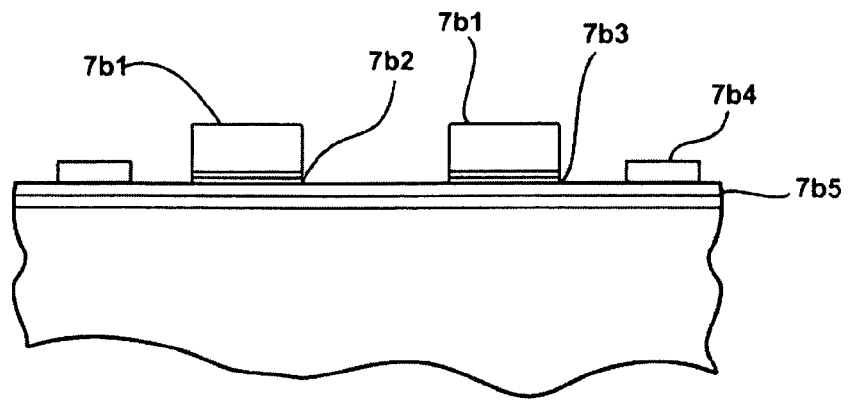
FIG. 7B is a cross section of a VSI IC with VSI die bonded onto a VSI IC.
Figure 7C:
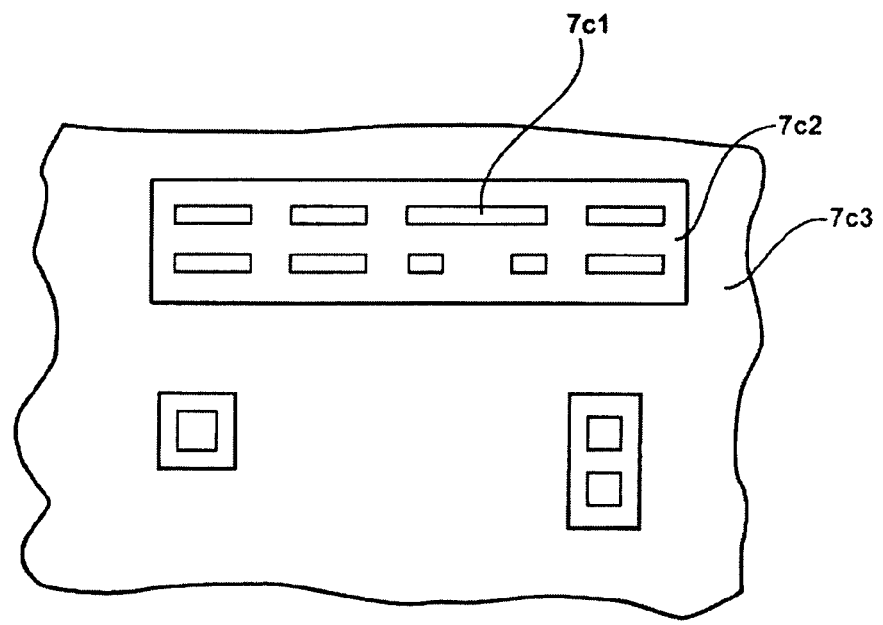
FIG. 7C is a top view of individual vertical interconnection contacts patterned into a bonding layer.

FIG. 7B shows VSI IC circuit layers 7b5 with VSI ICs 7b1 bonded to and forming vertical interconnections at their bond interfaces 7b2, 7b3. The I/O bond pads of the VSI IC are also shown 7b4. The bonding layers above and below the bond interfaces 7b2, 7b3 of the VSI ICs 7b1 are patterned in a manner as shown in FIG. 7C. The bonding layer 7c3 of FIG. 7C is patterned with open areas 7c2 and metal contacts 7c. Vertical interconnections between circuit layers are formed when VSI circuit layers with bonding layers patterned in mirror image are bonded together coupling the isolated metal contacts 7c1 of either bonding layer forming vertical interconnections between the circuit layers.

VSI Bonded Die Assembly Circuit Layer

Figure 7D:
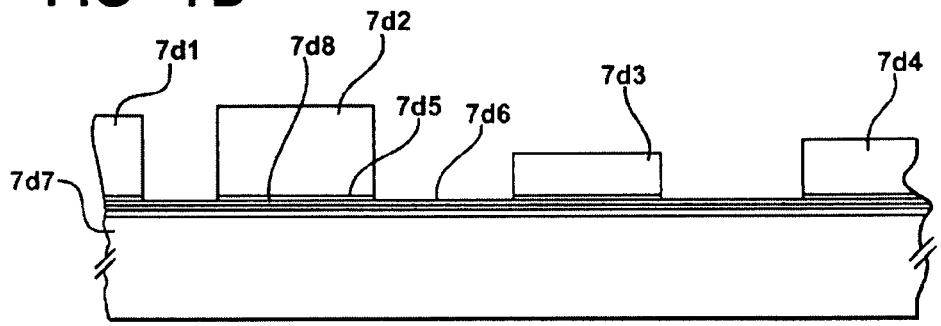
FIG. 7D is a cross section of a VSI wafer stack during fabrication of a bonded die assembly circuit layer.
Figure 7E:
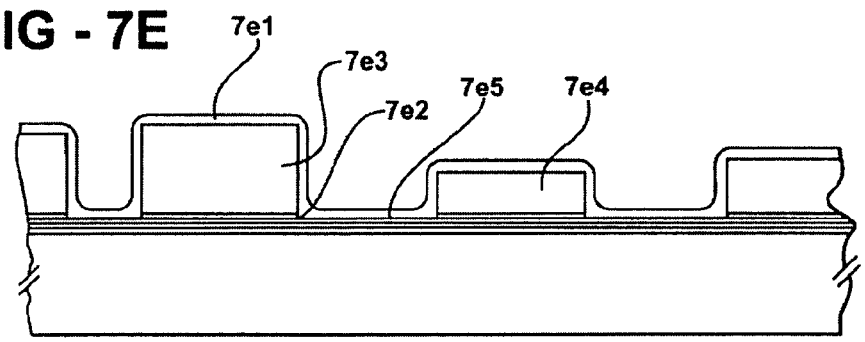
FIG. 7E is a cross section of a VSI wafer stack during fabrication of a bonded die assembly circuit layer.
Figure 7F:
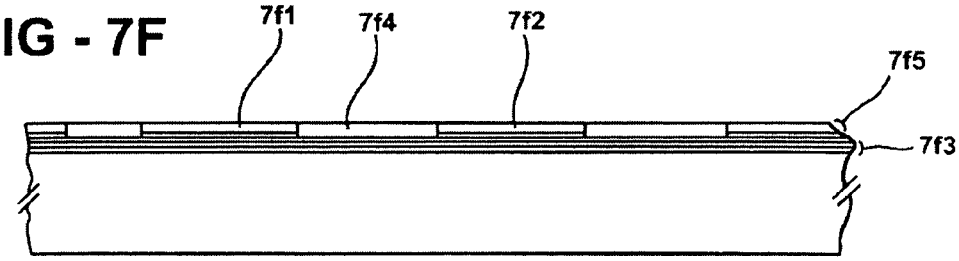
FIG. 7F is a cross section of a VSI wafer stack of a completed bonded die assembly circuit layer as the first VSI circuit layer.
Figure 8:
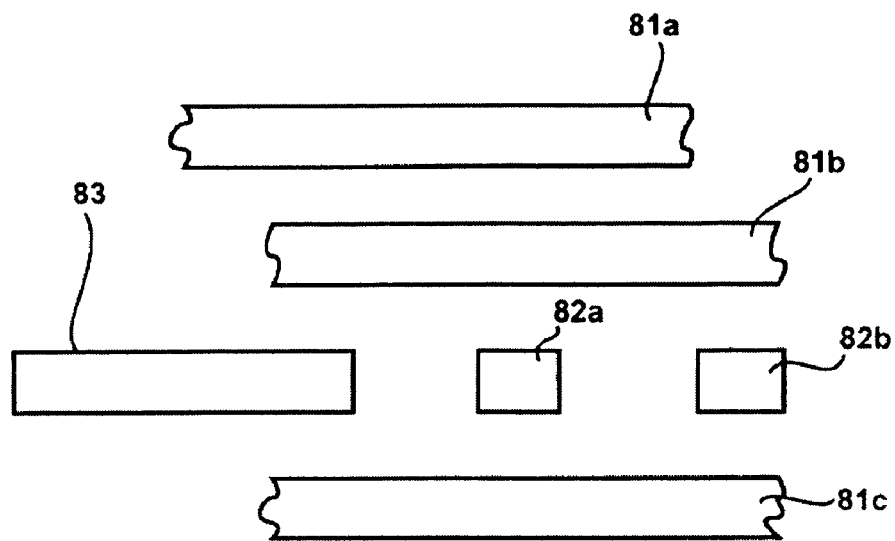
FIG. 8 is a layout view of horizontal and vertical interconnections with equal pitch spacing.

An aspect of the fabrication of a VSI circuit layer is that it can be an assembly of thinned die as shown in FIG. 7F where dice 7f1, 7f2 are shown as thinned to a thickness of less than 50 μm, or less than 25 μm, or less than 15 μm or as in an implementation using substrates with barrier layers such as a SOI substrate to a thickness of less than 10 μm. There are certain circumstances wherein the implementation of VSI circuit layers are more cost effective when formed from an array of die bonded onto a substrate or wafer than from a single substrate or wafer whereon an array of ICs or circuitry is fabricated; an example of such a possible circumstance could be where substrate sizes are not compatible for stacking.

A VSI circuit layer can be formed from a plurality of die 7d1, 7d2, 7d3, 7d4 in FIG. 7D aligned and bonded face down across an array of circuit positions formed on a substrate or wafer or VSI wafer stack 7f3. There may be one or more die aligned and bonded to a given circuit position of the array of circuit positions on the substrate or wafer and these die may vary in size and substrate material or fabrication process. The die bonded onto the substrate or wafer are aligned so that vertical interconnections preferably can be formed with the substrate or wafer to the die as part of the bonding process, although such vertical interconnections to underlying VSI circuit layers 7f3 can also be formed through the backside of the bonded die subsequent to completion of the thinning of the die array assembly; the preferred bonding processing is thermal diffusion bonding implemented with the use of one or more of a number of possible materials as described herein, but it is not limited to this process and could be accomplished with currently available non-metal bonding methods. The bond interface 7d8 bonding the substrate or wafer 7d7 with a bonding layer 7d6 and a die 7d2 with the bonding layer 7d5 of the die is preferably formed with patterned bonding layers 7d6, 7d5 on the surfaces of the substrate or wafer and die 7d2. Such deposited bond layers 7d6, 7d5 are typically less than 2 μm thick and can be thinner than 5,000 Å. The dice 7d1, 7d2, 7d3, 7d4 when first bonded to the substrate or wafer may vary in thickness having thickness values in a nominal range of 100 μm to 600 μm, typical for die cut from a wafer.

FIG. 7E shows bonded die on a substrate or wafer including a conformal deposition of low stress or a controlled stress dielectric 7e1 material such as oxide and or nitride deposited over the surface comprising all of the die 7e3, 7e4 bonded on the surface and on the exposed surface areas of the substrate 7e5. This dielectric deposition passivates each die at its edges 7e2 of the bond contact from the accumulation of particles and contamination or chemical attack during subsequent thinning processing steps. The dielectric may be deposited as one layer or in multiple layers and is preferably deposited to a thickness that is approximately or slightly greater than the final desired thickness for the die assembly 7e3, 7e4 circuit layer nominally by one or more microns. The objective is to deposit a sufficient thickness of dielectric so that the deposited dielectric forms part of a continuous flat surface 7f4 with the backside of all dice 7f1, 7f2 after they are thinned as shown in FIG. 7F. This enables the use of subsequent conventional IC processing steps such as dielectric and metal deposition, RIE and lithography which are necessary for addition of more circuit layers or to form termination bonding pads for I/O contacts for example.

The thinning of the bonded die is preferably done by first grinding until the bonded dice 7f1, 7f2 are level with the deposited dielectric 7f4, thereafter, substrate or wafer polishing, CMP or RIE processing used singularly or in combination can be used to bring the thickness of the die layer assembly 7f5 to the desired final thickness.

The approach to using wafer polishing, CMP and RIE processing techniques can depend upon hardness of the dielectric versus the substrate of the bonded dice. If there is a significant difference in hardness between these materials, then dishing of one material versus the other can occur. This can be avoided for example by adjusting the hardness of the dielectric or in the case where the dielectric is harder than the substrate of the dice, by uniformly selectively etching the dielectric 7f4 through one of the available wet or dry etch processes a few microns or fractions of a micron so it is below the surface of the dice causing the backside of the dice to be above the level of the dielectric so that the dice subsequently can selectively be made planar with and thinned to the thickness of the dielectric by such means as CMP.

The dielectric 7e1 is deposited onto the die following bonding of all of the die and prior to any die thinning processing is the preferred embodiment, because to do so after some amount of thinning of the die will increase difficulty in cleaning the areas between the die from accumulated particles and will leave the areas between the die unprotected from mechanical or chemical affects of the thinning processing methods used. Once the dice have been thinned to the level of the dielectric, measurement of the remaining thickness of the die can also be more easily made by measuring the thickness of the dielectric in the areas between the dice 7/4, since the dielectric does not have any intervening layers that could possibly complicate or prevent simpler thickness measurements. Further, since the original deposition thickness of the dielectric is known it can be monitored for a change in thickness indicating that the final desired thickness of the VSI die assembly circuit layer is being approached.

The deposited dielectric as a filler 7/4 in the areas between the bonded die is more cost effective than using a stenciled material such as another substrate which would be bonded before or after the bonding of the die array assembly. Dielectric in the areas between the bonded die also enables a simpler fabrication of vertical interconnections to the VSI circuit layers below the die assembly layer. VSI circuit layers below the VSI die array assembly layer also can be a VSI die array assembly layer. A VSI die assembly layer can be any layer in a VSI wafer stack and any number of them can be used in a VSI wafer stack. The dice used in a VSI die array assembly layer can be themselves VSI die; this is worth noting because it enables the inclusion of previously fabricated VSI ICs such as those from a VSI physical wafer or substrate circuit library that were designed for the expressed purpose of systematic inclusion as either circuit wafer or substrate components during the fabrication of a wafer stack or as singulated die components to be assembled as a VSI die array assembly layer.

It is also an aspect of the invention that the VSI die assembly circuit layer be fabricated on a substrate or wafer consisting only of an interconnect structure fabricated from one or more layers of metal and dielectric materials forming horizontal interconnections and overlying a release layer as described in U.S. Pat. Nos. 5,354,695 and 5,915,167 and incorporated herein by reference. The substrate or wafer on which the interconnect structure is fabricated can be a sacrificial substrate or wafer should a parting layer not be used, wherein the sacrificial substrate or wafer is sacrificed subsequent to the bonding of the VSI die assembly circuit layer onto a VSI circuit stack. Further, a principal purpose of the interconnect structure of the substrate or wafer that the dice will be bonded is to provide alignment marks for the aligning the dice onto the substrate or wafer during bonding, however, it is not necessary that an interconnection structure be fabricated, but it is necessary that at least the alignment marks be fabricated on the substrate or wafer to effect accurate positioning of the die to be bonded. In this aspect of the invention VSI die assembly circuit layers that are fabricated upon a separate substrate or wafer can be reserved or inventoried for subsequent VSI stacking fabrication as part of a physical VSI circuit layer design library. One example of this aspect of a VSI die assembly circuit layer is quartz substrate upon which a release layer and interconnection structure are fabricated through conventional IC fabrication means, and subsequently, die are bonded and thinned as described herein to form a VSI circuit layer that can be incorporated into a VSI circuit stack at a time when needed and the quartz substrate once released can be reused.

First Preferred Embodiment of the VSI Invention

A first preferred embodiment fabrication method and the devices that result from this fabrication method of the VSI invention is wherein Closely Coupled electronic, optical or MEMS device layers used to form a single integrated device of die form and further each layer used in the fabrication of the Closely Coupled device layers were themselves originally fabricated as non-application specific with respect to the final VSI device in which they were applied. It is an important distinction of this first embodiment that the circuit or device layers used were initially designed with the expectation of being used to form a VSI component, and therefore, each circuit or device layer is designed with the same die or foot print dimensions and conventions for vertical interconnections or busing between various layers are also a part of each circuit or device design, however, the hardwired or physical function of each such circuit or device layer is not designed in anticipation for use in a specific VSI component application.

The resulting VSI component of this first preferred embodiment of the VSI invention allows the VSI component to be fabricated from a library of completed physical circuit designs and or previously fabricated circuit or device substrates which can also be referred to as an inventory of circuit or device substrates that will have a useful inventory life time that may be greater than anyone VSI component or VSI IC for which these substrates are used. This aspect of the capability of the VSI invention is novel for it allows for the first time the fabrication of a planar circuit or IP [Intellectual Property] to be separate from its eventual fabrication in a larger integrated circuit structure. This means that the design, circuit simulation, fabrication tooling set and inventory life time of a fabricated planar [IP] circuit or device layer can be fixed quantities and need not require their obsolescence and recreation for each application design use. This further means that for the more frequent event of design updates or enhancements to an integrated circuit application, that all planar circuits [IP] not physically affect by such will not result in the obsolescence of planar circuit inventory and recreation of a fabrication tooling set for that planar circuit.

VSI library or inventory of completed physical circuit designs and or fabricated circuit layers of the first preferred embodiment of the VSI invention may be a group of circuit layers wherein such layers have interdependent designs. The design of such layers does not necessary affect their use as non-application specific library layers for the reason that the use of the group of layers still has a non-application specific range of use. Examples of such groups of VSI layers are memories [DRAM, EEPROM, MRAM] and FPGAs.

The first preferred embodiment of the VSI invention enables the fabrication of an application specific integrated circuit with varying amounts of logic processing capability such as a varying number of μPs, DSPs or IP, varying amounts of volatile and or non-volatile memory or other distinct memory type such as CAM [Content Addressable Memory], and other capabilities such as optical transceivers or MEMS mass storage without the present and unavoidable requirement of current IC manufacturing to create a new design and layout of the compete integrated circuit, perform circuit simulation and fabricate tooling for the IC and then fabricate the IC. This first preferred embodiment is similar to the well established method of PCB assembly, however, without the well known limitations in that art regarding planar IC packaging, package I/O count, I/O power requirements, I/O signal delay and individual testing of the planar ICs of the PCB prior to the functional testing of the completed PCB. The first preferred embodiment of the VSI invention enables the fabrication of application specific integrated circuits without unique circuit design engineering efforts or unique circuit fabrication tooling.

This first preferred embodiment of the VSI invention may include the use of backside device and interconnection fabrication of Closely Coupled circuit or device layers. Back side processing is used as a means for hardwired circuit corrections of circuit defects to achieve circuit yield enhancement; the implementation of specific logic functions or application specific logic functions; and, interconnection routing where by the bonding pattern used to form vertical interconnections between layers is modified to achieve a specific interconnection design objective or horizontal backside interconnections are modified as a means to achieve a specific routing use of an existing vertical interconnection bonding pattern. The wiring patterns for vertical interconnections of VSI circuit layers are subject to change or there may be several vertical interconnection [bussing] conventions sometimes referred to as interconnection standards, and therefore, existing or inventory VSI circuit layers that are affected by such vertical interconnection differences can avoid obsolescence or have a greater range of application usage with back side interconnection processing changes that bring vertical connection contact patterns of such VSI circuit layers into compliance with the vertical interconnection conventions of the VSI component on which they are being integrated.

This first preferred embodiment of the VSI invention may include the use of through the substrate alignment processes that enable alignment accuracies of less than ±1 µm for the alignment of circuit substrates and or Closely Coupled circuit, device layers when fabricating a VSI component. The greater the alignment precision of the method used to align the VSI component layers, the greater the level of layer to layer circuit integration density is possible in terms of vertical interconnection density and electronic and optical circuit element coupling.

This first preferred embodiment of the VSI invention may include reconfiguration control circuitry used to reconfigure circuitry on one or more other layers of a VSI component and further described herein. This circuitry may exist segregated to a circuit layer or may be integrated with other functions of a circuit layer. The reconfiguration circuitry performs at least two principle functions: first, enabling or disabling the use of some portion of circuitry, and second, enabling how that same portion of circuitry will be used. The reconfiguration control circuitry is enabled through conventional circuit or device means and is interconnected to the circuitry it effects through the fine grain vertical interconnections of the VSI invention.

This first preferred embodiment of the VSI invention may include internal self test circuitry or ATE [Automatic Test Equipment] circuitry used for testing circuitry on one or more circuit layers of a VSI component. The ATE test circuitry is differentiated from internal self test circuitry by the distinction that ATE circuitry is programmable for use over a wide range of electronic and optical circuit types; the inclusion of ATE circuitry capable of being programmed to perform a functional test of all or a portion of an IC is unique to the VSI invention and the inclusion of ATE circuitry is enabled through the fine grain vertical interconnections of the VSI invention. The self test circuitry may exist segregated to a circuit layer or may be integrated with other functions of a circuit layer. The ATE circuitry preferably exists segregated to one or more circuit layers. The self test circuitry or ATE circuitry can be programmed for performing tests from an external or internal source. If self test and ATE circuitry are both present, the self test circuitry preferably can be coordinated in its use by the ATE circuitry. The self test or ATE circuitry, if reconfiguration circuitry is present, is preferably used to determine what circuit defects exist in the reconfiguration circuitry and then in conjunction with the reconfiguration circuitry, various or all portions of the circuitry on other VSI component layers. If reconfiguration circuitry is not completely internal to the VSI component, circuit defects may be isolated from use by external control circuitry that implement interconnection changes such as through the use of fuses or anti-fuses that prevent the use of the portion of a VSI layer with the defect or the whole VSI layer. There may be multiple self test circuits with the intended purposes of providing redundancy should the self test circuit itself be defective, providing application specific test functions such as those tests specific to memory or logic, optical circuit elements and MEMS layers. It is a preferred aspect of the VSI invention that sufficient internal self test circuitry or ATE circuitry be present such that the VSI component is capable of performing all circuit testing required during circuit burn-in processing without the presence of external testing equipment. It is also a preferred aspect of the VSI invention that the VSI component is capable of performing sufficient circuit testing during its useful life in order to determine if a circuit defect is present in either a dynamic or static testing means and to use this information in conjunction with reconfiguration circuitry of the VSI component to avoid the use of defective circuitry with the objective of extending the useful life of the VSI component and avoiding the necessity for physical replacement of the VSI component wherein such efforts may exceed the cost of the VSI component. The inclusion of ATE circuitry into the VSI stack has several further unique advantages such as the capability to match the fabrication technology of the ATE circuitry to the circuitry under test, to perform extended at speed testing for extended periods of time sufficient to determine test coverage approaching or achieving 100% of circuit function, providing a means to determine circuit yields prior to the dicing of the VSI stack into separate die, and to make IC testing transparent to IC design and manufacturing processes. The incorporation of self testing circuitry and or ATE circuitry in combination with the VSI invention enables full functional testing of ICs to be performed in wafer or die form during burn-in processing.

This first preferred embodiment of the VSI invention enables it to be used as a predefined electronic, optical and or MEMS architecture providing a platform for the subsequent development of other hardware platforms. The term platform is presently used to describe a known to work hardware system or subsystem electronic architecture of busing, processors, memory, peripheral and IP [Intellectual Property] blocks implemented as one or a few planar ICs from which in combination with software an expected range of various application products can rapidly be designed and developed. Such planar IC platforms also incorporate various EDA [Electronic Design Automation] tools for their implementation. The limitation that is known to exist with this platform approach to product or application development is that the defined envelope of the architecture does not anticipate all future application requirements and cannot be easily changed once developed as planar ICs with respect to its initial platform design due to the level of design effort results in changes to many hardware functions and or the limitations of the EDA tools that accompanied the platform. Functional enhancements to a platform made with planar ICs does not easily accommodate a requirement to add additional hardware functions such as microprocessor units or IPs. The VSI invention enables the development of hardware platforms that can be enhanced with electronic, optical and MEMS hardware functions through the addition of VSI layers with the desired hardware function. An objective of present planar IC hardware design platform is the ability to reuse a designed hardware function in a series of product applications with only a minimum redesign effort required of the hardware function for achieving its reuse; often this is not the case because the placement and routing demands that result from planar IC design. The VSI invention enables the insertion or removal of hardware functions implemented as a VSI circuit layer without requiring redesign or change of hardware function prior to its subsequent insertion into a VSI application specific platform or product stack. The VSI invention further enables the expectation that design changes can be limited to only vertical interconnection routing changes on circuit backsides in order to integrate a desired hardware function into a platform or platform derived application end user product. VSI hardware platforms are uniquely enabled due the VSI inventions capability to add or remove hardware function device layers without affecting the design or implementation of the other device layers in the VSI platform stack. This capability for adding or removing hardware functions as device or circuit layers also eliminates the development requirement in planar ICs to use various EDA tools to effect the addition of a hardware function or what is often referred to as architectural tuning; wherein the layout of the planar IC is incrementally adjusted to achieve circuit timing closure. Timing closure of a planar circuit nominally requires the effective shortening of horizontal interconnections between hardware functions by hundreds to thousands of microns in length, by signal amplification or slower operation of the IC, the thickness of VSI circuit layers which are nominally less than 25 µm eliminate the possibility that the distance between hardware functions on any two VSI circuit layers will result in a timing closure failure.

This first preferred embodiment of the VSI invention may include the use of self packaging. The self packaging aspect of the VSI invention results from the bonding of all Closely Coupled circuit layers of a VSI component wherein as a result of such bonding the circuitry of all circuit layers is internal to the VSI component and cannot be damaged by mechanical means. Further, if the bond process used for bonding the layers of a VSI component form a hermetic seal, then the VSI component is also hermetically sealed.

Second Preferred Embodiment of VSI Invention

A second preferred embodiment of the VSI invention is the fabrication method of the first embodiment but wherein one or more but not all of the planar circuits or IPs for use as VSI circuit layers are designed for one or more specific applications of a VSI component. This also includes the application specific design of circuitry on the backside of one or more of the Closely Coupled circuit layers whether or not the top side planar circuit is of an application specific design for a VSI component.

Third Preferred Embodiment of the VSI Invention

A third preferred embodiment of the VSI invention is the fabrication method of the first embodiment but wherein all of the planar circuits or IPs for use as VSI circuit layers are designed for one or more specific applications of a VSI component. This third preferred embodiment of the VSI invention is most closely related to what is presently called an ASIC [Application Specific IC] for the reason that all of the VSI circuit layers are designed for a specific application or set of well defined applications. It can also be said that this third embodiment of the VSI invention is related to all production ICs no matter what the intended volume production whether only a few IC parts are fabricated or a high volume of parts are repeatedly fabricated as in the case of embedded microprocessors or the microprocessors used in Personal Computers.

Additional Considerations of the Preferred Embodiment of the VSI Invention

Further, it is a well know that circuit yield is related to the size of a circuit, and therefore, the greater number of layers in a VSI circuit or component, then the lower the expected yield VSI Component. Yield enhancement is a principle characteristic of the VSI invention. The yield enhancement of a VSI Component is implemented by fine grain vertical interconnections used to enable, disable or power circuit devices, groups of circuit devices or circuit blocks, or whole circuit layers by yield enhancement circuitry located on a different circuit layer of the VSI Component or external to the VSI Component. The separation of the yield enhancement circuitry to separate circuit layers allows the enhancement circuitry to be designed and fabricated without affecting the design, fabrication and quantity used of other circuit layers in a VSI Component.

VSI Process Methods

The preferred embodiment of the VSI fabrication process method forms a stacked integrated circuit of closely coupled circuit layers and comprising:
1. Two or more non-application specific or application specific circuit layers, or one or more non-application specific or application specific circuit layers and one or more MEMS layers with vertical data rate transfers equivalent to on circuit or on chip horizontal data rate transfers of planar ICs.
2. Internal or external yield management circuitry with internal yield enhancement configuration circuitry.
3. Interconnection and or device fabrication on the backside of a circuit layer substrate.
4. One or more layers requiring layer to layer alignment of less than ±1 µm, less than ±500 nm and less than ±250 nm.

VSI Substrate Back Side Interconnection

The VSI invention increases interconnect density by enabling an equal amount of horizontal interconnect layers to be fabricated on the backside of a thinned semiconductor IC substrate as presently possible on the front side of the IC substrate. This 2× improvement over conventional interconnection routing density is enabled with the use of conventional interconnection fabrication methods once the semiconductor portion of the IC substrate is sufficiently thinned to a thickness of less than 50 µm and preferably in a range of 0.5 µm to 10 µm for bulk substrates and in a range of 0.010 µm to 10 µm for SOI substrates; these ranges are approximate and not to be considered limitations on the actual thickness that can be achieved. The thinning of the substrate is required to enable low cost vertical interconnect or via fabrication from the front side of the substrate to the back side. The thinning of the substrate or partial thinning can occur before or after bonding of the IC substrate as part of a VSI circuit stack. The IC substrate thinning step is independent of whether it is bonded to a supporting substrate such as a VSI circuit stack if the IC substrate is fabricated with stress controlled dielectric or low stress dielectric materials such that the net stress on the surface of the substrate prior to thinning is less than $8 \times 10^8$ dynes/cm$^2$ [80 Mpa] in accordance with the inventor's U.S. Pat. No. 5,354,695.

The capability for fabrication of similar horizontal interconnect densities on either side of VSI circuit layers enables the a doubling of semiconductor circuit device interconnection density without the requirement of additional geometry scaling of the interconnect [feature size]. Conversely, this also allows the use of larger interconnect geometries with the objective of lowering the number of critical higher cost mask [feature size] layers, but achieving the same or a better routing interconnection density by completing the interconnect on the back side of the IC substrate. The ability to fabricate circuit structures on the back side of an IC substrate is not limited to horizontal interconnections but can also include such circuit structures as back side gates [dual gates], passive circuit elements, circuit references or wave guides.

The VSI invention enables the fabrication or the completion of fabrication of passive and active circuit elements or devices such as resistors, capacitors, inductors, transistors, floating gate transistors, diodes, optical amplifiers, optical wave guides, etc. Backside circuit element fabrication is enabled as a result of the face down bonding of wafer or substrate onto a VSI substrate stack. The backside of the just bonded substrate in now available for circuit fabrication, if the substrate already is of the desired thickness and surface preparation. The substrate, if not already thinned to a desired dimension, is thinned by numerous known process methods and or combinations of same such as grind and polish, plasma etch, RIE, spray wet etching or thinning to a existing barrier layer or etch stop. Once the backside of the just bonded substrate is of desired thickness and surface preparation, most conventional IC fabrication processing techniques can be used that do not exceed VSI stack temperature heating beyond the thermal budget limit of specific materials in the stack. If an inorganic bond material such as copper is used, a CMOS VSI stack processing temperature in a range up to 550° C. could be used. Repeated process step heating of a CMOS VSI stack for example to temperatures beyond 600° C. can result in semiconductor auto-doping. However, such high temperature steps as dopant annealing or activation, source/drain ohmic contact formation or thermal oxidation of silicon can be localized to surface heating effects through the use of excimer laser processing. In the case of backside circuit element fabrication where a high temperature step is required that is beyond the thermal budget of the VSI stack, high temperature surface effect processing which does not heat the lower portions of the VSI stack appreciably can be used to perform such processing. The use of surface effect high temperature processing in combination with VSI backside processing enables the fabrication of most circuit elements or devices which are presently limited to fabrication on a first or top side of a planar circuit substrate.

The backside processing aspect of the VSI invention uniquely enables the fabrication of passive and active circuit elements and MEMS, on the backside of completed circuit substrates or MEMS substrates with the use of conventional semiconductor fabrication equipment. This unique method for circuit or MEMS processing allows for the completion of circuit elements such as dual gate transistor with backside gates, or dual function circuit elements such as a combined transistor and memory cell circuit element further described herein. Further, lower temperature epitaxy deposition or semiconductor poly-crystallization processes in combination with the VSI backside processing enable the fabrication of additional semiconductor material layers for the fabrication of additional active circuit elements such as heterojunction transistors or TFTs [Thin Film Transistors].

VSI Backside Circuit Layer Process

The VSI invention enables the fabrication of interconnection on the backside of a thinned semiconductor substrate or an appropriate carrier substrate like a deposited dielectric such as silicon dioxide, or glass or quartz substrates which could be used in the fabrication of deposited semiconductor circuit devices or elements such as polysilicon transistors. The VSI process method uses SOI substrates or heterojunction semiconductor substrates such as GaAs on Silicon or Silicon on Sapphire to provide a means to precisely terminate or stop the thinning of the backside of such a semiconductor circuit substrate. The VSI process method uses a carrier substrate with a release layer under the deposited semiconductor devices to remove the carrier substrate.

The VSI process enables backside fabrication of electronic or optical circuit devices or elements following the bonding of a circuit substrate and the thinning of the substrate if and as required to allow the formation or completion of vertical interconnections from the front surface or bond layer of the last bonded substrate. The methods for fabrication of electronic or optical circuit devices are the same as those presently used to fabricate such devices on a semiconductor or carrier substrate. This is enabled by the VSI invention when preferably thermal diffusion bonding is used or inorganic bonding processes that can tolerate elevated temperatures from deposition or surface annealing processes by laser or rapid thermal processing.

Figure 9:
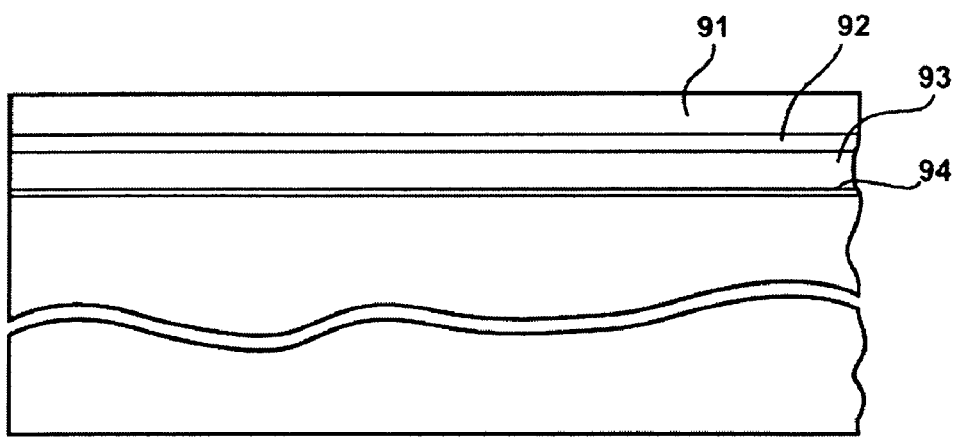
FIG. 9 is a cross section of a VSI double layer SOI substrate.

The use of a dual SOI substrate is another embodiment of the VSI invention for backside electronic and or optical circuit device fabrication. FIG. 9 shows in cross-section a dual SOI substrate with a top or first device layer 91, an isolation buried layer 92, a bottom or second device layer 93 and a thin barrier dielectric layer 94 for termination of the backside substrate thinning process. The two device layers 91 and 93 may have nominal thickness ranging from 50 Å to more than 5,000 Å, the isolation layer 92 may have a thickness ranging from approximately 500 Å to 5,000 Å and the buried dielectric layer 94 may have a thickness of typically less than 500 Å and less than 150 Å. The barrier dielectric layer 94 provides a precision etch stop when thinning the backside of the SOI semiconductor substrate, the etching process can be terminated by the dielectric layer without etching any of the second device layer 93.

The dual SOI substrate is made with conventional oxygen ion implant processing means except instead of only implanting one dielectric layer, this implementation of the VSI process requires the second buried dielectric layer 94, wherein the buried dielectric layer 94 is implanted first followed by the implant of the isolation dielectric layer 92. The dual dielectric implant or buried layer structure in combination with the VSI backside fabrication processing enables a single SOI substrate to be used for fabrication of two distinct layers of electronic or optical devices. The use of other compound semiconductor substrates such as GaAs on Silicon, or InP on Silicon allow the backside of the GaAs or InP semiconductor device layers to be used in a similar manner, however, without the requirement for a dielectric isolation layer because these semiconductor materials are semi-insulating, and therefore, have lower intrinsic conductance. If the compound substrate is formed on a SOI substrate, the buried dielectric layer could be used to form a uniform crystalline device layer on the backside of the substrate.

A primary advantage or benefit of the use of a VSI dual SOI substrate is the reduction in substrate cost, wherein two active circuit layers can be fabricated on one semiconductor substrate. It is also clear that this advantage is provided by compound semiconductor substrates like GaAs on Silicon, however, silicon is presently the most widely used semiconductor substrate material, and therefore, the use of the VSI dual SOI substrate is of unique cost advantage. Some of the unique benefits of the VSI dual SOI substrate is the capability to fabricate a CMOS circuit layer where the NMOS devices of the CMOS layer are on one side of the dielectric isolation layer 92 and PMOS of the CMOS devices are on the opposite side; the same advantage can be used to achieve a complementary Bipolar circuit layer.

VSI Enhanced Diffusion Bonding Processes

The VSI invention enhances metal thermal diffusion bonding of two substrates by combining the primary metal film with one or more secondary metal films, preferably with lower melting temperatures than the primary metal film, with the objective of lowering the temperature and or pressure necessary to achieve a desired bond quality. The use of such secondary metal films also has the objective that with subsequent temperature annealing the secondary metal films will diffuse into the primary metal film resulting in a metal bond layer that has a higher working temperature. The use of the term working temperature means a temperature wherein the physical characteristics of the resulting metal layer are compatible with subsequent fabrication processing steps and sufficient to meet the mechanical and electrical operating requirements of the IC of which it is a part.

Examples of such multiple bonding metal films with copper [Cu] as the primary film are Cu:Sn, Cu:Zn, Cu:Ni:Sn or Cu:Sn:In, but numerous other combinations of metals are also possible such as Al:Sn. In such metal film systems the primary metal film would have a thickness of 2,500 Å to 20,000 Å and a secondary films would have a thickness of typically less than 2,000 Å and preferably about 500 Å. The primary and secondary metal films are preferably deposited sequentially without exposure to atmosphere, such as in the case of sequential sputtering steps in the same sputtering process tool. In this manner a metal oxide is not allowed to form on the surface of an underlying metal film. The metal films as first deposited have their purer form properties, so a properly chosen secondary film with a lower melting temperature and a high solid solubility coefficient or diffusion rate for the primary metal will achieve two goals for enhanced VSI bonding: enable substrate bonding to occur at a lower temperature, and, after subsequent lower temperature thermal annealing of the bonded wafers, allows for the diffusion of the secondary metal film into the primary film wherein the resulting metal layer of diffused metal films has a set of physical properties that more closely resemble those of the primary metal film such as a melting temperature that is higher than the melting temperature of the secondary film, and therefore, a higher working temperature for the metal bond layer resulting from the initial deposited metal films or other physical properties of the primary metal film.

A more explicit example would be a Cu:In set of metal films. The In to In films will form a bond at less than 100° C. with applied mechanical pressure, but the In will diffuse into the Cu metal films on either side of the bonded In films with annealing temperatures in a range of 80° C. to 150° C. or higher wherein the resulting diffused metal film will have a melting temperature that is much greater than the melting temperature of In at approximately 122° C. The resulting benefit of such a combined metal layer is one that retains the higher electrical and thermal conductivity of Cu without requiring the use of bonding temperatures in excess of 350° C. that would be required to form a Cu to Cu bond in a timely manner and without the use of higher mechanical bond process step pressures.

VSI Process Method for Low Power High Bandwidth Data Transfer

The VSI invention enables through vertical integration of two or more circuit layers a low power means for high bandwidth data transfer. The transfer rates through horizontal interconnect metallization on the surface of a conventional IC such a microprocessor presently demonstrate information transfer rates in excess of 32 Gbytes/s. This example is taken from the transfer of information between microprocessor and cache over a 256 bit wide bus with a 250 ps time interval and over signal bus lines of 1 mm [1,000 µm] or greater in length. Using similar information transfer circuitry over a shorter distance of nominally 250 µm or less and a bus path width of 2,048 to 4,096 [this bus path width is consistent with memory array sizes such as in DRAMs], the VSI invention enables a bandwidth transfer rate in excess of 2 Tbytes/s between circuit layers. Conventional IC I/O circuit driver [IC to IC on a common PCB] transfer power is nominally 10 mWatts and greater. The VSI power transfer per serial signal line between circuit layers is nominally less than 1 µWatt. This results in a power transfer dissipation reduction of approximately 1/10,000 less per I/O [vertical interconnections] between VSI circuit layers.

VSI Process Method and Complexity Reduction

The VSI invention is a method for vertical integration of two closely coupled circuit layers, or ICs which are bonded together in a face to face fashion, or a VSI circuit layer and a MEMS device layer. The bonding method is preferably thermal diffusion bonding and the bonding process preferably forms a hermetic seal of the surfaces of the IC circuit layers. A hermetic seal is formed when thermal diffusion bond processing is performed using inorganic metal or dielectric materials. Preferred bonding metals are metals such as Al, Cu, In, Sn, Zn, Ag, Au, and alloys of same. Preferred bonding dielectrics are oxides of silicon and nitrogen, and glasses with glass transition temperatures below 450° C. The circuit layers are interconnected by fine grain vertical interconnections and these interconnections are organized to form at least one bus path or connections for information transfer with a serial line data transfer rate capability of 100 Mbps and preferably greater than 500 Mbps or 1 Gbps, or 5 Gbps using conventional logic circuitry with a vertical separation of typically less than 2 millimeters using no circuitry of a design for transmitting signals distances greater than 10 millimeters. The circuitry used for sending information between the circuit layers on vertical interconnections does not require transmission line structure or specialized circuitry, this is due to the short distance of the vertical interconnection which are nominally less than 250 µm, and therefore, nominally less than a majority of the longer horizontal signal lines typical of a circuit layer or planar ICs in general. The circuit drivers for external I/Os or off IC transmission for both circuit layers are preferably fabricated only as part of one circuit layer. Such external I/O circuit drivers may be fabricated on the backside of anyone of the circuit layers, and the external bond pads of the VSI IC are all formed on the backside of one or both of the external circuit layers.

The VSI invention enables the backside processing of a single circuit layer by bonding a circuit substrate face down onto a second substrate without active circuit elements which serves the purpose of providing such capabilities as mechanical support, thermal dissipation, interconnection structures and or passive circuit elements. This second substrate may be made from a non-semiconductor material such as quartz, graphite, Boron Nitride, Aluminum, NiFe alloys or Mo. After the circuit layer substrate or wafer is bonded to the second substrate it is thinned as necessary, and thereafter, active circuit elements and horizontal interconnections may be fabricated on the backside of the circuit substrate.

The use of the VSI invention with only one circuit layer is its minimal form, with a primary benefit of enabling access to the backside of a circuit layer whereupon conventional semiconductor fabrication processes may be used to form or complete the formation of active circuit elements or horizontal interconnections. An additional substrate may be bonded onto the backside of the circuit wafer in order to form a hermetic seal of the circuit layer's surface, to form a means of mechanical protection of the circuit layer, and thereby, creating a package for the circuit layer.

VSI Process Method and Yield Enhancement

The VSI invention is a method for vertical integration of two or more closely coupled circuit layers and one or more MEMS device layers. The bonding method is preferably thermal diffusion bonding and the bonding process preferably forms a hermetic seal of the surfaces of the IC circuit layers. A hermetic seal is formed when thermal diffusion bond processing is performed using inorganic metal or dielectric materials. Preferred bonding metals are metals such as Al, Cu, In, Sn, Zn, Ag, Au, and alloys of same. Preferred bonding dielectrics are oxides of silicon and nitrogen, and glasses with glass transition temperatures below 450° C. The circuit layers are interconnected by fine grain vertical interconnections and these interconnections are organized to form at least one bus path or connections for information transfer with a serial line data transfer rate capability of 100 Mbps and preferably greater than 500 Mbps or 1 Gbps, or 5 Gbps using conventional logic circuitry with a vertical separation of typically less than 2 mm and without requiring circuitry for transmitting signals distances greater than 10 millimeters. The circuitry used for sending information between the circuit layers on vertical interconnections does not require transmission line structure or specialized circuitry, this is due to the short distance of the vertical interconnection which are nominally less than 250 μm, and therefore, nominally less than an majority of the longer horizontal signal lines typical of the circuit layer or planar ICs in general. The circuit drivers for external I/Os or off IC transmission for both circuit layers are preferably fabricated only as part of one circuit layer. Such external I/O circuit drivers may be fabricated on the backside of anyone of the circuit layers with the external bond pads of the VSI IC formed on the backside of one or both of the two external circuit layers.

Increasing the number of VSI layers will negatively affect the yield of the VSI component or IC in just the same manner as increasing the area of a planar IC. The VSI invention enables yield enhancement through the use of reconfiguration and or test layers. The fine grain vertical interconnections enable the reconfiguration layers to change the interconnection routing on one or more circuit layers when a portion of a circuit layer is determined to be defective. The test circuit layer can be used to determine defective portions of a circuit layer. Test circuitry can be physically external to the VSI component, but it is the preferred embodiment that test circuitry be internal to the VSI component to enable circuit reconfiguration on going during the useful life of the VSI IC. The use of reconfiguration layers, wherein also a redundant reconfiguration circuit layer or a redundant reconfiguration layer may be used to increase its yield, can be the primary yield determinate for the VSI component. This is a VSI yield factoring or VSI IC yield localization wherein the VSI IC yield is determined by a limited number of circuit layers of a VSI IC with a large number of circuit layers. VSI IC yield factoring is when VSI IC yield is determined primarily by the yield of its reconfiguration circuitry, or by the yield of a limited number of circuit layers which enable the yield of a VSI component to be largely determined by the designed use of these circuit layers, examples of VSI yield factor circuits are VSI memory components, VSI PLD components or large logic circuitry VSI ICs with appropriate redundant logic circuitry resources. The yield of VSI components, therefore, can be independent of the total area of all of the circuit layers comprising the VSI component. Further, the yield of an arbitrarily large VSI component or IC can be designed to always have a yield greater than 80%.

The VSI invention enables the fabrication of a circuit layer or a group of circuit layers with a well known yield expectation and wherein their subsequent inclusion in a completed VSI component affects the final VSI IC yield in a predictable and calculable manner that can be determined prior to VSI component fabrication. For example a memory circuit layer group, processor circuit layer group and a FPGA circuit layer group each with their own yield enhancement circuitry can be combined into a VSI component wherein the yield of the VSI component is determined in part by the known yield of each group and not the yield that would be anticipated by independently considering the yield of each circuit layer of the VSI component.

The VSI invention enables the use of 100% circuit redundancy for any circuit type without consideration to the layout of the circuit. The application of full redundancy in planar circuits is limited by the need to provide additional horizontal interconnection routing for redundant circuit sections and a doubling of die size which restricts the area of a planar circuit prior to redundancy circuitry additions to approximately one half the reticle area of present lithography tool which is for most lithography tools less than 3 $cm^2$. The VSI invention does not have either of these limitations. The VSI full redundancy method stacks circuit layers of identical of mirror image layouts that are divided into arbitrary blocks of circuitry that can be isolated through the use of fuse links or by pass transistors if the block is found defective. If a block is found defective, it is isolated and the vertically positioned redundant or spare equivalent circuit block is used. Since both the first block and its redundant spare are vertically position relative to each other there are not routing delay effects induced because the routing length to each block are identical or nearly so. Further, the full reticle of the lithography tool can be used because no planar area need be used for placement of redundant circuitry. And most importantly, the yield of the circuit is improved for the well established reason that whatever the number of partitioned fully redundant blocks in the circuit, yield product of their separate yields will always be higher than the yield of the circuit taken for a planar circuit. For example, a planar circuit of size 4 $cm^2$ in a state-of-the-art technology can be expected to have a yield of less than 25%, whereas the same circuit as a fully redundant VSI IC of eight blocks each with an area of approximately 0.5 $cm^2$ and an approximate yield of 85% would have a VSI circuit yield of approximately 83% or $[1-[1-0.85]^2]^8$. It should be clear that the VSI yield calculation improves with a greater partitioning and is applicable to all planar circuits regardless of physical area if the effective yield cost is less than 50% after inclusion of test and packaging cost which is the case for many state of the art high performance logic circuits, and 32 bit and 64 bit microprocessors with die sizes greater than 2 $cm^2$. This VSI method of yield enhancement also can be extended for use with any number of circuit layers or more than one redundant spare circuit block. An additional advantage of this VSI redundancy method is the design and layout of a circuit layer is much the same as would be the case for a planar circuit but for the incorporation of isolation circuitry associated with each redundant block.

The VSI invention enables yield enhancement by allowing IC processes to be segmented to separate circuit layers of the VSI component. This is distinct from the segmentation by circuit layer of semiconductor technologies such as the use of CMOS on one circuit layer and GaAs, GaN, InP, InSb, or ZnTe on other circuit layers. It is often the case that in the design of large CMOS planar ICs that only a limited portion of the IC requires the use of the most advanced IC process fabrication technology, whereas, the remaining and generally larger portion of the circuit does not. The more advanced IC process will have a lower yield per area than a less advanced process. The result is a reduced yield of the planar IC due to the use of a more advanced IC process over a larger IC area. The VSI invention enables that portion of the planar IC requiring the more advanced IC process to be fabricated as a separate circuit layer and the remaining portion of the circuit to be fabricated on one or more additional circuit layers. An example of this type of VSI yield enhancement is its application on high performance microprocessor wherein more than half of the IC is cache memory. Nine or more horizontal interconnection layers are used in present state of the art microprocessors, however, this interconnect density is need only by the microprocessor or logic portion of circuitry and not the on chip memory. The separation of the logic portion to a separate circuit layer results in limiting the lower yield process to only the logic circuit layer or layers, and allowing the memory portion of the planar microprocessor IC be fabricated with fewer horizontal interconnection layers. The memory portion of the planar microprocessor circuit fabricated as separate circuit layers will then have a higher yield, therefore, resulting in a net higher yield for an equivalent VSI microprocessor component.

VSI Process Method and Power Reduction

In many ICs the most significant source of power dissipation is from I/O driver circuitry required for off die or off chip interconnections. The VSI invention enables the reduction of circuit power dissipation through vertical integration of two circuit layers and by eliminating the need to have conventional I/O driver circuitry to transmit signals between circuit layers. VSI integration reduces the total number of off chip I/Os that would be required if each VSI circuit layer were instead a conventional planar circuit using off chip I/O driver circuitry.

The VSI invention enables power management of various circuit layers and portions of circuit layers of a VSI die through vertical integration of two or more circuit layers by physically placing power control circuitry on one or more circuit layers other than the circuit layers of which power dissipation is to be controlled. The power control circuitry controls power dissipation from circuit layers or portions of circuit layers by switching on or off the voltage supply and or clock signals carried over vertical interconnections from the power control circuitry based on system or application required use of the circuitry on the controlled circuit layers or portions thereof. The separation of the power control circuitry to a separate circuit layer enables the power circuitry to be fabricated from an IC process that is most appropriate for this purpose and vertical routing of power and clock interconnections simpler and shorter than in a planar implementation.

The VSI invention enables transistor leakage reduction through backside fabrication processing of transistor body contacts to achieve a forward body bias in order to increase the transistor threshold voltage [$V_t$] or fabrication of a backside gate or dual gate. The backside processing preferred embodiment uses a buried dielectric layer such as the oxide buried layer of a SOI [Silicon on Insulator] wafer substrate. In the preferred embodiment the buried dielectric can be used as an etch stop for precise thinning of the closely coupled substrate last bonded to the VSI substrate stack. Such controlled thinning allows contacts to be made to the backside of a transistor without affecting the thickness of the transistor body which can be less than 15 nm.

The backside processing enables the placement of contacts where biasing with larger than the power rail can be applied. This allows the off leakage from source to drain regions of the transistor to be reduced or eliminated depending on the applied voltage. Fabrication of additional circuit element structures such as the fabrication of diode junctions by epitaxy means or the fabrication of a floating backside [dual] gate, which can be used to apply a non-volatile or permanent bias to the transistor gate channel, is also enabled.

VSI Process Method and Test & Packaging Cost Reduction

The cost of testing and packaging of high I/O count planar ICs is often far more than the manufacturing cost of IC die of the completed circuit. The VSI invention enables through vertical integration the reduction or elimination of testing and packaging costs by the incorporation of ATE [Automatic Test Equipment] functions as a circuit layer and the packaging of two or more circuit layers eliminating the use of conventional planar IC interconnecting means. Conventional IC interconnection means of planar ICs are IC packages, package carriers or sockets for IC packages, multi-layer PCBs [Printed Circuit Boards] and PCB edge connectors.

Planar ICs are tested with the use of ATE systems which occurs more than once during the manufacturing process of a planar IC. The VSI invention enables the incorporation of ATE functions as a separate circuit layer which places a fixed limit on ATE processing costs no matter how often such tests may be performed for all the layers of a given VSI component and with the fixing of ATE cost at no greater than the cost of one of the VSI component circuit layers plus the pro rata cost per IC of test programming. For example, if a VSI component has five circuit layers and one ATE circuit layer, the cost of test processing is reduced approximately by a factor of five while enabling the performance of testing with additional frequency at no additional testing costs. It is well known that for certain ICs such as high performance microprocessors, longer test times are required to verify the proper functioning of the IC. Further, such internal test capability enables the testing of the VSI component during its useful life.

Planar IC packaging with I/O count in excess of 500 can cost several times the cost of the IC die they enclose. In order to interconnect a number of such packaged planar ICs additional interconnection means such as a PCB and package sockets are additional costs. The VSI invention enables the reduction of the number of packages used to one or none. This is accomplished by the VSI invention, since any number of VSI circuit layers need only require at most one package enclosure. Further, since VSI processing results in the enclosure of all circuit layer surfaces, which can be hermetic, no additional package enclosure may be needed. For example, if a packaged VSI component has five circuit layers, the packaging cost of the five circuit layers is reduced approximately by a factor of five. This cost can be further reduced to near zero, if the inherent self packaging capability of the VSI component is used.

VSI Process Method for Circuit Design and Validation

The VSI invention reduces the complexity of circuit design and validation by enabling an arbitrary division of a planar IC into a number of stacked circuit layers. This has the immediate benefits of simplifying functional and physical design, and validation. IC functional and physical design are simplified when a smaller physical area or size of a circuit layer is used; the partitioning of a large planar IC into several circuit layers allows changes to the functional or physical placement of circuitry on one layer to affect only the circuit layer on which the change is being made. By example, a change in a microprocessor circuit does not result in a physical change to associated planar ICs that it may be connected to on a PCB. IC validation is simplified by fixing the timing analysis of a circuit layer, and the signal timing between circuit sections on various circuit layers through shorter vertical interconnection paths; power distribution is also simplified in the same manner. The VSI invention allows the partitioning or division of a large planar IC enabling the interconnect density of the various partitions to be maintained, the routing distance between circuit divisions to be shortened, and the treatment of each circuit partition or circuit layer in a "black box" fashion, wherein once a circuit layer partition is completed it can be treated as a fixed entity that is not affected by subsequent circuit design changes on other layers. Further, a circuit partition that is physically used multiple times in a planar circuit will vary in design for each one of it uses, whereas as a VSI circuit layer partition has only one design. Present circuit design and validation software tools for planar circuits process the complete planar IC as a single entity resulting in longer processing times and software complexity. The VSI invention enables circuit design and validation to be performed on a circuit layer basis wherein circuit design changes can be considered to have affects limited to the circuit layer on which they occur.

The VSI invention enables a circuit design framework or platform wherein circuit layers of widely varying design and function, process and technology used previously on fabricated circuit designs can be reused in an as is manner as circuit layers for a new IC application. Circuit layers can be fabricated and held as inventory for subsequent insertion into a VSI component application, and therefore, avoiding the need to integrate the circuitry of this circuit layer into each and every new circuit design such as in the design of planar IC. This circuit design aspect of the VSI invention is not available in present circuit design processes. IP [Intellectual Property] in the form of hard circuit design must still be integrated and fabricated a new for each planar circuit application circuit use; the reference to reuse of such IP circuitry is in regards to it physical or logical design and not the reuse of the IP in a second application with the same fabricated circuitry from a first application. This type of VSI design platform simplifies circuit designs by eliminating the design validation complexity of integrating previously designed circuitry or IP for each application circuit and reduces the circuitry to be designed to that uniquely required to implement the desired application. For example, the advantages of the VSI design platform can be seen in applications regarding micro-controllers where microprocessor and memory circuitry are frequently unchanged for each application design and only peripheral circuitry is unique to the application design; a VSI design platform allows the micro-controller and memory circuitry to exist as an inventory of previously fabricated IP layers that does not require a design and validation effort for integration with the application specific peripheral circuitry. Another example of IP of a VSI design platform is tester circuitry. Tester circuit layers for broad classes of applications such as microprocessors, memory or analog can be inserted into a VSI component and programmed for the unique testing requirements of specific circuit layers of the VSI component application. The testing is accomplished through one or more tester specific fine grain vertical busing interconnections common to some number of circuit layers and or circuit layer vertical busing interconnections specific for use by such tester circuitry. A further example of the VSI design platform is the design of a VSI component using a large number of functional circuit units such as DSPs, FPUs, ALUs, MACs, Serdes, various SRAM, DRAM, MRAM memory groups, ECC, etc. as circuit layers and not requiring the design, validation, placement or orientation of the functional blocks with respect to each other as would be required in a planar IC design, while interconnection of these blocks would be through a placement convention for high density fine grain vertical interconnections or busing.

The VSI invention design platform further enables the means for the incorporation of redundant or spare circuitry in much the same manner as in the above examples. Yield of an IC is presently a result of fabrication process and its ability to achieve specific defect densities. The use of design to affect the yield of an IC only has limited specialized use such as in DRAM ICs. A VSI design platform allows selective yield improvement or enhancement per circuit layer. If the yield of a specific circuit layer of a VSI component is for example 25%, if a redundant or spare of that circuit layer is added to the VSI component layers, then the effective yield for that circuit layer [the primary circuit layer or the spare] is enhanced to 44%, and if a second spare is added the effective yield for that circuit layer is enhanced to 58% or $1-[1-0.25]^3$. The benefit of the VSI design platform method for yield enhancement is the low design effort, and simplicity and selectivity for increasing the effective yield of any given circuit layer of a VSI component. This circuit layer specific design approach to VSI component yield enhancement is preferably implemented through the use of signal line bypass transistors and or power bypass to isolate defective or spare circuit layers within the VSI component.

VSI Process Method and Self Packaging and Hermetic Sealing

The VSI invention enables self packaging and hermetic sealing of the circuit die. This is accomplished by the thermal diffusion bonding using thin film depositions of inorganic materials such as aluminum, copper or low temperature glasses to form the bond between circuit layers. Since all IC surfaces of a VSI die can be made to be interior to the circuit layer stack. The I/O pads used to make external connections to the VSI circuit are formed on the backside of the last bonded circuit layer. This is accomplished by making vertical interconnections through the semiconductor substrate of the last circuit layer where the substrate of this circuit layer may be thinned to a thickness of between 15 and 50 µm to provide a thicker separation between the circuitry of the last circuit layer and the bond pads formed on its backside. The vertical interconnections to the bond pads and the bond pads are formed with conventional process means. No additional packaging enclosure is then needed to protect exposed IC surfaces of the VSI circuit resulting in a self packaged condition upon the completion of the fabrication of the VSI die, because none of the VSI circuitry layer surfaces have external expose, as shown in FIG. 3, FIG. 4 & FIG. 5 and FIG. 1 of inventor's U.S. Pat. No. 5,915,167.

The process of bonding the circuit layers of the VSI circuit causes a hermetic seal of the surfaces of the circuit and wherein access to these surfaces is only from their exposed edges. The VSI invention achieves a hermetic seal depending on the type of bonding process used. Thermal diffusion bonding process using inorganic materials achieves a hermetic seal, whereas a bond process using organic materials may not. Since all IC surfaces are interior to the VSI circuit then all of the IC surfaces are sealed and no additional hermetic packaging enclosure is required to create a hermetically sealed environment for the VSI circuit which is always required for planar ICs.

VSI Process Method and I/O Pad ESD Isolation and Distribution

The VSI invention enables substrate isolation and distribution of I/O pads onto a separate circuit layer or the backside of a circuit layer. The placement of I/O pads over or in close proximity to active circuitry in planar ICs creates the opportunity for damage to the underlying circuitry from Electro Static Discharge [ESD]. ESD circuit structures around I/O pads are designed to couple the ESD to the substrate. The placement of I/O pads in a distribution pattern convenient to a packaging method is often incompatible with the placement and routing of the circuitry of a planar IC, therefore, I/O pads of planar ICs are generally located at the edge of the die to allow for fabrication of ESD structures, this often results in what is termed a pad limited die size where the size of the die is increased to accommodate the number of peripheral I/O pads and beyond that needed by the area of circuitry on the die.

ESD isolation of the I/O pad in a VSI die is accomplished without concern of circuitry placement or resulting in I/O pad limited die size because the I/O pads are formed on a separate circuit layer or on the backside of a circuit substrate. Therefore, the fabrication of ESD protection circuit structures and the distribution or placement of I/O pads, does not impact the placement and routing of VSI circuit layer circuitry. The benefit of this aspect of the VSI invention is smaller die size resulting from the removal of the area normally allocated for I/O pads from the circuit layout, and the elimination for nearly all circuit designs with the possibility of a pad limited die size condition.

VSI Process Method and Dielectric of Low K Value Constants

The horizontal circuit interconnections are typically formed in dielectric materials of silicon dioxide, however, the integration progression below 0.15 μm [150 nm] has raised the need for materials with lower dielectric constants than the nominal value of 3.9 provided by silicon dioxide. The fabrication method of the VSI invention enables the use of a vacuum or a fluid dielectric such as dry nitrogen or dry air resulting in a dielectric constant near or equal to unity for horizontal interconnections. This is enabled by a combination of the VSI fabrication process and the removal of the dielectric material or a sacrificial material such as amorphous silicon or low temperature glasses used in place of the dielectric material. FIG. 7A. shows in cross-section free standing vertical and horizontal interconnections 74a in a cavity formed as part of a circuit layer. The VSI fabrication process forms a hermetic seal 76b at the edges of the surfaces of the individual ICs of a circuit layer and or of a wafer or substrate during the bonding process step. During circuit layer fabrication a dielectric margin support 73b is formed along the edge of each IC of the VSI circuit layer, and in the area at the edge of a die when arrayed as part of a substrate which is referred to as the die scribe lane 79; the forming of a hermetic seal does not require additional processing steps, is compatible with the metal interconnect processing steps and is accomplished through the design of the layout of the circuit layer. After the completion of the fabrication of horizontal interconnections and prior to wafer bonding the dielectric or sacrificial material is removed by selective etching or a dissolving solution leaving a free standing structure of horizontal interconnections; similar to some MEMS processing techniques used to make free standing metal structures. This method of forming a low-k dielectric separation between horizontal and portions of vertical interconnections of a circuit layer is herein referred to as VSI low-k dielectric. The free standing horizontal antennas for Rf transmission and reception can also be formed in this manner.

The horizontal interconnection structure remains without collapsing due to the low mass of the interconnection wires [measured in μm grams or less] and the typical use of low tensile stress deposition methods of forming the metal interconnects which are made primarily from aluminum or copper. The free standing interconnect structure is supported at the edge of the die by the dielectric margin of the IC 73b and where also a hermetic seal is formed, and as may be required by the design of the horizontal interconnection layers or IC die size, support columns or posts formed with the interconnection structure as part of the interconnection fabrication process or subsequent to the formation of the interconnection structure but before the removal of the dielectric or sacrificial material. The vertical interconnections of the VSI fabrication process are formed as columns as required over the surface of the circuit layer. Once the circuit layer is bonded on to the VSI circuit substrate stack the free standing interconnect structure is protected from subsequent damage of continued VSI circuit layer processing and when the VSI component is cut from the substrate stack, it can be handled in the same manner as any other VSI component.

A further advantage of the removal of the dielectric material or the VSI low-k dielectric method when such metal interconnection materials such as Cu [copper] are used, is the reduction or elimination of the requirement for a barrier layer about the exterior of the interconnection. It is well known that a barrier layer such as TiN is required to enclose copper interconnections in order to prevent the diffusion of copper atoms in to the dielectric. It is not possible for copper to diffuse through a VSI low-k dielectric material. The elimination of the requirement to form a barrier layer enclosing the interconnections increases the conductivity of the interconnections and reduces the cost of fabrication. The interconnection conductivity is increased as a result of replacement of the barrier layer with additional interconnect material; all present barrier layer materials have lower conductivities than the preferred interconnection material of Cu now used and for circuit geometries of less than 120 nm the barrier layer thickness surrounding the interconnection can occupy more than 10% of the volume of the physical interconnection, and therefore, the combination of the barrier and interconnection material results in a net lower conductivity of the interconnection than if the barrier layer was not present. A cost reduction results from the elimination of the cost in forming the barrier layer.

VSI Process Method for Multiple Path Access to Memory for Error Detection and Correction The VSI invention enables the use of conventional busing structures and memory organization to achieve various error correction methods. When two or more fine grain vertical bus paths to memory are used where the data or control information is transmitted on a separate bus from the error encoding information, the memory array structure does not need to be uniquely designed or structured to accommodate the amount error encoding information as is the case with current memory designs. Two examples of this is parity encoding which adds one bit of error detection information for every eight [8] bits, and ECC which can add two or three additional error detection and correction information bits for every eight bits of information.

This aspect of the VSI invention allows a number of vertical bus paths to memory to be implemented without the need to be designed to support a specific error detection or correction method, but to be designed without accommodation to any specific error detection or correction methods. The error information would be provided by one or more of the available bus paths to memory and programmable processing logic would decide where and when the method to apply if any to determine if information from memory is in error. The benefit of this partitioning of information and error code data of the information, simplifies the design of memory structure, does not require the error detection correction methods to be a fixed capability designed into the memory structure and enables a choice of when to apply a memory error detection correction method for some segment of stored information and which type of method to apply.

VSI MEMS Integration Methods

MEMS [Micro-Electro-Mechanical Systems] can be integrated as one or more layers of a VSI component using the VSI fabrication technology. A MEMS layer can be integrated as a separate layer or as an internal layer of a VSI component or group of VSI circuit layers or incomplete VSI component.

The VSI stacking fabrication processing sequences are sufficient to incorporate the inclusion of MEMS layers with minor or no modification allowing direct interconnection to the various circuit or device layers of a VSI component through fine grain vertical interconnections. There are two preferred VSI component MEMS fabrication sequence embodiments. These are:

[1] MEMS device substrate as the first layer of a VSI component: This sequence is:
  [1.] Bond, preferably by thermal diffusion bonding methods, circuit layer top side down [face side down], this also seals and provides a protective cover of the open surface of the MEMS device.
  [1.2] Thin as necessary circuit layer substrate or wafer and complete fabrication of circuitry and fine grain vertical interconnections on circuit layer backside.
  [1.3] Continue the VSI fabrication stacking sequence. This sequence is the same as that used in completing a VSI component stack or for inclusion of additional MEMS layers as outlined below in the second VSI MEMS fabrication sequence.

[2] MEMS as an internal VSI component layer: This sequence is:
  [2.1] Bond MEMS wafer layer onto an incomplete VSI component substrate or wafer stack. This typically would be done with the MEMS surface side of the wafer as the bonding surface; this seals the MEMS devices and allows subsequent processing of the backside of the MEMS wafer.
  [2.2] Thin as necessary MEMS substrate or wafer and fabricate circuitry and fine grain vertical interconnections as needed.
  [2.3] Continue the VSI fabrication stacking sequence. The MEMS layer may be the last layer of the VSI component or any arbitrary number of additional circuit layers and or MEMS layers may follow.

It should be further noted regarding VSI MEMS fabrication:

[1] Some MEMS substrates cannot be thinned from the backside to allow fabrication of VSI fine grain vertical interconnections. In these cases such MEMS devices would be restricted to being the first or bottom VSI layer so that fine grain vertical interconnections can be originated from the MEMS device surface of the MEMS substrate.

[2] A MEMS device can be fabricated [in situ] as a layer of a VSI component if its processing sequence steps [typically thermal step requirements] do not damage the existing VSI layers. This processing sequence can be implemented by first processing the backside of the substrate onto which the MEMS device is to be subsequently fabricated, wherein circuitry and fine grain vertical interconnections are formed to enable interconnection to and bonding onto a VSI component stack, after substrate bonding, the substrate surface to be used for MEMS device fabrication is available for processing. The processing sequence of the MEMS device will include processing steps to form vertical interconnections from the backside of the MEMS substrate for use by the MEMS device and connection to any additional VSI device layers.

[3] A MEMS device may require placement as the bottom layer of a VSI component but with its device surface [top surface] allowed to face out from the VSI component [into the environment] as may be required by an optical array. This is facilitated first by bonding the MEMS substrate to a temporary substrate with a release layer allowing its removal or a permanent transparent substrate such as glass, quartz or an application compatible substrate. In this manner, the backside of the MEMS substrate can be thinned as needed to allow fabrication of fine grain vertical interconnections and subsequent VSI processing.

The VSI process enables the integration of MEMS devices and a majority of semiconductor electronic or optical circuit types. This is possible because there is no requirement to merge the fabrication processes of the MEMS device and circuitry as would be the case in a planar fabrication that combined MEMS and circuit fabrication. The VSI process separates or segregates the typically incompatible fabrication processes to layers of a VSI component, and thereby avoids this particularly difficult problem. Presently MEMS devices cannot be integrated with state of the art semiconductor circuitry such as CMOS in a single die. The VSI process enables the integration of MEMS devices with semiconductor electronic or optical circuitry into a common or single die.

There are numerous benefits of VSI component MEMS integration, some of these benefits are a generic and simple method for integration of electronic and or optical circuits with a MEMS device, VSI process hermetic seal and self packaging, short wiring interconnections between circuit layers and MEMS device layers of typically less than 0.5 mm to 1 mm, higher analog circuit fidelity and lower noise from short interconnect length, smaller net IC and MEMS footprint size, greater interconnect density and the anticipation of low cost.

VSI Optical Circuit Layer Integration Methods

Optical circuits fabricated with semiconductor processing means can be integrated into a VSI component with the same VSI fabrication processing steps as those used for electronic circuit layers. In the preferred embodiment, optical circuits can be bonded onto a VSI component stack with dielectric or metal thermal diffusion bonding and then thinned as needed to allow fabrication of optical connections on the backside of the optical circuit layer or vertical optical interconnections to other circuit layers.

The switching of optical input signal to optical output signals is now accomplished by converting incoming optical signals from a given optical input to electronic signal to make the determination onto which outgoing optical signal the incoming information from the optical signal should be forwarded or output. This presently involves the use of a number of discrete optical and electronic circuits assembled on a PCB [Printed Circuit Board] or MCM [Multi-Chip Module]. The VSI invention enables the integration of optical and electronic circuits into a single Optical-Electronic [OE] IC or die or Optical-Electronic-Optical [OEO] IC or die.

Such OE or OEO ICs reduce the cost of optical switching applications through reductions in packaging and IC package to IC package interconnection costs. Such OE or OEO ICs improve optical switching performance by coupling the electronic circuitry on layers within distances of microns to either optical input or output means; this reduces the delay time of electronic signals both from between the optical inputs and outputs and electronic circuitry, but also among the numerous electronic circuit means that comprise the electronic processing portion of the VSI OE or OEO IC, such as programmable processors, programmable logic [PLDs] and memory.

The VSI OE or OEO IC structure enables the integration of active and passive optical signal processing components such as modulators, filters, optical sensors and laser diodes, or WDMs as separate VSI layers in the OE IC. Planar optical circuits are increasingly being fabricated on silicon or similarly sized substrates and with processes that are compatible with semiconductor electronic circuit fabrication. The VSI process directly integrates such optical circuit substrates or wafers into a VSI substrate stack or component as long as, at a minimum, the edge surrounding the optical circuit die is sufficient planar for use by one of the VSI substrate or wafer bonding processes.

Figure 10:
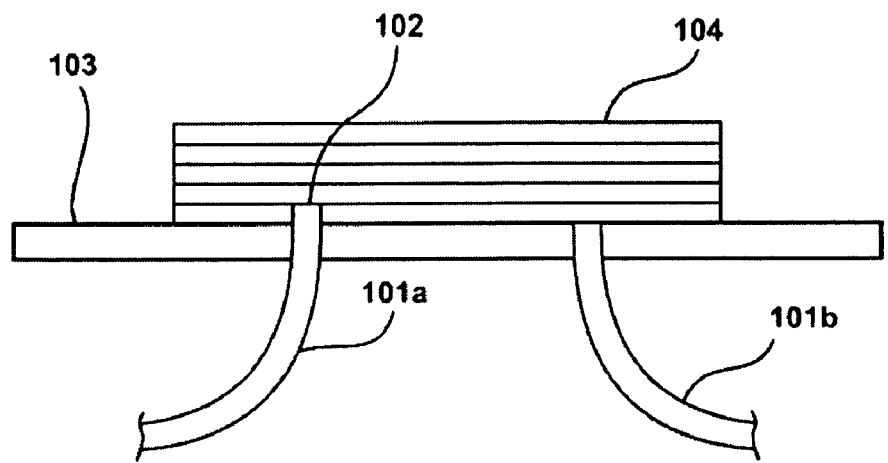
FIG. 10 is a cross section of a VSI IC mounted on a support substrate with optical fiber interconnections.

FIG. 10 shows the integration of an optical circuit layer into a VSI component IC stack 104 which is mounted on a support substrate 103. Optical signals are received by way of an optical fiber connection 101a, 101b passing through and attaching to support substrate 103 and sensed by photodiodes 102 on one or more circuit layers of the VSI component 104 where these optical signals are converted into electronic signals. The optical signals may also be routed between optical circuit layers of the VSI component 104, prior to their conversion to electronic signals, by means of optical planar wave guides and reflective corner mirrors or facets fabricated on an optical and or electronic circuit layer or by means of layer to layer coupling by placing optical waveguides [using voids or dielectric materials with appropriately chosen indices of reflection] into physical proximity as a result of the substrate or wafer bonding process. Electronic signals are converted to optical signals from within the VSI component by laser diodes on one or more circuit layers and routed from the VSI component via planar waveguides on one or more circuit layers terminating into one or more output optical fiber connections.

VSI Ate Method for Internal Self Test

Another embodiment of the VSI invention is the use of self test circuitry as a layer that can be programmed to test one or more logic and or memory type circuit layers of a VSI component. These self test or ATE [Automatic Test Equipment] circuit layer or layers may have many of the design and operating characteristics found in present ATE systems, however, the VSI self test or ATE circuit layers offer fundamental differences in operation and capabilities versus externally applied ATE systems. The VSI self test or ATE circuit layers may rely on or make use of the internal memory layers of the VSI component to store some or all of its test vectors, and can perform its testing procedures of the VSI circuit layers of which it is a part on demand, such as during manufacturing burn-in processing or at anytime during the useful life of the VSI IC or VSI component. The use of the ATE term with respect to a VSI test circuit layer or layers is intended to make clear that such VSI circuit layers are generic programmable VSI circuit layers with as much or more of the test function capability as an ATE system and intended for integration into VSI components for use in testing a broad range of VSI component applications. The test function logic of an ATE system can be integrated as one or two planar ICs, however, at least the requirements for very high throughput resulting in large complex test vector memories and very sophisticated transmission interconnection paths in order to propagate test signals to the DUT [Device Under Test] with matched timing from the ATE to the DUT have prevented the ATE systems from benefiting from advances in IC integration to the same degree as the ICs the ATE systems are intended to test. These limitations or disadvantages do not exist for the VSI ATE logic circuit layers for the following reasons: the use of a smaller internal VSI component memory is sufficient because there is not a high throughput requirement for processing a number of ICs per hour, as with ATE systems [due to the large capital cost of the ATE systems], the internal VSI component memory can be loaded repeatedly with additional test vector data until the desired testing is completed, and therefore, large complex test memories are not need; the VSI ATE interconnections to the other VSI circuit layers are through fine grain vertical interconnections which are too short to create signal propagation timing differences, and therefore, the complex signal transmission interconnect and circuitry are not needed; and further, as a consequence that the VSI ATE circuit layers are closely coupled to the circuit layers of the VSI component, the power requirement of the VSI ATE is nominally 1,000 to 10,000 times less than a ATE system and the number of ATE test contacts, generally referred to in the ATE art as "pins" can be increased by greater use of VSI vertical interconnections with only marginal increases in power dissipation, and most distinguishing versus ATE systems, little or no increase in VSI ATE fabrication cost.

The integration of an ATE circuit layer into a VSI component requires that there is sufficient internal memory to support the operation of the ATE processing logic, and the added cost of the ATE layer for most applications be less than the combined testing costs of the individual device layers that may be included in the circuit design of the VSI component. The inclusion of the ATE circuitry becomes a reasonable consideration in the use of the VSI invention given the rising cost of testing for such complex logic circuitry as microprocessors or network processors where their test costs presently exceeds their fabrication costs, and wherein the duration of present external ATE testing does not provide exhaustive fault coverage of the circuit. The VSI ATE method for IC testing allows a fixed cost of ATE logic usage for whatever duration of testing, this is not the case with current ATE systems because such systems have very high capital costs and this results in a trade-off of test usage costs versus adequate IC test coverage. The cost per VSI component of the VSI ATE method can nominally be estimated as a fixed cost of approximately the cost of one circuit layer of a VSI component, and independent of the duration of testing conducted on the VSI component.

The operation of the ATE circuitry testing program can be loaded under control of external logic or by internal logic of the VSI component under test. The test vectors used by the ATE are loaded into the memory of the IC or VSI component and testing is conducted as needed to complete the desire level of fault coverage for a given device layer or group of device layers. This process is then repeated as needed for the testing of all device layers of the IC including the testing of optical and MEMS device layers. One of the significant differences of the VSI ATE test method versus present external ATE system testing methods is that it enables VSI component or IC testing to be conducted for extended periods of time and at the maximum performance rate of the VSI component in either burn-in facilities or low cost PCB test fixtures, and after assembly in an end use application.

Other manufacturing benefits of internal ATE circuitry in addition to lower circuit test cost are at-speed testing of the IC, testing sufficiency for greater IC fault coverage, no additional IC test handling or requirements for IC bare die or packaged tester interface fixtures. The fabrication process used to make the ATE circuitry can match the state-of-the-art fabrication process used for any of the other electronic circuit layers of the VSI component. The electronics used in current state of the art ATE systems are generally two to three IC generations behind IC state of the art fabrication processes, and therefore, are often insufficient to provide the testing performance capability that IC manufacturers seek, and greater automation of the IC manufacturing process.

VSI Yield Enhancement Methods

The VSI integration process invention incorporates several circuit yield enhancement methods. These methods vary in application but are distinctly enabled through the VSI integration process. The term yield used herein is the percentage of accepted [passed] VSI components or circuit die of the total number of available die per VSI wafer or substrate stack.

The VSI yield enhancement methods of the invention are presented below in an order intended to show that there is a progression of capability of the VSI yield enhancement methods.

VSI Yield Enhancement Method 1, Die Size Reduction

The VSI invention enhances die yield by allowing a large planar circuit die to be partitioned into some number of circuit layers each with the same die size but with a reduced die size versus the original planar circuit. The statistical yield of a VSI die is higher versus the equivalent planar die. This is the due to the existence of the non-linear relationship of yield versus die size. The VSI integration process enables IC fabrication processing to uniquely utilize this non-linear relationship.

As an example, a die of 400 mm² in a current CMOS logic or memory process may have a yield of less than 20% whereas a die of 25 mm² in the same process may have a yield of 96%. The yield of an equivalent VSI component or die made of 16 25 mm² circuit layers is $(0.96)^{16}=0.52$ or 52%. This yield enhancement is a statistical result and in all likelihood is a consequence of IC fabrication processes, but is a yield enhancement result uniquely attributable to the VSI integration process.

VSI Yield Enhancement Method 2, Wafer Tiling Efficiency

The VSI invention enhances die yield per wafer or substrate by allowing the size of a planar die to be reduced by partitioning portions of a planar circuit design onto separate circuit layers to achieve a higher wafer tiling efficiency or a greater number of physical die per wafer or substrate surface area. This increases the total number of dice fabricated per wafer, and therefore, for some percentage yield, a greater number of total good or usable dice.

The VSI dice per wafer yield enhancement quantitatively varies in a range approaching 25% greater die per wafer or substrate and can be shown by the example of a 520 mm² planar die and an equivalent VSI component or die with a size 66 mm² and 8 circuit layers. The 520 mm² planar die will have a wafer tiling efficiency of approximately 74% or 44 die per 200 mm² diameter wafer. The equivalent VSI component or die will have a wafer tiling efficiency of approximately 85% or 400 die per wafer. This results in a net increase of 48 additional die or 14%, or an increase in die per wafer [VSI stack] yield of approximately 14%. If the VSI die size is decreased to 33 mm² there is a net increase of 149 die or an increase in die per wafer [VSI stack] yield of approximately 22%.

The increased number of circuit die per wafer results in increased die per VSI wafer or substrate yield. The reduced die size used in this method of VSI yield enhancement is further improved, and unavoidably benefits, from VSI yield enhancement method 1.

VSI Yield Enhancement Method 3, Process Separation

The VSI invention enhances die yield by allowing the separation or segregation of high complexity processes or technologies which have lower yield to be restricted to a smaller physical size when integrated with high yield processes or technologies. The VSI invention allows the size or physical dimensions of a VSI component or die [not the total area of all circuit layers] to be determined by the maximum amount of circuitry desired per circuit layer rather than the total amount of circuitry to be fabricated onto the die as is the case with planar ICs. The net yield of a VSI component or die per wafer or substrate, therefore, is the combined yield of the separate or segregated circuit layers made with lower complexity processes or a combination of higher and lower complexity processes, as compared to the yield of equivalent planar circuitry requiring the merger of two or more distinct circuit fabrication processes resulting in a more complex process with higher defect density and lower yield. The VSI component or die yield will be always greater because the complexity or defect density per VSI circuit layer is lower resulting in a higher net yield of VSI components. This yield effect of the VSI process can be stated as resulting from a semiconductor industry established fact that the defect density of merged IC fabrication processes are always greater than the defect densities of those IC fabrication processes if utilized separately.

An example of this specific VSI yield enhancement method is the application of the VSI invention to high performance planar microprocessor, communication or graphic processors which incorporate both logic and large amounts of one or more types of memory. Such planar processor circuits are generally designed with a significant percentage of their circuit surface area allocated to memory circuitry. The logic circuitry typically uses a transistor fabrication process that is more complex or significantly different from those used for fabrication of the memory circuitry. The logic circuitry presently may require nine [9] or more horizontal interconnect metallization layers whereas the memory circuitry typically requires less than four [4], and in the case where embedded DRAM memory is used, the logic and memory cells are formed with two different processes. The fabrication yield of the logic circuitry is usually less than that of the memory circuitry due to its greater fabrication complexity, therefore, the combination of two or more distinct fabrication processes increases the total number of process steps required to produce the a planar IC resulting in a lower net circuit yield than if the logic and memory circuitry where fabricated as separate planar circuits. The VSI invention enables the logic and memory circuitry to be fabricated separately and integrated as separate closely coupled circuit layers of the VSI component or die. Therefore, yield of the VSI die is higher than a planar die equivalent because the net yield of the individual and separate logic and memory circuit layers of the VSI die are higher. A further aspect of this yield enhancement method is that it has a lower cost of manufacturing, and therefore, lower net die costs result from both a higher yield and cost savings from manufacturing wafers or substrates with fewer process steps. The following is an example of this VSI yield enhancement method. The percentage logic circuitry of planar die surface area in current high performance microprocessors such as 32-bit and 64-bit circuits with a die size of 200 mm$^2$ is less than 25% with the balance generally given over to memory circuitry. An equivalent VSI component or die of the planar circuit would consist of the logic layer and three memory layers. The estimated yield of the VSI logic layer is 85% and 94% for each VSI memory circuit layer, the estimated yield of this VSI component would be approximately 70% versus an estimated yield for the equivalent planar circuit of 40%.

Another example this specific VSI yield enhancement method is the use of non-silicon fabrication technologies such as GaAs, InP or InSb for logic and CMOS memory. If GaAs is used as the non-silicon semiconductor technology, it is well known that the yield of GaAs is significantly less per unit area than that of digital logic CMOS or for such a CMOS memory as SRAM. Presently there are no commercially produced examples of planar ICs with merged GaAs and CMOS technologies, however, it is reasonable to estimate that the yields of such planar circuits would be significantly less than the yields of their separate GaAs and CMOS circuit portions if fabricated as separate planar circuits. The capability to integrate different semiconductor technologies into a single die would enable the integration GaAs optical transceivers circuitry and digital CMOS, simultaneously improved performance over present discrete IC implementations and at lower cost. The fabrication of different semiconductor based circuits as circuit layers under the VSI process and in combination with VSI backside interconnect fine grain vertical interconnect fabrication means allows wiring connections to be made on the basis of individual circuit elements or devices between the two distinct semiconductor technologies by virtue of the placement of such devices in close proximity either directly above or below each other, and therein, achieve a circuit integration equivalent to planar integration. This method of VSI yield enhancement by circuit layer complexity reduction or separation can be further improved by use of VSI yield enhancement methods 1 and 2.

VSI Yield Enhancement Method 4, Vertical Redundancy

Figure 11A:
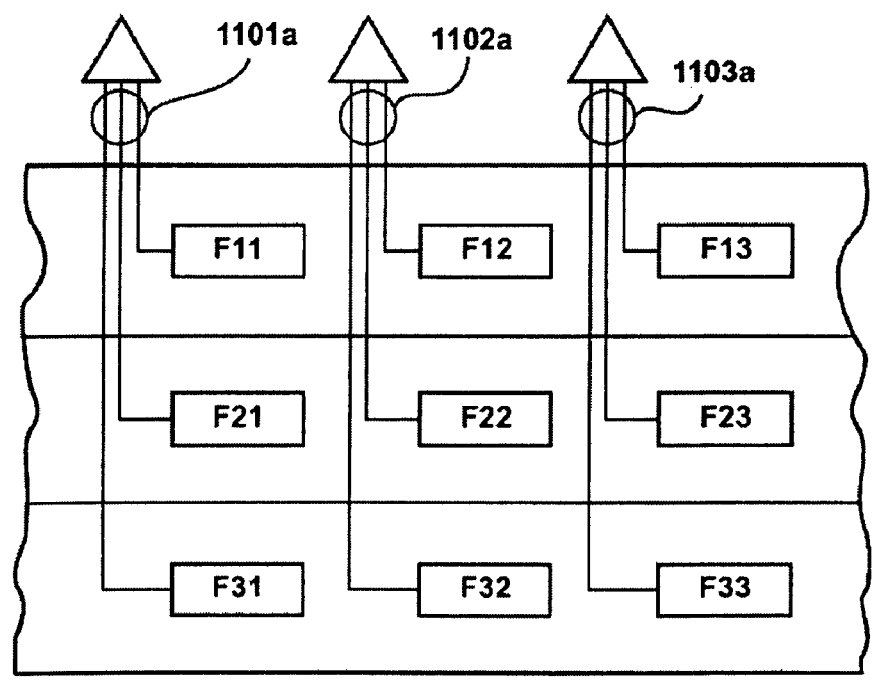
FIG. 11A is a cross section of a VSI IC with use of fine grain vertical interconnection redundancy.

The VSI invention enables yield to be primarily determined by a specific portion of circuitry instead of circuit yield being directly proportional to total surface area of all VSI circuit layers. In this method of the VSI invention, the portion of circuitry affected by a defect is small preferably less than 0.5 mm$^2$ in size. The size is important because when a defect is found the affected area of circuitry or the portion of circuitry that can be isolated and replaced by an identical spare is preferably small. This is VSI fine grain redundancy and allows a circuit to be repaired through the availability of 100% circuit logic redundancy which is structured as shown in FIG. 11A. In FIG. 11A functional unit F11 can be replaced by F21 or F31 which are positioned in close vertical proximity which allows vertical interconnections 1101a to all three units to be of similar length and require a minimum of horizontal interconnection wiring; it should be clear that a planar placement of these same functional units would require wiring lengths that would vary significantly from each unit. Similar wiring length efficiencies are represented by vertical interconnections 1102a and 1103a.

Figure 11B:
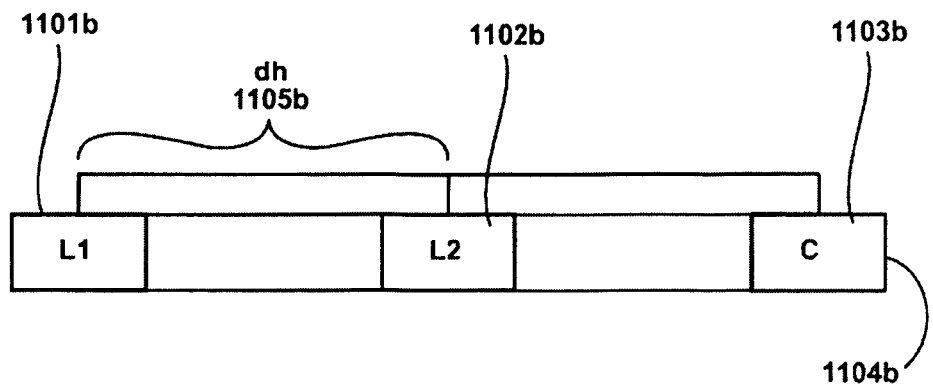
FIG. 11B is a cross section of placement of redundant circuitry on a planar IC.
Figure 11C:
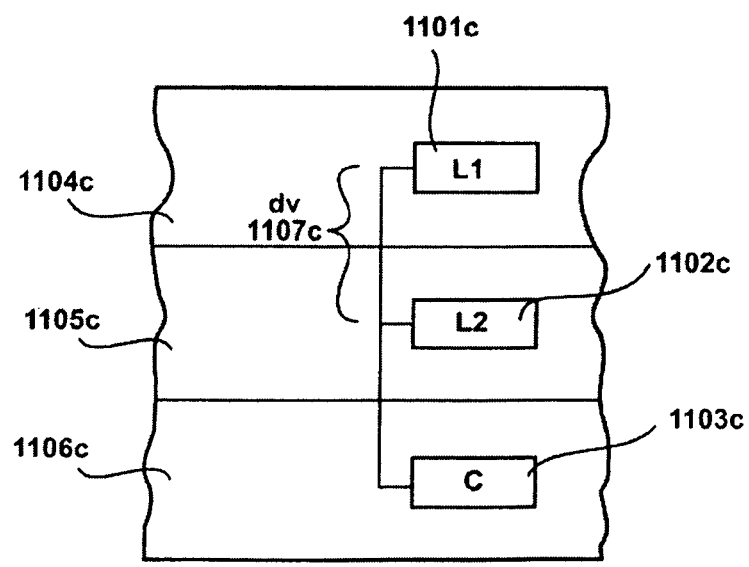
FIG. 11C is a cross section of placement of redundant circuitry in a VSI IC.

FIG. 11B and FIG. 11C contrast the wiring length efficiencies of VSI vertical fine grain interconnections with planar interconnections. FIG. 11B shows in cross section a planar IC 1104b with logic unit 1102b and spare logic unit 1101b which are separated by wiring length dh 1105b. Redundancy control unit 1103b is used to enable the use of either logic unit 1101b or 1102b. FIG. 11C shows in cross section a three VSI circuit layers 1104c, 1105c and 1106c with logic units 1101c, 1102c and spare control logic unit 1103c vertically aligned and positioned on one each of the three circuit layers. Logic units 1101c and 1102c have a vertical wiring length of dv 1107c. The dh 1105b wire length will vary widely because it is dependent upon the placement and size of logic units 1101b, 1102b and any requirements on their placements relative to other logic unit circuitry. It would not be unusual that dh have nominal wiring length values in a range of 500 µm to 2,000 µm. The dv 1107c wire lengths only dependent on the number of vertical layer separations of the logic units 1101c and 1102c which in most cases will be in a range of 10 µm to 20 µm. The wire lengths of dh are nominally 50 to 200 times greater than dv. The wire length variances of dh are significant to the performance of an IC and will cause the circuit timing to be a function of the longest wiring lengths between the logic units, this may cause the timing performance of the circuit to be inadequate. Secondly, the placement of spare circuitry will cause additional wiring lengths between a number if not all of the other logic blocks of a planar IC and again resulting in lower or inadequate circuit performance. It can be easily seen from this comparison that a 100% or 200% VSI circuit redundancy will not affect circuit performance as a result of wiring length delays, and that the use of the VSI method of redundancy is not only transparent to performance but also to the layout or placement of the IP or circuit blocks of a given circuit layer.

The unique difference of this method is that the majority of horizontal wiring layers are on one side of a circuit layer with one or more circuit element or element group spares directly below each primary circuit block that can be replaced if defective. This type of fine grain circuit redundancy nominally results in yields of greater than 99%. The reason for this very high yield is that the portion of circuitry being spared is small enough to have an effective yield of 99.99% and there is at least one [1] available spare to replace it should it be defective providing an effective yield for the primary circuitry and its spare of $1-[1-1-0.9999]^2=99.999999\%$. This yield per configurable circuitry portion enables 90% yields for logic circuit layers of greater than 1,000,000,000 transistors with the assumption that each sparing portion of circuitry has 10 transistors or more and some number of the first horizontal interconnection layers such as the layers generally referred to IC layout art as M1, M2 and or M3.

Selection of the primary or spare circuit portion is accomplished by a row and column orthogonal wiring matrix on the backside of the primary circuit layer or on the spare circuit layer[s] which can select and configure the use of spare circuitry on the spare circuit layer as temporary or permanent. This type of sparing interconnection, allows for the repair of circuitry in a VSI component throughout its useful life. This method of yield enhancement has little if any impact on conventional planar circuit design methods because the spare circuitry is vertically below or above the primary circuitry with fine grain vertical interconnection providing the wiring for enabling the use of the spare circuitry, and therefore, the logical or physical design of any circuit is unaffected. This method lends itself for automation by the physical layout CAD tools used for present planar circuit design because this method does not cause changes to the planar circuitry placement. The CAD tool would insert fine grain vertical interconnection routing to sparing circuitry as a vertical overlay of a circuit design with interconnections for circuit sparing made from the backside of a primary circuit layer.

Fine grain vertical interconnections and pass transistors or fuses/anti-fuses can be used to replace the primary circuitry with the spare circuitry in the event of a defect in the primary circuitry. The efficiency or cost reduction of this VSI invention is provided through its high yield and the ability of the VSI process to integrate identical circuit layers organized in circuit blocks to the horizontal wiring layers of one circuit layer.

Vertical buses are themselves sources of IC defects from fabrication of the vertical bus interconnection or the logic used to interface to the bus vertical interconnections. The area used per circuit layer even for buses with large numbers of wires such as 1024 or 4096 vertical interconnection wires is relatively small. The area required for a bus of 4096 vertical wires with a 2 µm wiring pitch and its drive logic is approximately $0.03 \text{ mm}^2$. It is cost effective to make portions of a bus reconfigurable with spare or redundant logic or wiring portions or to have a fully redundant bus in close proximity to the primary bus.

VSI Yield Enhancement Method 5, Yield Factoring

The yield of memory, PLDs and multiprocessors VSI components or ICs can be determined from the yield of one or two circuit layers, therefore, a yield of 90% or higher can be expected no matter how large the actual circuit area. This method of VSI IC yield enhancement combines the use of circuitry sparing and the incorporation of test and reconfiguration logic.

This VSI invention method for circuit yield improvement combines the use of the VSI fine grain vertical interconnect, the ability to isolate whole circuit layers or arbitrary portions of circuit layers through pass transistors, fuses, anti-fuses or other electronic device, and yield management control, test and reconfiguration logic. The VSI fine grain vertical interconnect requires little surface area for implementation of large number interconnections on a circuit layer and typically no additional horizontal interconnect layers are needed in order to connect yield management control logic which resides preferably on one of the layers of the VSI component or can be partially external to the VSI component.

The VSI yield methods are uniquely enabled by the novel aspect of fine grain vertical interconnect that provides significantly greater densities of circuit interconnections than possible with horizontal interconnect and without additional process complexity. This VSI yield enhancement method requires a greater level of interconnect than can be provided by horizontal interconnect at present with 8 to 9 layers or even the 14-16 layers anticipated in the future. This aspect of fine grain vertical interconnect is demonstrated when considering that fine grain vertical interconnections implemented with a 2 µm pitch enables an interconnect density of 250,000 interconnections per $1 \text{ mm}^2$ or the equivalent of 125 horizontal interconnect layers of 0.25 µm pitch over an area 1 mm wide.

This VSI yield method achieves yield improvement by partitioning a VSI component by circuit layer, Circuit Block of a circuit layer or a circuit element of a circuit layer that is vertically interconnected to one or more spare circuit equivalents. Such spares are enabled by yield management control logic. The yield management control logic typically on a separate circuit layer. The yield management control logic uses self test circuitry or internal VSI ATE [Automatic Test Equipment] circuitry to determine the presents of a defective circuit layer, Circuit Block or circuit element. If a defect is found by the internal test circuitry, the yield management control circuitry uses reconfiguration circuitry to disable the defective circuit layer, Circuit Block or circuit element and enable spare circuitry replacement.

This VSI method of yield enhancement is efficient for the following reasons:

1. Multiple circuit spares can be placed vertical association or proximity to a primary circuit.
2. Vertical interconnection density is able to meet the interconnection density required by circuit sparing.
3. Conventional circuit layout techniques can be used since circuit spares are on separate circuit layers.
4. Internal yield management control circuitry, self test or VSI ATE circuitry, and reconfiguration circuitry can be generic or non-specific to the application circuitry it is embedded with in the VSI component. This circuitry can exist on inventory or pre existing VSI circuit wafers or substrates for immediate use and do not require circuit design layout for integration into the application circuitry.

This VSI yield method is not restricted to die size since yield is dependent on sections of circuitry of a circuit layer or Circuit Blocks that have a surface area that is smaller than the circuit layer or die. However, the use of a die size of less than $200 \text{ mm}^2$ and preferably $50 \text{ mm}^2$ or less, reduces the fabrication horizontal interconnection complexity of a circuit layer, and therefore, the likelihood that a circuit defect will occur on a specific circuit layer and less so per Circuit Block. The reduced fabrication complexity results from few active Circuit Blocks types, and therefore, typically a reduced number of horizontal interconnect layers. The die yield model for planar circuits resulting from the established and traditional semiconductor fabrication process quality enhancement methods is directly related to die size. This VSI yield method uses the established planar fabrication yield method benefits for smaller die or Circuit Blocks in combination with fine grain vertical interconnect to achieve higher yields for VSI circuits by raising the expected yield per layer than would be possible if the separate VSI circuit layers were made as one planar circuit. The VSI small die size yield enhancement method benefit is more clearly seen when considering semiconductor technologies or processes that when merged on a common substrate [versus implemented separately as VSI circuit layers] are known to have lower yields such as in the case of merged GaAs and CMOS technologies or digital CMOS and DRAM memory cells.

The yield management enhancement circuitry isolates a whole VSI circuit layer, portion or portions of a circuit layer from the operation of the total circuit. It also can enable the operation of a whole circuit layer, portion or portions of a circuit layer for operation with the total circuit. There can be multiple yield management control logic units which are specialized to work with various circuit types such as DRAM, Flash, PLD, analog circuit arrays, passive circuit arrays, MEMS, microprocessors, network custom processors, etc.

The VSI yield method is independent of die size. This is to say that with sufficient spare or replacement circuit portions, and or sufficient redundant circuit layers, the die size can approach the size of a complete wafer for such applications as full wafer circuit test and burn-in [a MEMS application wherein micro-probe points are integrated on the surface of a VSI wafer stack].

VSI Wireless Interconnection Array and Applications

Semiconductor fabrication methods are expected to reduce the cost of planar integration of 10 billion transistors per $cm^2$ to less than a few dollars within the not too distant future. The availability of such large quantities of low cost transistors provides the opportunity for implementing information processing electronic subsystems or equipment solutions by using increasing amounts of parallel circuit functions. What has been and continues to be a clear limitation on the use of such large numbers of transistors is the ability of current planar IC fabrication technology to provide sufficient interconnection density of these transistors. The interconnection requirements of an array [n by m] of transistors as the quantities [n] and [m] become very large increase in an exponential manner resulting in the use of greater numbers of interconnection metallization levels or methods that compromise or trade lower interconnect performance for fewer metallization levels. The cost and technology limitations of greater numbers of interconnection metallization levels will result in lower utilization of future lower cost transistors, and therefore, the potential benefits to be gained from these transistors are reduced or potentially eliminated.

Circuit layer stacking as shown by the VSI invention has a first enabling benefit of increasing the number of interconnections or interconnection density between any two IC layers while simultaneously lowering the net cost of achieving greater interconnection density through the use of various well established semiconductor fabrication methods. The VSI invention provides greater interconnection metallization density through interconnect metallization scaling through the arbitrary addition of three dimensional [k by n by m] circuitry which is independent of the fabrication process used for making any one of several possible circuit layers of the VSI IC. This thereby increases the planar [n by m] interconnection metallization limitations by [k] times. The VSI method for increasing interconnection density increases the utilization of future lower cost transistors, and therefore, the benefits that can be gained from these lower cost transistors.

When an IC is packaged similar interconnection limitations return. When a VSI IC or conventional planar IC is packaged and there is a requirement for forming large numbers of I/O connections between packaged ICs, the IC designer is no longer able to take advantage of semiconductor fabrication cost reduction advantages. This is an obvious problem currently seen where packages in excess of 600 I/O connections can cost far more than the ICs they contain, and reduce the potential performance while increasing the operating power requirements of the interconnected collection of such ICs. Once again, for large numbers of interconnections between separated VSI ICs, similarly stacked ICs or planar ICs, a solution for the problem of reducing the cost and performance disadvantages of the high density physical I/O interconnections between ICs bare or package is needed.

Large computational or communication switching equipment or systems are presently assembled using planar IC and PCB [Printed Circuit Board] technologies. These systems use numerous microprocessor ICs that operate in parallel and in conjunction with other ICs such as memory ICs to achieve an intended performance capacity. These systems are typically assembled from a number of PCBs wherein a PCB has mounted on it one or more microprocessors or processors and associated support ICs such as application specific logic ICs, memory ICs and bus I/O or interconnection ICs and may be generically referred to in industry as processor PCBs or processor modules. These processor modules are then typically plugged into another PCB often called a backplane which provides one or more wired interconnection paths between all the processor modules; in addition, there may be cabling connections between the processor modules to improve the data access and transfer rate between processor modules; such cabling may take the form of a bundle of copper transmission wires or one or more fiber optic transmission lines. A PCB backplane interconnection is often a shared or multiplexed interconnection resource of the processor modules plugged into it, and cabling is used to connect two processor modules [point to point] or small number of processor modules that are part of a larger assembly of processor modules. All of the backplane or cabling interconnection methods presently in use in such systems, due to their physical structure or size, are not practical or are impossible for use in making high numbers of point-to-point connections per processor module, and further, to the extent that they are used result in a significant increase in the overall physical size or volume of the system. It is because of the physical or mechanical limitations inherent in the wired interconnection methods used for interconnecting processor modules that systems of processor modules are organized in groups of processor modules that are in some fashion closely coupled or interconnected and wherein the number of processor modules in a group is typically less than 32. Groups of processors are loosely coupled or interconnected by cabling to make data processing or supercomputer systems consisting of more than the number of processor modules that may be in a group of processor modules.

An example of such a data processing system is a current IBM supercomputer of 1,408 processors consisting of 44 groups of processors wherein each group contained 32 processors; computational systems like this IBM supercomputer presently cost in the hundreds of millions of dollars even though the microprocessor and memory ICs comprising a majority of the data processing related ICs in their assembly amount to less than 1% of their cost. The majority of the physical costs of such large computational and communication systems are accounted for by the costs of their PCB and cabling interconnections and not the semiconductor ICs. This disparate distribution of the material costs of the system has the result, which is well known to those skilled in the art of designing large multiple processor computational systems, like the above referenced IBM super computer, that the number of interconnections per processor module is not sufficient to allow the processors to operate continuously at peak performance.

An alternative interconnection structure architecture to processor modules organized as groups, sub-arrays or clusters such as the IBM supercomputers is the mesh or Massively Parallel-Processing [MPP] interconnection structure used in the Red Strom supercomputer system of CRAY Inc. wherein over 10,000 microprocessor modules are physically interconnected each to seven other microprocessors. When a processor module needs to communicate to a processor module that it is not physically interconnected, router logic in each module routes or passes the request and information to subsequent intervening processor modules until the target processor module of the communication is reached. This is similar to an Internet Protocol communication network wherein communication between the majority of processor modules is not a direct point-to-point interconnection, but through some number of intervening processor modules with an additional access and transmission delay for each intervening processor.

It is clear that both the clustered and mesh processor module interconnection topologies are not uniform point-to-point topologies. Both of these currently in use processor module interconnection topologies are known to excessively limit the maximum potential performance of the system of processor modules due to delays resulting from data transmission paths with intervening or forwarding modules during communications between various pairs of processor modules. Further, due to the fixed and physical interconnections connecting the processor modules, when a physical failure occurs that affects the use of one of these fixed and physical interconnections or when there is communication along a specific fixed capacity interconnection path that exceeds its capacity, routing around or avoiding this failed or capacity limited interconnection path has as yet to be solved without resulting in additional performance losses and system implementation costs. These limitations are a direct result from the fact that the interconnection topologies of these processor module structures do not use a multiple point-to-point interconnection method and that physical and not wireless interconnection methods are used.

The limitations of present processor module interconnection technology used in the design of large computational or communication systems can be summarized as three broad categories:
1. Processing capacity. The processing capacity of a system of a large number processors operating in parallel for the processing of a common problem is directly related to the structure of the interconnections interconnecting each of the processors and physical distance separating each of the processors.
2. Interconnection capacity. The interconnection capacity of a system with a large number or array of processors used in parallel for the processing of a common problem is directly related to the number and available on demand [instantaneous] capacity interconnections interconnecting each of the processors. This interconnection capacity also directly affects the capability of such processor systems to recover from physical failures and excessive interconnection path loading.
3. Physical size or volume. The greater the number of physical interconnections interconnecting each of the processors of a system of processors the greater the physical size or volume of space required by the interconnection means and the greater the separation distance between each of the processors. The physical size of the mechanical means used to interconnect processor modules such as PCB backplanes and cabling connector sockets require a physical volume of space for their use that is considerably larger than the volume of the ICs they are intended to interconnect. This volume of space for wired interconnections for a module is greater by factors in a range of 1,000 to over 100,000 than the volume of space required by the processing electronics they are intended to interconnect.

The VSI invention enables a means for reduction of the cost and performance disadvantages presently resulting from high densities of physical interconnections between information processing or switching planar ICs, VSI ICs or stacked ICs also from time to time herein referred to as a processor ICs, or modules of VSI ICs or stacked ICs and or planar ICs, wherein a module also from time to time herein referred to as a processor or processing module, is a collection of such ICs on one or more interconnection substrates; examples of modules are a MCM [Multi-Chip Module], MCP [Multi-Chip Package], a PCB [Printed Circuit Board] with ICs or MCMs thereon and an assembly of PCBs. The preferred embodiment of this example of the VSI invention is a VSI IC module wherein in one or more VSI ICs integrate one or a plurality of wireless transceivers as circuit layers of the VSI IC stack for creating a wireless interconnection and enabling communication between one or more other such VSI IC modules, however, such a module is not limited to or by the use of a VSI IC; the module would also incorporate the antenna or antennas required to enable a means of transmission of the wireless signal. The antenna can be fabricated as part of a VSI circuit layer in a VWM, or as part of a substrate one or more VSI ICs are bonded and incorporated in a VWM. Herein this processor module will be referred as a VSI wireless module, VWM, or from time to time a processor module or module. The VSI wireless module or VWM is not limited in data processing capability or memory storage capacity. VWMs can be used for example in the assembly of data processing systems, servers, IP network switching systems or supercomputers. VWM systems are preferably enclosed by an enclosure which shields or prevents the release of electro-magnetic radiation in the Mhz, Ghz or Rf [Radio frequency] frequencies from VWMs and prevents the entry of such interference radiation frequencies; the use of this radiation shield is optional and depends on the use of the VWM system.

A VWM in addition to incorporating one or more wireless transceivers can incorporate a wide range of data processing capabilities and data processing logic capacity. Examples of the various logic circuits a VWM can incorporate singularly or combination are one or more microprocessors such as 32 or 64 bit fixed instruction microprocessors, programmable logic such as FPGAs [Field Programmable Gate Arrays], custom design logic such as ASICs [Application Specific ICs]. A VWM can incorporate most of the various types of integrated circuit memory technologies such as SRAM, DRAM, Flash, ferroelectric, MRAM, chalccogenide based memory cells or dendritic based memory cells, and in capacities of a few thousand bytes to more than several gigabytes. In the preferred embodiments of a VWM, there is a memory capacity from several megabytes of memory to more than sixteen gigabytes of memory. A VWM can incorporate one or more wired bus interconnections, however, in the preferred VWM embodiment there is only one bussed interconnection or there are none; such VWM wired interconnections, either electronic or optical, are typically arbitrated or shared bused connections common to a portion or all the VWMs of the system in which they are incorporated.

A VWM by intention has a limited number or no wired connections for data transmission to other VWMs. The wireless transmission between VWMs enables the forming of multiple point-to-point or VWM to VWM transmission paths as needed and or on demand such that all connection paths are effectively a nearest neighbor connection; the transmission paths and the number of point-to-point transmission paths between VWMs are dynamically configurable under VWM programmed control, this is clearly not possible in a wired system of data processing modules. The preferred embodiment of the VWM invention is VSI IC incorporating a plurality of wireless transceiver circuits within its circuit layers and where each transceiver is preferably programmable to a plurality of transmission frequencies. The programmable transmission frequencies are preferably in the Radio frequency [Rf] frequency range. A VWM also may be an assembly of more than one VSI ICs and conventional planar ICs. The objective of the wireless interconnection [communication] between any two VWMs is to provide one or more point-to-point high speed high capacity data transmission paths at one or a plurality of transmission frequencies. The use of multiple transmission frequencies simultaneously enables higher overall data transmission through parallel transmission of information or data as a means to achieve greater bandwidth. The signal strength of the wireless interconnection signal between VWMs need only be sufficient to reach any one of the other VWMs in a specific system assembly or array of modules where the maximum wireless communication distance between modules of such an assembly or array may vary in a range from less than an inch to less than 10 meters and with the nominal or preferred distance being less than 4 feet and less than 18 inches wherein the use of lower Rf radiated power per VWM transceiver is an embodiment preference. The localized use or limited distance use of the wireless interconnection signal in combination, if necessary, with radiation shielding allows any MHz or GHz frequency to be used without causing interference with the licensed transmission frequencies in use such as those used in cellphones or TV transmissions. The radiation shielding is made with conventional methods as a metallic grill or solid metallic layer or film and with the appropriate choice of metal. The use of a radiation shield enclosure enables the use of the greater range of transmission frequencies by a system of VWMs without regard to the use of those transmission frequencies that are reserved for licensed use such as broadcast frequencies. The radiation shield can be used to reduce the signal noise within the space it encloses, and therefore, among the VWMs it encloses, by absorbing incident radiation and so reducing reflected signal radiation from the VWMs.

Power to a VWM may also be wirelessly transmitted. This would allow an array of VWMs to be embedded in a large electronic and or mechanical assembly or system without physical wiring connections. The use of wireless power transmission to a VWM depends on the power requirements of the VWM or VWMs to be used and the type of transmission methods used such as a conventional isotropic antenna transmission or adaptive antenna transmission. VWMs that are powered through wireless transmitted power, in their preferred embodiment would incorporate a rechargeable battery.

A transceiver in a VWM uses one or more antennas incorporated in the VWM to transmit a wireless signal to one or more VWMs in a VWM array or to one or more VWMs in another VWM array, or to information or data receiving electronics that can be internal or external to the system in which the transmitting VWM is installed. The preferred VWM antenna embodiment is an adaptive array antenna for the purpose of achieving spatial transmission path spectrum or channel reuse among VWMs of a VWM array. The adaptive array antenna is presently used in cell phone communication networks to maximize the use of Rf frequencies available to the cell phone service provider. The VWM use of adaptive array antennas is in a much different manner than their present use by cell phones; whereas cell phones communicate only with and through a central transmission tower, VWMs communicate directly with one or plurality of VWMs without an intermediate transceiver means. VWMs use adaptive antenna technology to enhance the capability to achieve on demand transmission paths for direct simultaneous communication to one or more other VWMs, and therefore, without an intermediate transceiver coordinating or controlling means. Although the use of an intermediate transceiver means such as a central switching or control point tower as that used in the structure of cell phone communication could be used, this approach is not necessary and would add delay to transmission performance. This is the case because each VWM in a VWM array is held in a fixed position relative to the other VWMs of the array without a requirement for tracking VWM movement or coordinating its availability state as in a cell phone communication network; the position of one or more VWMs can be changed during its operation as might be the case during maintenance and this can be dynamically compensated by the affected VWMs, however, VWMs are not expected to be individually mobile like cell phone users. The communication network of a VWM array in its preferred embodiment is self organizing upon startup and continues to be so during operation, wherein each VWM of the array is identified to every other VWM of the array and a determination of the physical position of each VWM relative every other VWM of the array is made such that the adaptive antenna electronics of each VWM can create a spatial transmission path to the adaptive antenna of every other VWM of the VWM array. If an established spatial order of VWMs is changed or disrupted, a new spatial order would be computed, however, this is not expected to be a frequent occurrence.

The objectives in using a wireless interconnection for the interconnection structure of a VWM array are data transmission performance with the characteristics of non-interfering point-to-point transmission using whatever transfer protocol that provides for the highest level of reliable information or data transfer rate and minimum access delay. This is markedly different from most applications of wireless data transfer such as in a cell phone for at least two reasons: first, the wireless interconnections formed between two VWMs are designed only for data transmission between VWMs in much the same way a dedicated wired interconnection between two VWMs would be designed and without the design restraint of compliance with one or more established transmission standards or protocols over the relatively short distances between VWMs of preferably less than one meter [39.4 inches]; and second, due the preferably small volume of a VWM array, the environment of a VWM array is preferably closed or shielded and not subject to external radiation interference sources normally found in an open air or unshielded environment and is preferably not intended for communication directly with public communication systems.

VWMs can use multiple Rf frequency bands in order to increase the transmission of information or data between two VWMs, and to allow the direct simultaneous transmission of data by a VWM to two or more other VWMs. The use of adaptive antennas by VWMs is the preferred transmission means although it is not essential to the implementation of point-to-point transmission paths between VWMs. The preferred Rf frequencies used by VWMs are in the range of 10 Ghz to 300 Ghz, but not limited by this range. The choice of frequency bands to be implemented by the VWMs of a VWM array is determined primarily by the available transmission rate of the frequency band through the various materials used to make the VWMs and mechanically suspend them in their array structure with respect to non-line-of-sight transmission, and the size of the antenna or antennas needed for effective transmission at the selected frequency band or bands. For example, the length of an antenna is determined by the wavelength of the central frequency of a frequency band, the wavelength of a 1 Ghz frequency is 300 mm [11.8 inches], the wavelength of a 60 Ghz frequency is 5 mm [0.1968 inches] and the wavelength of a 100 Ghz frequency is 3 mm [0.1181 inches]. It is clear from the above examples of wavelength with respect to Rf frequency that the use of higher frequencies allows for the fabrication of smaller antennas for each VWM and the antenna is preferably fabricated as an integrated part of the VWM.

VWMs can vary significantly in processing capacity, functional capability, storage capacity and wireless communication or transmission capacity, more commonly referred to as information or data transmission bandwidth. This is to say that system assemblies of VWMs can be heterogeneous or can have specialized functions such as IP [Internet Protocol] processors, data base analysis processors or conventional general purpose instruction set processors, however, the wireless interconnection or communication transceivers of the VWMs of a system are by necessity compatible, thereby providing high speed dynamically configurable [changeable under programmable control] module to module transmission paths for information or data transfer without the restrictions imposed by wired interconnections of fixed and unchangeable physical connection paths between communicating processor modules or the volume required for these physical interconnection such as sockets for mechanically coupling the wired connections to each module. A VWM may incorporate one to 1,000 to over 4,000 wireless transceivers, this is enabled as a direct result of the circuit stacking capability of the VSI invention. Further, since each wireless transceiver of a VWM may be programmed on demand to transmit to any of the VWMs in an array of VWMs, the cost of the interconnection communication path is clearly limited to the cost of the IC transceiver circuitry no matter which two VWMs in a system array of VWMs of any size need to establish a transmission path between each other for the transfer of data or information. This is in contrast to current wired connections where a physical connection path between any two modules must previously exist to affect the transfer of information. Further, for each physical or wired connection there is the requirement for a socket or connector into which the wiring means must be mechanically plugged in order to form a wired connection. A wired data processing module requires such a connector means for each physical or wired data transmission path it may incorporate; the number of wired data transmission paths of a wired module is limited by at least the physical volume need for such connectors. The elimination of the physical or wired connection path [of either electronic or optical means], and therefore, their physical and mechanical limitations is a principal benefit and advantage to a data processing equipment or system employing an array of VWMs.

The data transmission paths between VWMs may be dynamically established. This means that the wireless transceivers of a VWM can be used to configure the information or data transmission interconnection topology that is best suited for a particular information or data processing task, and subsequently reconfigured to the requirements of another task. It is the capability for on demand point-to-point interconnection of VWMs in any as needed order or arrangement of interconnection without requiring an intervening physical [electronic or optical] switching or forwarding means, or preexisting wired interconnection capacity sufficient to provide transmission between any configuration of information or data processing modules, that provides a novel size [volume], performance and cost advantage of a system of VWMs versus a system of wired modules. It is because of the physical volume and mechanical connection forming requirements of systems of wired modules, that the modules of such systems use one or a few shared or common interconnection transmission paths or buses typically fabricated in the form of PCB backplane into which wired modules are plugged. It is the physical volume and mechanical connection forming requirements that make point-to-point transmission path topologies for systems of wired modules impractical or impossible for systems consisting of more than 8 to 16 wired modules. The wireless transceivers and antennas of the VWM invention replace the function of the high performance PCB backplanes and other PCB and cabling interconnection means while increasing processor interconnection capacity and reducing system interconnection implementation costs.

It should be further noted that a VWM array is an inherently fail safe computing structures. What is meant by this, is that in the event of the failure of a VWM, the VWM array prevents the use of a failed VWM by performing similar computing processes to those used for establishing or verifying wireless transmission paths between VWMs such as when the VWM array is first started. Continuous reconfiguration processes eliminate, preferably through self adaptive and decentralized VWM function, the failed VWM from use within the VWM array, or more simply said, by reconfiguring the existing wireless transmission paths of the VWM array to exclude the failed VWM. This fail safe capability is a by product resulting from a VWM array or system with decentralized VWM self organizing capability and is inherent in an assembly of wireless processing modules where all connection paths are effectively a nearest neighbor connection.

Figure 11D:
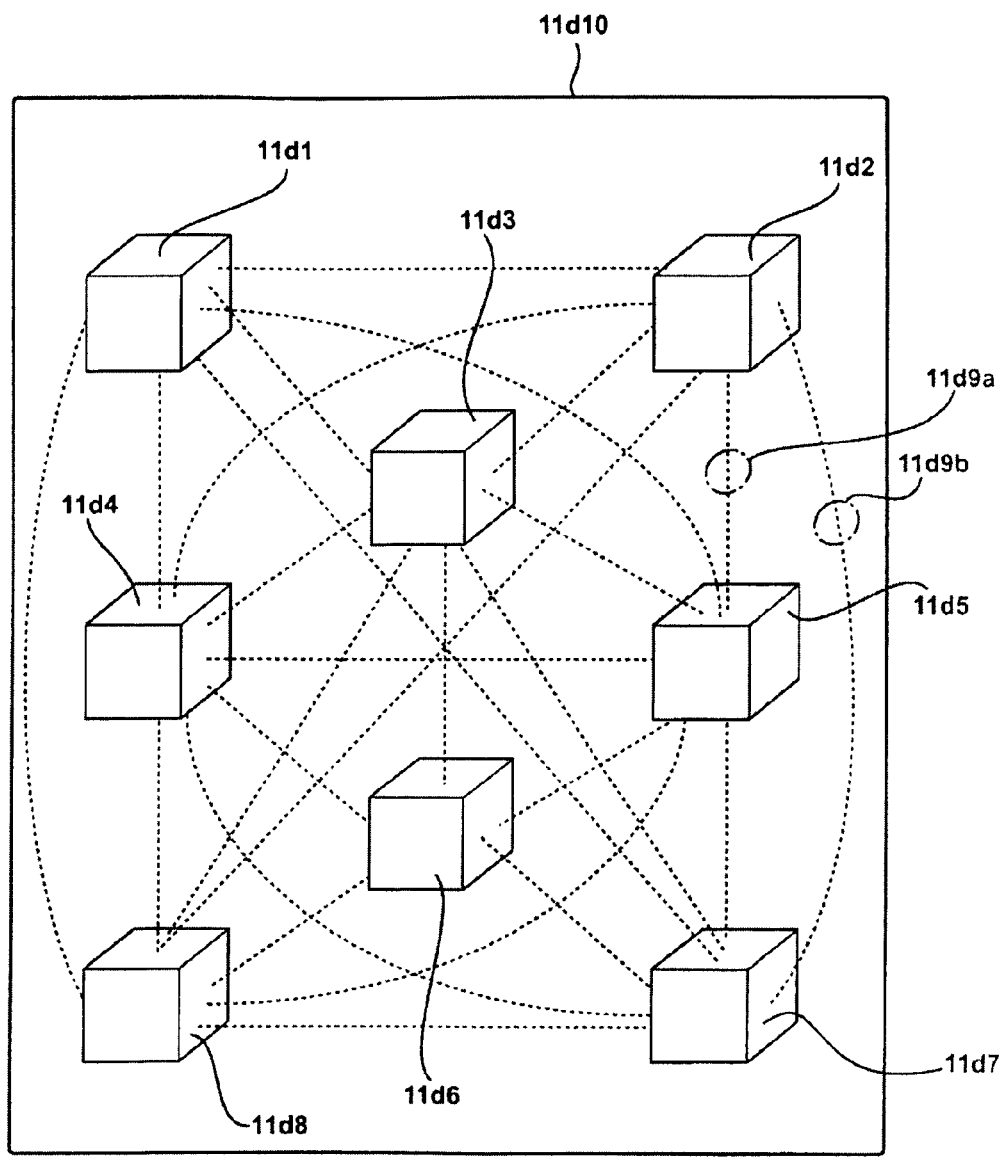
FIG. 11D is a pictorial view of a VSI Wireless Interconnect Multiprocessor Computing System.
Figure 11E:
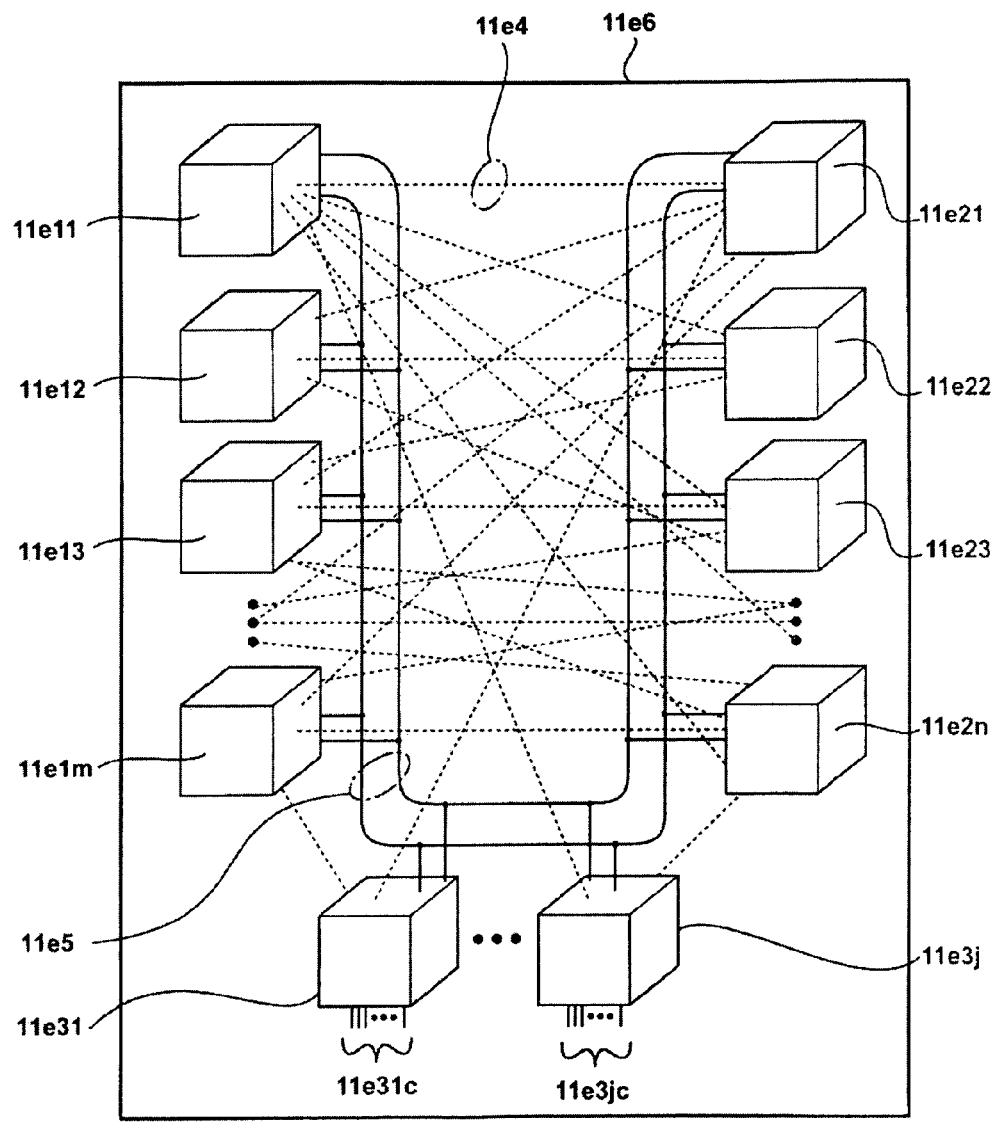
FIG. 11E is a pictorial view of a VSI Wireless Interconnect multiprocessor Computing System.
Figure 11F:
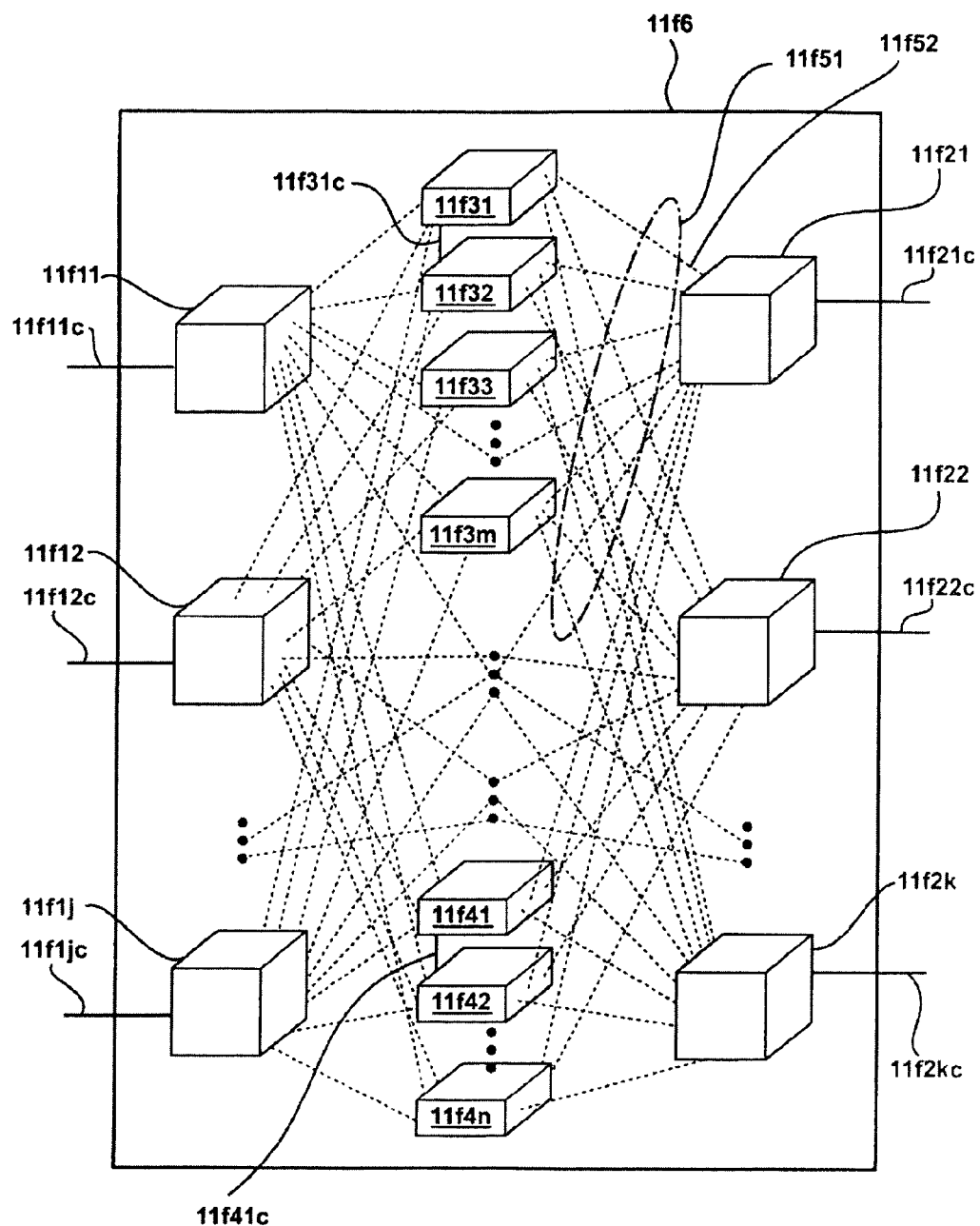
FIG. 11F is a pictorial view of a VSI Wireless Interconnect IP Router and Switching System.
Figure 11G:
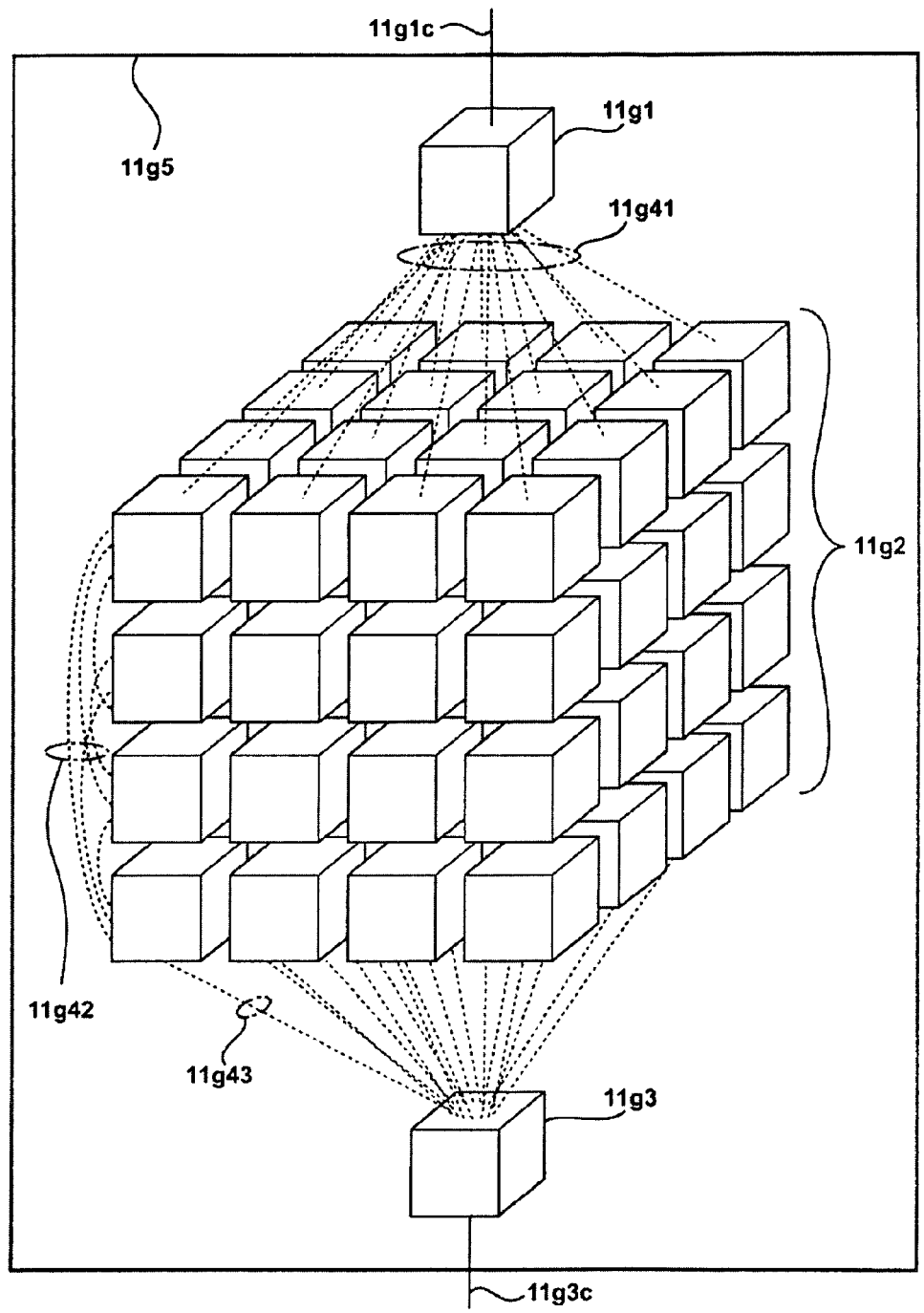
FIG. 11G is a pictorial view of a VSI Wireless Interconnect Three Dimensional Super Computer System.

FIG. 11D shows an array of eight [8] VWMs 11d1 through 11d8 with Rf signal communications 11d9a and 11d9b between each of these modules and an optional electronic shield 11d10 enclosing the VSI modules to prevent the electro-magnetic radiation of the Rf signals from the VWMs from potentially interfering or harming electronic equipment in sufficient proximity to the VWM array or for external Rf signals from reaching the VWMs of the array. Power interconnections between the VWMs are not shown for simplicity, but also with consideration that the VWMs could be wirelessly powered if so designed; the Radio frequency [Rf] transmission of power to electronic ICs is well known in the art, and therefore, no discussion is provided. The wireless communication paths are shown as being line-of-sight 11d9a and non-line-of-sight 11d9b; the as indicated wireless transmission paths 11d9a, 11d9b shown in FIG. 11D are for illustrative purposes only and are not intended to be exhaustive or limiting by their presentation of a VWM wireless interconnection network. Not all transmission frequencies that could be used for wireless communication between VWMs will provide the capability for forming a non-line-of-sight information or data transmission path, but the capability of non-line-of-sight frequency transmission when used allows electronic systems formed by the aggregating or arrangement or assembly of three dimensional [3D] arrays of VWMs as shown in FIG. 11G wherein some number of VWMs in a 3D array do not have a line of sight between each other but are not restricted from forming point-to-point communication information or data transmission paths.

It can be seen from FIG. 11D that each of the eight [8] VWMs has a direct point-to-point interconnection to each and every other VWM in the array of VWMs. In a preferred embodiment of a VWM array each VWM would have a plurality of wireless transceivers with unique transmission frequencies or adaptive antenna electronics such that each VWMs could have an interconnection transmission path to each of the seven other VWMs that would permit non-interfering simultaneous transmission of information to any VWM at any time, if greater bandwidth between each module were required additional transceivers at unique frequencies could be added, thereby creating a number of parallel interconnection paths between each VWM. However, it is not necessary for each VWM to have a separate transceiver for each of the other VWMs of an array, but at least one is required and as few as one or two transceivers will be sufficient to satisfy the communication requirements of some VWM arrays and allow non-arbitrating non-interfering point-to-point communication. It is through the addition of wireless transceivers per VWM that the information or data bandwidth between any two modules can be increased without a corresponding increase in physical size of the VWM as would be the case of a wired module. It is also the case that for a fixed number of transceivers per VWM, the number of VWMs in a VWM array can be increased without diminishing the processing throughput of the VWM array for the fundamental reason that for most information processing tasks the number of communication paths needed simultaneously by a VWM is a relatively small number that is generally four [4] or less, however, the VWMs connected by these communication paths can vary greatly and may at any time be between any two of the VWMs in the VWM array; further, these wireless communication paths between any two VWMs are non-interfering or exclusive to the VWMs using it and not shared or multiplex with other VWMs. Therefore, for these reasons, the number of VWMs in an array can be increased without a decrease in interconnection bandwidth or an increase in the number of potential I/O interconnections per VWM. The ability of each VWM in an array to create a non-interfering transmission path to any other VWM of the array on demand results is a capability of VWM arrays that could be equaled in wired systems only by having a physical connection between each and every other module in a wired system resulting in an increase of the physical size of the wired system of at least one to two orders of magnitude for wired systems of thirty two [32] or more processor modules without consideration of whether such implementations are cost effective or even possible.

The numbers of VWMs in an array can be increased with a proportional or linear increase in physical size or volume. This is the case because there is no increase in VWM size due to the increase in potential wireless interconnections, the circuitry in the VWM or any additional increase in such circuitry as layers in a VSI IC circuit stack, since the addition of VSI circuit layers does not necessarily result in an increase in the overall volume of the VWM. Further, because the assignment of transmission frequencies are programmable or can be allocated on demand, a module may simultaneously broadcast information to more than one module using the same frequency, while wireless interconnection capacity for other on going uses is not affected. It should be pointed out that there is a very large number of interconnection structures that can be programmed between VWMs to achieve an optimized interconnection performance implementation for each of the may widely varying information or data processing applications that currently exist. This flexibility of the formation of on demand interconnection paths between information or data processing modules of, for example, multiprocessor severs, is not possible because each processor has a fixed wired connection structure. Further, current multiprocessor systems use one or more wired bus interconnections [electronic or optical], these interconnections are shared or in common connection and must be arbitrated between the attached processors in order to obtain their use. It is well know in the art that such shared bus interconnections greatly reduce the operating performance of the processors that use it due to the transmission bandwidth limitations attributed to a shared bus.

The physical volume of the preferred embodiment of a VWM is 1 cubic inch [16.387 cm3], however, a VWM can be larger or smaller in volume. The smaller the size of a VWM, then the greater the number of VWMs per unit volume resulting in smaller equipment size, and the shorter the transmission distance between VWMs providing increase equipment performance.

In the preferred embodiment of a VWM array the position of each VWM in the VWM array is in a fixed position relative to the other VWMs of the array it is embedded while it is in operation. Fixing the position of each VWM in an array permits the point-to-point wireless transmission signals between each VWM to be characterized or to be tuned for optimum transmission performance with the assumption that the geometry of its environment with respect to the position of other VWMs is not variable. It is not a requirement of the invention that each VWM of a VWM array be held in a fixed position in order to be functional, however, it is preferred because it simplifies the typical operation of each VWM while increasing throughput. It may also be an operating requirement of a VWM system that there be a limited capability to change the position of VWMs without interruption of its operation. This requirement is the case for application such as life critical support or 24 hour transaction processing systems, and are referred to as high availability or non-stop electronic systems.

It is well known in the art that for computing or data processing systems or supercomputer systems that are made of large numbers of microprocessors, that it is the wired interconnection structure interconnecting the microprocessors that is more than half of the cost of the electronics making up such equipment and is the primary determiner of its performance. It is well known that current multiprocessor sever, parallel processor systems or supercomputer systems which use large numbers of microprocessors such as 8 to several thousand are required to use some form of shared bus system as a fundamental implementation requirement in order to implement a means of common interconnection structure between all the processors, however, there presently appears to be no wired interconnection structure for large numbers of processors that provides a direct nearest neighbor transmission path for all processors of a system or where the order or number of those transmission paths is without restriction. It is well known that dedicated wired, non-shared, non-interfering point-to-point interconnection between information processing modules is the simplest and most throughput efficient interconnection means, but rapidly becomes impractical to implement for large numbers of microprocessors or the electronic module of a microprocessor or microprocessors. The number of processors used in supercomputers presently made by IBM, Hewlett-Packard or NEC exceed 1,000, however, these supercomputers are structured into subsystems comprising typically 32 processors or less; these processor subsystems use backplane interconnection structures which provide one or more common or shared or multiplexed connections between all the processors in the subsystem, continuously or on demand available point-to-point interconnection structures are not known to be used. FIG. 11D shows a wireless point-to-point interconnection structure of a minimum of 28 point to point wireless interconnection paths 11*d*9*a*, 11*d*9*b* between eight [8] VSI wireless modules resulting in a total of potentially 56 separate serial module interconnection or transmission path transceivers.

The complexity of a wired point-to-point interconnection structure [often referred to as a star or radial interconnection structure] can be understood from FIG. 11D should the wireless paths be replaced by wired paths and with each wired path having a wired width of 32, 64, 128 or 256, which are often the width of data paths [bus widths] used in computers from desktop PCs to high performance servers and supercomputers. The wired interconnection connectors of each processor module and physical cabling require a volume several times that of the microprocessor modules, and because of this volume increase the separation distance between the modules results in lower performance and or increased power requirements necessary to drive the signals due to the length of the interconnection. However, most importantly, the cost in parts and assembly of such a wired interconnection structure exceeds the cost of the microprocessor electronics of the processor modules. It becomes clear that electronic equipment consisting of 64 microprocessor modules and using a point-to-point interconnection structure would require 2016 separate wiring or cabling connections and 256 microprocessor modules using a point-to-point interconnection structure would require 32,640 separate wiring or cabling connections; each such wiring or cabling connection may consist of a single physical wire or optical fiber or more likely a wiring bundle of 32 or more wires. It is clear from these examples that the use of a point-to-point interconnection structure, or variations thereof, for interconnecting eight or more microprocessors rapidly becomes an implementation method that is physically daunting or not possible despite its performance advantages.

What the VSI wireless module array invention enables is the use of the economies semiconductor integration manufacturing to effectively integrate the external physical interconnection structures between microprocessor or electronic processor modules into the module. The result of this integration is a reduction in the size, power and manufacturing cost to implement electronic equipment using a plurality of microprocessor modules. The integration of wireless transmission into a VSI IC or a circuit stack represents a manufacturing cost that is subject to the well known and established cost reduction efficiencies of semiconductor manufacturing of approximately 40% per year, whereas, the cost of any physical wiring interconnection means enjoys no such comparable year to year cost reduction benefit, but are seen as non-reducible and fixed manufacturing costs. The VSI invention enables the effective integration of interconnection paths onto the VSI IC, and in doing so achieving benefits of reduced cost and increased performance of the interconnection paths between VWMs or information processing modules.

The larger the number of processor modules in an information processing system or subsystem, the greater the probability of failure in an electronic component of a processor module or the connectors that join the processor modules to backplane or cabling. The well established reliability benefits of semiconductor integration are offset by the increased part counts of larger electronic systems that have large part counts. The VSI wireless module reduces the part count of a large system to approximately the number of VSI wireless modules used. An example of an application using a large number of VSI wireless processor modules is shown in FIG. 11E. In FIG. 11E VSI wireless processor modules 11*e*11 through 11*e*1*m* and 11*e*21 through 11*e*2*n* are interconnected by wireless point-to-point transmission paths 11*e*4 and an optional common wired cabling path 11*e*5; the as indicated wireless transmission paths 11*e*4 shown in FIG. 11E are for illustrative purposes only and are not intended to be exhaustive or limiting by their presentation of a VWM wireless interconnection network. The part count of this system based on the VSI invention can be seen as approximately [m+n] modules, [j] I/O processing modules 11*e*31 through 11*e*3*j* and cabling 11*e*5 plus connectors [not shown]. The system is optionally enclosed by radiation shield 11*e*6 to reduce wireless transmission interference. FIG. 11E shows that the transceivers of the wireless transmission paths are point-to-point and the bandwidth of any point-to-point wireless path is determined by amount of wireless circuitry integrated into the VSI ICs of the wireless processor modules; this is intended to be example of how the VSI invention increases the level of IC integration of the system by replacing or integrating what would normally be interconnection structure consisting of physical cabling, connectors and line driver circuitry into lower cost, lower power integrated circuitry of a VSI IC. The number of processor modules [m+n] in FIG. 11E could easily exceed 32 without a reduction in wireless communication performance due to deficiencies in interconnection bandwidth since the performance of the interconnection between the VSI wireless processor modules is not determined by the wired interconnection 11*e*5 but by the numerous indicated wireless interconnections 11*e*4. The incorporation of the wired interconnection 11*e*5 of FIG. 11E is optional and could be eliminated; since it is shared over a large number of processor modules, it is not likely that it would be used for performance critical processing, but it could be used as a system management or maintenance resource. Modules 11*e*31 through 11*e*3*j* with wired I/O connections 11*e*31*c* to 11*e*3*jc* are also wirelessly connected to the VWMs and serve as interfaces to external peripherals or connections.

The preferred embodiment of a VWM computing system or a VWM array does not incorporate a backplane or physical wiring interconnect means. If a backplane or wiring interconnection means is used, it is not used as the primary interconnection or busing means for transfer of information or data. FIG. 11E and FIG. 11F show wired interconnections means 11*e*5, 11*f*31*c*, 11*f*41*c* these are used as examples of how wired interconnections could be used in conjunction with wireless interconnections discussed herein, however, the wired interconnection means in the preferred embodiment of a VWM system is not the primary interconnection means.

FIG. 11F shows an IP [Internet Protocol] communication processing switch and router consisting of I/O processing VWMs 11*f*11 through 11*f*1*j* and 11*f*21 through 11*f*2*k* and IP message information or data processing VWMs 11*f*31 through 11*f*3*m* and 11*f*41 through 11*f*4*n*. The I/O processing VWMs have one or more each of wired interconnection 11*f*11*c* through 11*f*1*jc* and 11*f*21*c* through 11*f*2*kc*. Each of the information or data processing VWMs may optionally incorporate one or more wired interconnections 11*f*31*c*, 11*f*41*c* that interconnect in common two or more VWMs, Wireless transmission paths 11*f*51, 11*f*52 are point-to-point interconnections between the I/O processing VWMs 11*f*11 . . . 11*f*1*j*, 11*f*21 . . . 11*f*2*k* and IP message information and data processing VWMs 11*f*31 . . . 11*f*3*m*, 11*f*41 . . . 11*f*4*n*; the as indicated wireless transmission paths 11*f*51, 11*f*52 shown in FIG. 11F are for illustrative purposes only and are not intended to be exhaustive or limiting by their presentation of a VWM wireless interconnection network. Further, wireless transmission paths can be made between the various I/O processing VWMs and between the various IP message information and data processing VWMs. An optional radiation shield 11*f6* is used to prevent radiation from the transmissions of the VWMs from going beyond the radiation shield or allowing radiation from beyond the radiation shield from reaching the VWMs.

The IP communication processing switch and router of FIG. 11F is intended to perform similar operations to those of existing IP router and switching equipment but without the well known physical wiring bandwidth limitations between I/O electronics and IP message processing electronics. IP messages are received through wired interconnections, sent to an IP message information and data processing VWM for designation determination and then sent on to the appropriate I/O processing VWM for transmission over wired interconnections. It is well known that IP message traffic loading through IP switching equipment can vary widely and unpredictably and that having sufficient IP message processing and transmission data path capacity to handle such changing IP message loads has proved challenging in the design of this type of electronic equipment using wired interconnection paths. The IP processing equipment of FIG. 11F provides the novel capability of dynamically configuring IP message processing capacity and bandwidth capacity by use of reconfigurable wireless transmission paths between the I/O processing VWMs and the IP message processing VWMs. The wireless transmission data paths 11*f51*, 11*f52* do not have to be line-of-sight paths. The IP message processing capacity of the invention can be increased with the addition of IP message processing VWMs without considerations for the ability of each VWM to accommodate an increased density of interconnection paths or the increased physical space that would be required for wired interconnection. The IP communication equipment of FIG. 11F has the novel capability for using more VWMs to process IP messages in parallel in an on demand capacity basis without consideration of whether the system will have sufficient message transmission or switching capacity. This is a result of the use of wireless interconnections which can be increased between various VWMs as needed through the reconfiguration of transmission data path and the transmission frequencies used between any two VWMs and the use of more VWMs to maintain a level of performance which is termed in the industry as "wire speed" or the processing of IP messages at the speed at which they arrive at the equipment without a throughput wait or delay in their processing. The IP message processing capacity of the equipment is not limited to the structure of VWMs 11*f31* . . . 11*f3m*, 11*f41* . . . 11*f4n*, but can take on other structures such as that shown in FIG. 11D or FIG. 11G for example. The invention uniquely enables allocation of VWM IP message processing and transmission capacity and capability without the requirement that the VWMs be designed in advance to anticipate such allocations as must be done in the case of wired systems.

VWM arrays can be arranged in three dimensional structures in addition to the planar structures as suggested by FIG. 11D, FIG. 11E and FIG. 11F. This enables the emergence of a new form of three dimensional IC integration wherein VWM are closely packed into the shape of various solid 3D geometric structures or arrayed in the outline of hollow 3D geometric structures such as a cube or a sphere. FIG. 11G shows a pictorial view of an array of VWMs in a cubic 11*g2* structure. FIG. 11G shows wireless transmission paths 11*g42*, 11*g41*, 11*g43*, intended to suggest point-to-point transmission data paths between all VWMs of the 3D VWM array and between all VWMs of the 3D VWM array and two external interface processing modules 11*g1*, 11*g3* within wireless transmission radiation shield 11*g5* and with external I/O wired connections 11*g1c*, 11*g3c*; the wireless transmission paths 11*g42*, 11*g41*, 11*g43* as indicated in FIG. 11G are for illustrative purposes only and are not intended to be exhaustive or limiting by their presentation of a VWM wireless interconnection network. Each VWM of the cubic 11*g2* structure is interconnected with point-to-point wireless transmission paths 11*g42*. These wireless transmission paths 11*g42* are a combination of line-of-sight and non-line-of-sight transmission paths. The wireless transmission paths shown 11*g41*, 11*g42*, 11*g43* represent one or a group of transmission frequencies depending on the desired data path width or the desired data transmission rate between VWMs. The cubic array of FIG. 11G is shown as comprising 64 homogeneous or heterogeneous VWMs without wired interconnections; wired power distribution to the VWMs is not shown. Each VWM of the VWM array 11*g2* is not restricted in the number of wireless transmission path capacity it may have but it is not necessary for each VWM to have sufficient wireless capacity such that each VWM be capable to simultaneously communicate with each of the VWMs of the array, however, such simultaneous communication capability, if needed, can be accomplished through integration of greater numbers of wireless transceivers. The capability for any VWM of the VWM array 11*g2* to form a wireless interconnection to some number of other VWMs is a requirement only of the transceiver capacity of the VWM and not a capacity limitation inherent in the design of the size of the VWM array or other system level design consideration.

It is clear from FIG. 11G that the VWM array of 64 VWMs is a closely packed 3D structure which is not complicated by wireless interconnection circuitry or antennas required to implement the large numbers of potential wireless transmission paths that may exist at any one moment in time, nor does the physical size or volume of the array have to compensate for the wireless circuitry required for creating the transmission paths between each VWM. This is to say the physical size of an individual VWM is largely independent of the size of a VWM array of which it is in, such that the size of a VWM array can be increased without diminishing the point-to-point connectivity between the VWMs of a VWM array as the size of the VWM array is changed. Further, if the number of VWMs of the array were increased from 64 to 256, 1000, 8000, 20,000 or some other large number, the volume of the VWM array would increase as a multiple of the average volume of the VWMs used in the array, and not require an increase in the size of the individual VWM in order to accommodate the increase in the number of interconnections required to interconnect to a larger number of VWMs. This is unique to the VWMs wireless method of VWM to VWM interconnection when compared to a wired multiprocessor or cluster system with point-to-point interconnection wherein the addition of a processor would require the addition of wired interconnection couplings to each of the existing processors of the system.

A VWM computing system or VWM array enables the reduction of the distance necessary for information signals or data to travel between VWMs. More than approximately 50% of the delay in sending a signal between logic modules in conventional systems is due to the wired distance between them, the VWM array capability to closely space the VWMs reduces the distance signals must travel between VWMs versus conventional logic modules by 5× to more than 100×, and in consideration of some large multiple processor or supercomputer systems, more than 1000×.

A VWM computing system or VWM array enables fault tolerant capacity and excessive transmission path loading recovery through programming changes of the VWMs. This is novel to the VWM due to its wireless interconnection means. Fault tolerance can be implemented in a VWM system through isolation or reconfiguration of the available or useable wireless transmission paths of the VWM array by software programming means to avoid a physical failure at a VWM as it occurs. Excessive transmission path loading between any two VWMs is avoided by reconfiguration or reallocation by software programming means of the available point-to-point transceivers of the affected VWMs to create additional or multiple point-to-point transmission paths to increase the transmission capacity between the capacity affected VWMs.

Another aspect of the use of a VWM is in an unshielded network. In this aspect the preferred embodiment of the VWM is to have a volume of less than ten [10] cubic inches, preferably less than four [4] cubic inches and preferably less than one [1] cubic inch, water proof packaging without external contacts, powered by wireless transmission with or without an internal battery, made from one or a plurality of VSI ICs such as those shown in FIG. 3 through FIG. 6, and where a VWM operates over regulated transmission frequencies or over a sufficiently short legally proscribed distances for unregulated frequencies so that no harmful or interference effects result from VWM usage. Further, in this preferred embodiment of the VWM, the VWM may communicate wirelessly over conventional or standard wireless communication protocols and frequencies to non-VWM electronic equipment, be used by itself or with a plurality of other VWMs, and where a VWM may have dedicated functions such as mass storage, audio or video processing, for consumer appliances, home security and networking control, home appliance control, cell phone and wireless phone networking, or application specific processing functions such as language translation, voice recognition or handwriting recognition. These VWMs, like the VWMs of a VWM array previously discussed, are capable of forming self organizing wireless networks with multiple transmission paths to multiple VWMs or between any two VWMs with those VWMs that are in sufficient proximity.

Benefits of an information or communication processing VWM array:
1. Dynamic or on demand availability or configuration of VWM-to-VWM interconnections.
2. Dynamic reconfiguration of VWM-to-VWM data path bandwidth enabling the increase or decrease transmission path bandwidth capacity as required.
3. A physical increase or decrease in the number of VWMs in a VWM array by more than 25% without requiring physical changes to the connectivity between VWM.
4. System or equipment physical size or volume reduction through the reduction or elimination of wired interconnection connectors and cabling between VWMs.
5. System processing throughput capacity increase through the reduction of the physical transmission path length separating point-to-point VWM interconnections.
6. System assembly cost reduction through reduction or elimination of wired interconnection connectors and cabling means interconnecting VWMs.
7. System processing capacity characterized by using VWM-to-VWM or point-to-point transmission structure for all VWMs in a VMW array regardless of the number of VWMs in the VWM array.
8. System recovery from physical failures of the electronics in a VWM through isolation and reconfiguration of the failed VWM or the transceiver portion of the VWM by preventing future use of the failure affected VWM by a programming change of all other VWMs disabling wireless communication to that VWM.
9. System recovery from transmission path capacity loading limitations between any two VWMs by the programmed reallocation of VWM transceivers to form additional or parallel point-to-point transmission paths to increase transmission capacity of the specific affected transmission path.

VSI Method for Lithographic Die Size Limitations

The VSI fine grain vertical interconnect enables the fabrication of ICs that cannot presently be manufactured by stepped optical, UV, EUV or other EM radiation source based lithographic techniques due to the limited size of the reticle image field. Present UV stepper lithographic tools perform a 4× or 5× reduction of the mask field or reticle resulting in an imaged field of less than 30 mm by 30 mm. Therefore, the largest IC that can be fabricated is less than the size of the reticle image field, approximately 25×30 mm at present.

The VSI stacking of circuit layers allow the VSI components or ICs to have a circuit area that is more than the limit imposed by stepped lithographic methods through the stacking of thinned circuit layers of arbitrary size until the desired amount of circuit integration is achieved. The stacking is done in combination with fine grain vertical interconnections between all circuit layers providing an interconnection density that is equivalent or higher than that possible in planar ICs.

Another aspect of die size reduction through the VSI invention is the reduction of interconnection lengths versus planar circuitry. Interconnection resistance is inversely proportional to interconnection length, and therefore, the reduction of interconnection lengths resulting from the VSI invention increases the operational frequency of the VSI IC versus an equivalent planar IC. Since interconnect delay accounts for more than 50% of the delay in large planar ICs fabricated with processes with geometry feature sizes of less than 120 nm, the smaller die size of a VSI IC versus an equivalent planar IC is a distinct and novel means of increased IC performance from the VSI invention. Further, the dissipated power of a planar IC is directly related to the resistance resulting from interconnection length. The smaller die size of a VSI IC versus an equivalent planar IC is a distinct and novel means of reduction of IC power dissipation from the VSI invention.

V-Groove Dual Gate VSI Transistor

Figure 12:
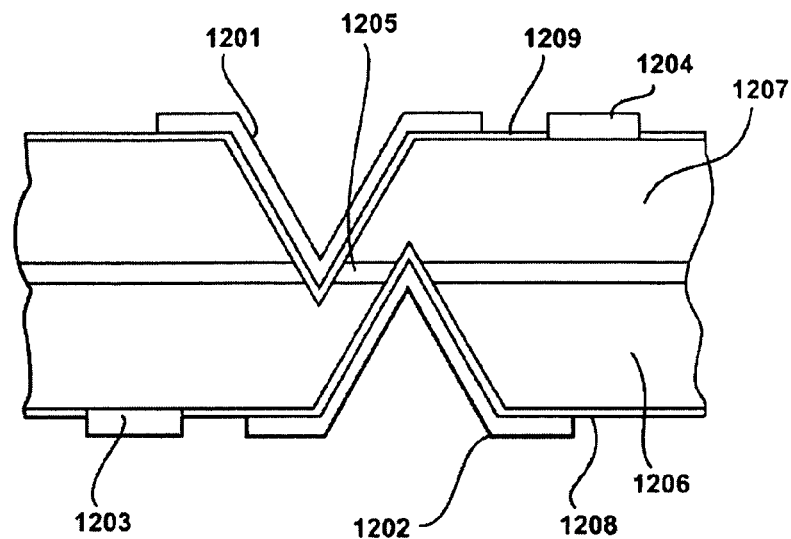
FIG. 12 is a cross section of a dual gate V-groove MOS transistor.

Another embodiment enabled by the VSI invention is shown in FIG. 12 and is a V-groove dual gate transistor with a non-optically formed gate channel. The transistor is formed by the epitaxial deposition of a NPN or PNP sequence of semiconductor layers where the channel is lightly doped and the adjacent layers are heavily doped. The FIG. 12 shows two anisotropically formed V-groove gates 1201 and 1202 that transect the gate channel layer 1205. Source 1203 and drain 1204 are in contact with the heavily doped layers 1206 and 1207 respectively. The V-groove gates are separated by oxide layers 1208, 1209.

The gate channel 1205 can be formed with an arbitrary thickness and can be formed with a thickness of over 250 nm and less than 10 nm and with a thickness of 1 nm; the channel is not formed from an optical process, and therefore, does not suffer from the current restrictions that are well known when using optical lithography equipment to form transistor features that are less than 100 nm. The forming of the channel layer and its thickness is determined by the capability of epitaxial equipment, which is known to be able to deposit semiconductor layers of 1 nm. The transistor or FIG. 12 functions when voltages are applied to one or both gates 1201 or 1202 which changes the conductive state of the low doped gate channel 1205 between the V-groove shaped gates 1201 and 1202. The operation of the transistor is similar to convention MOS transistors.

The transistor of FIG. 12 is fabricated by first forming a first V-groove in a first surface of the semiconductor substrate, preferably formed on a substrate with a barrier layer or buried etch stop layer such as an SOI substrate. The V-groove formation by anisotropic etching is well known. A thin layer of dielectric is then formed over the first V-groove and an electrode is deposited and patterned. The first surface is then bonded to a surface of a VSI circuit stack or is held in such a manner that the underlying substrate [not shown] can be removed to expose the lower device layer 1206 where upon a dielectric layer is deposited and a second V-groove etched such that the tip of the second V-groove is adjacent the first V-groove and transects the channel layer 1205. A dielectric layer and electrode are then fabricated in the V-groove as with the first V-groove. It is preferable that the length of gate channel separating the two V-groove tips be made as short as possible.

Figure 13:
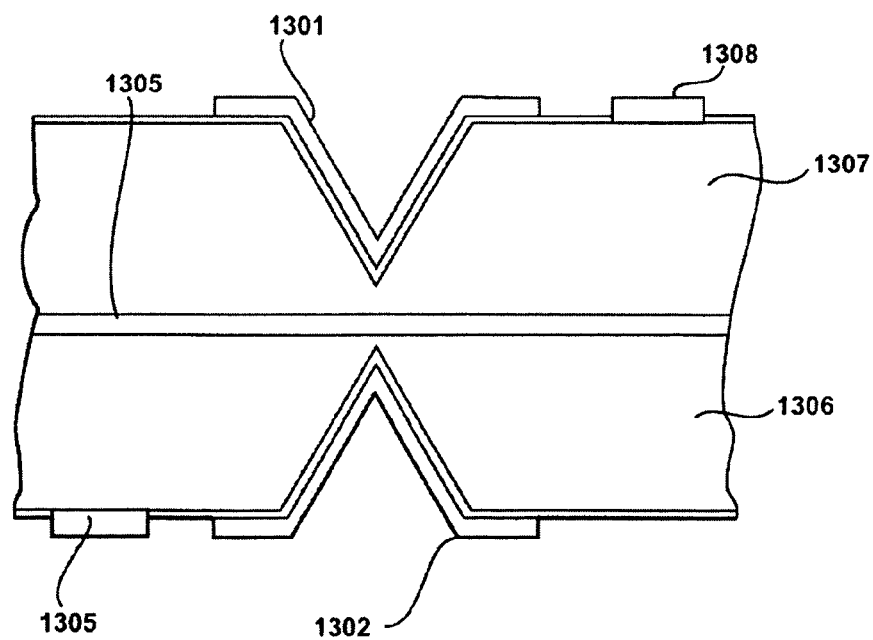
FIG. 13 is a cross section of a dual gate V-groove MOS transistor.

If the gate channel layer 1205 is less than 100 nm it is preferable but not necessary that the tips of the V-groove gates 1201, 1202 pass through the gate channel layer 1205, the tips need only come within less than 20 nm to cause a change in the conductance of the channel. This is due to the ability of the tip shape to create a sufficient high field when a voltage is applied. FIG. 13 shows an example of a V-groove dual gate transistor with one or both V-groove gates 1301 and 1302 not intersecting the low doped gate channel 1305. It should be noted that in this configuration of the V-groove gates 1301, 1302, the source 1308 and drain 1305 must be on opposite sides of the semiconductor layers to avoid a short circuit condition.

The V-groove transistors of FIG. 12 and FIG. 13 can be operated to reduce source to drain off condition leakage. This is done by operating both gates in parallel or by using one of the gates to affect the threshold switching voltage of the transistor.

Elimination of the Floating Body Effect in PD SOI Circuitry

Partial Depletion [PD] SOI MOS transistors suffer from an electrical phenomenon called the Floating-body effect. The floating-body effect is a condition of excess charging in the transistor [gate] channel and at the interface of the channel drain regions. This excess charging results from the impact ionization of hot-carriers in the channel due to high source to drain electric fields across the channel region. A further result of hot-carrier impact ionization is a rise in the temperature of the channel and this is due to the poor thermal conductivity of the buried oxide layer underlying the transistors of the SOI substrate.

Figure 14:
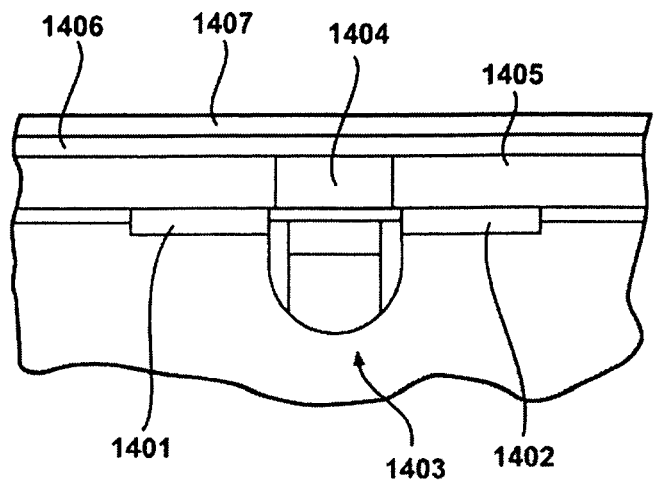
FIG. 14 is a cross section of prior art SOI MOS transistor in a VSI circuit layer.

FIG. 14 shows a typical SOI MOS transistor in a VSI circuit layer with source contact 1401, gate 1403, drain contact 1402 and channel region 1404 and drain region 1405. The transistor of FIG. 14 is shown in the preferred embodiment as integrated as part of a circuit layer in a VSI IC and with the substrate removed stopping at the buried oxide layer of the SOI substrate. The SOI buried oxide layer may be removed or reduced during VSI backside processing from its original thickness to a desired thickness by conventional semiconductor processing means. A dielectric 1406 with a higher thermal conductivity than oxide is deposited such as $Al_2O_3$ [sapphire] or diamond to a desired thickness. Optionally, a metal layer 1407 may be deposited; in the preferred VSI embodiment, a metal layer such as aluminum or copper would be used to serve as a means to form horizontal interconnection structures such as a ground plan, or vertical interconnect and bonding means between VSI circuit layers, in addition to this aspect of the invention, as a means to conduct a significant portion of the thermal energy resulting from the floating-body effect away from the transistor. It is also an aspect of the invention that the metal layer 1407 have a capacitive coupling with a portion of the back side of the transistor body such as the channel or drain region so that bias voltages can be applied to actively offset the channel charging effects. The proximity of the metal layer 1407 to the backside of the transistor also acts to assist in the thermal dissipation of the transistor due the higher thermal conductivity of metal layer versus that of dielectric 1406.

This invention for the elimination or reduction of the SOI floating-body effect is practiced through the VSI process because the VSI processing sequence provides, as one of its process sequence steps, for the thinning of the back side of an electronic circuit wafer to a buried etch stop layer. Further, the two novel features of this invention that enable the elimination or reduction of the SOI PD MOS transistor floating-body effect are enhanced thermal dissipation of transistors through immediate contact with the back side of the transistor body and the formation of an electrode in proximity to portions of the backside of the transistor body in order to apply a voltage bias to reduce the transistor channel charging. These two novel features of the invention can be implemented in combination or separately.

This method of reducing or eliminating the floating-body effect of PD SOI MOS transistors can also be implemented by thinning the SOI substrate to the buried oxide layer independently or with the SOI substrate first bonded to a holding or carrier substrate. The implementation of this method for controlling the floating-body effect of PD SOI MOS transistor is not limited in its use through the VSI invention, however, it does require the removing of the underlying substrate to the buried oxide layer 1406.

VSI Low Substrate Leakage Transistors

Substrate leakage in MOS transistors results in increased power requirements, resulting in increased circuit thermal dissipation, and is a limiting factor in the design and the integration progression of large ICs and their operating performance. The VSI invention enables the fabrication of a low substrate leakage MOS type transistor through fabrication of a Substrate Leakage Barrier [SLB] under the transistor gate and blocking the substrate leakage path between source and drain regions of the transistor.

Figure 15A:
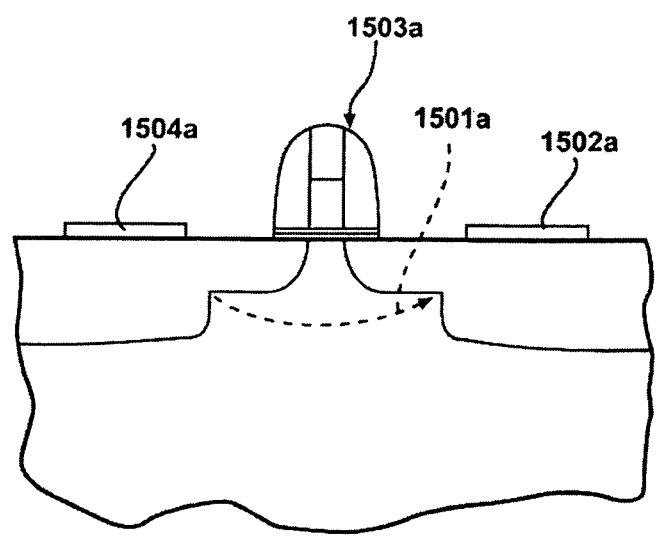
FIG. 15A is a cross section of prior art MOS transistor showing substrate leakage path.
Figure 15B:
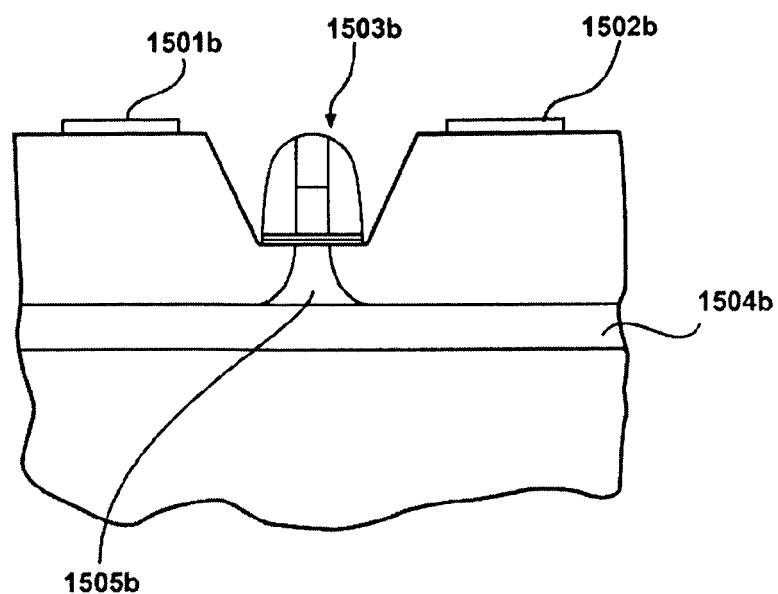
FIG. 15B is a cross section of prior art SOI MOS transistor.

FIGS. 15A and 15B show prior art transistor structure. FIG. 15A represents a logic transistor fabricated in a bulk CMOS process and FIG. 15B represents a logic transistor fabricated in a SOI CMOS process. The transistor leakage path 1501a is shown in FIG. 15A. No such leakage path exists in FIG. 15B, a Full Depletion [FD] SOI transistor, however, to achieve this result required that the source 1501b and drain 1502b of the transistor be raised out of the plane of the gate 1503b adding to the complexity of fabricating the transistor. The buried oxide layer 1504b of the SOI substrate used in FIG. 15B is shown directly below the transistor source 1501b, drain 1502b and channel 1505b.

The VSI SLB is formed from the backside of the transistor gate region after the substrate is thinned in accordance with the VSI processing sequence, wherein access to the underside of the gate region is had through conventional semiconductor processing. It is the preferred embodiment that the SLB be part of the VSI fabrication processing, however, the fabrication of the SLB is not limited to use with the VSI invention, but can be implemented on any appropriately thinned electronic circuit substrate.

Figure 15C:
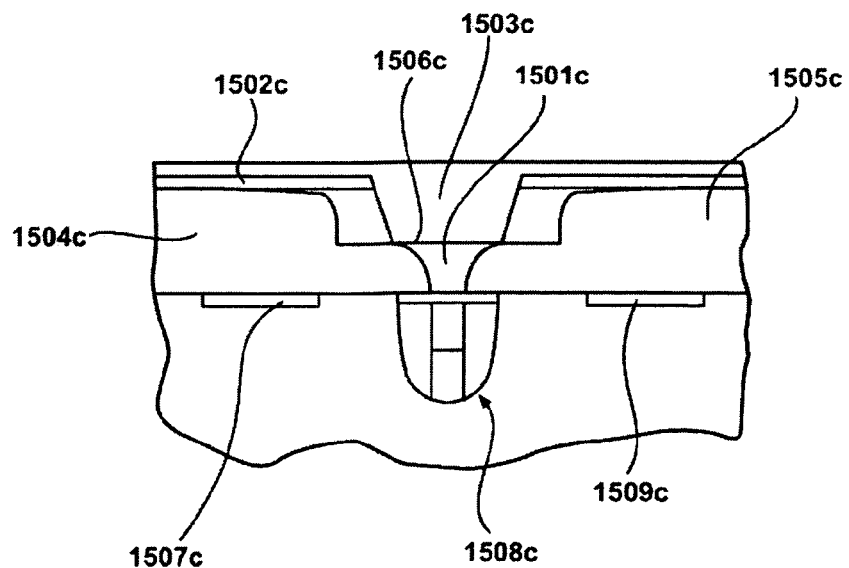
FIG. 15C is a cross section of a VSI SOI transistor with SLB.
Figure 15D:
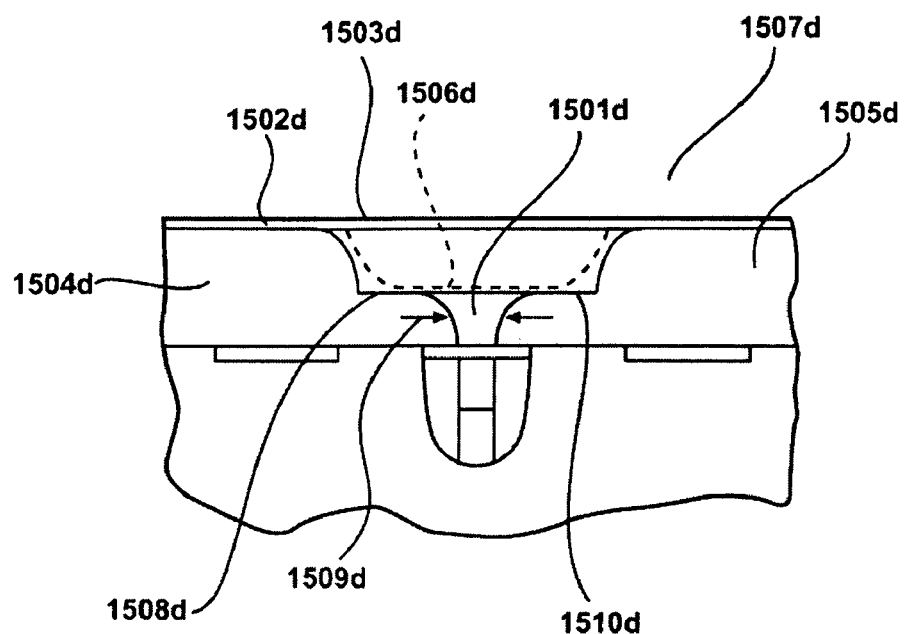
FIG. 15D is a cross section of a VSI SOI transistor leakage path trench.

The structure of the SLB 1503c is shown in cross section in FIG. 15C. It is fabricated from a conventional bulk MOS transistor or a PD SOI transistor once the underlying substrate indicated by dashed line 1506d has been removed to within close proximity of the back side of the transistor body drain 1504d, channel 1501d and source 1505d as shown in FIG. 15D. The controlled thinning of the backside of the substrate to a specific thickness can be accomplished by various means such as grind and polishing, RIE [Reactive Ion Etch] or spray etching with such silicon selective etch agents as KOH with spray processing.

The backside formation of the SLB is preferably formed with use of a barrier 1502d layer under the device layer which acts as a buried etch stop layer during substrate removal processing. Such barrier layers are present in a SOI [Silicon on Insulator] substrate; in the case of a SOI substrate, the buried oxide layer which is typically several thousand Ås in thickness can be formed in a thickness range of 50 Å to 500 Å, since the intended function of the buried oxide layer of the VSI invention is not isolation but a barrier layer or etch stop to provide a means for well controlled termination of the removal process of the semiconductor substrate; a means to achieve wafer thinning as part of the VSI wafer circuit stacking method. An alternative barrier layer is the formation of an epitaxial layer beneath a device layer. A barrier layer such as GeB [Germanium Boron] with a Boron doping concentration greater than $10^{20}$ boron atoms/cm$^3$ and a Germanium concentration sufficient to offset lattice dislocations due to the high concentration of Boron atoms and typically in a concentration in excess of 25%. The GeB epitaxial layer has the property of etching 100 to 1,000 times slower than silicon in the presents of a selective silicon etch agent such as KOH, and enabling a well controlled means to achieving removal of the substrate. The capability of uniformly terminating the removal [thinning] process of the substrate as part of the VSI method is necessary for the correct operation of the circuit devices formed in the device layer.

The SLB of the VSI invention is implemented from the backside of a conventional MOS transistor structure of a thinned VSI layer as shown in FIG. 15D, in the preferred embodiment this occurs after formation of the transistor and bonding of the substrate of the transistor face down such that the backside of the substrate of the transistor is a new top surface of the VSI stack and once thinned. The VSI layer is thinned to a specific thickness either by a controlled etching process or by use of a barrier layer that acts as an etch stop. Examples of such barrier layers are the buried oxide layer of a SOI wafer, a buried nitride layer made in a similar method as the oxide layer in a SOI wafer or an epitaxially grown heavily Boron doped layer [1-2E20/cm$^3$] with Ge doping for crystal lattice stress relief. Once thinned to the desired thickness the barrier is removed, if required or appropriate, then a hard mask is deposited such as silicon dioxide which is patterned through conventional semiconductor lithographic and RIE means to form an opening directly over and overlapping the channel region 1501d as shown in FIG. 15D. The dimensions of this opening are such that the subsequent etch processing step of the silicon substrate through the opening of the hard mask stops on or slightly into the shoulders of the source 1508d and the drain 1510d doped regions. The removal of silicon directly below the source and drain shoulders eliminates the substrate leakage path under the channel region 1501c. The SLB 1503c of FIG. 15C is then formed by depositing dielectric material such as an oxide. The etch of the substrate below the gate channel region is preferably an anisotropic etch, spray wet etch or an etch by RIE means. The amount of the channel removed is determined by the design requirements of the transistor and will vary based on the design of the transistor. The depth of the channel remaining after the etch processing step is typically 50% or less than the channel length 1509d.

The VSI SLB transistor shown in FIG. 15C is a MOS transistor of either npn or pnp type structure. The transistor shown has a source region 1504c, source contact 1507c, SLB 1503c, gate structure 1508c, gate channel region 1501c, drain region 1505c, drain contact 1509c and buried oxide layer 1502c of FIG. 15C. The substrate leakage path between the source 1504c and drain 1505c through the substrate region under the channel region 1501c is prevented by the formation of the dielectric comprising the SLB 1503c.

The SLB structure can also be fabricated as one of the gates of a double gate transistor or provide the dual function as a block to substrate leakage and as the gate of the transistor. A double-gate MOS transistor is shown in FIG. 15F as disposed on the upper layer of a VSI structure similar to the MOS transistor shown in FIG. 15D. The construction of this transistor uses a very lightly doped channel 1505f formed by MBE [Molecular Bean Epitaxy] or equivalent means as described in the prior art which achieves an extremely abrupt transition to the underlying heavily doped transistor body.

Figure 15E:
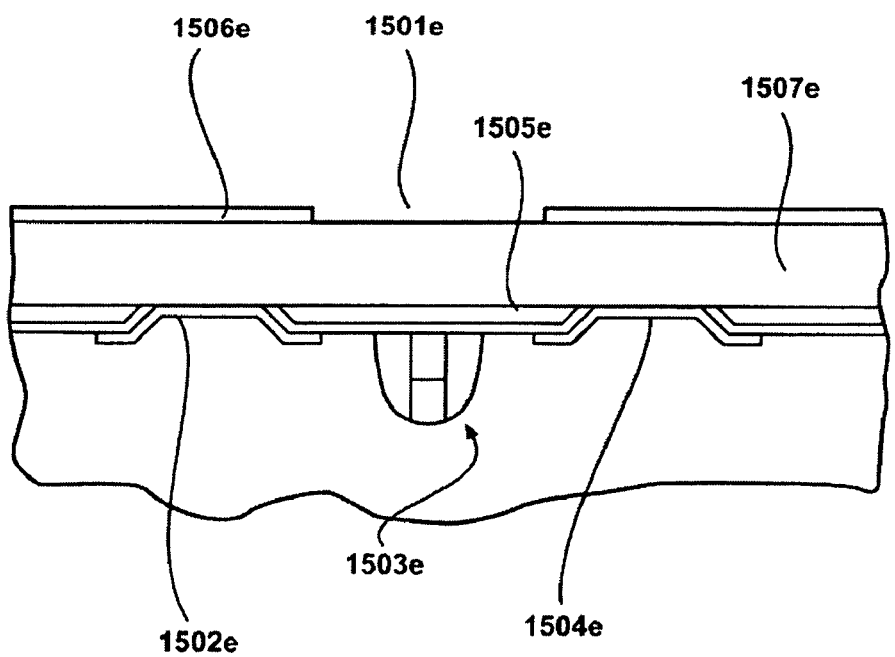
FIG. 15E is a cross section of a partially formed VSI double gate MOS transistor.
Figure 15F:
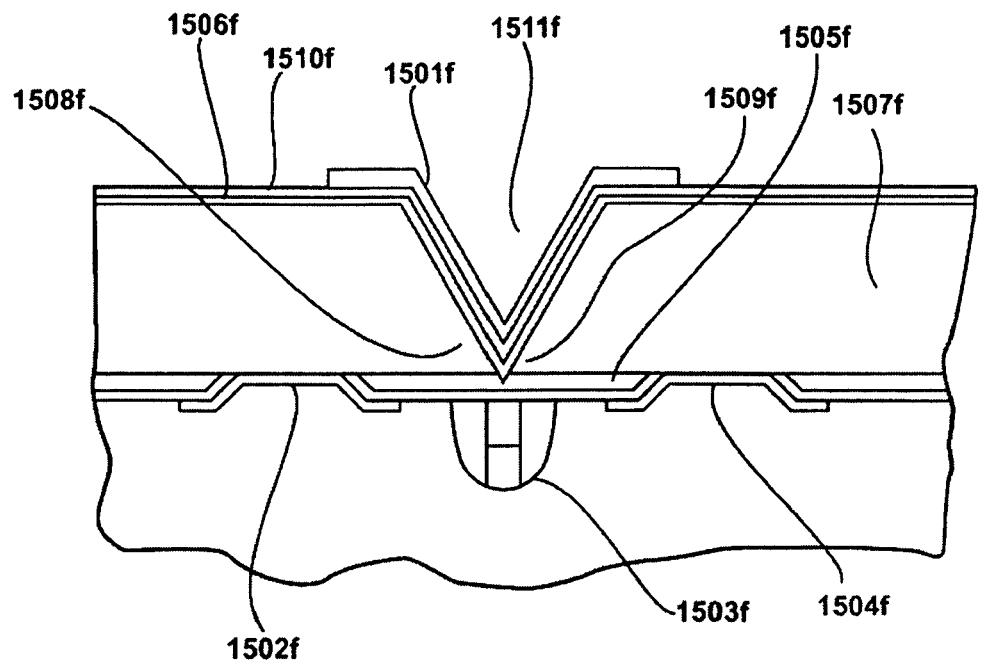
FIG. 15F is a cross section of a VSI double gate sub-optical MOS transistor.

The backside fabrication method of the SLB for the transistor of FIG. 15F is shown by FIG. 15E, wherein a source contact 1502e and drain contact 1504e are formed in contact with the underlying more heavily doped transistor body 1507e gate 1503e oxide mask 1506e and opening 1501e in the oxide mask 1506e. The SLB is formed by a RIE or preferably an anisotropic etch of transistor body under the lightly doped channel terminating in the lightly doped channel 1505e as shown in FIG. 15E. The SLB and back side gate are then formed by formation of an oxide layer 1510f and conductive layer 1501f which are shown in FIG. 15F.

The SLB 1511f of FIG. 15F is shown to be in combination with conductive layer 1501f and dielectric layer 1510f allowing capacitive coupling to the conductive layer 1501f to the transistor body 1507f. There is no substrate leakage path from the source region beneath the source contact 1502f to the drain region under the drain contact 1504f. The transistor operates in a conventional manner by application of appropriate voltage levels to gates 1501f and 1503f in order to cause the channel 1505f to conduct or not conduct. Either gate of the transistor 1501f or 1503f can also be used as a voltage source for biasing the threshold voltage of the gate region 1505f in order to improve the performance of the transistor. The SLB of this transistor could also be formed as a dielectric without a gate function. The operation of this transistor is novel due to lack of doping profile under the full length of the gate. The channel region 1505f is inverted by high fields created by the triangular shaped regions of the source 1508f and drain 1509f and their close proximity adjacent to the channel region 1505f. This use of the SLB reduces the fabrication complexity of the gate versus prior art due to the elimination of the need for self alignment and multiple diffusion implants, while providing high performance due to the short channel region 1505f separation between the source region 1508f and drain region 1509f which can be less than 25 nm due to the shape of the SLB enabled by anisotropic etching from the backside of the transistor channel region.

Figure 15G:
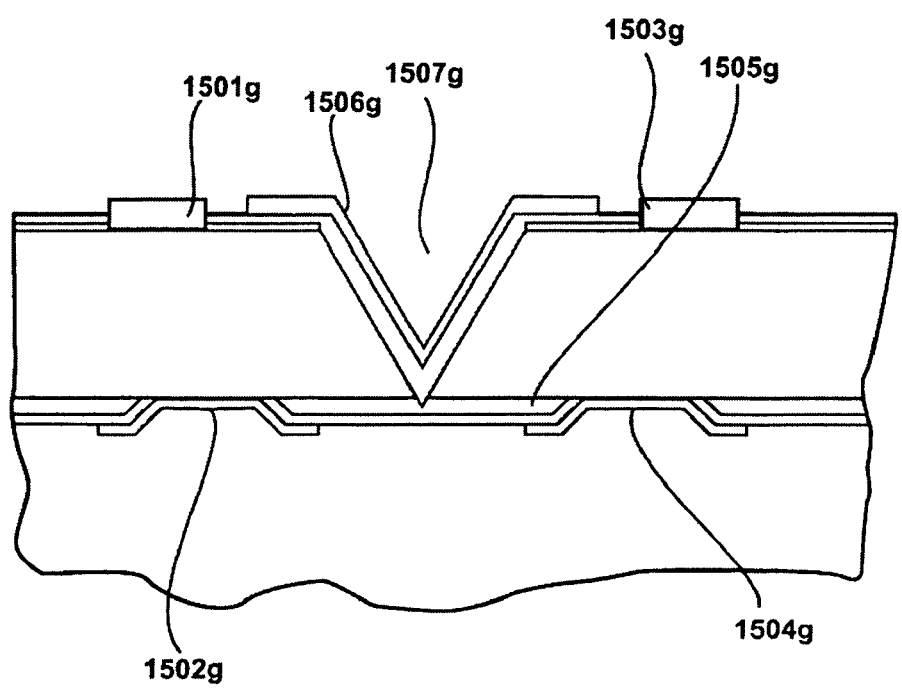
FIG. 15G is a cross section of a VSI double contact source drain MOS transistor.

FIG. 15G shows a similar transistor to that shown in FIG. 15F without the lower gate 1503f of FIG. 15F. FIG. 15G shows backside gate contact 1506g, dual source contacts 1501g, 1502g and dual drain contacts 1503g, 1504g, wherein the additional source or drain contacts are enabling for the purpose of forming horizontal interconnections on either side of the VSI device layer; the source and drain contacts are formed with conventional semiconductor fabrication techniques. The SLB structure 1507g takes the form of a gate and is formed by conventional RIE or preferably anisotropic etching stopping in the lightly doped channel 1505g.

Figure 16A:
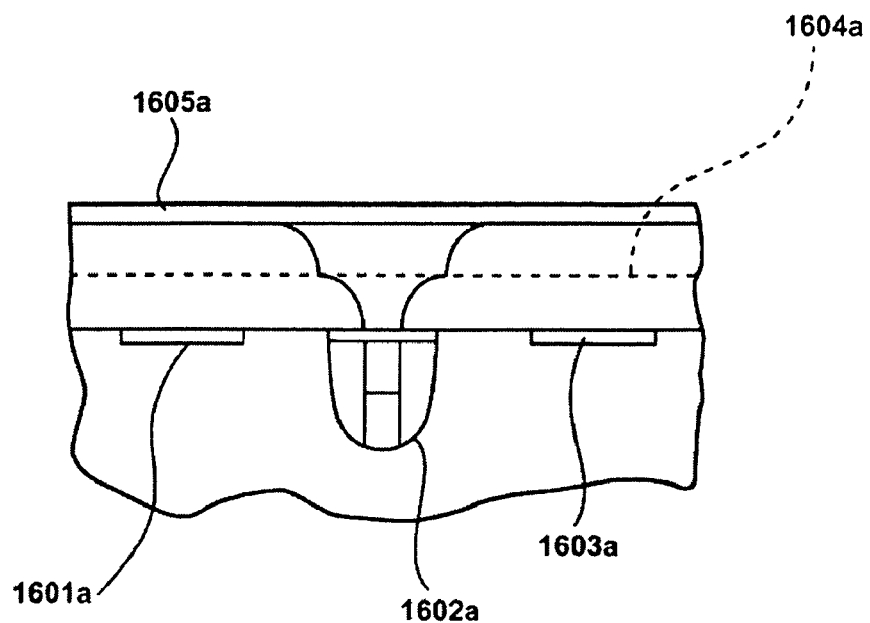
FIG. 16A is a cross section of a prior art PD SOI MOS transistor.
Figure 16B:
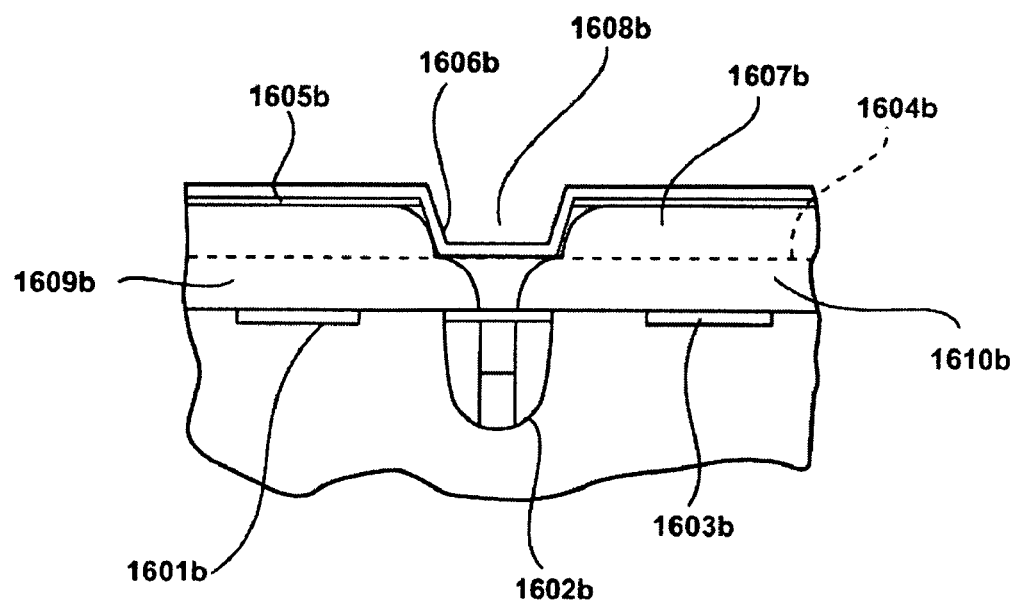
FIG. 16B is a cross section of a prior art PD SOI MOS transistor with VSI substrate leakage barrier.
Figure 17A:
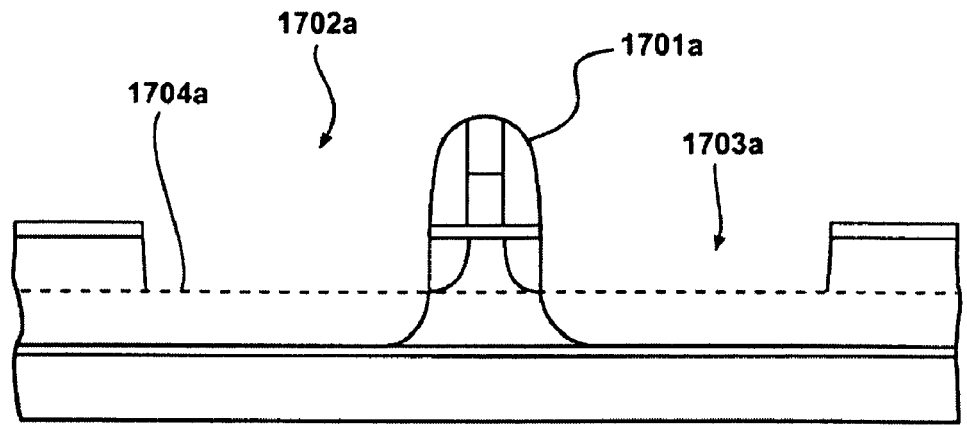
FIG. 17A is a cross section of a partially completed VSI MOS transistor.
Figure 17B:
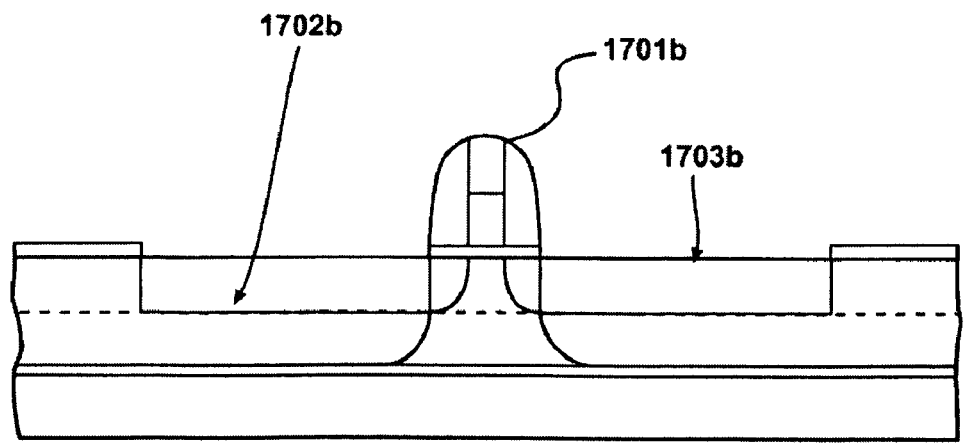
FIG. 17B is a cross section of a VSI MOS transistor.

FIG. 16A shows a conventionally formed PD SOI logic transistor with source contact 1601a, drain contact 1603a and gate 1602a, again as the upper layer of a VSI device layer stack with the substrate removed to a first barrier layer 1605a allowing access to the backside of the transistor. A second barrier layer of oxide or nitride 1604a, and indicated by a dashed line, has been implanted at a depth equal to the channel depth of the transistor. The second barrier layer 1604a is less than 4 nm thick and preferably 0.5 to 1 nm in thickness. The purpose of the second barrier layer is to act as an etch stop for the etch processing necessary to form the SLB 1608b as shown in FIG. 16B. The second barrier layer is sufficiently thin to be disrupted as a barrier to conduction by dopant implant processing of the source and drain regions 1609b and 1610b to have little effect on the conduction of the source and drain regions. Additionally, the portions of the second barrier layer 1604b in the source and drain regions could be removed through etch processing of the source 1609b and drain 1610b regions from either side of the second barrier layer 1604b and then removing the barrier layer upon which source and drain regions could be replaced with epitaxy processing. FIG. 17A shows the removed source region 1702a and drain region 1703a stopping on the second barrier layer 1704a and FIG. 17B shows the source region 1702b and drain region 1703b replaced by epitaxy processing after the removal of the second barrier layer.

Figure 16C:
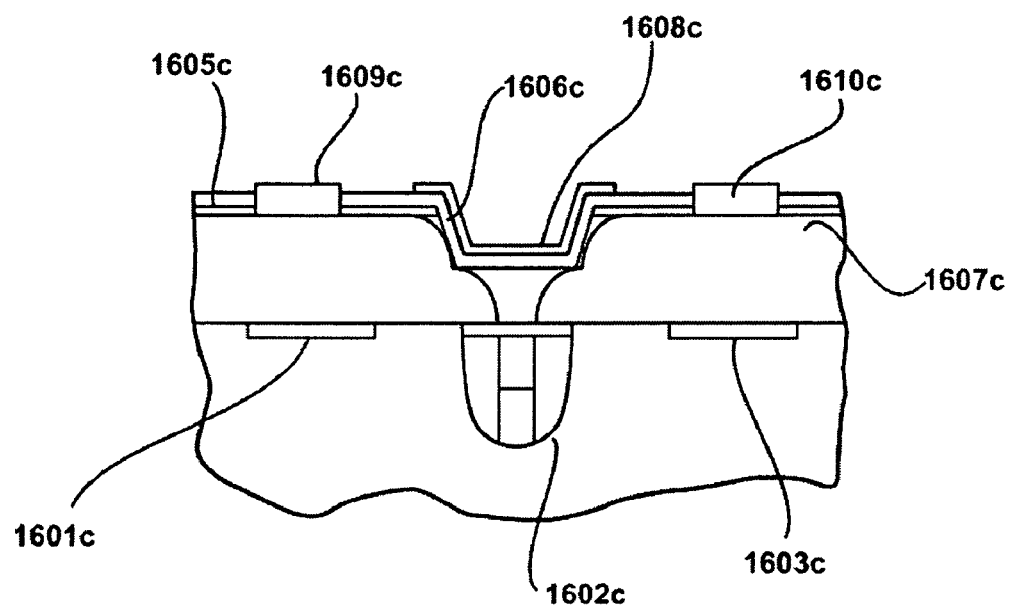
FIG. 16C is a cross section of a VSI double gate PD MOS transistor with SLB.

FIG. 16C is similar to the transistor of FIG. 16B but with the SLB formed in the transistor body 1607c as a gate with conductive layer 1608c and gate dielectric 1606c resulting in a double gate transistor in combination with gate 1602c. Additionally, the transistor of FIG. 16C is shown with dual source contacts 1601c, 1609c and dual drain contacts 1603c, 1610c which can be formed with conventional semiconductor fabrication techniques.

Figure 18A:
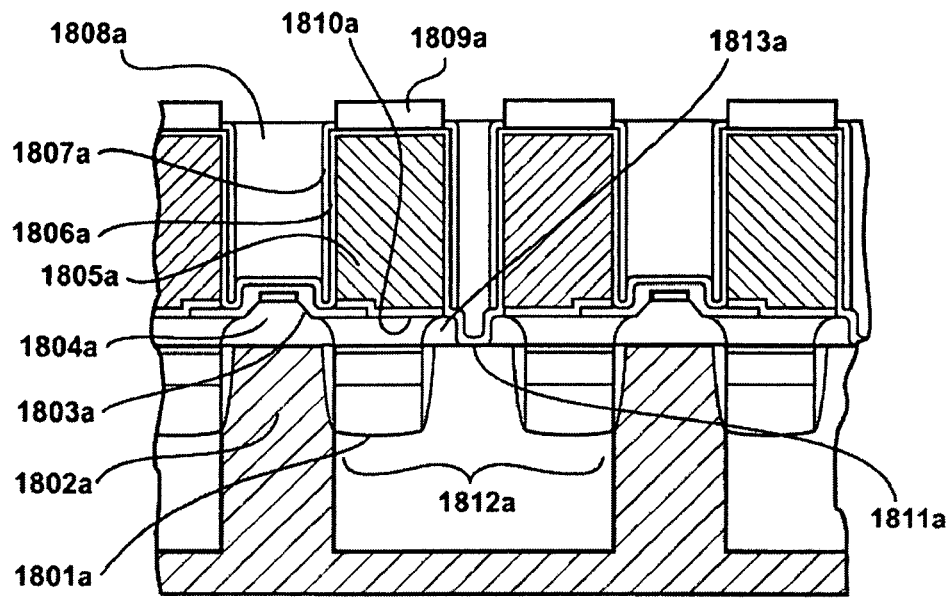
FIG. 18A is a cross section of a VSI 1T1C low substrate leakage cell.

Another aspect of the low leakage SLB transistor of FIG. 15C is its embodiment as a 1T low leakage DRAM memory cell in a VSI IC where charge is held in the transistor body by using appropriate biasing of the dual gates. A significant limitation of all current DRAM memory cells is a high rate of charge leakage with increased operating temperature and the inability to reduce memory cell size in keeping with small fabrication geometries due to limitations in fabricating smaller capacitors. The SLB SOI MOS transistors of FIG. 18A are shown in cross section with a data line [bit line] of an array of memory cells using the invention. Here a conventional logic gate 1801a has a shared data line connection 1802a to transistor body 1804a and SLB 1803a formed as part of a capacitor structure consisting capacitor inner electrode contact 1810a, capacitor body 1805a, capacitor dielectric 1806a, capacitor outer electrode 1807a and outer capacitor electrode contact 1809a. The SLB is formed by anisotropic etch of the transistor body under the gate 1801a and extending across to one adjoining memory cell where upon a several conventional capacitor fabrication sequences can be used, wherein the capacitor body 1805a may be formed as part of a copper electroplating process. It should be noticed that the adjoining transistors 1812a are separated by dielectric 1811a which is shown as a portion of the blanket deposition for the capacitor dielectric. Since the capacitor is formed on the backside of the transistor, it can be fabricated without the need to accommodate layout of the gate line [not shown] and data line 1801a interconnection which is a design limitation in stacked capacitor planar DRAM memory cells. The backside access to either the transistor channel region 1810a or drain region 1813a does so without increasing the size of the memory cell beyond a minimum area represented by the crossing of only the gate line and the data line while also allowing the size of the capacitor to be as nearly as large the total layout area or foot print of the memory cell, and therefore, avoiding the area limitations present in the fabrication of current planar DRAM memory cells. Further, this memory cell design or layout enables a cell size typically of less than $5F^2$ and as small as the practical limitation for all such 1T memory cells of $4F^2$, where F is the minimum feature size used by the lithography system in the fabrication memory cell. This memory cell is also novel due to the presents of an outer electrode capacitor contact 1809a which enables capacitors of a given gate line of memory cells to be selectively and independently biased versus the memory cells of other gate lines assisting in the performance of read and write operations of the memory cells. The outer capacitor contact 1809a also allows the capacitor of the memory cell to be calibrated to a predetermined level of charge prior to a write operation, this allows a common voltage base reference to be used for a gate line memory cells or portion thereof when multiple data bits of information are stored per memory cell.

Figure 18B:
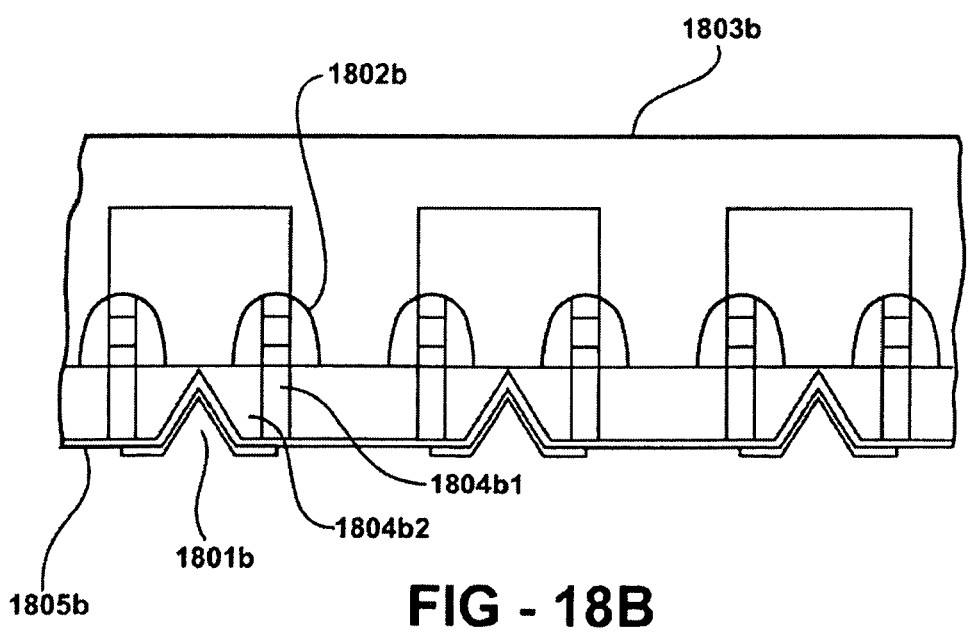
FIG. 18B is a cross section of a VSI 1T DRAM cell.

FIG. 18B shows a VSI 1T DRAM cell made from a PD SOI transistor. It is known in the art that the floating body effect of a PD SOI transistor can be used as a memory cell. The VSI invention allows this type of DRAM memory cell to be implemented with a backside capacitive coupled contact 1801b preferably formed by anisotropic etching from the exposed backside of the transistor body and isolating the adjacent transistor drains. The backside contact 1801b can sever as a voltage bias to drive a calibrated charging of the transistor body, and as a means to sense the voltage of the charge on the transistor. FIG. 18B shows transistor gate 1802b, data line 1803b, channel charge storage node 1804b1 or drain charge storage node 1804b2, and dielectric 1805b. The backside contact 1801b is shown as common to adjacent transistors, but could also be formed as separate contacts to each transistor without significantly affecting the small size of the memory cell which is approximately equal to $4F^2$, where F is the minimum feature size of the elements of the transistor.

Figure 19A:
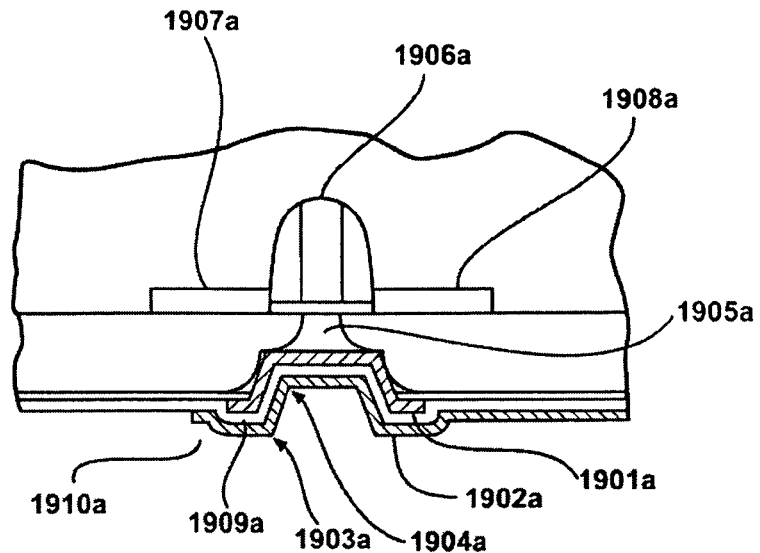
FIG. 19A is a cross section of a dual function transistor EEPROM device.
Figure 19B:
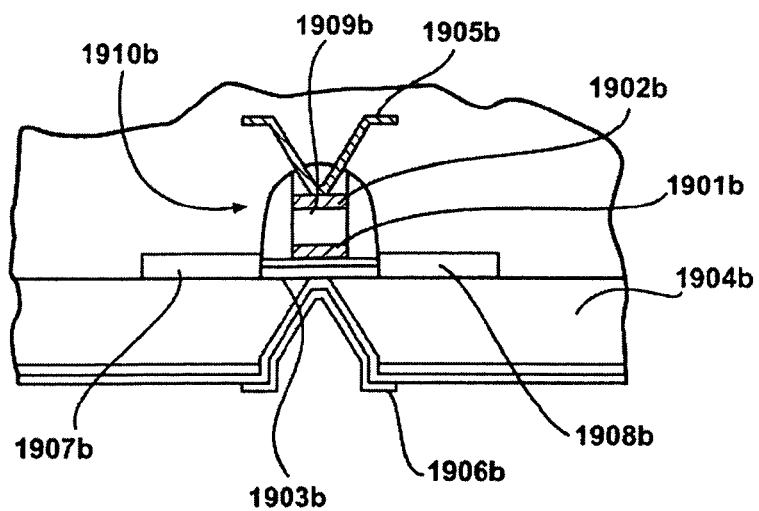
FIG. 19B is a cross section of a dual function transistor EEPROM device.

FIG. 19A and FIG. 19B are dual function devices with capability to operate as a logic transistor or as an EEPROM which is enabled through use of a VSI SLB in the form of an EEPROM floating gate. The SLB 1910a can be fabricated in the form of a floating gate to create the function of a low leakage EEPROM memory cell from a conventional MOS transistor. The FIG. 19A shows a low leakage logic transistor with SLB 1910a formed in a similar fashion as in the transistors shown in FIG. 15C and FIG. 16C except for the fabrication of a floating gate [FG] 1901a and a programming gate [PG] 1902a; dielectric isolation of the FG from the transistor body is not shown. The FG and PG of the SLB structure acts to prevent substrate leakage in the conventional operation of the MOS transistor. The fabrication of the SLB 1903a is enabled preferably as part of the VSI process wherein the backside of the transistor of FIG. 19A is accessed through conventional semiconductor processing. The dual function transistor device of FIG. 19A consists of source contact 1907a, gate 1906a, drain contact 1908a channel region 1905a, FG 1901a and PG 1902a. The MOS logic transistor operates in a conventional manner when there is no charge, relative to the transistor type being npn or pnp, on the FG 1901*a* or when there is a biasing charge to correct for deficiencies of the operating threshold voltage of the gate 1906*a*. The MOS logic transistor operates like a EEPROM devices when the FG 1901*a* is charged and appropriate voltages applied to the gate 1906*a*, the gate 1906*a* can also be used in the reading of the EEPROM cell by providing a partial voltage and therefore enabling the FG to carry a lower effective operating charge. The charging of the FG 1901*a* is accomplished by the PG 1902*a* through capacitive coupling to the FG and is enhanced by the present of the electron emitting edges 1904*a* of the PG on the side of the SLB which create electric fields between the PG and FG causing the injection of the electrons into the dielectric 1909*a* between the PG and FG. The FG is erased by reversing the polarity of the capacitive coupling of the PG 1902*a* to the FG 1901*a*, this process is enhanced with the electron emitting edges 1903*a* on the FG which create electric fields causing the injection of electrons into the dielectric 1909*a* between the FG and PG. The transistor gate 1906*a* can also be used as a second PG during the writing or erasing of the FG with application of an appropriate voltage. The FG is programmed independently of the programming voltages applied at the source or drain regions of the transistor, which allows the value of the FG to be read continuously during programming operations improving the accuracy of the applied charge to the FG and lowers the time required for programming. A further advantage of the FG and PG structure is that the FG is charged and discharged from the PG greatly reducing or eliminating the opportunity for charge trapping in the dielectric 1909*a* which is known to shorten the useful life of current planar EEPROM devices, and reduces the leakage of the charge from the FG during operation of the channel due to the use of lower transistor operating voltages as a result of transistor geometry scaling. The lower leakage condition of the transistor and the FG improves the reliability of the EEPROM for use in storing multiple data bits per memory cell. The design of the MOS device of FIG. 19A enables the EEPROM memory cell to be scaled to the same geometries of logic transistors and to achieve a layout area of approximately of $4F^2$, where F is the minimum fabrication feature size of the device; both of which are improvements over current planar EEPROM memory cells. It should be noted that the gate structure 1906*b* could be fabricated as a SLB FG structure similar to the SLB FG structure 1903*a* in FIG. 19A making a dual EEPROM gate structure or the FG structure 1910*b* may be fabricated as conventional gate.

An additional aspect of the dual function devices shown in FIG. 19A and FIG. 19B is to use the gate 1906*a* or 1906*b* to enable the individual EEPROM by providing a partial reference voltage sufficient to cause the EEPROM channel to conduct if the FG is charged or encoded with a data value. This allows the FG to be encoded with data values at lower charge values, and it also provides a means for lowering the probability for cross gate line induced noise in EEPROM memory arrays.

It is important to note that a benefit of charging and discharging the a FG 1901*a* from a PG 1902*a* is to minimize or prevent the accumulation of charge in the dielectric separating the FG and PG, and avoiding the opportunity for charge accumulation in the gate dielectric in contact with the channel which can bring about an unwanted change in the conductance of the channel; this results in extended programming cycles of the FG and a longer useful life of the EEPROM device. The electron emitter edges 1903*a*, 1904*a* formed on either side of the EEPROM gate 1910*a* of the FG and PG create stronger electric fields when programming voltages are applied to the PG and since these stronger fields only exist when the PG has applied programming voltages and the voltage differences between the source and drain of an EEPROM embodiment with electron emitter edges on the FG and PG of FIG. 19A are not sufficient to effect the programmed charge of the FG during its operation at normal voltage potentials. Further, the gate dielectric over the channel of the EEPROM does not have to be made thin to support electron injection. This programming process of the FG reduces the probability that electron leakage between the gate and the source or drain is greatly reduced by the design of EEPROM gate 1910*a*. It is also important to note that as a result of the lower leakage of the VSI EEPROM memory cells made with write and erase functions implemented only through a PG and not through the source and or drain regions of the EEPROM device, a calibrated or standard reference value can be used as a reliable initial memory cell value for writing or reading multiple storage values when more that one bit of data is encoded or store on a memory cell. The benefits of the invention's EEPROM extended write/erase life cycles and low FG charge leakage also apply to the structure of the V-groove EEPROM gate discussed herein for the same reasons due to the electron emitter edges present in the V-groove gate structures such as the one shown in FIG. 19B and FIG. 19C.

The FIG. 19B shows an alternative VSI SLB dual function logic transistor and EEPROM memory cell device with function and capability the same as the device of FIG. 19A. This device uses a conventionally formed EEPROM FG 1901*b* and PG 1902*b* gate stack, however, a lightly doped MBE formed channel 1903*b* over a heavily doped transistor body 1904*b* is used rather than conventional source drain diffusion based doping profiles. The PG has contact 1905*b*. The transistor function is enabled by anisotropically formed V-grooved shaped gate 1906*b*, source contact 1907*b* with transistor body 1904*b* and drain contact 1908*b* with transistor body 1904*b*. The gate 1906*b* makes contact into the channel region 1903*b* and creates a leakage barrier between source and drain regions of transistor body 1904*b*. The FG and PG surfaces of dielectric 1909*b* are shaped in the manner presented in FIG. 20F to provide electron emitter edges 2001*f* through 2004*f* to enhance the ability of the PG to charge and erase the FG. The design of the MOS device of FIG. 19A enables the EEPROM memory cell to be scaled to the same geometries of logic transistors and to achieve a layout area of approximately of $4F^2$, where F is the minimum fabrication feature size of the device; both of which are improvements over current planar EEPROM memory cell.

Figure 19C:
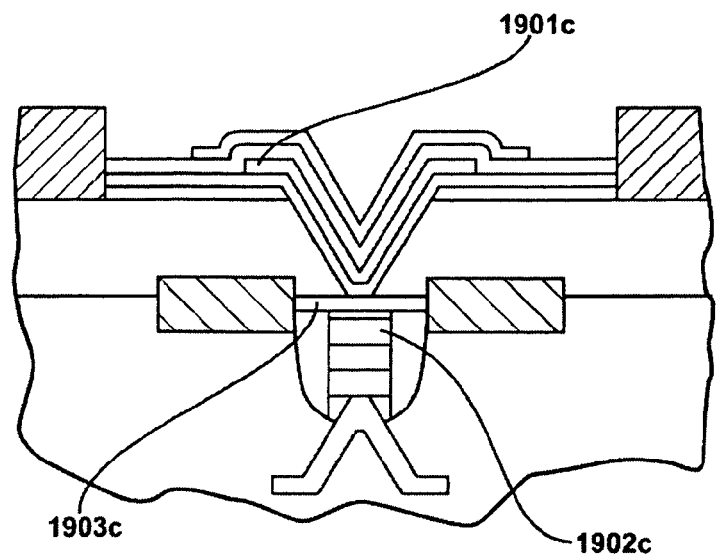
FIG. 19C is a cross section of a dual gate EEPROM device.
Figure 19D:
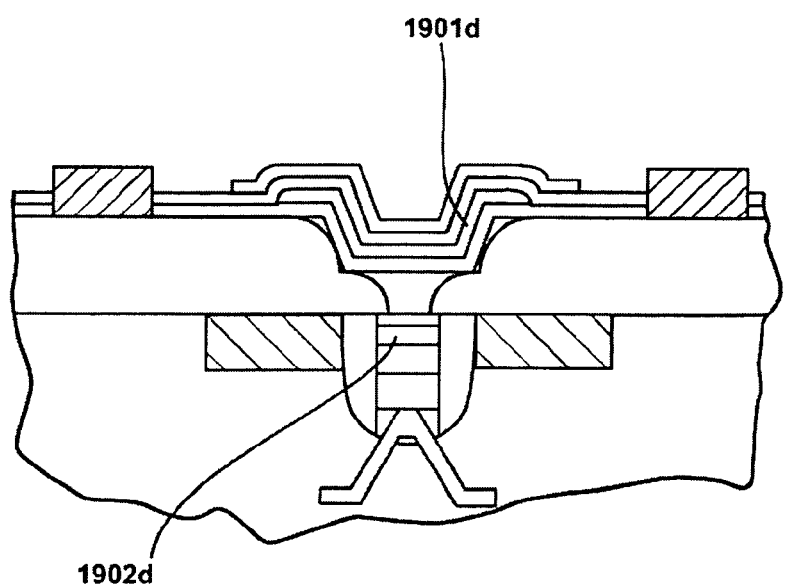
FIG. 19D is a cross section of a dual gate EEPROM device.

The FIG. 19C and FIG. 19D show double gate EEPROM memory cell embodiments of the VSI SLB invention. The double gate EEPROM provides a means for lowering the charge storage level per FG required to implement single and multiple bit storage capability. The gate channel 1903*d* corresponds to 1903*b* of FIG. 19B. In one embodiment, FG 1901*c* or 1902*c* of FIG. 19C, or FG 1901*d* or 1902*d* of FIG. 19D is given a partial charge or reference charge and the other gate is encoded with the charge level representing the data stored, and therefore, the encoded gate requires less charge in order to represent a specific data value. This is useful because lower FG charges have lower probabilities of spontaneous charge loss. This same function can also be achieved in the dual function devices shown in FIG. 19A and FIG. 19B where the gate 1906*a* or 1906*b* would provide a dynamic or enabling partial charge bias.

Figure 20A:
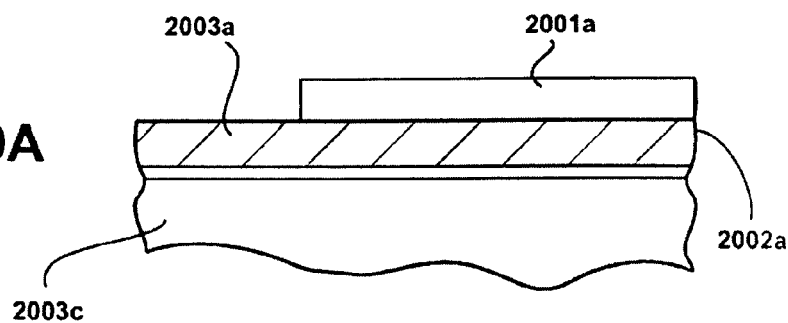
FIG. 20A through 20F are cross sections of a VSI EEPROM emitter fabrication sequence.
Figure 20B:
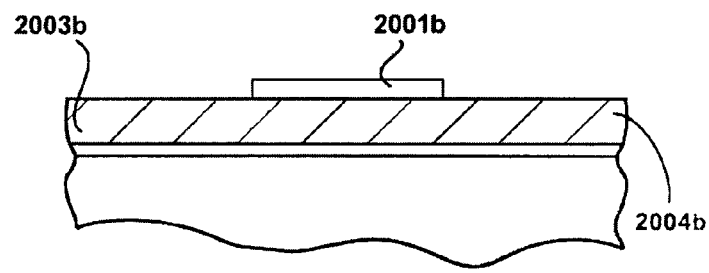
Figure 20C:
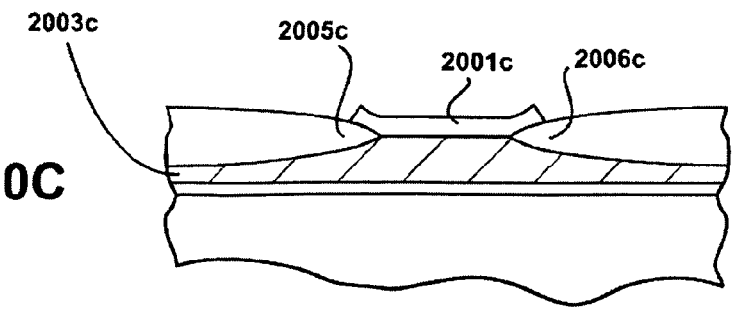
Figure 20D:
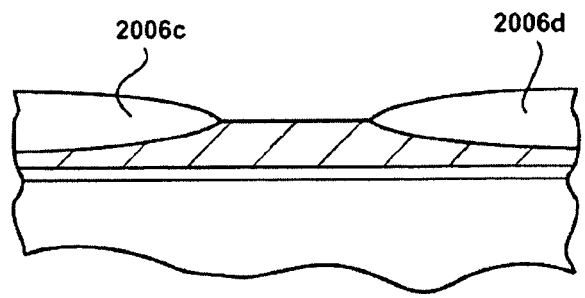
Figure 20E:
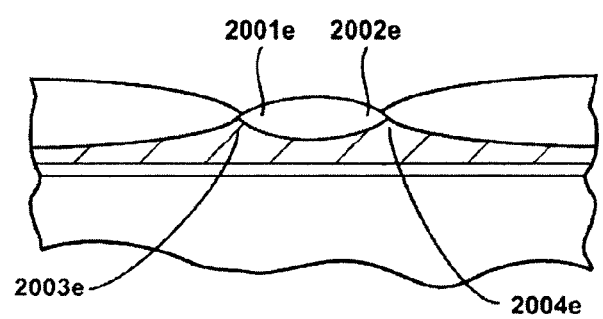
Figure 20F:
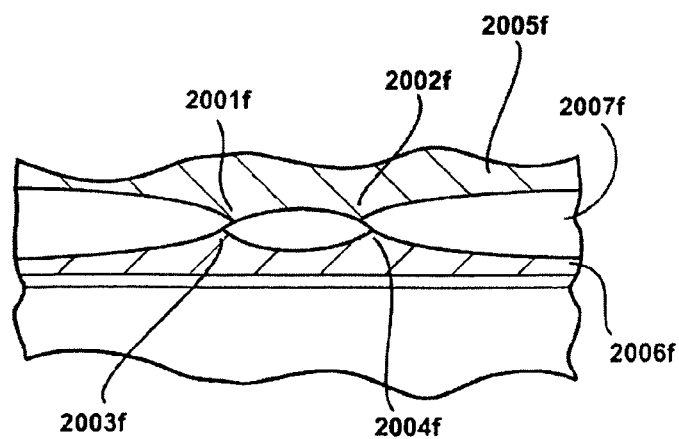

FIG. 19E and cross sections of FIG. 19E-AA and FIG. 19E-BB show a dual function logic transistor and EEPROM memory cell device with conventional logic gate 1902*e*, 1902*e*1 and EERPOM gate 1911*e*1, wherein the EEPROM gate has FG 1908*e*1 and PG 1909*e*1. The source contacts 1901*e*, 1901*e*1, 1905*e*1 and drain contacts 1903*e*, 1903*e*1, 1907*e*1 contacts can be positioned on either side of the transistor body as shown with all possible contacts present. The distinction of this device is that the EEPROM can be continuously programmed while in operation. This is accomplished through programming of the FG 1908*e*2 through PG contact 1912*e*2 or by optional PG contact 1904*e*2 which are out of the line of the transistor body as shown in FIG. 19E-BB. The portion of the EEPROM gate of FIG. 19E-BB which is out of the conductive path of the device body shown in FIG. 19E-AA is enhanced with electron emitter edges 2001*f* through 2004*f* as shown in FIG. 20F but only over that portion of the FG and PG that are out of line of the body of the device. The unique V-groove shape of the PG 1904*e*2, the tip of which is positioned in contact with the oxide layer 1910*e*2 directly under the FG, creates a strong electric field for injection of electrons into the oxide layer 1910*e*2. The programming of this device can be done without changing the conductance of the channel 1906*e*1 allowing the continuous monitoring of channel conductance or use of that conductance wherein it can provide a continuous feed back to an analog circuit network as an analog memory device. The logic gate 1911*e*1 provides additional control of the operation of the EEPROM memory cell such as a lower range of voltages on the FG or a enabling switch.

FIG. 20F shows the cross section of a PG, FG and the thermal grown oxide dielectric separating a PG and FG of an EEPROM gate such as the gate 1910*b* of FIG. 19B. Electron emitter edges 2001*f*, 2002*f*, 2003*f* and 2004*f* are shown which create electric fields that assist in the injection of electrons from PG 2005*f* in to the oxide 2007*f* during a write or charging operation or from FG 2006*f* into the oxide 2007*f* during an erase or discharging operation of the FG. The electron emitter edges enable lower voltages to be applied to the PG in order to charge or discharge the FG than would be necessary if the surfaces of the PG and FG were parallel surfaces. The electron emitter edges 2001*f* through 2004*f* are fabricated by patterning the oxide of the FG 2006*f*. FIG. 20A shows the cross section of a FG 2002*a* and an overlying hard mask 2001*a* such as a nitride film that has been partially patterned exposing a portion of the FG 2003*a*. A second lithography step completes the patterning of the hard mask 2001*b* and exposes the other side of the FG 2004*b* as shown in FIG. 20B. Two lithography steps are required to create the hard mask pattern 2001*b* because it is assumed that the width or length of the FG is of a dimension approaching the minimum feature size of the lithography process, and therefore, could not be imaged in one step. The FG 2003*c* is then oxidized creating the well known bird's beak oxide shape 2005*c* and 2006*c* on either side of the hard mask 2001*c* as shown in FIG. 20C. The hard mask 2001*c* is then stripped as shown in FIG. 20D and a second thermal oxidation step creating bird's beak oxide shapes 2001*e* and 2002*e*, and resulting in the formation of electron edges 2003*e* and 2004*e*. The thickness of the oxide at this point can be reduced or increased by etching or additional dielectric deposition to adjust what will subsequently be a vertical separation of the electron emitter edges. The PG 2005*f* is then formed over the oxide and in the same step forming the electron emitter edges 2001*f* and 2002*f*. The vertical separation of the electron emitter edges is determined by the amount of thermal oxide grown. Thermal oxide growth is a well known and well controlled process, and therefore, the vertical separation of the electron emitter edges can be well controlled which in turn is directly related to the predictable and uniform operation of the EEPROM memory cells.

It is important to note that a benefit of charging and discharging the a FG 2006*f* from a PG 2005*f* is to minimize or prevent the accumulation of charge in the dielectric separating the FG and PG, and avoiding the opportunity for charge accumulation in the gate dielectric in contact with the channel which can bring about an unwanted change in the conductance of the channel; this results in extended programming cycles of the FG and a longer useful life of the EEPROM device. The electron emitter edges 2001*f*, 2002*f*, 2003*f*, 2004*f* of the FG and PG create stronger electric fields when programming voltages are applied to the PG and since these stronger fields only exist when the PG has applied programming voltages and the voltage differences between the source and drain of an EEPROM embodiment with electron emitter edges on the FG and PG of FIG. 20F are not sufficient to effect the programmed charge of the FG during its operation at normal voltage potentials. Further, the gate dielectric over the channel of the EEPROM does not have to be made thin to support electron injection. This programming process of the FG reduces the probability that electron leakage between the gate and the source or drain is greatly reduced by the design of EEPROM gate. It is also important to note that as a result of the lower leakage of the VSI EEPROM memory cells made with write and erase functions implemented only through a PG and not through the source and or drain regions of the EEPROM device, a calibrated or standard reference value can be used as reliable initial memory cell value for writing or reading multiple storage values when more that one bit of data is encoded or store on a memory cell. The benefits of the invention's EEPROM extended write/erase life cycles and low FG charge leakage also apply to the structure of the V-groove EEPROM gate discussed herein for the same reasons due to the electron emitter edges present in the V-groove gate structure of FIG. 19B and FIG. 19C.

The transistor and EEPROM structures presented herein have been shown incorporating polysilicon floating gates. This is not a limitation on those transistors or memory cells shown and the well known art of ONO [Oxide, Nitride, Oxide] used for trapping charge in EEPROM cells or other such charge trapping dielectric film stacks can also be used to instead of the polysilicon floating gate illustration.

It should be understood that the relative positions of transistor gate structures and that of an EEPROM gate structure on either side of a transistor body as shown in the various figures does not limit their use, and that these structures can be positioned opposite the order of that shown.

VSI Quad Gate Low Leakage Transistor Structure and Interconnect

Transistor source drain substrate leakage can be reduced by configuring the geometry of the gate so that it has more than one surface adjoining the transistor gate region. Dual-gate and triple-gate transistors are well known in the art. The dual-gate and triple-gate transistor structures have been fabricated with a planar process. The fabrication of a quad-gate transistor is a novel aspect of the VSI invention. It is not apparent that present planar processing methods can be extended to enable the fabrication of quad-gate transistors.

FIGS. 19F1 through 19F5 show a first preferred VSI method for the fabrication of a vertical transistor with quad gate structure. The transistor shown in FIG. 19F5 is a quad-gate transistor implemented through VSI fabrication processing methods, which enable both sides of an integrated circuit to be processed, however, the fabrication of this quad-gate transistor is not limited to the VSI fabrication processing techniques. FIG. 19F5 shows a quad-gate transistor with two gate body regions 1905/5, 1908/5, quad-gate dielectric 1913/5, gate electrodes 1906/5, 1910/5, gate contacts 1901/5, source contact 1902/5, source transistor body region 1904/5, 1907/5 drain transistor body region 19012/5, 1907/5, drain contact 1903/5 and dielectric layers 1914/5, 1909/5, 1911/5. The gate electrodes 1906/5, 1910/5 surround the transistor body enabling the complete inversion of the transistor gate region when a threshold voltage is applied. Although the gate electrodes are connected in common causing both gate regions to invert simultaneously, the quad-gate electrodes 1905g5, 1913g5 could also have been fabricated to operate independently as shown in FIG. 19G5. FIG. 19F5 clearly shows that the transistor body is vertical passing through the VSI circuit layer 1909/5, and therefore, can also provide the additional function of a vertical interconnection.

The fabrication sequence of the quad-gate transistor of FIG. 19F5 is shown in FIG. 19F1 through FIG. 19F4. FIG. 19F1 shows the fabrication of the quad-gate electrodes 1901/1 in dielectric layer 1903/1 overlying dielectric layer 1904/1 and semiconductor substrate 1905/1. The quad-gate electrode is further overlaid by dielectric layer 1902/1. The circuit fabrication shown is accomplished with established IC fabrication processes.

Figure 2C:
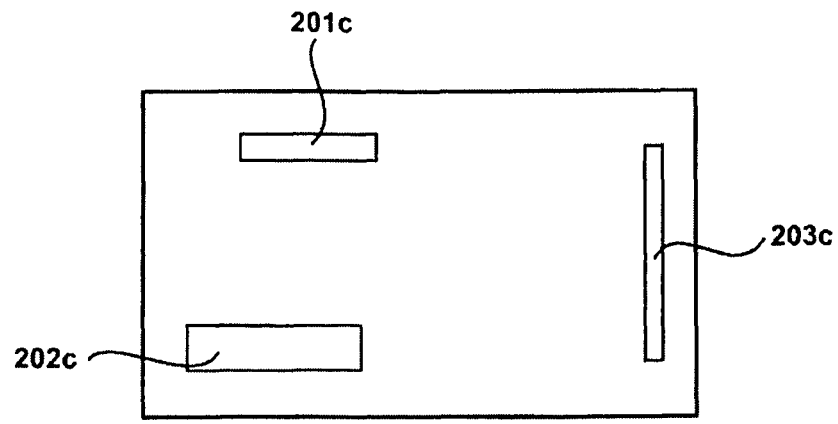
FIG. 2C is top view of predefined or standardized placement of vertical interconnection blocks on a VSI circuit layer.

FIG. 19F2 shows a via 1901/2 etched through the dielectric layers 1902/2, 1904/2 and quad-gate electrodes 1903/2 terminating on the semiconductor substrate 1906/2 with substrate contact 1905/2. The circuit fabrication shown is accomplished with established IC fabrication processes.

FIG. 19F3 shows quad-gate electrodes 1907/3, 1908/3, dielectric layers 1902/3, 1904/3, 1905/3 and semiconductor substrate 1906/3 with the addition of quad-gate dielectric layer 19013 over the side walls of the via 1901/2 shown in FIG. 19F2. The growth or deposition of the quad-gate dielectric 1901/3 will cover the semiconductor substrate contact 1903/3 and is not shown, it is removed by use of RIE processing techniques enabling a directional or differential etch of the horizontal surface of the substrate contact 1903/3 versus the quad-gate dielectric 1901/3 on the via side wall. This etch processing removes that portion of the quad-gate dielectric from the substrate 1906/3 which is required to be open as a crystalline seed surface for subsequent epitaxial growth of the transistor body.

FIG. 19F4 shows the quad-gate electrodes 1907/4, dielectric layers 1902/4, 1913/4, 1911/4, semiconductor substrate 1912/4 and quad-gate dielectric 1901/4 with the addition of the transistor body source 1903/4, 1906/4, gate 1905/4, 1908/4, and drain 1909/4, 1906/4 regions. The transistor body regions were fabricated by convention semiconductor epitaxial controlled growth techniques. The epitaxial grown transistor body is grown from the substrate seed contact area 1910/4 at the bottom of the transistor via. The doping profiles of the source, gate and drain regions are formed during the epitaxial growth of the transistor body. The distance from the semiconductor contact 1910/4 to the gate regions 1905/4, 1908/4 are known distances along the transistor body from the semiconductor substrate 1912/4 and the epitaxial growth rate is used to determine the use of doping constitutes and concentrations required to form the various regions of the transistor body during epitaxial growth of the transistor body. Once the quad-gate transistors of the VSI layer are completed, overlying horizontal interconnection is formed as needed, and the circuit layer is then ready for bonding onto a another substrate and the removal of the underlying substrate 1912/4 up to dielectric layer 1911/4. This followed by backside fabrication of the drain contact 1903/5 and the fabrication of additional interconnection, as needed.

Additional quad-gate transistors could optionally be formed on the backside of the completed first quad-gate VSI circuit layer through the use of a semiconductor substrate with a dielectric barrier layer such as a SOI substrate. If this were desired, the removal or thinning of the SOI substrate would stop on the barrier layer, and the then underlying device layer of the SOI substrate could be used as a crystalline seed contact for the growth of the next layer of quad-gate transistors by repeating the fabrication sequence represented by FIGS. 19F1 through 19F4. Such backside fabrication of quad-gate transistors also assumes that a drain contact and interconnection to it was fabricated during top side first quad-gate transistor circuitry fabrication in anticipation of the backside quad-gate transistor fabrication.

FIG. 19G1 through FIG. 19G4 show a second VSI method for fabrication of a vertical transistor with quad gate structure. The transistors shown in FIG. 19G4 and FIG. 19G5 are quad-gate transistors implemented through VSI processing which enables fabrication access to both sides of an integrated circuit, however, the fabrication of these quad-gate transistors are not limited to the VSI fabrication processing techniques. FIG. 19G5 shows a quad-gate transistor with two gate body regions 1907g5, 1909g5, quad-gate dielectric 1912g5, gate electrodes 1905g5, 1913g5, gate contacts 1901g5, 1903g5, source contact 1902g5, source transistor body region 1906g5, 1908g5, drain transistor body region 1908g5, 1910g5, drain contact 1911g5 and dielectric layers 19014g5, 1904g5, 1915g5. The gate electrodes 1905g5, 1913g5 surround the transistor body enabling the complete inversion of the transistor gate region when a threshold voltage is applied. FIG. 19G5 clearly shows that the quad-gate transistor body is vertical passing through the VSI circuit layer 1904g5, and therefore, can also provide the additional function of a vertical interconnection.

The fabrication sequence of the quad-gate transistor shown in FIG. 19G5 is shown in FIGS. 19G1 through 19G4, or the fabrication sequence also as shown in FIG. 19F1 through FIG. 19F5. FIG. 19G1 shows the fabrication of the epitaxially grown layers 1901g1, 1902g1, 1903g1, 1904g1 on the surface of substrate 1907g1, dielectric barrier layer 1906g1 and semiconductor device layer 1905g1. The epitaxial layers correspond to the source 1901g1, 1903g1 and gate 1902g1, 1904g1 regions of the transistor body; the preexisting device layer 1905g1 corresponds to the drain region of the transistor body and is assumed to be doped appropriately or extended by epitaxial processing.

FIG. 19G2 shows the transistor body formed by etching away the surrounding semiconductor material to the dielectric layer 1907g2 overlying substrate 1908g2 and leaving the transistor body vertically oriented with hard dielectric etch mask 1901g2 overlying source 1902g2, 1904g2, gate 1903g2, 1905g2 and drain 1904g2, 1906g2 regions.

FIG. 19G3 shows the quad-gate transistor after fabrication of quad-gate dielectric 1910g3, gate electrodes 1904g3, 1914g3, gate contacts 1901g3, 1903g3 and dielectric layers 1911g3, 1915g3. The gate electrodes are deposited at a distance from the dielectric layer 1912g3 that corresponds to gate body regions 1906/3, 1908/3 of the quad-gate transistor body. The circuit fabrication shown is accomplished with established IC fabrication processes.

FIG. 19G4 shows a completed VSI quad-gate transistor with quad-gate electrodes 1903g4, 1912g4, gate contacts 1902g4, transistor source region 1905g4, 1907g4, gate regions 1906g4, 1908g4, drain region 1907g4, 1909g4, quad gate dielectric 1904g4 and the substrate removed with drain contact 1910g4 and optionally formed over dielectric layer 1912g3 shown in FIG. 19G3. The quad-gate electrodes are connected in common, but also can be fabricated to operate independently as shown in FIG. 19G5 or in numerous other single or multiple quad-gate design configurations.

Figure 19H:
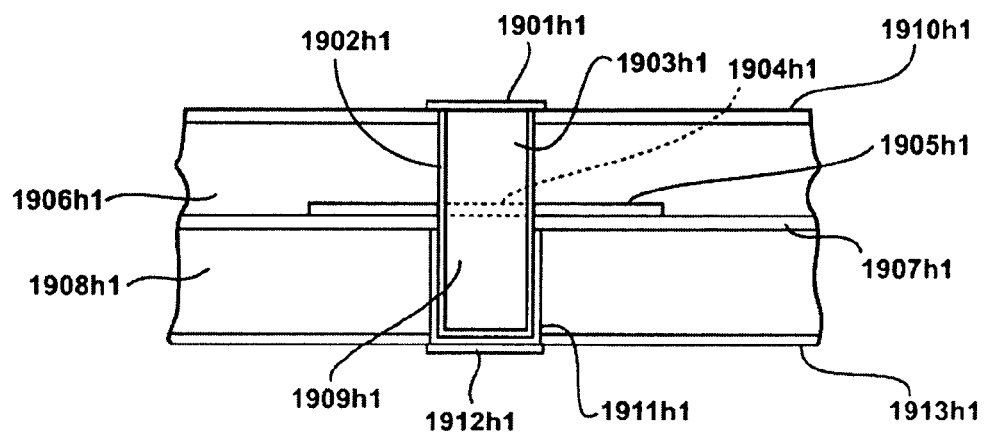
FIG. 19H is a cross section of a Quad-Gate 1T Memory Cell.

FIG. 19H shows a VSI quad-gate 1T non-destructive read memory cell. This single transistor memory cell is composed of a quad-gate electrode 1905h1 surrounding the transistor body of source 1903h1, gate 1904h1 and drain 1909h1 regions, gate dielectric 1902h1, drain charging electrode 1911h, source contact 1901h1, drain charging electrode contact 1912h1 and dielectric layers 1910h1, 1906h1, 1907h1, 1908h1, 1913h1. The VSI quad-gate 1T memory cell operates by storing charge in the drain region. The amount of charge in the drain region of the quad-gate transistor is determined by the voltage applied to the drain charging electrode 1911h-i. The charge stored in the drain region 1909h1 can be sensed through the drain charging electrode contact 1912h1 enabling the memory cell to be non-destructively read. The memory cell may require periodic refresh of its stored charge depending on the rate of charge leakage that may occur from the drain, however, the quad-gate structure will act to reduce or eliminate charge leakage depending on the geometry of the transistor body and quality of its fabrication.

It is a further aspect of the 1T quad-gate memory cell described herein, that more than one quad-gate can be used to reduce charge leakage as shown in FIG. 19F5. It is a further aspect of the 1T quad-gate memory cell described herein, that the memory cell can be integrated with additional logic functions in the same vertical transistor body of the memory cell through the fabrication of additional gate regions and quad-gate electrodes, and additional source/drain electrodes can be added along the transistor body. It is a further aspect of the 1T quad-gate memory cell described herein, that the memory cell can be integrated as the memory element in PLD logic such as FPGA logic or programmable combinatorial logic. It is a further aspect of the 1T quad-gate memory cell described herein, that the a feed back circuit can be used to accurately monitor the charge or voltage of the memory cell to adjust the charge without a complete refresh of the charge. It is a further aspect of the 1T quad-gate memory cell described herein, that the memory cell can be used to store multiple levels of charge so that more than one bit of information can be stored in the memory cell.

VSI IC Yield Enhancement and Dynamic and Static Configuration

The VSI fine grain vertical interconnect enables novel methods of IC yield enhancement after the fabrication of an IC is completed, for ICs with large surface areas, and for ICs where the yield of even one IC per wafer would be acceptable if such yield were obtainable. The capability for post circuit wafer fabrication integration of a large number of VSI circuit layers has the advantages of simplified IC integration, improved performance, and lower overall IC costs. The yield of such highly integrated ICs is not possible without a method for configuration of the IC to avoid various expected physical defects in the circuitry of the IC.

Full or multiple redundancy of complete VSI circuit layers enables higher net VSI IC yields independent of circuit die size. This method of VSI IC yield enhancement offers unique net VSI IC circuit yield advantages when a specific net circuit yield is an application requirement or even the yield of one IC would be acceptable. Fine grain vertical interconnect implements this method of yield enhancement with a small number of vertical interconnects sufficient to separately enable and power each redundant circuit layer. An example of yield enhancement with this aspect of the VSI invention is a circuit layer with an expected planar IC yield of 80% if made fully redundant in a VSI component would have an effective yield of approximately 96%, similarly, an IC with an expected planar IC yield of 60% if made triply redundant in a VSI component would have an effective yield of approximately 93%. It is important to point out that the cost of packaging often is greater than the cost of a planar die being packaged, and in certain circuit applications packaging costs are several times greater than planar die cost, and therefore, VSI circuit layer redundancy can be cost effective through reduction of packaging costs. Circuit test costs are reduced in a similar manner, wherein the cost of testing one VSI IC is less than the cost of testing a number of planar ICs that are equivalent to the VSI IC.

Circuit configuration or reconfiguration control circuitry is located on one or more VSI circuit layers separate from the circuit layers to be configured through VSI vertical interconnections. The redundant VSI circuit layers are connected enabling or disabling configuration circuitry by as many fine grain vertical VSI interconnections as may be required to achieve the desired control over the use of these circuit layers, and may range from 100s to 10,000s or more interconnects. The configuration of a VSI IC or component can be implemented with programmable circuitry such as PLD or FPGA circuitry using dynamic memory means, for example SRAM or Flash devices or static means such as fuse or anti-fuse devices, all presently used programming means in planar PLD circuits. An example of this type of VSI IC is shown in FIG. 5.

This aspect of the VSI invention dramatically impacts computer architecture by enabling the integration of heretofore more circuitry than is presently possible with existing IC technologies and without regard to the incompatible characteristics of the disparate semiconductor processes and technologies that may be used or the yield of any particular circuit layer. The primary objectives of this aspect of the VSI invention are higher IC performance with lower cost through reduction of conventional package and testing costs, and performance delays due to packaging interconnections.

VSI ASIC Manufacturing Inventory Method

The VSI integration and yield enhancement methods when combined with standardized die sizes, and circuit interfaces, communication protocols, layout and placement of fine grain vertical interconnections enable the fabrication of circuit layers that have a varying range of utilization for a broad range of end-user or OEM [Original Equipment Manufacturer] applications. This combination of the VSI IC manufacturing integration and design methods enables the novel method for integrating completed VSI circuit wafers from an inventory of various circuit wafer designs. This offers two heretofore unavailable IC manufacturing capabilities:

[1] a method for the manufacturing of completed circuit wafers as integral components or sub-systems prior to subsequent use in multiple application circuits that differ by one or more circuit features such as processing capacity, storage capacity, design, method of use or intended use; and,

[2] a method for inventory control for reuse of fabrication completed IC circuitry prior to final circuit integration fabrication.

VSI Stacked Wafer Alignment Method

Another aspect of the VSI invention includes methods for achieving high precision wafer to wafer bonding alignment with tolerances below current available capabilities of ±1 µm physical alignment [4 µm vertical contact pitch] and as low as approximately ±5 nm physical alignment. The objective of achieving greater alignment precision of wafers prior to bonding is to be able to provide a vertical interconnection pitch that scales with or is compatible with the pitch of the last horizontal interconnections of a circuit device layer. This is enabled by the use of specific alignment wafer processing steps in combination with the use of established micro-lithographic alignment means conventionally used in currently available stepper scanner lithography equipment to align exposure masks to a wafer or substrate.

The alignment accuracy for of the invention is similar to the alignment accuracy achieved with established lithography alignment equipment and has the capability to scale with ever decreasing circuit geometries. This degree of wafer alignment precision also requires that the individual lithographic images that are printed across the surface of a VSI circuit wafer be placed at placement tolerance relative to each other that is typically less than 50% of the minimum feature size of the vertical interconnect patterns on the bond surface layer and preferably less than 25% of such minimum feature sizes. State of the art micro-lithography equipment are capable of layer to layer alignment of less than 20 nm., however, such equipment when first stepping across a wafer [so called blind step] exhibit center to center placement of adjacent stepped circuit images of nominally 100 nm or greater.

The wafers or circuit layers or MEMS device layers used in making a VSI IC are composed of rows and columns of circuits or MEMS and each of said circuit or MEMS must be fabricated with a circuit placement accuracy relative to each other such that all vertical interconnections from one VSI IC layer to the next VSI circuit layer can be aligned properly. The cumulative placement variance from first to last stepped image in either row or column can currently be as much as 2 µm. It is the objective of the VSI substrate alignment method that the placement of die images relative to each other [in x, y & theta] across a wafer not vary by more than 50% of the minimum feature size of the last imaged layer or bonding layer. This is to say the center to center placement of any image on the wafer to any other image on the wafer not vary by preferably more than 50% of the final substrate bonding alignment budget. This presently is not done by as part of lithography processing. This is accomplished by use of the following processing steps:

1. Printing a first image with alignment marks on substrate [so called blind step image] wherein the placement of any image relative to any other image has a center to center placement variance when added to the substrate bonding alignment tolerance of less than the final substrate to substrate alignment budget. The first printed image may be limited to a first set of alignment marks prior to the printing of the first circuit image layer using pattern generator equipment or direct write on wafer equipment such as those presently used for making circuit masks using E-beam or optical exposure means. The accuracy of the placement of blind step images on a substrate is presently controlled by a precision mechanical substrate stage with current nominal image to image stepping motion control of less than 50 nm and with a substrate temperature controlled to approximately 1° C. and often to 0.1° C. This does not provide sufficient placement accuracy for VSI alignment method objectives of less than ±250 nm and preferably less than 100 nm due to insufficient substrate temperature control. If a value of 4 is used as the CTE for a silicon substrate, then at 0.1° C. an additional 80 nm of placement variance is incorporated into the mechanical substrate stage placement accuracy for a 200 mm wafer and more for a 300 mm wafer. The lithography for planar circuitry does not require a high precision first image placement alignment control tolerance. A majority of current lithography stepper and pattern generation equipment have the capability to adjust exposure image placement with a high accuracy of less than 1 nm. The VSI alignment method uses this current image exposure placement adjustment capability in combination with the measurement from the substrate stage interferometer [such interferometers have measurement tolerances of less than 1 nm] and with immediate measurements of the wafer or substrate surface temperature to an accuracy of less than 0.1° C. and preferably to 0.001° C. or less. The exposure image adjustment demagnification means is then further compensated by a first image placement adjustment calculation for exposure placement that includes the wafer or substrate expansion or contraction as a function of its CTE. The temperature measurement of the wafer or substrate can be either an average physical temperature measurement calculated from one or more physical measurements of the top or backside of the wafer or substrate, or preferably, a distribution of physical temperature measurements taken over either the front or back surfaces and wherein the physical position of the temperature measurement is used as part of the image demagnification and placement adjustment calculation. The image placement calculation methods are derived from established physical methods. The blind step or first on wafer step image exposure demagnification and placement compensation for all initial image exposures is a combination of interferometer measurement and substrate temperature measurement as a function of substrate CTE will enable an image placement accuracy of less than 10 nm and typically less than 5 nm. The use of substrate temperature measurement to increase image placement accuracy also allows the temperature control of the substrate to be less demanding than current lithography temperature control methods.

2. Printing the wafer bond layer [last imaged layer] aligned to alignment marks of a lower layer and preferably the marks used to align the first image layer. This may require that all or nearly all image layers be aligned to the alignment marks on a lower layer or preferably the first imaged layer.

3. Through substrate interferometer or AFM [Atomic Force Microscope] alignment as explained below.

The true placement of all first images on a wafer or substrate are primarily affected by mechanical wafer or substrate stage motion error and relative expansion or contraction of the wafer of substrate due to it temperature; there are other placement error factors but there are existing methods for minimizing these placement error factors. The VSI first on wafer or substrate imaging alignment budget for all first printed images is composed of two components: an image placement adjustment by the image exposure means of the lithography tool of the mechanical substrate stage position based on the true stage position measurement from the stage interferometer; and, an image placement adjustment by the image exposure means of the lithography tool based on immediate or in situ temperature measurements of the wafer or substrate surface wherein additional image placement adjustment is calculated from these temperature measurements using the CTE for the wafer or substrate material. This VSI first on wafer or substrate lithographic imaging method enables all printed images to have a relative placement alignment budget to all other printed images of less than 10 nm and or 5 nm. This image placement alignment budget is a result of the capability of current lithographic imaging means to make image placement adjustments to an accuracy of less than 1 nm from stage interferometer position measurements and substrate surface temperature measurements. The VSI first on wafer or substrate image alignment budget objective is an image to image alignment of all images printed on the substrate relative to each other all such placements being relative to or initialized from the placement of the first image on the wafer or substrate; it is understood that the initial printed image on the wafer or substrate is printed by those means presently available and that the placement of all other first on wafer or substrate images are relative to the initial printed image.

The VSI invention stacked wafer to wafer alignment process is a combination of the alignment accuracy of the image placement of the last or top printed image on the wafer of substrate and the VSI means for aligning the wafer or substrate images on the bonding surfaces on wafers or substrates to be bonded. The on wafer or substrate image placements using the VSI image placement method described herein enables an image placement alignment budget of less than 50 nm and or less than 10 nm. The VSI wafer to wafer or substrate to substrate alignment means described herein enables a alignment budget of less than 50 nm and or less than 10 nm. The combination of these two alignment budgets enables a final alignment budget for all images on a wafer or substrate corresponding to images on a second wafer or substrate to be less than 100 nm and or less than 20 nm. This final alignment budget enables wafer or substrates that are to be bonded to be aligned with an accuracy that is compatible with the pitch of the last metallization horizontal interconnection layer of a circuit layer presently in the nominal range of 0.5 µm to 2 µm.

FIG. 21A and FIG. 21B show an embodiment of the VSI invention stacked wafer to wafer alignment process. This embodiment is accomplished by either pre-thinning the semiconductor substrate portion 2103a of a circuit wafer to be bonded to a thickness of less than 25 µm and preferably less than 10 µm as shown in FIG. 21A, or by etching a minimum of two openings, only one shown as 2100b, in the backside of the semiconductor portion of a circuit wafer to be bonded such that at the bottom of the etched openings less than 10 µm of the semiconductor portion of the circuit wafer remains, as shown in FIG. 21B, or a combination of both subsequent substrate thinning and etch of openings. The remaining semiconductor portion of the circuit wafer to be bonded when thinned to less than 25 µm and preferably less than 10 µm is sufficiently transparent to view conventional alignment marks formed on the bonding surfaces of the wafers being bonded. Once the backside wafer thinning is done or openings are made, wafer to wafer alignment can be done by established means as those used conventionally in lithography wafer processing tools for alignment of a mask and a circuit wafer being fabricated, FIG. 21D shows an example of a split field optics alignment method used to align a VSI circuit wafer to a VSI circuit wafer stack.

In all embodiments of this invention, the upper alignment marks 2101a, 2101b are suspended on or in a layer of transparent dielectric which allows the clear and unobstructed viewing of all upper and lower alignment marks. In the circumstance where a thin layer of semiconductor substrate remains before the dielectric layer, it is thin enough to be transparent. A wafer silicon semiconductor material when thinned to 10 µm or less becomes transparent.

The alignment of VSI substrates is similar in method to contact printing methods. The VSI substrates are brought in contact and alignment verification is performed. However, wherein contact printing the contact the mask and substrate must be separated again if additional alignment adjustments are required, this is not the case with VSI alignment. The VSI substrates during alignment adjustment can remain in contact due to low surface to surface frictional forces because their surfaces are smooth and free of adhesives agents such as photo-resist as in the case of contact printing, and under little or no pressure load for bring the surfaces into contact. This enables the alignment of the substrates to be held in place since no additional motion of the substrates is necessary once their alignment is completed. Once alignment of the in contact substrates 2103a, 2104a or 2103b, 2105b is completed, the pressure load on the substrates is increased holding their placement to prevent subsequent loss of alignment due to mechanical vibration due to the substrate bond processing.

Figure 21C:
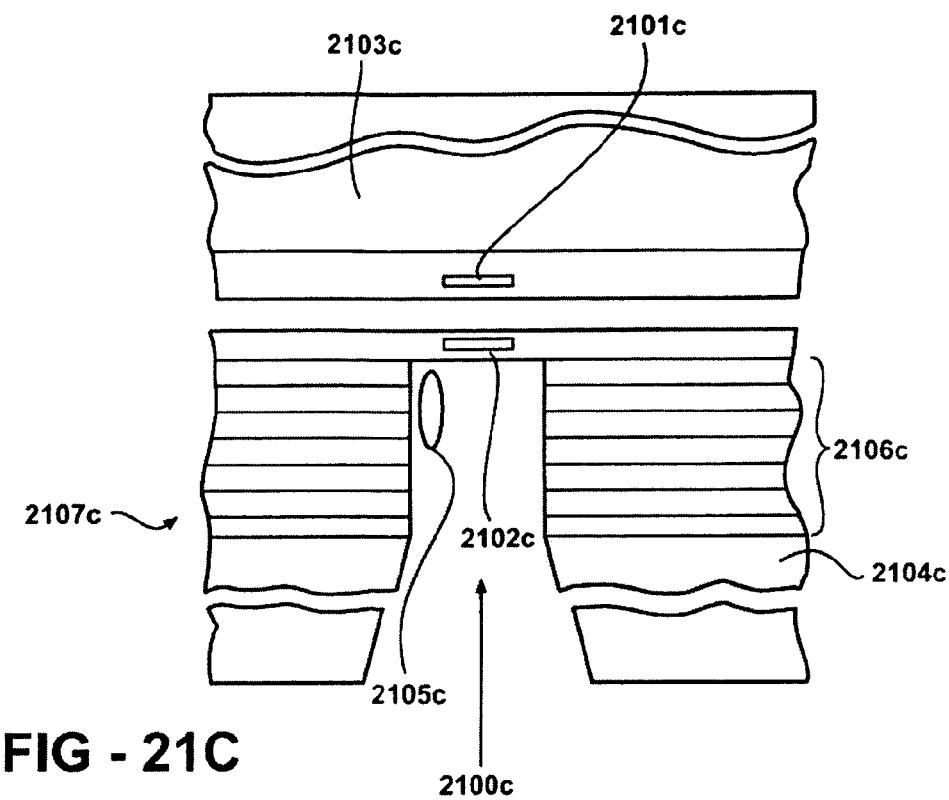
FIG. 21C is a cross section of a VSI optical substrate alignment method.
Figure 21D:
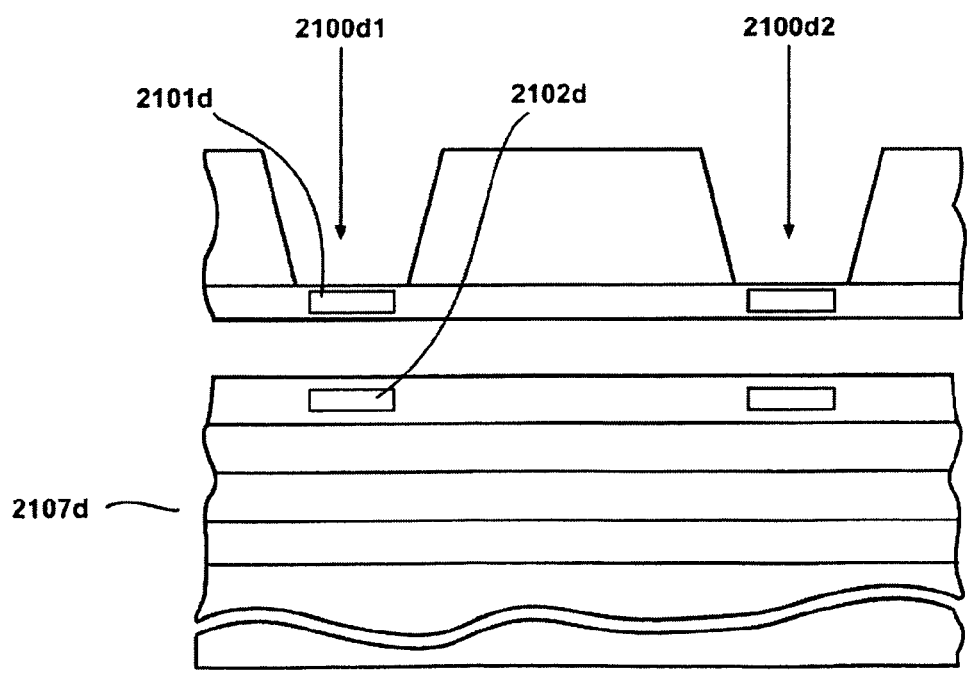
FIG. 21D is a cross section of a VSI optical split field substrate alignment method.

The preferred embodiment of this wafer to wafer alignment invention for aligning a circuit wafer to a circuit wafer stack is by opening two or more openings in the back side of the wafer stack to expose the alignment marks formed on the backside of the of the last bonded circuit wafer as shown in FIG. 21C. The backside alignment openings 2105c of the wafer stack are extended through VSI circuit layers 2106c by conventional etching methods down to the alignment marks 2102c printed on a dielectric layer deposited on the backside of the last thinned wafer bonded to the wafer stack 2107c. The extension of the backside opening 2105c of the wafer stack removes the previous alignment mark used to align the most recent bonded circuit layer to the circuit layer stack 2106c (this most recent aligned and bonded circuit wafer is now the last circuit wafer on the wafer stack 2107, its has an alignment mark which will be used for alignment of the next circuit wafer to be bonded), the dielectric layers supporting the previous alignment mark 2102c and any remaining semiconductor substrate, then stopping on the deposited dielectric layers on the bonded side of the circuit wafer most recently bonded to the wafer stack.

Figure 22A:
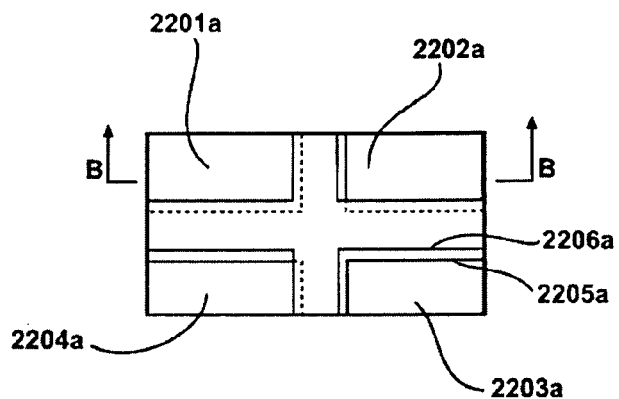
FIG. 22A is a top view of overlapping alignment marks.
Figure 22B:
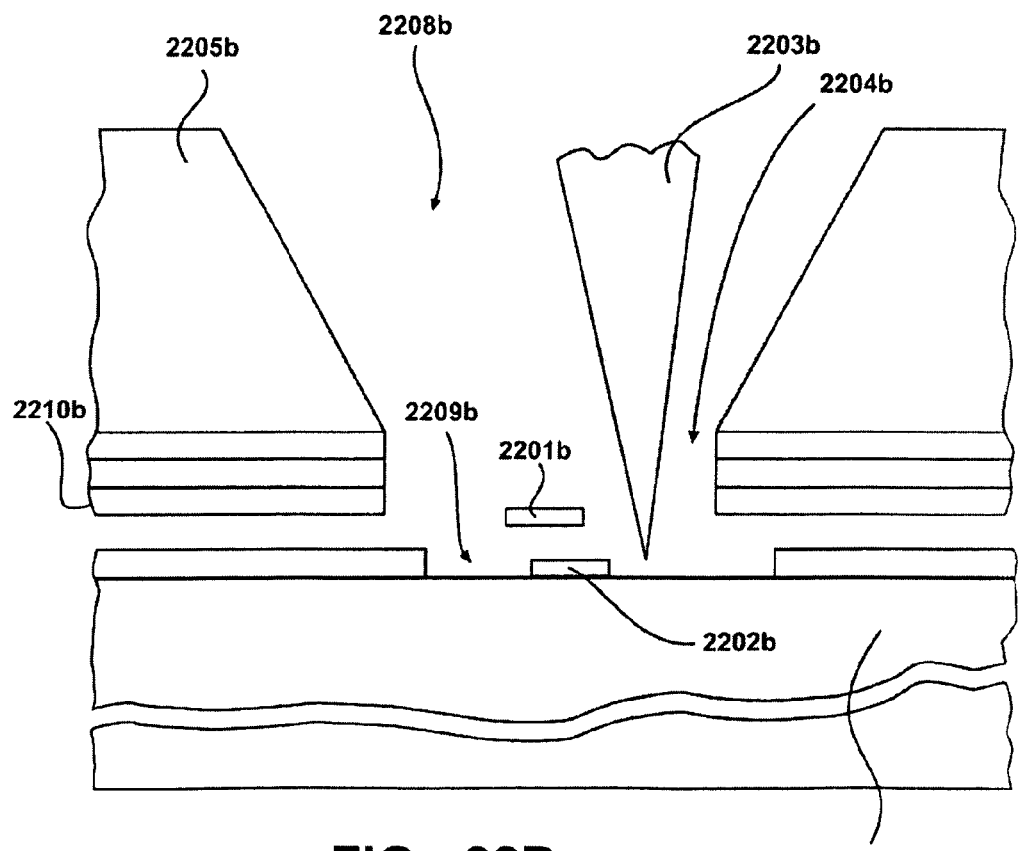
FIG. 22B is a cross section of a VSI substrate alignment method with a AFM probe.

An alternative alignment method to the alignment embodiments of FIG. 21A through 21D is to use a mechanical atomic force microscope [AFM] or such similar measurement tool as are presently in common use for imaging surfaces on an Angstrom or nanometer scale. This type of alignment could optionally follow an initial gross optical alignment of the two circuit layers to be aligned. The probe 2203b as shown in FIG. 22B, and the probe's position corresponding to the cross-section line BB of FIG. 22A, reaches through a backside opening 2208b of the circuit stack substrate 2205b and through alignment mark openings 2201a, 2202a, 2203a, 2204a and images the overlap displacement or position of the alignment cross mark 2201b of the top circuit layer of the circuit stack 2210b and the alignment cross mark 2202b of the circuit layer 2206b to be bonded by reaching through openings 2204b, 2209b on either side of the alignment cross marks 2201b, 2202b. The type of alignment marks are not limited to cross alignment marks, the use of cross alignment marks is only for the purpose of illustration.

The AFM probe simultaneously images the physical positions of the alignment marks 2202b on the wafer or substrate 2206b to be bonded and the alignment cross marks 2201b of the top circuit layer of a VSI circuit stack 2205b onto which the wafer or substrate 2206b is to be bonded with respect to each other. Once this measurement is made, a calculation is made from this measurement by which the relative position of the two wafers or substrates 2205b, 2206b, is changed, if needed, to bring the alignment marks into alignment, and therefore, wafers or substrates to be bonded. The alignment measurement procedure may subsequently be repeated, as needed, until the desired alignment accuracy is achieved.

This alignment procedure requires additional process steps to allow access to the bottom wafer alignment marks 2201b so that they can be imaged by the atomic level probe 2203b. This step is the selective etching by conventional means such as RIE of the dielectric on which the metal pattern that is the alignment mark was formed. It is assumed that the layout of the alignment mark is so designed that once the dielectric around the alignment mark is removed it has sufficient support to remain suspended in the alignment opening 2208b which is part of the of the top circuit layer 2210b on the wafer or substrate 2205b, as shown for example by the suspended alignment mark 2201b in FIG. 22B. The process of simultaneously imaging both alignment marks with the atomic level probe provides measurement data on the relative position of one alignment mark to the other; this imaging of alignment marks is preferably done at two locations of the wafers or substrates to be bonded in order to measure angular displacement, and is a process similar to that used in split filed optical alignment methods. Typically only one of the wafers or substrates is then moved in x, y and angular directions in accordance with the measured differences between the respective alignment marks. This alignment procedure takes only a few seconds or less when automated and can be repeated to verify that the desired alignment has been achieved. The capability of this alignment procedure enables wafers to be aligned to an accuracy approaching the resolution of the measurement probe; the probes available today are able to achieve resolutions of less than 2 nm, and therefore, wafer to wafer alignment mark positioning accuracies of less than ±5 nm can be achieved after assuming an allowance for alignment mark edge roughness nominally of less than 5 nm resulting from present pattern processing methods.

Figure 28:
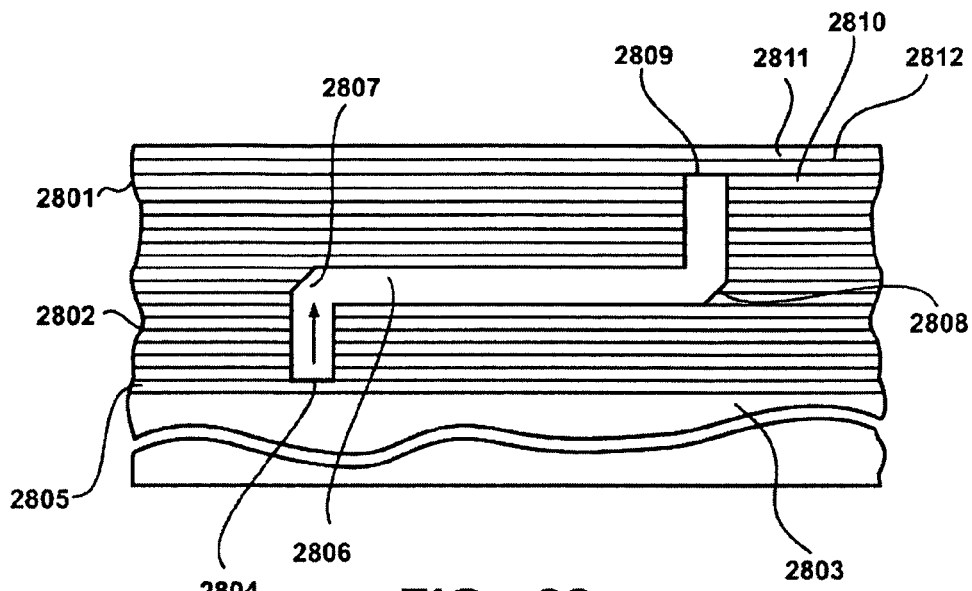
FIG. 28 is a cross section of a VSI optical waver guide interconnection.
Figure 29:
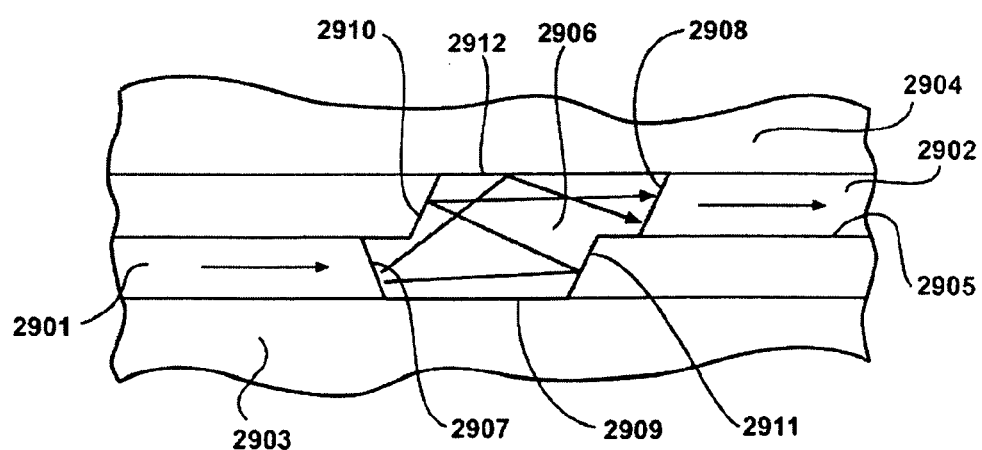
FIG. 29 is a cross section of a VSI optical waver guide coupling interconnection.

An another alternative alignment method to the above preferred alignment embodiments is to use electro-magnetic proximity sensing through a wire coil pattern. This method of alignment is consistent with the invention provided in applicant's U.S. Pat. No. 5,354,695 42:39-44:9 with FIG. 28A and FIG. 28B, and is included by reference. One coil is a closed loop pattern in the position of the alignment mark on the wafer to be bonded and a second and a third open loop coil is in the opening of the bottom wafer again in the position of the alignment mark. Two probes are used to make contact with one of the open loop coils for propagating a signal through the coil which induces a signal in the closed loop coil of the wafer to be bonded. Two probes are used to make contact to the other open loop coil as a means to sense the signal induced in the closed loop coil. The strength of the sense signal is maximized by adjusting the position of either the closed loop coil or the open loop coils. As part of the fabrication of these coils they are approximately 2,500 Å below the surface of the dielectric film they are part of or embedded; this is done to prevent shorting of the coils during the alignment process and provides an approximate measure of the separation distance between the closed and open loop coils. Alternately one open loop coil may be used, in this case there is an electrical load induced on the signal of the open loop coil by the closed loop coil; this method requires a greater degree of signal processing to determine when the desired alignment is achieved.

VSI Method for the Reduction of Distributed Circuitry

The VSI component vertical circuit structure enables a novel design method for the reduction of the distributed circuitry of a planar circuit design or layout. An example of this are sense amps in a memory array. Sense amps are distributed through out a planar circuit layout as a result of the electrical necessity to be physically close to a memory bit [data] line in order to determine its state. This distribution of sense amps is not necessary for the memory array circuit layers of a VSI IC because the sense amps can be placed on a separate circuit layer and shared among multiple memory bit lines on separate circuit layers in direct close coupling [through fine grain vertical interconnections] without addition of significant wiring length between a sense amp and associated memory bit lines. A second example are the signal repeaters necessary to propagate a signal over a long distance across a circuit, such as is the case in PLD circuits. The VSI IC fine grain vertical interconnection lengths of nominally less than 200 µm eliminate the need for all or most of such repeater circuits over the planar circuit layer when used with a smaller die size.

VSI Ate System on Wafer Processing Method

Another embodiment or aspect of the VSI invention is its use in the fabrication of a full on-wafer or substrate ATE [Automatic Test Equipment] system. The objective of the VSI ATE system is to provide the capability to test all circuits on a wafer or substrate at their maximum possible speed, to test such circuits during a burn-in procedure, to program such circuits based on test data for the purpose of configuration of the circuit due to circuit defects and to program such circuits with data for their subsequent application use.

Figure 23A:
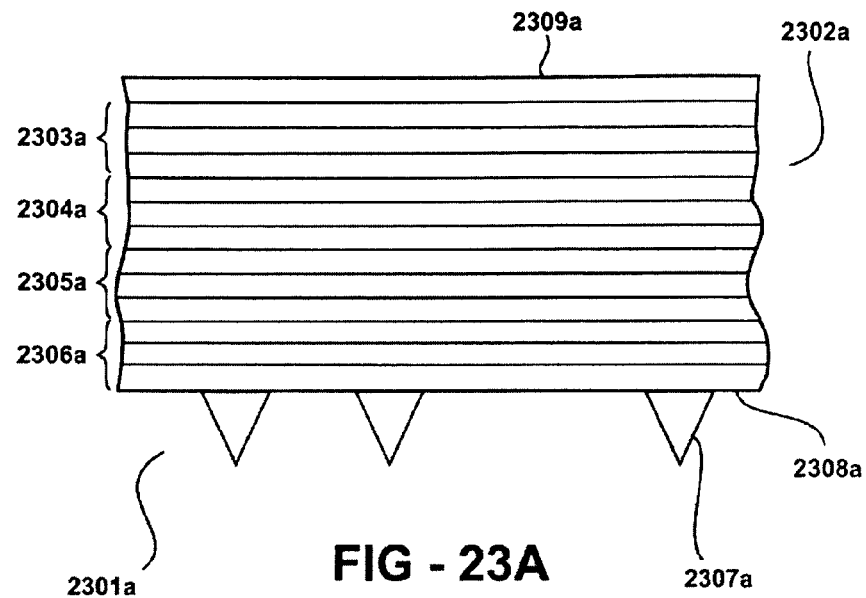
FIG. 23A is a cross section of VSI ATE system circuitry.

FIG. 23A shows in cross section a VSI ATE system 2301a. The VSI ATE system is a wafer or substrate stack 2302a composed of circuit layers or groups of circuit layers that provide the pin electronics 2305a, programmable tester logic and external communication circuitry 2304a, yield enhancement testing and reconfiguration logic 2306a and tester memory 2303a for circuit test vectors. Optional support substrate 2309a may be used as means for handling and or connecting to the VSI ATE system; such optional support substrate being made from such flexible materials as polysilicon or graphite with a thickness of less than 4 mm and preferably less than 500 µm. FIG. 23A also shows DUT [Device Under Test] contact means 2307a as part of the bottom circuit layer 2308a of the VSI ATE system 2302a. These contact means are fabricated in accordance with inventor's U.S. Pat. Nos. 5,323, 035 and 5,4543,404 and included herein by reference. The various circuit layers or groups of circuit layers are intended to be modular in design such that depending on the type of DUT pin or programmable tester logic layers of generic or specific design required for the DUT circuit type, such logic layers can be inserted into the VSI ATE system wafer stack, or further, the amount of memory required for the test of a specific DUT type can be varied to meet the testing requirements.

The VSI ATE system incorporates yield enhancement circuitry 2306a which allows the defective pin or tester circuitry to be replaced by spare circuitry or not to be used. The VSI ATE system yield enhancement circuitry is implemented from circuitry such as FPGA or fuse circuitry which allows dynamic or static implementation of the interconnection routing of various circuit blocks of the VSI ATE system electronics. The majority of the circuitry of a VSI ATE system is devoted to circuitry referred to in the ATE industry as pin electronics 2305a. With each DUT IC on the surface of a circuit wafer or substrate there is some number of I/O contact pads or pins on that IC to be tested and pin electronics of the VSI ATE system are provided for all or some number of an IC contact pads. The pin electronics do not take significant circuit area and since the pin electronics are in immediate physical location to the pads of the DUT there is little or no requirement for additional drive and timing circuitry to be associated with the pin electronics further reducing the power required for the pin electronics. The VSI ATE system in its preferred embodiment simultaneously tests a plurality of ICs or DUTs on a wafer or substrate while in contact with all or the majority of ICs to be tested. The method and rate of in which the VSI ATE system performs DUT testing is a manner of how it is programmed to operate. A VSI ATE system can also be designed to test by contacting only a limited portion of ICs on a wafer or substrate at one time whereupon such a VSI ATE system would be stepped over the surface of the DUT wafer to make contact with all the ICs to be tested.

The benefit of the VSI ATE system is at-speed IC testing and burn-in of ICs, while the ICs are in substrate form or prior to their separation from the wafer or substrate upon which they where fabricated, and early IC process yield knowledge. Current ATE systems are large programmable electronic assemblies of PCBs and because of their size do not presently have the capability to propagate test signals at a level of performance to test most ICs at their full rated speed while on wafer or substrate. Secondly, present ATE systems are expensive and have the ability to test one or a limited number of IC on a wafer simultaneously. The VSI ATE system may be fabricated with as few as 4 circuit layers or more than 32 circuit layers with a cost that is approximately less than 25% of the current IC testing costs. A further benefit of the VSI ATE system is that it enables testing ICs with large numbers of I/Os with contact pitch of 10 µm or less without an increase in cost, since the probe point contact means 2307a of the VSI ATE system are lithographically formed and programming of interconnections of the pin electronics can be routed dynamically from one IC to another should the ICs of a substrate require more pin electronics than are available to meet the requirement for testing all ICs simultaneously.

Figure 23B:
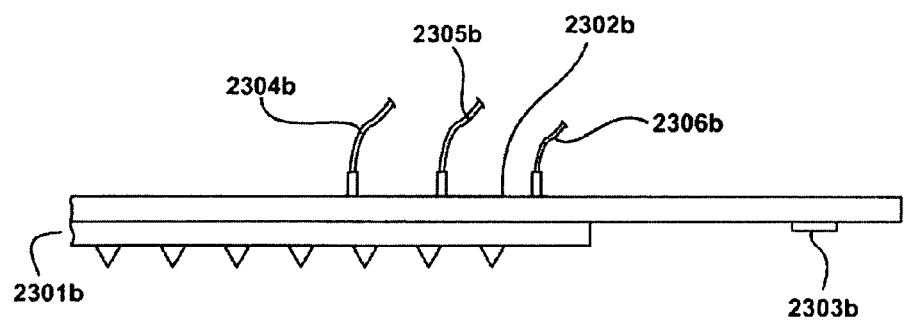
FIG. 23B is a cross section of VSI ATE system circuitry mounted on a support substrate.

The input and output of data to the VSI ATE system is accomplished by making electrical or optical contact to the VSI ATE system wafer or substrate stack or by wireless or radio means or a combination. The VSI ATE system may be bonded to a support substrate for the purpose of mechanical manipulation and or a means through which electrical contacts can be made to the VSI ATE system wafer stack. FIG. 23B shows in cross section a VSI ATE system 2301b bonded to a flexible supporting substrate 2302b preferably made from polysilicon or graphite material and with a thickness of less than 4 mm and preferably less than 500 µm [0.5 mm]. The support substrate 2302b may optionally make external electrical contact to the VSI ATE system 2301b bring those contacts to the edge of the support substrate 2303b. The support substrate 2302b may optionally be used to mount fiber optical connections 2304b, 2305b, 2306b allowing optical signals to pass through the support substrate either to optical wave guides or directly to optical transmission transceivers on one or more of the circuit layers of the VSI ATE system 2301b. Programming and data for the VSI ATE system 2301b may be also be transmitted or received by optical fiber connections, wired or wireless means.

Figure 23C:
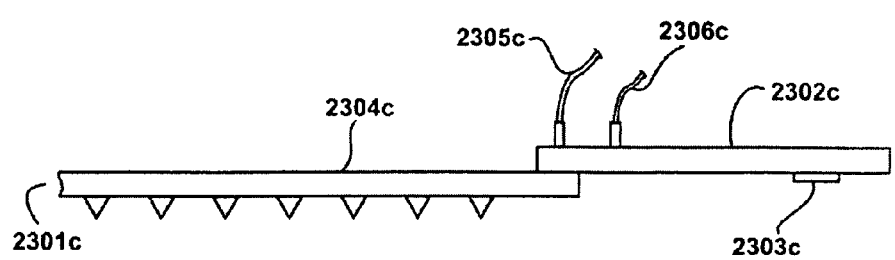
FIG. 23C is a cross section of VSI ATE system circuitry mounted on a support substrate.

The FIG. 23C shows in cross section a flexible support substrate made from materials like those of FIG. 23B with an open internal area 2304c wherein the VSI ATE system 2301c is exposed and is bonded only at its edges to the supporting substrate 2302c. Electrical contacts 2303c may be fabricated on the support substrate that brings contacts from the VSI ATE system 2301c to the edge of the support substrate 2302c. The support substrate 2302c may optionally be used to mount optical fiber connections 2305c, 2306c near the inner edge of the support substrate allowing optical signals to pass through the support substrate to either to optical wave guides or directly to optical transmission transceivers on one or more of the circuit layers of the VSI ATE system 2301c.

The VSI ATE system is intended for use by equipment means in accordance with inventor's U.S. Pat. No. 6,288,561 and included herein by reference, but is not limited in use to such equipment means. Programming and test data for the VSI ATE system 2301a, 2301b, 2301c may be transmitted or received by electronic, optical fiber connections or wireless means.

VSI Dynamic Memory Reconfiguration and Self Test

Another embodiment or aspect of the VSI invention is its use as a stacked memory that has the capability of self test and reconfiguration as a means of recovering from logic and memory circuit defects, and further, the integration as desired in combination with the other embodiments or aspects of the VSI invention presented herein. The yield and utility of a VSI IC memory is enhanced by the capability to internally self test and reconfigure the internal physical access to various portions of its memory cells and thereby maintain the external appearance of a continuous memory address space and the continued utility or availability of the remaining correctly working memory cells of the VSI IC. This embodiment of the VSI invention is in accordance with inventor's U.S. Pat. No. 6,551,857 and application Ser. Nos. 10/222,816 and 10/143,200, and are herein included by reference.

The primary objectives of this invention versus the current state of the art electronic memories is the reduction of the cost of electronic memory on a per bit basis through increased yield, increased serial and parallel memory access performance, increased operational utility, and increased reliability enabled by internal failure detection and failure recovery reconfiguration circuitry. The objective of dynamic or transparent failure tolerant operation can also be further enhanced by the invention through use of its internal failure detection circuitry and programming of the invention's controller circuitry to operate with multiple copies of stored data. Failure recovery may be also assisted by external controlling means upon a request for intervention by the invention's controller circuitry. A further objective is the making of high density memory systems with a net successful operating circuit yield probability in excess of 95% and in excess of 99%, therefore, enabling the option for vertical integration with other technologies of a near arbitrary range of electronic and optical circuits and MEMS as shown in FIG. 3 without significant reduction in the overall yield of such circuitry.

This type of memory IC accepts a logical address from a data processing IC such as a microprocessor, a graphics processor, the memory controller of another memory circuit, or a database processor as examples. The address is called a logical address because it is subsequently translated or mapped into a physical address by the VSI IC memory invention in the process of accessing the memory location represented by the logical address. The logical address is an external address used by a data processing IC to access a memory location within the invention over some known available range of logical addresses recognized by a specific incarnation of the invention. The use of logical addressing by external circuitry enables the addresses used by the external circuitry to appear contiguous over some range when the internal storage over the logical address range may not be contiguous, and the ability to simultaneously operate multiple addressing ranges and overlapping addressing ranges on a as needed or on demand basis through an external controlling means.

Additional primary objectives of the invention are to determine what quantity of memory storage it has that correctly operates and can make available for external use even in the presents of some number of memory cell failures, and accept an arbitrary logical address range assignment for that quantity of memory storage from an external IC or by internal pre-assignment. This external address operating range is also referred to as an address window and there may be more than one address window that the invention can be programmed to recognize. The use of multiple windows may be used to provide simultaneous access in a multiple port memory circuit or as a means to carry on parallel operations interior to the memory circuit. As a result of these primary objectives of the invention, the individual storage capacity of each of the various IC incarnations of the invention may vary and over the useful life of such ICs the storage capacity may change. This is a very valuable capability of the invention, because the failure of a small percentage of memory cells does not result in the scrapping of the IC, and perhaps of even greater value, as memory cell failures occur during the useful life of an IC of the invention, such failure can be transparent to its use and not result in its replacement where the cost to perform such a replacement can easily be far greater than the original cost of the IC of the invention.

Figure 24A:
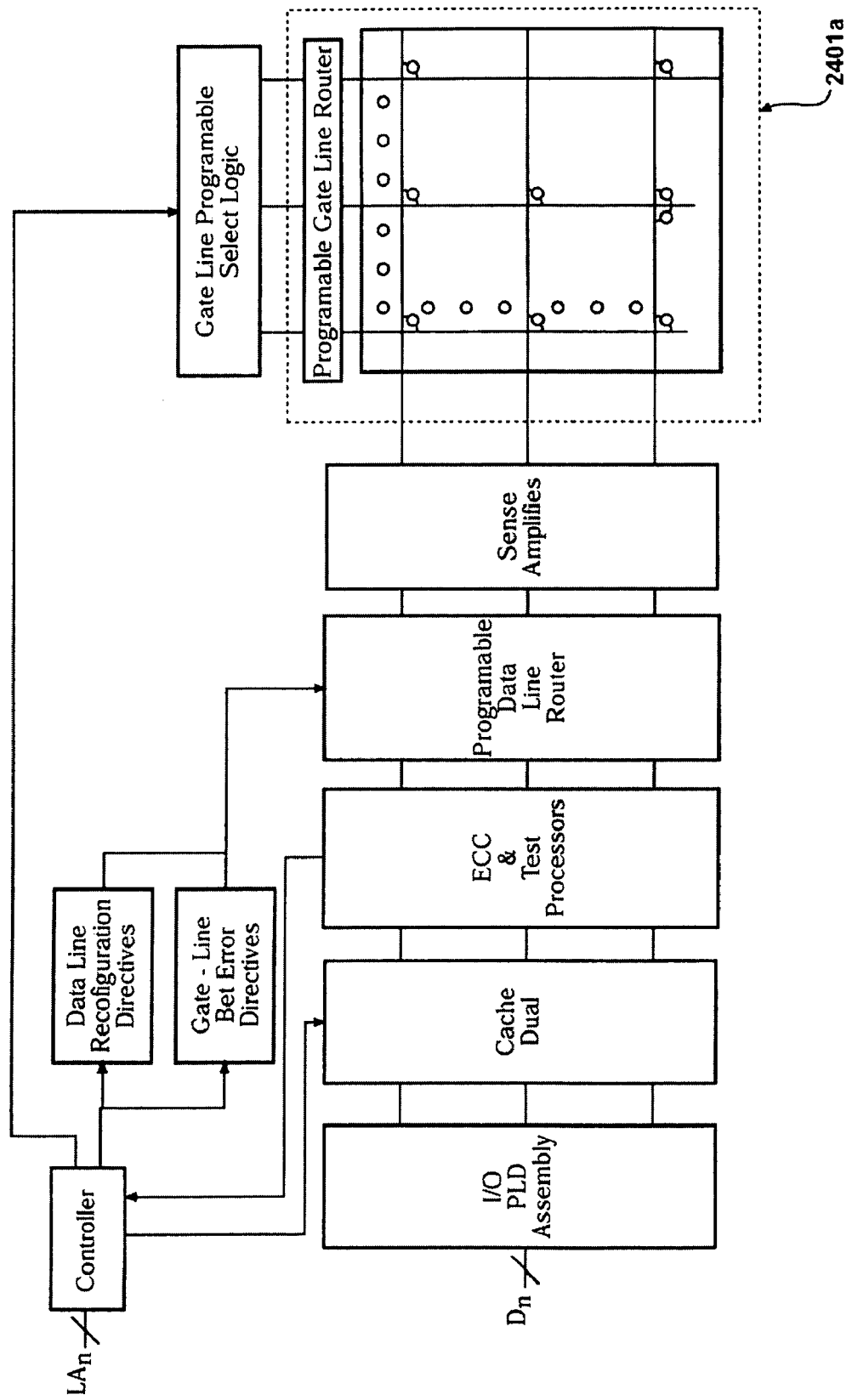
FIG. 24A is a planar circuit layout of a reconfigurable memory.
Figure 24B:
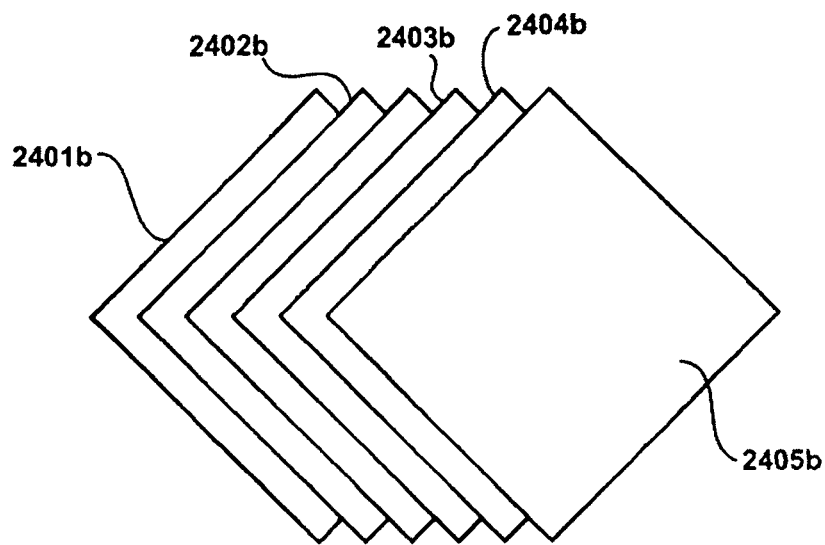
FIG. 24B is a sequence of reconfigurable memory layers.

The primary objectives of the invention are enabled by the use of internal self test, error detection, programmable logic and memory fault descriptors. An embodiment of the invention as a planar circuit is shown in FIG. 24A and for the purpose of this discussion is presented as a DRAM type memory consisting of a memory array 2401a, and the remaining circuitry logic consisting of a controller, Error Correcting Circuitry [ECC], Sense Amplifiers, programmable logic router, Cache, address select circuitry and memory cell fault descriptor storage. An example of a block layout of the VSI IC is shown in FIG. 24B, wherein each block such as 2402b, 2403b, 2404b are able to perform memory operations independently of each other. However, a memory array block is not limited to DRAM type cells, but could include any type of memory that could be integrated onto planar IC such as ROM, EEPROM, magnetic or SRAM. The memory array is composed of gate lines and data lines which are placed in an orthogonal orientation with respect to each other and at the respective crossings of the gate lines and data line are located memory cells of the array as shown by the memory array 2410a of FIG. 24A.

The failure recovery capability of the invention enables the yield for its circuitry to be defined as a net successful operating circuit yield as opposed to the conventional definition used for circuit yield of defect free. The invention enables the amount of physical storage of the circuit to be several times greater than conventional memory circuitry for equivalent fabrication technology by use of a plurality of memory layers and such storage cell capacity enhancements as multi-level storage. It is due to this large storage capacity capability of the invention and its novel controller circuitry that circuit yield is redefined in terms of net successful operation per available memory storage capacity.

Figure 24C:
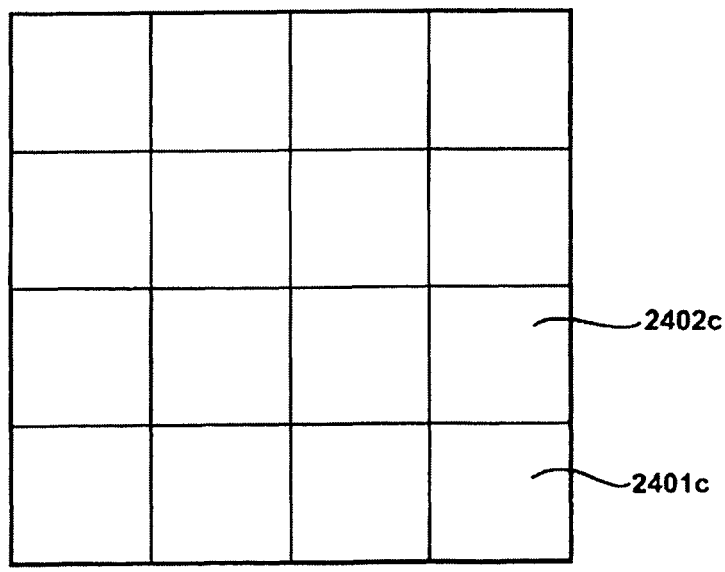
FIG. 24C is reconfigurable memory circuit layer layout of memory array blocks.

The circuitry of the VSI configurable memory invention is shown in FIG. 24A in a planar circuit layout with only one memory array 2401a and associated control and processing logic. The preferred embodiment of the VSI configurable memory system or subsystem is shown in FIG. 24B as a VSI IC circuit layer stack, diced from a wafer stack, consisting of one or more logic or controller layers 2401b used in implementing the memory circuit and one or more memory layers such as 2402b, 2403b, 2404b. One or more other data processing layers may also be present as represented as 2405b and may appear at either end of the memory circuit stack as required by a given overall circuit design. Further, 2405a could also be a layer of additional memory controller circuitry such as redundant circuitry of the controller. The preferred VSI embodiment of the invention is to organize the memory circuit layers into a plurality of memory blocks 2401c, 2402c as shown in FIG. 24C, which become multiple stacks internal to the VSI configurable memory IC and preferably each memory stack would have control circuitry on one or more circuit layers that would allow each such memory stack to have the capability of independent operation with respect to other memory stacks or blocks, and thereby, its own effective memory circuit yield. This structure of independently operating memory blocks 2401c, 2402c increases the expected total circuit yield by localizing the effect of major circuit defects where the loss of a complete memory stack associated with memory block 2401c does not cause the loss of the complete VSI IC and would allow the option for use the VSI IC with a diminished capacity.

The invention consists of one or more and preferably a plurality of memory circuit layers 2402b, 2403b, 2404b as shown in FIG. 24B stacked vertically with respect to one or more layers of non-memory circuitry 2401b, 2405b except where such non-memory circuitry is expressly placed on a memory circuit layer; examples of non-memory include more than logic circuitry such as optical transmission circuitry, sensor devices or MEMS devices. Although the invention can be implemented as a planar IC, the preferred embodiment is as a stacked IC and preferably consistent with the VSI stacking processes. There are several advantages to implementing the invention as a stacked memory IC which relate to higher performance and lower cost. The principal advantages are segregation of logic and memory fabrication processes to separate layers, shared utilization of several memory layers to one or two logic layers, design control over die size to achieve a smaller die size, and at the same time, a nearly arbitrary IC memory density.

The operation of the invention consists of accessing memory layers as memory read or write operations. Before the memory can be operated the controller logic performs an internal test of the memory storage cells to determine which are defective if any. In the process of performing the internal memory test the programmable logic is used to configure the memory so that defective memory storage cells are either not used or their use is avoided during memory accessing operations. Memory defects consist of single defective memory cells, up to one or more defective gate lines or data lines. During the operation of the memory a portion of the test circuitry, such as the Error Correcting Code [ECC] circuitry, is used to verify that a failure does not occur, and if it does, an attempt is made to dynamically correct for the failure if possible. It is a primary objective of the invention to provide various levels of error free operation, which is based on the intended use of the memory. The invention may be configured from a range of operating capabilities, from reporting the occurrence of an error, to correcting certain classes of error as with ECC circuitry, to the use of completely redundant multiple memory windows whereby memory operations are duplicated in all windows using a combination of error detection and data comparison mechanisms to guarantee a state of error free operation which is referred to as Fault Tolerant.

The testing process of the invention consists of at a minimum of writing and reading bit patterns to memory storage locations and verifying that the written pattern is the same as the read pattern over some extended period of operation. When a memory IC is first fabricated, it goes through a circuit verification step generally referred to as burn-in. Burn-in is a lengthy process during which an effort is made to determine the maximum operating speed of the IC and if there are memory cell failures that are intermittent or a result of extended operation. The result of the burn-in process is information, which is used to determine the maximum operating speed of the memory IC by using various clocking rates that may be generated either within or externally to the IC and the maximum available useable memory of the IC. A circuit of the invention will be scrapped should the number of internal memory cell defects exceed a predetermined number. It is a unique attribute of the invention that a memory IC can have a range of memory capacity whereas presently memory ICs are scrapped should there be a capacity variance from a fixed capacity requirement of present memory ICs.

The preferred embodiment for reconfiguration processing of the invention uses a programmable gate line router on each memory layer, one programmable data line router located on a controller or logic layer, test and error correcting circuitry, spare programmable gate line selector circuits, spare gate lines and spare data lines. Associative address circuits may also be part of the reconfiguration circuitry as a means to add capacity to the gate line or data line reconfiguration circuitry, this circuitry will preferably use a write once type programmable logic means.

There is gate line select circuitry used in common for all gate lines on all memory layers which is located on a logic layer and is used for the selection of gate lines on the various memory layers. The gate line selector may be made from circuitry that is programmable multiple times, one time programmable or have a fixed address recognition value, since the value of a gate line selector is not likely to change from an initial assignment. There are a number of spare gate line selector circuits that can be programmed to replace a defective gate line selector circuit which is programmed to select a specific gate line. The use of a common gate line selection circuit versus one for each memory layer conserves significant circuit area. The gate line selector circuit couples to vertical interconnections to the various memory layers.

Figure 24D:
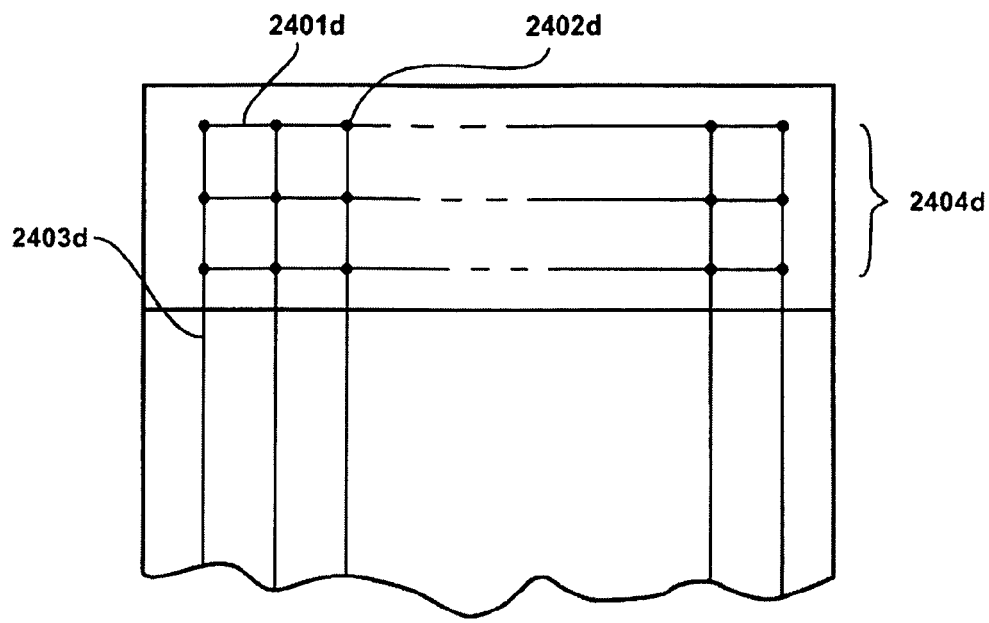
FIG. 24D is a layout showing VSI configurable memory gate line router and sparing.

A programmable gate line router on each memory layer 2404d, as shown in FIG. 24D, provides the necessary reconfiguration capacity to interface a common set of gate line selectors 2402d and reconfigurable interconnections 2401d to a plurality of sets of gate lines 2403d one each on a memory layer. The gate line router is programmable logic such as that commonly used in a PLD [Programmable Logic Device] and preferably uses a program once technology such as a fuse technology in order to route new connections or reconfigure connections permanently preventing the use defective gate lines or defective gate line selection circuitry. This programmable router is programmed by the controller as a defect is found either during manufacturing [burn-in testing] or during period test verifications over its useful life. Since the expected numbers of such defects are few, the reconfiguration capacity of this gate line router or the number of gate lines that it can separately route is also limited based on the expectation of the number of defects, and therefore, is physically small in area. If the capacity of a given gate line router is exhausted by the number of defects, then a reduced memory storage capacity may result such as eliminating the use of the memory layer, or the use of an associative address circuit routes address requests for only defective gate lines of the memory layer to a spare gate line of the memory layer or an alternative memory layer. The associative address circuit is not shown, but would be located as part of the controller logic.

Figure 24E:
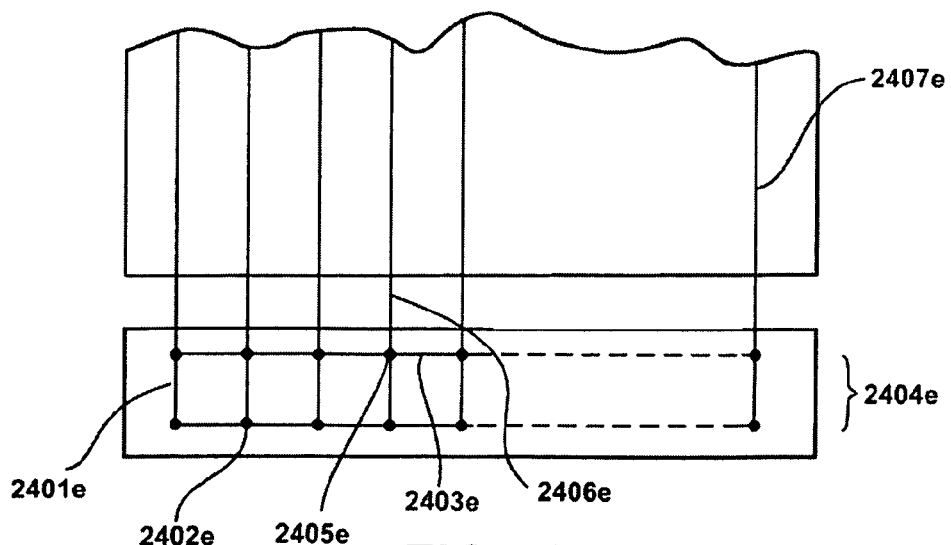
FIG. 24E is a layout showing VSI configurable memory data line router and sparing.

The data line programmable router 2404e shown in FIG. 24E, is part of the controller logic circuitry, also uses PLD type circuitry, configures the routing of data from data lines when coupled to the memory cells of a selected gate line. The data line router is reconfigured during every memory cycle by reconfiguration directives that cause data lines coupled to defective memory cells to be rerouted to spare or defect free data lines; this is done by setting dynamic switches 2405e or coupling circuits at various crossing points of the defective data line 2406e, router line 2403e, and spare data line 2407e as shown in FIG. 24E. If the memory block used more than one vertical access bus for all of the circuit layers, then two reconfiguration router circuits 2401e, 2402e would be required in order to have simultaneous memory access cycles in the memory block. The data line router is configured during each memory cycle because the defects are defined on the basis of a memory access cycle, which is per selected gate line and per selected memory layer. The data line reconfiguration directives are created during the burn-in process, maintenance of the memory such as part of the system startup sequence or as part of a system directed maintenance, or part of a operational memory access cycle. These reconfiguration directives are stored in associative address circuits that are typically write once programmable logic. When a gate line on a specific memory layer is selected, all reconfiguration directives for that gate line are read causing the data line router to be configured specific to the defects of the selected gate line and data lines of the selected memory layer. The data line reconfiguration directives at least are specific for the replacement routing of a data line when coupled to single defective memory cell of a specific gate line, or in the case of a defective data line where one directive causes all memory cells that would couple to a specific data line to be replaced by routing to a spare data line.

The cache is part of a logic layer and acts as an associative memory buffer and referenced by logical addresses. The cache has the capacity to retain the data from one or more selected gate lines from each memory layer. The cache is organized for some number or depth of selected gate lines by the number data lines of the array, and by a second organization by depth and some word length, which is required to move data over the I/O interface to the memory block 2401a of the cache. The second organization may be programmable to provide various methods of assembling and de-assembling words for transfer to and from an individual memory block. Further, the preferred cache structure has at least two ports in order to support simultaneous transfers of data between memory layers and the cache, and between the cache and one or more data requesters.

The preferred embodiment of the invention performs a memory access upon receiving a logical address at the controller, the controller determines if the storage locations of the requesting address is in the memory layers with which it is associated. The control then translates the logical address into a gate line select address, a layer enable address and the portion of the data lines that are to be used in the access cycle with respect to writing or reading data. In a read access cycle a selected gate line of a memory layer is coupled with the data lines of that layer passing to the Sense Amplifiers and then through a programmable data line router which is configured as part of the read access cycle by data line directives read from configuration memory. The resulting data from the data line router pass through the test and error correction circuitry and then to a cache from which the read data is passed on to the requesting source through a programmable I/O interface. If a failure is detected and not corrected, the read cycle is stopped and the status of the failure is reported to the controller, which in turn makes the existence of the failure known to the requesting source. In a write access performed to the cache, the data is passed from the cache to error coding circuitry and then through the data line router to the data lines where the data is stored in memory cells coupled to the data lines and the selected gate line. If a recoverable memory cell failure is detected during a read or write memory access cycle, the specific cell failure is passed on to the controller which in turn saves this information for subsequent determination of reconfiguration of the IC or passes it onto a second control logic which makes this determination and directs the controller to make such changes during the normal operation or during a startup or maintenance period.

The stacked structure of the invention through vertical interconnections enables shorter high density interconnect access to and simplified organization of the various portions of circuitry from several aspects such as common access to a central controller or for a plurality of circuit elements with common shared interconnections. Vertical interconnections are also an enabling aspect for the VSI implementation of reconfiguration router circuitry to achieve fail safe error recovery from memory failures during operation in either a dynamic or delayed method. This is the case because in planar memory circuitry the physical layout implementation of reconfiguration circuitry would increase in the number of horizontal interconnection layers such that doing so would go beyond present capabilities of semiconductor fabrication or the operational performance of the circuit would be unacceptable due to delays resulting from the length of interconnections. It is also clear that the added reconfiguration circuitry adds cost to the fabrication of a circuit, this added cost is offset by a high density of fine grain vertical interconnections therein enabling the reconfiguration circuitry to be cost effectively utilized or shared among the memory circuit layers of an IC due to a near equal physical proximity to all circuitry segments. Another example of shared circuit utilization in the invention is the shared use of control logic functions such as sense amplifiers among the memory arrays of each memory layer wherein a planar memory IC a separate set of sense amplifiers would be required for each memory array on the IC which adds significantly to the cost of planar memory ICs.

The invention enables a low cost high density high performance multiple port memory VSI IC that can be vertically integrated with multiple layers of logic for data processing such as microprocessors, graphic processors, database processors, FPGA logic, ASIC logic and other generic or application specific logic or optical or MEMS device layers. The use of fine grain vertical interconnections to a plurality of memory layers allows for the efficient shared use and near equal distance location of control and reconfiguration logic to the memory array of each memory layer. The shared use of logic enables approximate 50% cost reduction in manufacturing costs on a per memory cell basis versus conventional planar memory fabrication methods due to the inventions ability to increase the density of memory cells per IC, therefore, lower the ratio of control circuitry per memory cell; a 50% cost reduction is achieved typically when the number of memory layers is four or greater, and thereby, the ratio of control logic circuit area per memory cell of the invention is 20% versus a nominal 50% in planar DRAM or flash circuits. The performance of the invention is nominally 2 to 5 times faster than conventional planar memory circuits due to capability of the invention to use higher performance logic circuit fabrication processes than those known to be presently used in planar memory circuits because the logic layers physical separate from the memory layers, and therefore, do not require the use of merged fabrication processes which is known to compromise the performance of present DRAM and flash planar memory circuits. The performance of the invention is further enhanced versus planar circuit fabrication for example through use of parallel memory operations in blocks, multi port blocks, gate line segmentation, low leakage memory cell process implementation through SOI [Silicon on Insulator] and differential data line sense amplifier circuits; the use of such performance enhancement techniques when applied to planar memory ICs have been shown not provide the desired level of performance or have to come at too high a cost.

The controller circuit when implemented for a DRAM memory provides background or internal refresh. DRAM circuits require that their memory cells be refreshed periodically. Refresh is accomplished by concurrently performing refresh operations in memory arrays stacks that are not in use in an ongoing memory access or through multiple ports of a memory array stack. Refresh may also be accomplished by increasing the size of the memory stack cache allowing refresh cycles to be performed while memory operations are deferred to the cache.

The benefits of the invention's internal self testing and programmable reconfiguration capability are lower testing costs, higher circuit yields and lower failures during the operating life time of the IC. The internal test and reconfiguration capability of the invention lowers test cost by eliminating the current requirement of memory circuits such as DRAM that several separate tests of the circuit be performed by expensive external equipment called Automatic Test Equipment. Higher circuit yields result from the use of novel reconfiguration and error correction circuitry that allow a greater number of defective memory cells to be present than would be the case with present memory ICs.

The discussion of the embodiment of the invention is with respect to memories of common use such as DRAM and flash memories. The invention is not limited to such embodiments, but can be applied to a wider range of memory circuit types such as the anticipated MRAM [Magnetic Random Access Memory]. Although MRAM circuits are read by sensing the resistance of a memory cell versus charge or potential of the more common memory types, MRAM memory cells still have need of test, error detection, error recovery and reconfiguration circuitry, and high precision circuitry for operation as single or multi-level storage cells.

VSI Card PC and Workstation Form Factor

Another embodiment and aspect of the VSI invention is a hand insertion and portable package form factor for VSI IC systems and subsystems. There presently is in use microcontrollers and limited amounts of electronic storage embedded in credit card type packages or form factors and are referred to as SmartCards. There also has been speculation that a PC [Personal Computer] will eventual be reduced to this scale and referred to as SmartCard PC or Pocket PC, however, no such reduction of a general purpose computing system such as a PC to a PC SmartCard like form factor has been demonstrated. The VSI invention enables the electronic data processing and storage circuitry of what is today referred to as a workstation, desktop computer or a lap top computer to be reduced in physical volume so that it can be packaged in the form factor of a credit card or similarly sized cards that are commonly used today for commercial transactions. This form factor will herein be referred to simply as the VSI Card or Card packaging form factor. This VSI Card method of packaging the electronics of a computer system enables novel utility in terms of the portability of the information stored and processing capability therein that is not presently possible. The VSI Card form factor of the invention uses one or more VSI ICs wherein the stacked VSI IC or ICs contain at least a microprocessor or logic circuitry for data processing or computing, memory of volatile and or non-volatile types, and preferably, high speed wireless communication. The VSI Card is a complete computing environment sufficient to replace the electronics of what is now a set of planar ICs assembled on PCBs. The VSI Card reduces the I/O count, power dissipation, packaging costs in comparison to current PCB equivalents, but most importantly, the VSI Card form factor enables the computing hardware and software environment of the user to be independent of and detachable from peripheral equipment so the VSI Card may be used with numerous and varying sets of peripherals. The VSI Card can integrate optical and MEMS functions not only as part of the VSI IC integration but as part of the physical card packaging such as optical input or output through the surface of the package. The VSI Card is plugged and unplugged into peripherals as needed enhancing the utility and security of the information on the VSI Card. The transmission of signals to and from the Card, or I/O, is through a physical contact or wireless in the form of radio frequency or optical wavelengths.

The Card packaging of such a significant amount of computing electronics is enabled by the high circuit densities of the VSI invention. It should be noted that the electronic content of computing systems generally referred to as PCs [Personal Computers] or workstations has risen in a directly proportional manner to the rise of planar integrated circuit density and is expected to continue to do so. And, as of the present, the amount of circuitry necessary to provide the computing performance and capability of these computing systems currently comprise so many planar ICs that the insertion into a card package cannot be enabled from a physical or operational perspective. The VSI Card reduces the I/O interconnections versus planar ICs through vertical interconnections between circuit layers. The Card reduces power also through the reduction in the number of I/Os, since I/O drives constitute a significant percentage of the power dissipation of a planar IC. The Card reduces cost by eliminating or reducing the packaging, testing and handling of planar ICs.

There are three principle benefits provided as a result of the capability to reduce the number of ICs of present and future state of the art computing systems such as PCs or workstations that are derived through the use of the VSI invention to enable a VSI Card packaging form factor. These are portability, power reduction and lower computing equipment utilization cost.

The benefit of Card portability is a capability that enables the computing electronics to be plugged into various types of peripheral equipment which presently require that the computing electronics be embedded with such peripheral equipment. Separating what is currently the control electronics of a computing system such as a PC, work station or other such computing electronics from the peripherals of that computing system allows the sharing of both the processing capability and the memory among as many such computing systems that are designed to receive this card. Examples of such peripheral equipment are personal computer or workstation display monitors, keyboards, storage devices, etc., cellular phones, Personal Digital Assistances [PDAs], TVs, audio and video equipment, consumer appliances. Such portability enables the personal data that is stored on the card to be used or modified at multiple physical locations and enables a level of physical security of the information stored on the card that does not exist presently.

The benefit of Card power reduction is derived from the reduction or elimination of signal drivers from the ICs of the card. Signal drivers on present day microprocessors, graphics processors, encryption, voice analysis and memory circuitry can number in the thousands and contribute a majority of the power that must be dissipated from planar ICs. Whereas power reduction is widely recognized as an IC operating benefit presently, the ability to increase the amount of circuitry per unit volume while reducing power, due to I/O power reductions, is unique to the VSI invention and specifically to the application of high performance card computing form factors.

The benefit of Card computing equipment utilization results from the physical separation of the computing electronics from the peripheral equipment normally associated with what is presently a computer system or more broadly equipment that performs a function be it a desktop computer, a car, an airplane, manufacturing equipment or sensing and analysis equipment to name a few examples. Presently computing electronics is embedded or integrally assembled as part of a wide range of equipment. In general today the cost of computing electronics, without including the cost of the power supply and box enclosure presently used, is less than the peripheral equipment with which it is associated. Therefore, in the case where equipment is used by multiple individuals or users and these users have unique electronically stored information necessary to operate the equipment which would normally make the equipment captive or nearly so to one single user, this would be no longer the case. The equipment now has a higher potential utilization by virtue of its separation from any one user, and therefore, a lower cost of utilization per user because it can be shared or it has a shared utilization. Secondly, obsolescence of peripheral equipment is often the result of the obsolescence of the computing electronic assembled with them, therefore, the separation of the computing electronics into the VSI Card packaging form factor enables longer utilization of the peripheral equipment.

Such peripheral equipment, or simply equipment, presently can be disk storage devices, networking equipment with wired [metal and optical] or wireless interfaces, faxing, copying, imaging, scanning, photo reproduction, etc. The VSI Card and peripheral equipment separation benefit also includes equipment relating to manufacturing and industrial equipment where computing equipment is used to control the equipment as in the examples of robot assembly, inspection, semiconductor processing equipment, chemical processing equipment, etc. This separation benefit also includes equipment for monitoring and control of a facility such as an office building, industrial plant or home; here computing equipment is used to monitor and control peripheral equipment such as video cameras, door access security, elevators, furnaces, air conditioners, air quality sensors, etc. The separation benefit enables the computing electronics to be exchanged or up graded for such reasons as performance, maintenance, security or improved capabilities without affecting the physical cabling or fixtures used presently with computing equipment that uses the well know box or electronic stack form factor.

The VSI Card separation benefit enables multiple Card computing electronics to use the same peripherals in either in a serial or cluster manner. This allows the cost of peripheral equipment to be shared over several Card computing users serially or from time to time as needed or concurrently where some number of Cards on a given instance are connected to the same peripheral equipment. The concurrent use aspect of the Card computing electronics enables a form of what is now commonly referred to as cluster or multiprocessor computing where multiple Cards use the peripheral equipment they are inserted into as a means to communicate between themselves to perform specific tasks.

The VSI Card can be used as a packaging means for the selling of software to prevent its fraudulent use on other than the intended computing system or as means to guarantee to the customer certain performance and or operating capabilities. Software is presently sold on passive media or over the internet and its use thereafter is beyond the control of the software manufacturer. The use of the VSI Card as a packaging means of the software allows the software manufacturer to control the hardware environment wherein the product software is used. This means that the use of software manufacturers product software cannot be done except through use of the VSI Card and that it can only be updated through a VSI Card that packages the software, this is a degree of security for the software manufacturers that does not presently exist.

VSI Image and E-M Sensor Component

The VSI invention enables the making of high speed, low noise and lithographically limited high resolution image or EM [Electro-Magnetic] radiation sensors. This is done by separating the imaging array [CCD, photodiode or wavelength sensitive element array] as a top circuit layer or layers of a VSI Component and using fine grain vertical interconnections to connect image or EM sensing elements individually or larger organizations such as a line of imaging sensor elements to analog and digital circuitry on circuit layers directly below the imaging or EM sensor layer.

In this VSI invention CCD, photodiode or wavelength sensitive sensor elements or devices can be closely coupled to processing circuitry such as A/Ds, analog circuitry, and digital logic which can be made from IC processes independent of the processes used to make the image or EM sensor layer, and therefore, enabling design of such VSI components as photo imaging electronic components or communication Optical-Electronic converters that couple image or EM sensor elements with processing circuitry for any number of possible design objectives such as cost, performance or image or wavelength resolution without the manufacturing limitations that presently exist regarding the integration of the sensor elements with the type of processing electronics selected. Secondly, the amount or density of processing circuitry for processing the output from a single or group of image or EM sensors can be increased over the present art with the addition beneath the image or EM sensor layer of more processing circuit layers. Further, large amounts of memory circuitry can also be integrated into a VSI image processing component, the ability to buffer the image data on the VSI image component allows the image data to be internally processed or down loaded in a non real time rate or a rate other than the rate of EM sensor data generation.

The separation of the image or EM sensor layer[s], and the EM sensor interface and processing circuitry on independent circuit layers provides a unique level of noise isolation versus planar image sensors where noise generated by the processing circuitry directly couples through the common substrate of a planar IC to the image sensor elements. Further, additional noise isolation enhancement can be employed through the choice of semiconductor process and technology used to fabricate the EM sensor processing circuitry such as BiCMOS process or GaAs technology versus again the common substrate and fabrication technology used to make a planar image or EM sensor IC.

The resolution of the image or EM sensor is a direct result of the size of the individual sensor elements and the number of sensors in the EM sensing array. The scaling of the size of the EM sensing elements of the VSI invention is uniquely limited only by fabrication process capability and not proximity to processing circuitry as in planar EM sensor circuits. Secondly, the number of image or EM sensing elements is a design choice since sensor processing circuitry for any number of sensor elements used is immediately below the sensor elements, further the distance of separation of each image or EM sensor element or organization of elements in constant no matter how large the image array.

Additionally, the distance from the a single EM sensor element or organization of elements to processing circuitry is no longer a result of the row and column size of the image array, but is determined by design choice, since all image processing circuitry can be positioned immediately below and as close as a few microns in vertical interconnection distance through one or a few circuit layers.

Figure 25A:
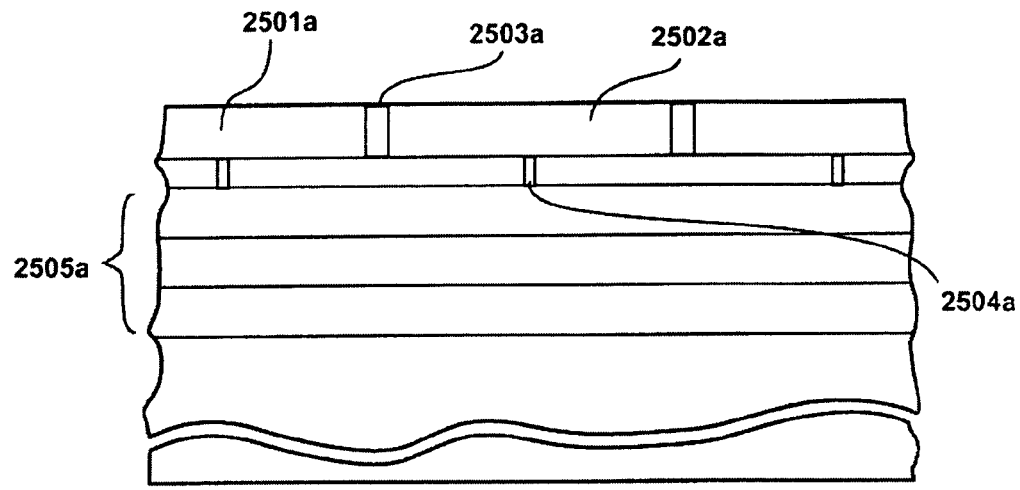
FIG. 25A is cross section of a VSI photo sensing circuit.

FIG. 25A shows a cross-section of a VSI EM sensor component with image or EM sensors $2501a$, $2502a$ separated by a dielectric and or EM isolation trench $2503a$ and sensor signal output contact $2504a$ formed preferably during bonding of the sensor layer as a vertical interconnection to processing electronic and or memory circuit layers $2505a$. The EM sensors of FIG. 25A and FIG. 25B have applications not only for imaging applications but also communications. Wherein in the components shown in these figures can be used in communication systems for single wavelength Optical to Electronic conversion or DWDM [Dense Wavelength Division Multiplexing] where a number of wavelength signals are simultaneously converted from optical to electronic form.

A further advantage of the VSI invention is the ability to use multiple EM radiation sensor circuit layers of varying materials that are sensitive to different radiation wavelengths such as Infrared, visible, Ultraviolet and X-ray wherein such wavelength absorbing materials are stacked to form an imaging sensor and where the order of the stacking of these materials is done in a manner to optimize the preference to their relative radiation wavelength absorption and transmission rates to an incoming radiation source. This is to say that the material with the higher transmission rates relative to the other wavelengths of interest will be positioned to be exposed first to the radiation source.

Figure 25B:
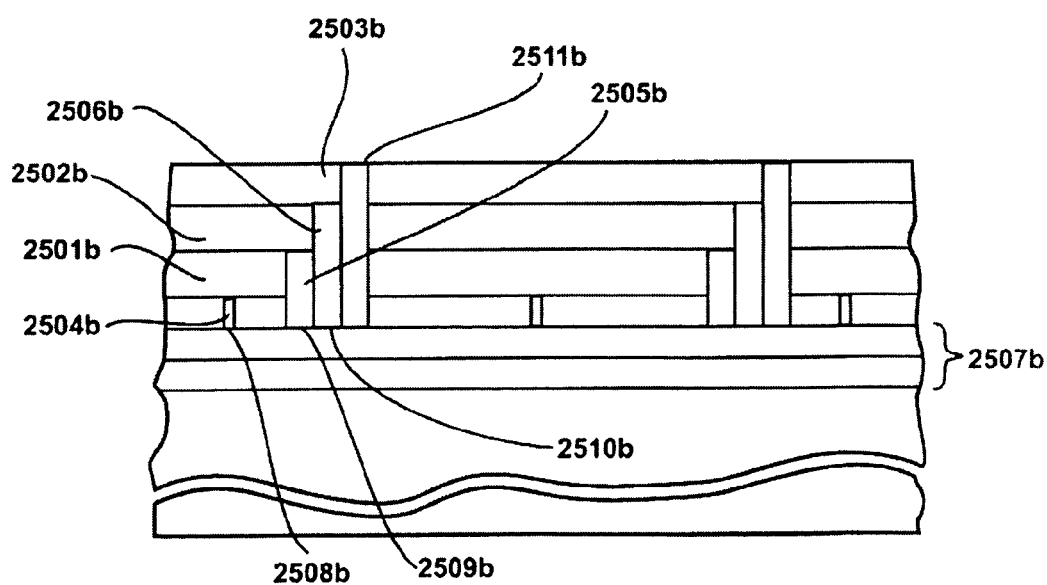
FIG. 25B is cross section of a VSI photo sensing circuit for multiple wavelengths.

Wavelength or wave band specific EM radiation sensor elements on separate and adjacent layers is shown in cross-section in FIG. 25b. Radiation sensor layers $2501b$, $2502b$, $2503b$ are bonded in the same manner as other circuit layers and through which separate vertical interconnections $2504b$, $2505b$ and $2506b$ from the image sensor elements in an image array layer to processing circuitry $2507b$ that enables the output of the image devices to be processed simultaneously or serially as preferred by the design of the circuitry. Electrical and EM isolation trench $2511b$ separate each sensor stack. The bonding of the sensor element layers is preferably done by metal diffusion bonding; which would also during the bond process form the vertical interconnections $2508b$, $2509b$, $2510b$ junctions between each image sensor layer. An example of a VSI component using an array of multiple visible image sensor layers is a video imaging component; and, an example of a VSI component using multiple waveband specific EM sensor array, is an optical fiber communications where an information signals are transmitted at multiple wavelengths and referred to as WDM or DWDM.

VSI FPGA IC and Method of Making

The VSI invention enables the making of high density FPGA [Field Programmable Gate Arrays] by the structural separation of its common planar circuit constituents of configurable logic, IP [Intellectual Property] logic, configurable routing logic and or programming memory into two or more VSI circuit layers. Present planar FPGA technology is restricted in gate density per IC due to lithographic die image fabrication process restrictions, the density of configuration routing circuitry, the incorporation of IP and the amount of programming context memory. The rapidly increasing cost of semiconductor fabrication masks is presently limiting the number or variety of planar FPGA designs that are fabricated or brought to market; the high fabrication mask costs cannot be recovered from most low volume FPGA designs. This aspect of the VSI invention is not limited to the FPGAs but applies to the broader class of programmable logic referred to as PLDs [Programmable Logic Devices], and including CPLDs [Complex Programmable Devices].

Planar FPGA circuits can be thought to consist of configurable logic, configurable routing interconnections and programming context memory, programming context memory will be hereafter referred to as context memory. Context memory circuitry holds the programming or configuration state information for configuring the logic functions and routing interconnections and is also referred to as context information or data. The context memory circuitry may be implemented in a ROM, a write once technology or a rewriteable memory technology. Planar FPGA circuits are complex circuits. A primary value of planar FPGA circuits is that because they are programmable they have broad application range or utilization, and therefore, have a lower unit cost resulting from higher production volumes due to their broader application range or utilization. A well known restriction of planar FPGA circuits is that all FPGA circuit designs have a limited range in the amounts of programmable logic, routing and memory resources; and if the FPGA circuit is a physically large die, the performance of the FPGA is reduced due to signal transmission delay across the die. Due to high development costs, there are few application specific planar FPGA circuits [so called low volume FPGA circuits] or FPGA circuits that include application specific hardwired IP functions. The inclusion of hardwired IP functions reduces the configurable logic resources, breath of application utilization and results in significant increased costs per circuit due lower production volumes.

VSI FPGA components enable the programmable gate density, configurable routing interconnections and context memory to be separated as circuit layers, and therefore, the design and capacity of gate density, configurable routing interconnect and context memory can be implemented independently per circuit layer. Further, the addition of IP per layer can be added. Of first importance, if the circuit layers to be used to fabricate a VSI FPGA IC for a specific application have completed physical designs or already have been fabricated or exist as inventory wafers of library as part of a FPGA development platform, then the VSI FPGA can be fabricated without requiring circuit design, mask tooling [NRE None Recurring Engineering] charges or a semiconductor fabrication cycle. The VSI FPGA eliminates and or reduces four primary problems facing FPGA planar IC which are development time, gate and routing density, custom design NRE and low volume fabrication costs. The VSI approach to FPGA or ASIC IC development and fabrication is significantly at variance to conventional planar engineering and fabrication methods with the important benefits of significant reductions in costs and time to market [wherein time to market time savings result from elimination of conventional IC development delays and reduction of fabrication delay]. The VSI invention achieves these results through its capability to separate or partition circuitry types to separate circuit layers, the VSI fabrication process simplicity which does not require planar circuit fabrication processing and the VSI fabrication process capability to use existing or inventory circuit wafers. The VSI FPGA IC may take the form of a standalone IC or component, or it may be incorporated into a larger VSI component with other electronic, optical circuit layers or MEMS device layers.

The primary objective of the VSI FPGA invention is to decouple the hardware IC design and fabrication process from the design of an application specific FPGA IC. The preferred embodiment is that all of the circuit layers of a VSI FPGA be available for use from an inventory source. It is also an embodiment of the VSI FPGA that one or more circuit layers may require design and fabrication, however, this still results in significant application IC development time and fabrication cost reductions. Other objectives of the VSI FPGA invention are variable programmable gate density per VSI component through the use of multiple programmable gate circuit layers, higher density programmable routing per VSI component through vertical interconnection gate routing and backside horizontal interconnections, option to change or vary without affecting hardware design per VSI the use of IP such as microprocessor, DSPs, CAM, or SERDES, and the capability to increase the available context memory per VSI component to enable in circuit programming changes of the programmable gates or routing interconnections.

Even through the VSI FPGA is composed of numerous circuit layers the benefit of the VSI fabrication process for the VSI FPGA component is an integration density that is greater than a planar circuit equivalent, and therefore, higher performance due to shorter interconnection lengths, and lower power due to shorter interconnection lengths and the need for fewer I/O off-chip circuit drivers. The need for fewer I/O off-chip circuit drivers resulting from the level of integration of the VSI FPGA, and therefore, the need to connect to fewer separate planar ICs. The preferred embodiment of the VSI FPGA uses thermal diffusion high precision alignment circuit substrate bonding and sub 2 µm pitch fine grain vertical interconnections enable the VSI FPGA integration.

The VSI FPGA routing interconnect density can provide an increase of 2× to 4× more than planar routing due to the inventions ability to fabricate horizontal interconnect on the backside of each circuit layer equal to the same density as on the front side, and the ability to fabricate fine grain vertical interconnections several times the density of horizontal interconnection layers, and therefore, allowing the implementation of such vertical interconnect structures as datapaths or buses with more than 512 transmission lines and in excess of 4,000 transmission lines without increasing the number of horizontal interconnection layers. This is done by using the VSI fabrication process to form fine grain vertical interconnections to form local and global busing between programmable logic blocks of an arbitrary number circuit layers of programmable logic blocks. Further, local vertical interconnections are used to couple circuitry on two or more circuit layers to form a logic block spanning vertically two or more circuit layers or for busing between vertically adjacent logic blocks. FPGA programming information can be held on separate memory register circuit layers with the capability through global fine grain vertical bussing to provide access to a range of memory register locations which can be addressed and read selectively into specific FPGA logic blocks and thereby change their functions.

The VSI FPGA invention also enables the inclusion of self test or ATE circuit layers and yield enhancement error reconfiguration circuit layers. These circuit layers in the preferred embodiment can be added to the VSI FPGA component without affecting the design of the existing VSI FPGA circuit layers. These circuit layers allow for a greater level of circuit testing at a fixed cost and the ability to reconfigure programmable gate and routing interconnection circuit layers when circuit defects are detected in a manner that is transparent or nearly so to the subsequent use of the IC. The error reconfiguration circuit layers provide redundant routing interconnection circuitry that can be substituted for defective portions of a programmable gate or routing interconnection circuit layer. The capability of the VSI FPGA to add self test and reconfiguration circuit layers becomes most important as the number of circuit layers used in the VSI FPGA increase and thereby increase the IC test duration and adversely affect the IC yield. The error reconfiguration circuit layers are programmed to replace various defective portions of programmable gate or routing interconnection circuit layers as a result of the test data derived from the self test or ATE circuit layer. The programming of the error reconfiguration circuit layer or layers is performed by control circuitry on the error reconfiguration circuit layer, but this control circuitry may alternately be part of the self test or ATE circuit layers.

It is important to point out that in the preferred embodiment of the VSI FPGA, the number of programmable gate circuit layers, IP circuit layers, programmable routing circuit layers and context memory circuit layers can be increased or decreased as required to meet application specific requirements without affecting the design of these circuit layers. Since only the VSI fabrication process steps are required in order to fabricate a VSI FPGA component or circuit layer group for subsequent insertion into a layer VSI component, there is not the existing requirement for circuit design changes, NRE tooling or circuit fabrication. Further, the insertion of self test and error reconfiguration circuit layers can be done in a similar manner with the benefit realized through the short VSI fabrication cycle and additional IC capability.

The circuit layers needed for a VSI FPGA may not all be available from the library of a VSI development platform or an inventory of VSI FPGA circuit layers, and therefore, the design and fabrication of one or more VSI FPGA circuit layers may be necessary. When this is the case, the design of such a circuit layer is clearly less complex and less costly than the complexity of integrating such additional circuitry into a planar design which affects the physical layout design of the exist circuitry of the planar IC. The VSI FPGA capability to vary its circuit resource capacities with little or no requirement for circuit layer design and fabrication has the following novel results: it uniquely reduces IC fabrication cycle time and cost of the VSI IC fabrication process which are significantly less; it enables lower volume application specific FPGA circuits to be designed and fabricated that for the present cost structure of FPGA manufacturing is development time and cost prohibitive; and, it enables low cost IC development experimentation or "what if," engineering exercises which are so very important in lowering the risk to the development of new product ideas and new business growth.

Figure 26A:
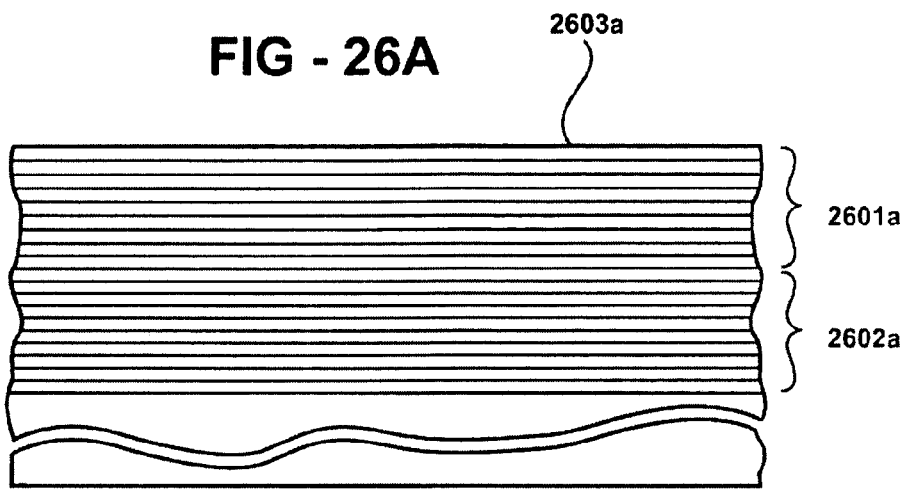
FIG. 26A is a cross section of a VSI FPGA IC.

FIG. 26A shows in cross-section a VSI FPGA component IC 2603*a* wherein programmable logic, IP and programmable routing interconnections consist of two or more circuit layers 2601*a* and context memory consists of one or more volatile and or non-volatile memory circuit layers 2602*a*. There may be memory cells incorporated in with the programmable logic layers 2601*a*, the context memory circuit layers are used to retain various programming states which can be loaded at high speed through dense vertical interconnections as needed into the programmable logic or routing interconnections. The FIG. 26A circuit may also incorporate ATE and reconfiguration circuit layers for yield enhancement of the total VSI component. The VSI circuit layers shown in FIG. 26A can be used as a sub-system and incorporated into a larger VSI component IC or be a member of a VSI platform library as post fabricated VSI circuit wafer inventory for integration into a future VSI IC or VSI ASIC.

Figure 26B:
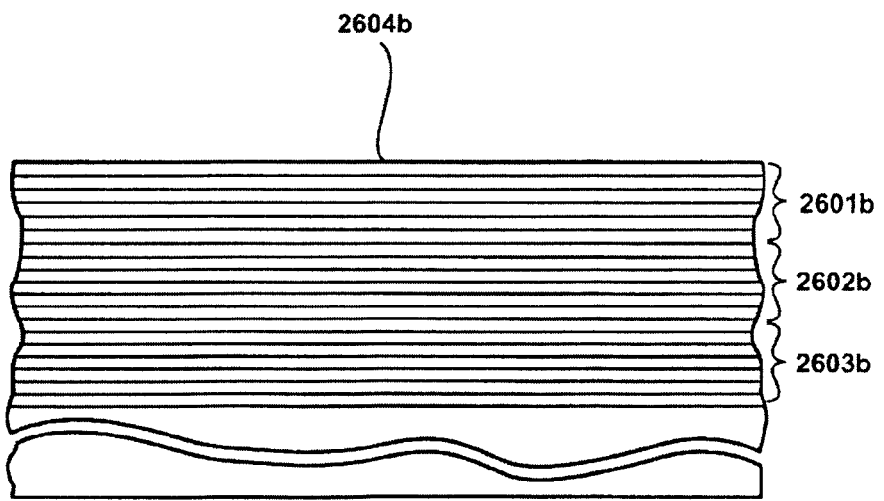
FIG. 26B is a cross section of a VSI FPGA IC.

FIG. 26B shows in cross-section a VSI FPGA component IC 2604*b* wherein programmable logic circuit layer types and IP consist of several circuit layers 2601*b*, programmable routing interconnections consist of several circuit layers 2602*b* and context memory consists of several circuit layers or memory circuit group incorporating yield enhancement circuitry 2603*b*. The FIG. 26B circuit may also incorporate ATE and reconfiguration circuit layers for yield enhancement of the total VSI component.

The VSI invention further enables the use of fuses and, anti-fuses or other type of write once technology for the programming the functions of interconnections between logic blocks implemented in the logic layers or the routing interconnection layers or both; the use of one time programmable technology may replace the use of all or part of the memory circuit layers or to be used in combination. This is accomplished by using fuse programming circuit layers and fine grain vertical interconnections to enable the blowing specific fuses on at specific locations on one or more logic block circuit layers. This uniquely enables the interconnection and circuit logic structures of the fuse blowing circuit layers to be used to program an arbitrary number of logic block circuit layers.

VSI Internet Protocol [IP] Communication System

Conventional Internet Protocol [IP] processors [referred to as routers or network processors] analyze the pack messages in coming from one high speed connection [typically a fiber optic transmission line] and as a result of the analysis collect information about the message and determine an out going communication line to forward the message. This message is then transferred to the appropriate out going transmission line or lines by means of a switch which may be implemented based on a multiple port memory or as a n×n non-blocking cross bar switch.

The VSI IP communication processor component or IC shown in FIG. 27 combines in the preferred embodiment as one die, one or more IP network processors 2701, multiple circuit layers of FPGA logic 2702, multiple circuit layers of CAM [Content Addressable Memory] 2703, conventional random access memory layers 2704, serial I/O serializer deserializer logic layer or layers 2705, and two or more very wide fine grain vertical buses 2706 connecting the IP VSI component circuit layers where each vertical bus may consist of several hundred to several thousand bus lines. The VSI IP communication processor shown as a VSI IC circuit layer structure in FIG. 27, is novel because it combines into one die all the fundamental functional circuit types traditionally used to route and switch an IP message in circuit densities per circuit type that are several times greater than that presently possible with planar IC technology, and heretofore such implementations have only been possible as multiple planar ICs if at all. The VSI IP communication processor incorporates optical serial line input and output, incorporating the traditionally separate switching logic. The use of both network processors and FPGA circuit layers is an implementation decision and is not a limitation on the IP VSI component illustrated herein.

The VSI IP communication processor can incorporate varying amounts of CAM and conventional memory to process an IP message depending on the design capacity objective of the VSI IP component and beyond any such capacity available from a planar IC for any future point in the integration progression for ICs. The preferred embodiment of the VSI IP communication processor incorporates on a separate layer multiple serial input and output logic for internal circuit serializing and deserializing IP messages from communication lines; by doing so, this greatly reduces the total pin count and power dissipation of the VSI component versus such a system implemented as some number of planar ICs. The preferred embodiment of the VSI IP communication processor achieves its most significant advantage through the use of multiple arbitrary wide high speed vertical buses 2706 that allow for a large number of paths from IP message processors to memory and to serial I/O, and VSI test and yield enhancement logic 2707. The VSI IP communication processor also may have conventional busing interfaces for wired or wireless communications to additional VSI IP communication processors and conventional subsystem components.

The benefits of the VSI IP communication processor are nominally a cost reduction of 10× versus equivalent circuit implementations by multiple planar IC IP communication electronic assemblies, a 5× performance enhancement, and a 10× reduction in power dissipation. These primary benefits are a direct result of the multiple wide high bandwidth fine grain internal vertical buses, fewer off-chip I/O circuit drivers, net shorter interconnection lengths between and yield enhancement reconfiguration circuit logic.

VSI n×n Cross Bar Integration

The mention herein of an integrated n×n non-blocking crossbar deserves a little additional discussion. Larger systems like multi-processors or internet IP routers are collections of separately packaged and interconnected high integration processor ICs where the most significant portion of the manufacturing cost of these systems is the wiring interconnections [datapaths] between these ICs consisting of packages, sockets, low integration crossbar control circuits, PCBs and PCB connectors. The implementation of these high cost low integration datapaths are reduced to less than 1 $mm^2$ for each VSI processor circuit layer, so for the interconnection of 16 processor system with a integrated 16×16 non-blocking cross bar interconnection, the cost is about $2-3, or approximately a 1000× cost reduction, not to mention significant power dissipation reduction and performance improvement.

Integration of multiple processors with a n×n crossbar bus system is an integration challenge for planar IC technology even without consideration of the requirements for embedded processor memory. This type of data path interconnect problem also is a characteristic of internet switches & routers, and the VSI invention enables the fabrication of a single chip high-end router.

A VSI n×n non-blocking crossbar switch is implemented as a vertically interconnecting set of buses where processing logic of each circuit layer that is a port to the crossbar switch has interconnect access to any of the n-ports of the switch. In present planar IC implementation of n×n crossbar switches data processing circuitry has access to only one or two ports of the n×n switch. The VSI n×n switch simplifies access to the switch by providing access to all or most of the ports of the switch. The VSI n×n switch increases throughput performance by enabling access to more than one switch port at one time to achieve a higher bandwidth per transmission.

VSI Passive and Analog Device Programmable Array

The VSI invention uniquely enables a method of making programmable passive and analog stacked circuits. This is done by fabricating one or more circuit layers of passive devices [resistors, capacitors and inductors] and vertically interconnecting these devices to one or more circuit layers of programmable routing interconnections designed for making and or remaking interconnections between the passive devices and the circuitry on other circuit layers. This aspect of the VSI invention is herein called a programmable passive array or PPA. Passive circuit elements may be fabricated from MEMS processes such as in the fabrication of inductors. The passive circuit elements are preferably fabricated on a semiconductor substrate which would allow fabrication of active circuit elements if desired such as SOI, GaAs, InP or GaN.

This same approach can be used to make programmable analog circuit arrays. This is done by fabricating one or more circuit layers of analog elements and vertically interconnecting these elements to one or more circuit layers of programmable routing interconnections designed for making and or remaking interconnections between the analog devices and the circuitry on other circuit layers. This herein is called a programmable analog array or PAA.

It is also an aspect of the VSI invention that PPA and PAA circuit layers be combined in a common VSI component or circuit stack, wherein the same programmable routing interconnections circuit layers can be used to form vertical interconnections to both the passive and analog circuit elements. The various passive and analog circuit elements that may be integrated into an IC are often fabricated with processes that cannot be combined in the fabrication of a planar IC, this is often the primary limitation for the fabrication of a class of planar ICs that are broadly referred to as a SoC or System on Chip. The VSI process allows the various fabrication processes to be used to their full extent but segregated to separate circuit layers. In this manner the benefit of a fabrication process can be realized as needed without comprise or added fabrication complexity that would result if these processes were merged on one substrate.

It is also an aspect of the VSI invention that in the design of PPA and PAA circuit layers a redundant or spare passive, analog and routing interconnections be used to either increase the yield of the PPA and PAA circuit layers or to provide a means to tune the final circuit by changing the selection of PPA or PAA elements with the expectation that the various individual passive or analog elements will have operational or performance variations. The yield of the PPA or PAA circuit layers would be improved through use of a test means such as an internal self test or ATE circuit layer which would test PPA, PAA and routing interconnections to determine if circuit defects are present. The use of defective PPA or PAA elements is avoided by changing the programmable routing interconnections from a defective element to its spare. The use of defective routing interconnections is avoided by changing the programmable routing interconnections to an alternate interconnection path or by use of spare programmable routing interconnections corresponding to the defective one.

It is also an aspect of the VSI invention of the PPA circuit layers that the passive elements be fabricated with conventional IC fabrication means on the backside of either an analog circuit layer or the programmable routing interconnection circuit layers. Backside fabrication may not be possible for certain passive element types due to an incompatibility of certain process steps with respect to an existing set of circuit layers of a VSI substrate stack, and therefore, may require the fabrication of the passive electronic circuitry before the fabrication of the active circuitry on the same substrate and before its addition to a VSI IC stack.

It is important to also keep in mind that not all PPA and PAA fabrication processes have the same cost, and that there is a wide range in costs of such fabrication processes. It is therefore another aspect of the VSI invention that due to its capability to separate fabrication processes per circuit layer then process costs are minimized to an as need fabrication sequence. An example in a planar circuit is the fabrication of an IC wherein approximately one half of the IC area uses a lower cost process and the other half of area uses a premium cost process, since the cost of a fabrication process is based on unit area, the cost of the planar IC could be approximately twice the cost of two separate fabricated circuit layers each of area approximately one half of the planar IC.

Further, it is also an aspect of the VSI invention that passive and analog circuit layers be connected without a programmable routing interconnection wherein the VSI fabricated vertical interconnections are dedicated from passive and or analog circuit layers to other circuit layers of a VSI component. The use of a switching circuit layer with passive and analog arrays is not required, if there is no need that the vertical interconnections to various passive or analog elements of one circuit layer from other circuit layers to be alterable. This is another embodiment of the VSI invention wherein vertical interconnections from passive or analog circuit layers have fixed interconnections to other circuit layers. These fixed interconnections may be formed at the time the passive or analog circuit substrate is fabricated or at a subsequent time such as during backside processing wherein vertical and horizontal interconnections may be fabricated for an application specific design.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

The invention claimed is:

1. A stacked integrated circuit comprising:
    a plurality of closely-coupled integrated circuit layers in stacked relation to one another,
    at least one of the plurality of closely-coupled integrated circuit layers having a predetermined interconnection pattern;
    wherein there exists at least one additional completed integrated circuit layer, different than each of the plurality of closely-coupled integrated circuit layers, having the predetermined interconnection pattern, whereby the additional completed integrated circuit layer, without modification, could have been added to the stacked integrated circuit.

2. The stacked integrated circuit of claim 1, wherein the additional integrated circuit layer is identical to one of said plurality of closely-coupled integrated circuit layers.

3. The stacked integrated circuit of claim 1, wherein the plurality of closely-coupled integrated circuit layers include a processing layer and a memory layer.

4. The stacked integrated circuit of claim 1, wherein the plurality of closely-coupled integrated circuit layers include an I/O layer.

5. The stacked integrated circuit of claim 4, wherein the I/O layer performs wireless communications.

6. The stacked integrated circuit of claim 4, wherein the I/O layer performs optical communications.

7. The stacked integrated circuit of claim 1, comprising vertical interconnections formed by bonding the plurality of closely-coupled integrated circuit layers by metal diffusion bonding.

8. The stacked integrated circuit of claim 1, wherein at least one of the plurality of closely-coupled integrated circuit layers comprises only one integrated circuit.

9. The stacked integrated circuit of claim 1, wherein at least one of the plurality of closely-coupled integrated circuit layers is substantially flexible.

10. The stacked integrated circuit of claim 1, wherein at least one of the plurality of closely-coupled integrated circuit layers comprises a semiconductor substrate.

* * * * *